(12) United States Patent
Hurwitz et al.

(10) Patent No.: US 7,682,972 B2
(45) Date of Patent: Mar. 23, 2010

(54) ADVANCED MULTILAYER CORELESS SUPPORT STRUCTURES AND METHOD FOR THEIR FABRICATION

(75) Inventors: Dror Hurwitz, Gilboa (IL); Mordechay Farkash, Haifa (IL); Eva Igner, Haifa (IL); Boris Statnikov, Nazerth Illit (IL); Benny Michaeli, Nazerth Illit (IL)

(73) Assignee: Amitec-Advanced Multilayer Interconnect Technoloiges Ltd., Migdal Haemek (IL)

( * ) Notice: Subject to any disclaimer, the term of this patent is extended or adjusted under 35 U.S.C. 154(b) by 270 days.

(21) Appl. No.: 11/421,600

(22) Filed: Jun. 1, 2006

(65) Prior Publication Data

US 2007/0281471 A1  Dec. 6, 2007

(51) Int. Cl.
*H01L 21/44* (2006.01)
(52) U.S. Cl. .............. 438/672; 438/637; 438/618; 438/622
(58) Field of Classification Search ......... 438/612–624, 438/637–638, 672–673
See application file for complete search history.

(56) References Cited

U.S. PATENT DOCUMENTS

| | | | | |
|---|---|---|---|---|
| 4,970,106 | A * | 11/1990 | DiStefano et al. | 428/209 |
| 6,280,640 | B1 * | 8/2001 | Hurwitz et al. | 216/15 |
| 7,268,012 | B2 * | 9/2007 | Jiang et al. | 438/106 |
| 2006/0027934 | A1 * | 2/2006 | Edelstein et al. | 257/774 |
| 2006/0046485 | A1 * | 3/2006 | Maeng et al. | 438/689 |
| 2007/0082501 | A1 * | 4/2007 | Hurwitz et al. | 438/763 |

* cited by examiner

*Primary Examiner*—Dung A. Le
(74) *Attorney, Agent, or Firm*—Dennison, Schultz & MacDonald

(57) ABSTRACT

A method of fabricating a free standing membrane including via array in a dielectric for use as a precursor in the construction of superior electronic support structures, includes the steps of fabricating a membrane of conductive vias in a dielectric surround on a sacrificial carrier, and detaching the membrane from the sacrificial carrier to form a free standing laminated array. An electronic substrate based on such a free standing membrane may be formed by thinning and planarizing laminated array, followed by terminating.

22 Claims, 104 Drawing Sheets

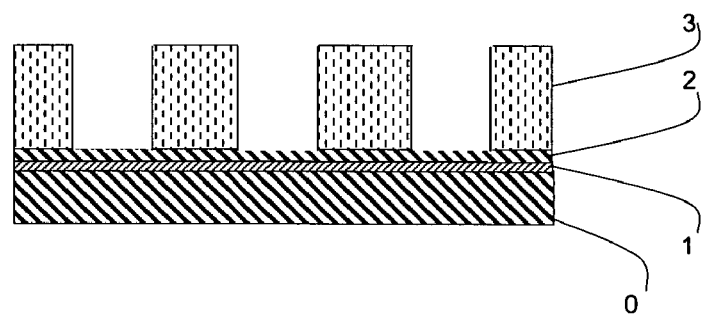
Fig. 7(iii)

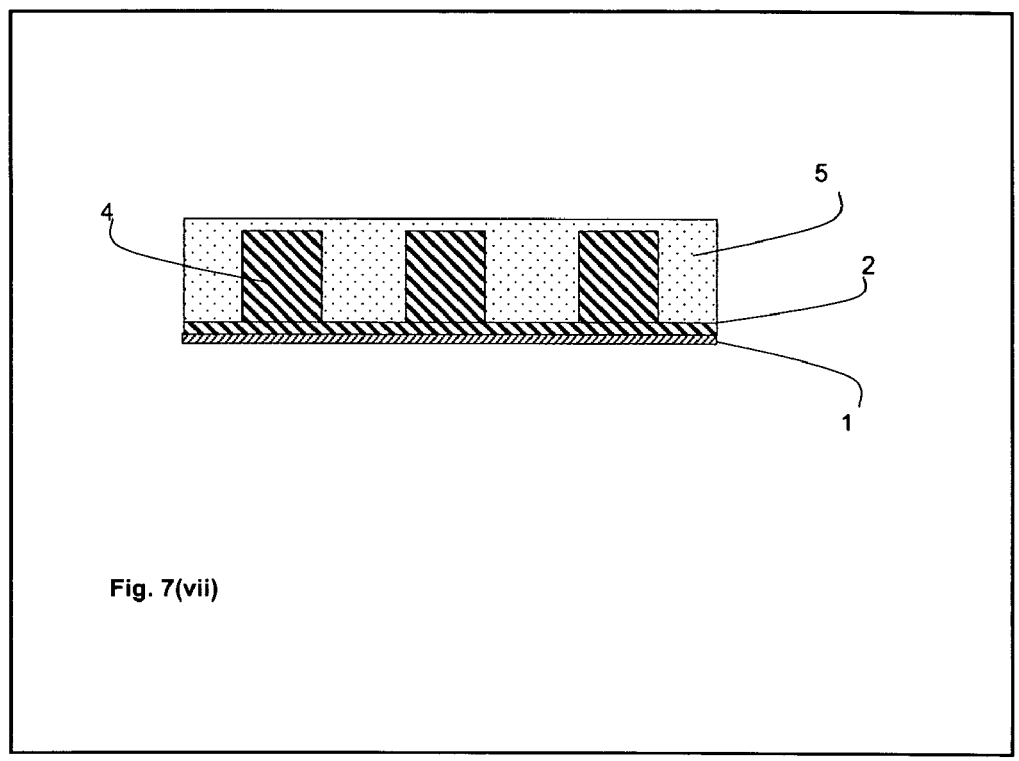
Fig. 7(vii)
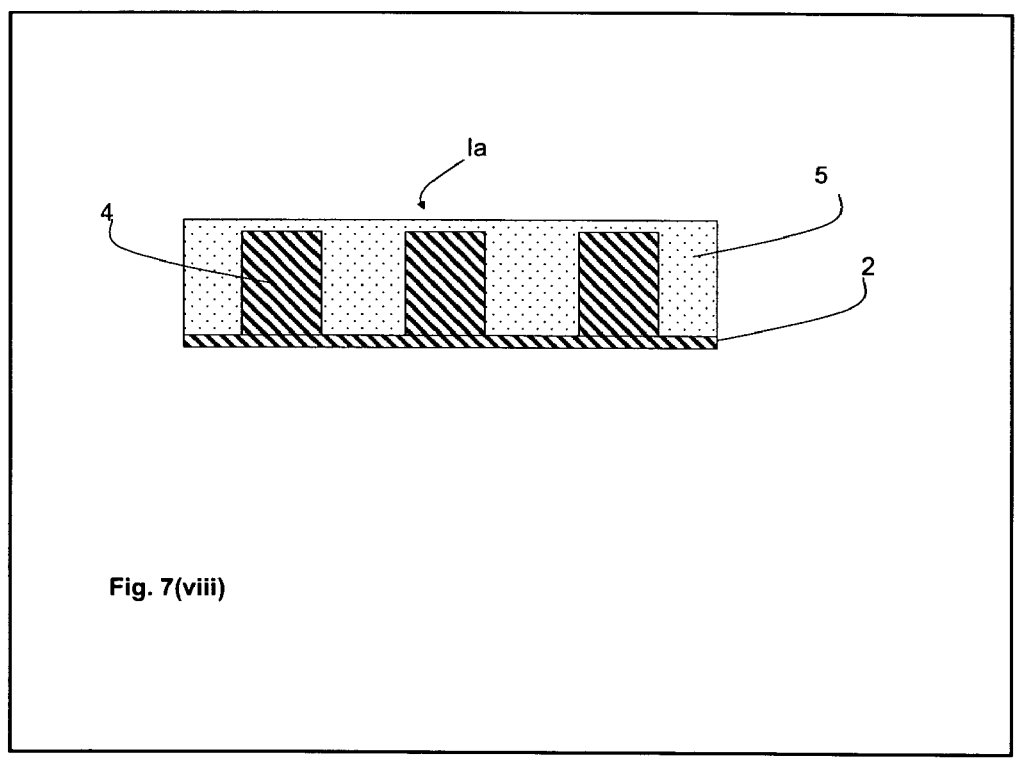
Fig. 7(viii)

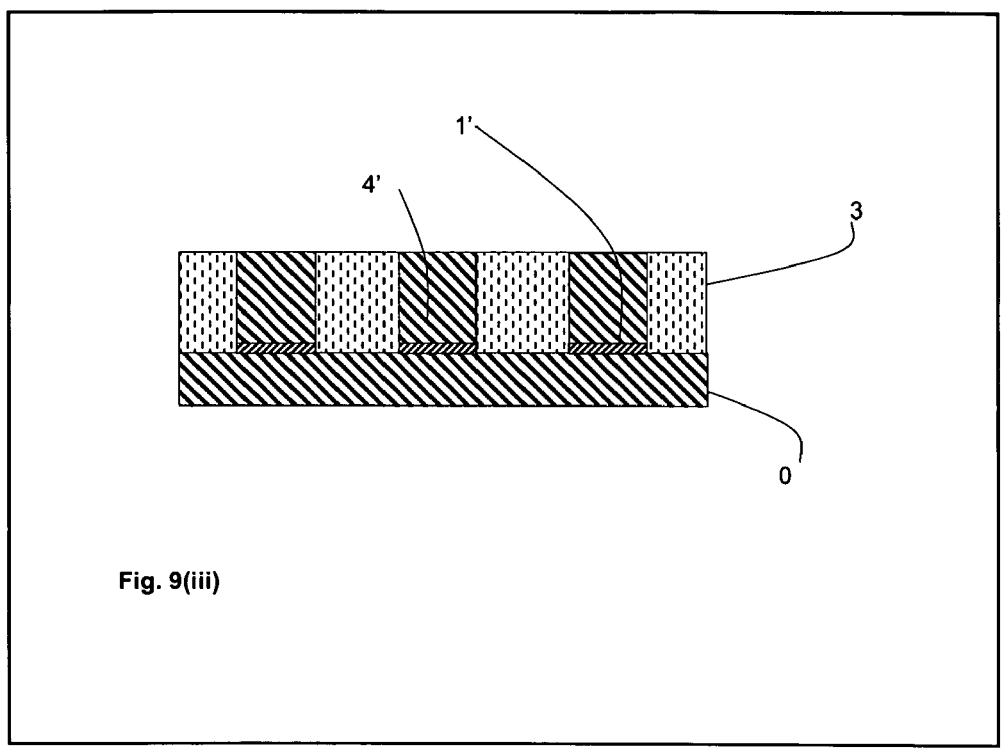
Fig. 9(iii)

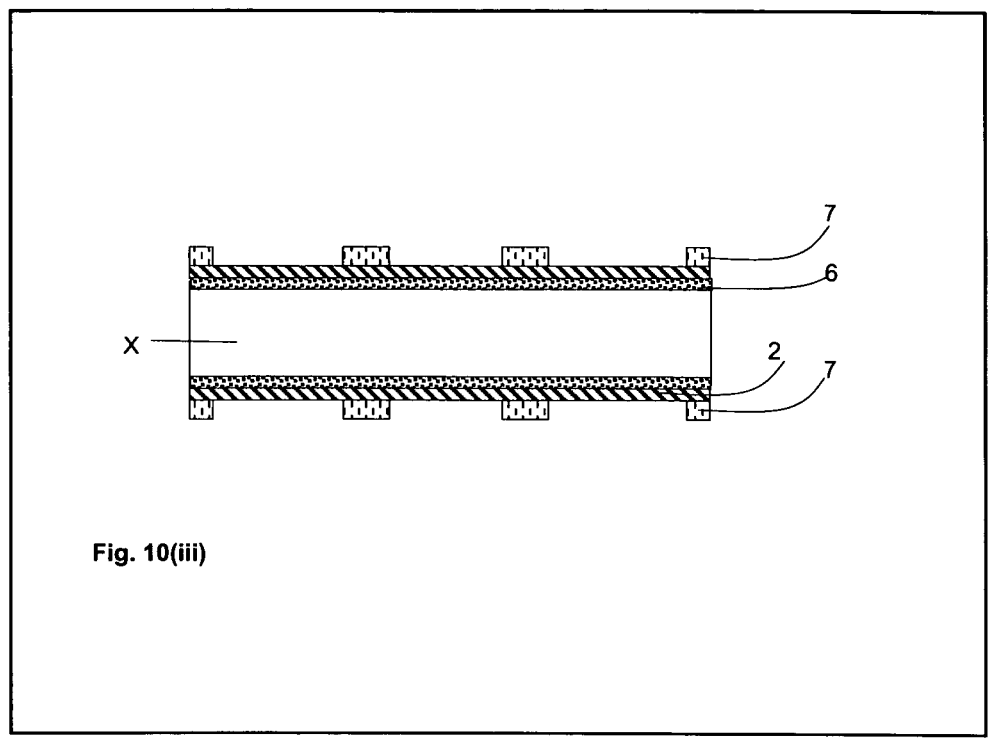
Fig. 10(iii)

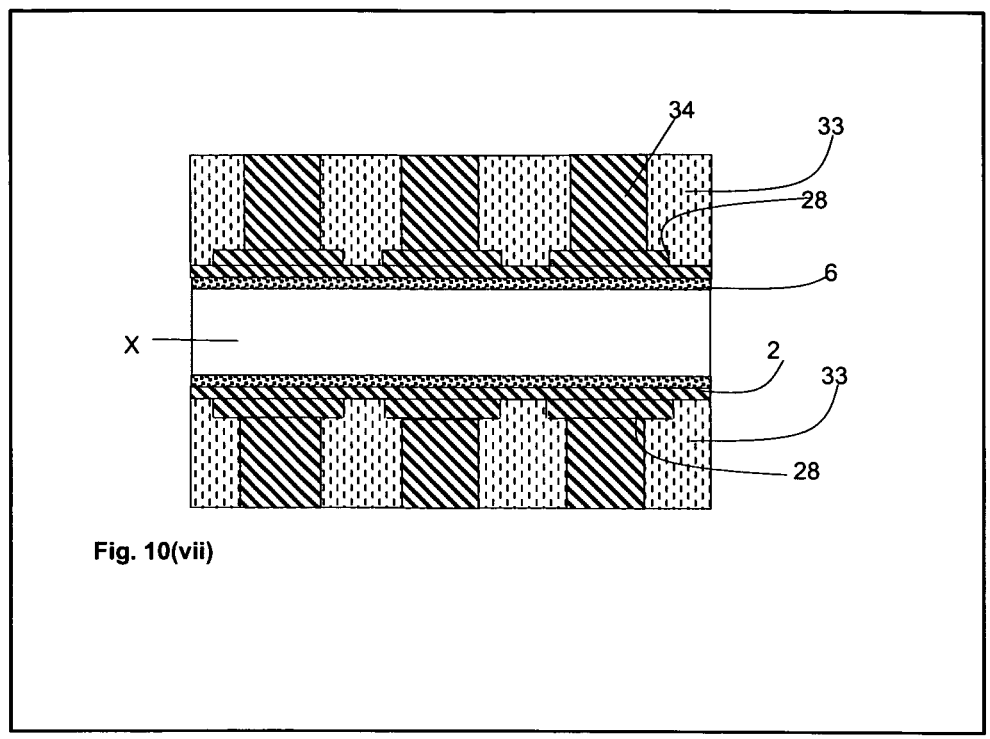
Fig. 10(vii)
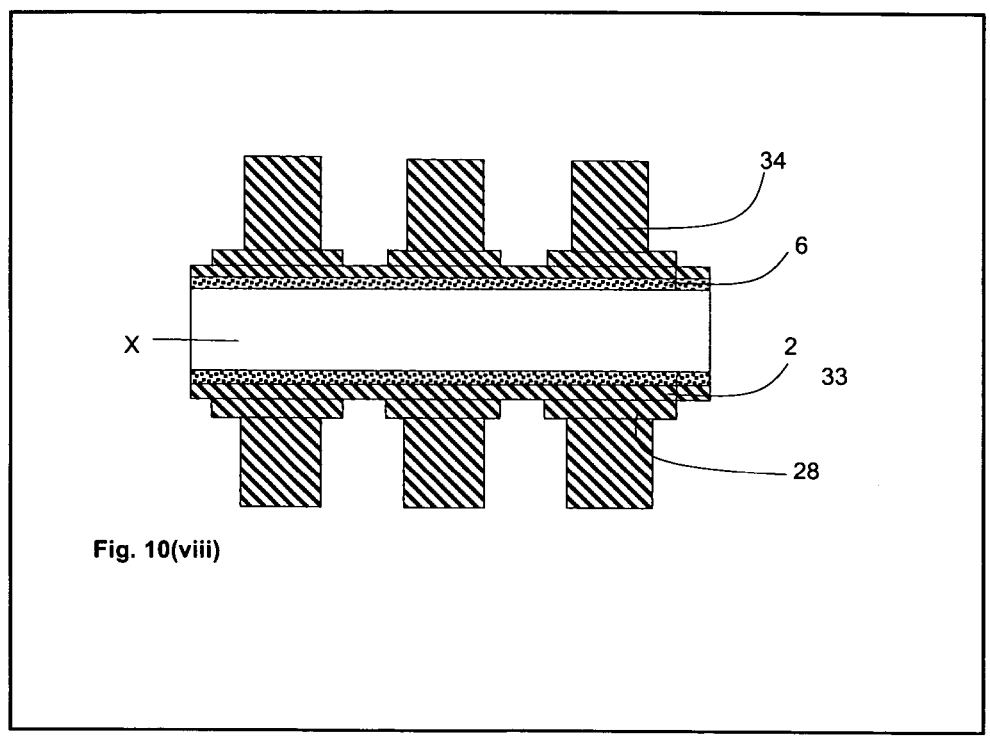
Fig. 10(viii)

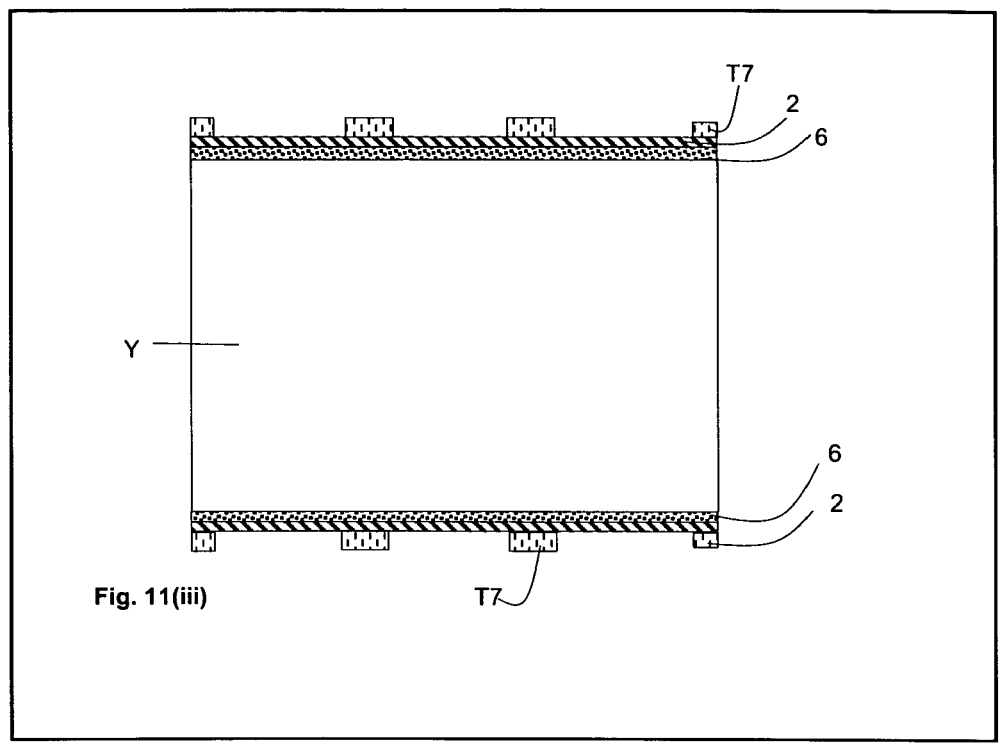
Fig. 11(iii)

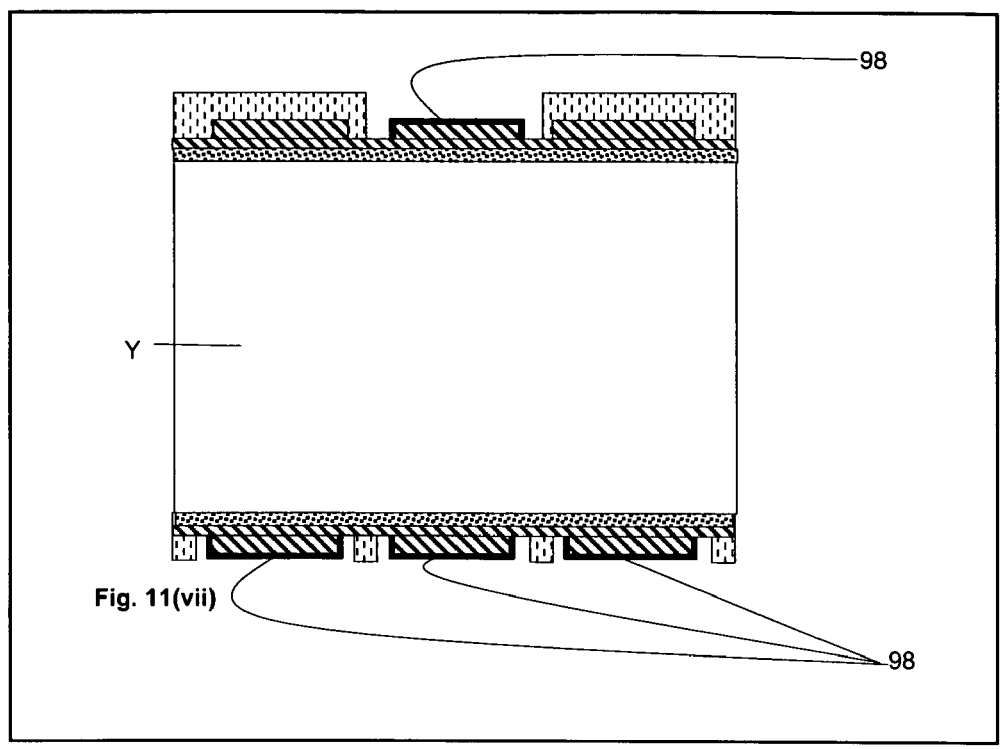
Fig. 11(vii)
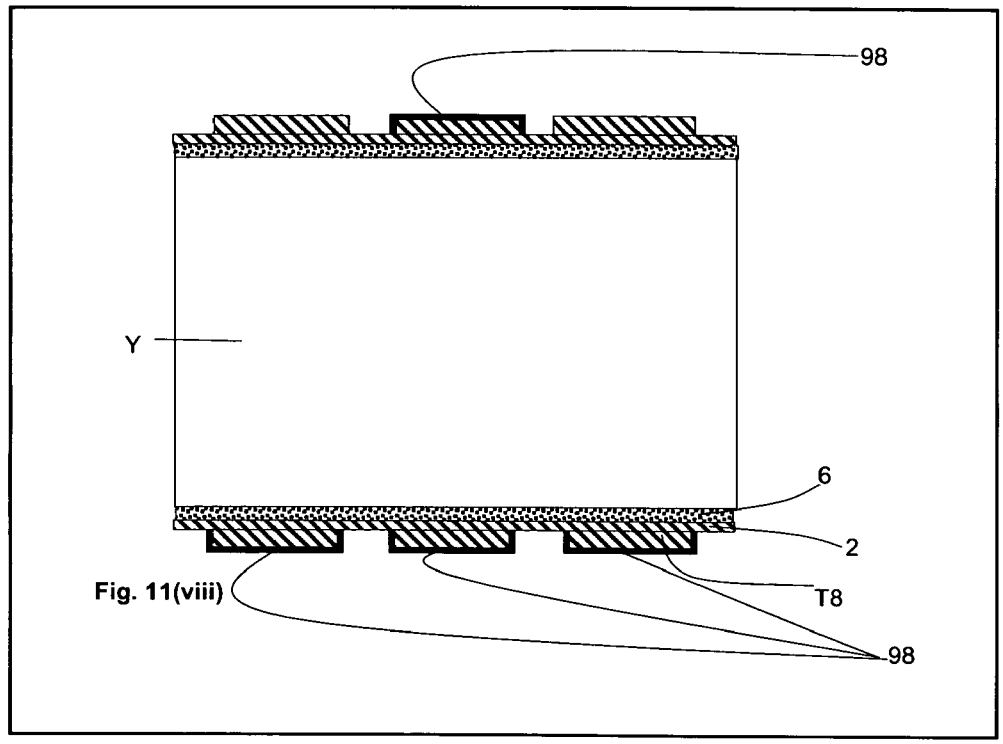
Fig. 11(viii)

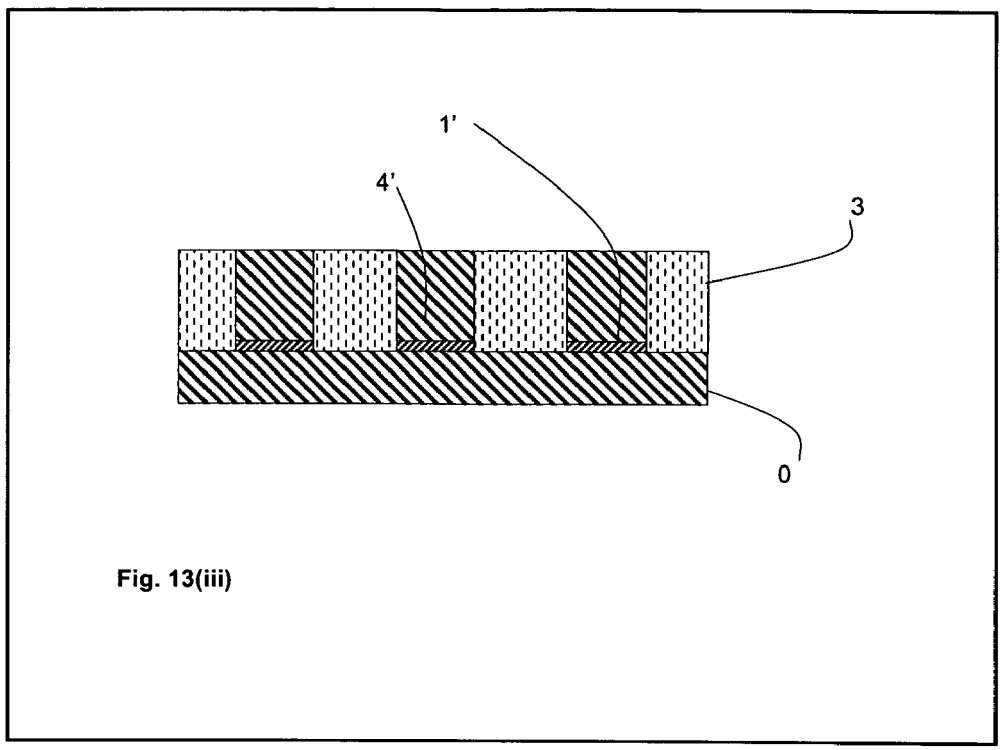
Fig. 13(iii)

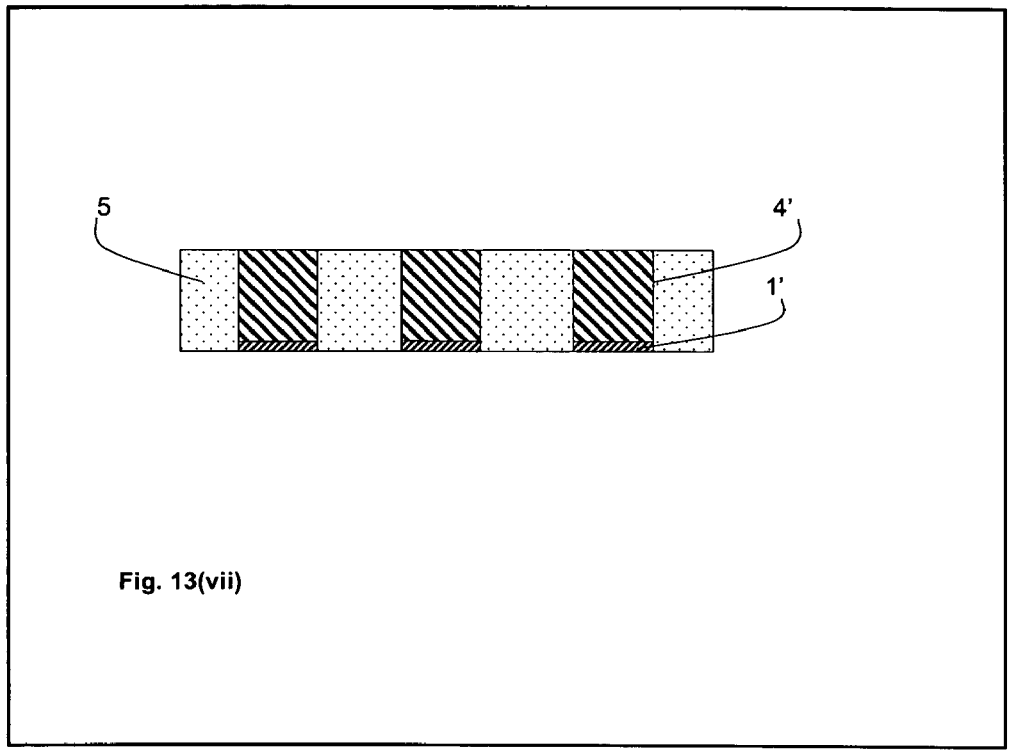
Fig. 13(vii)
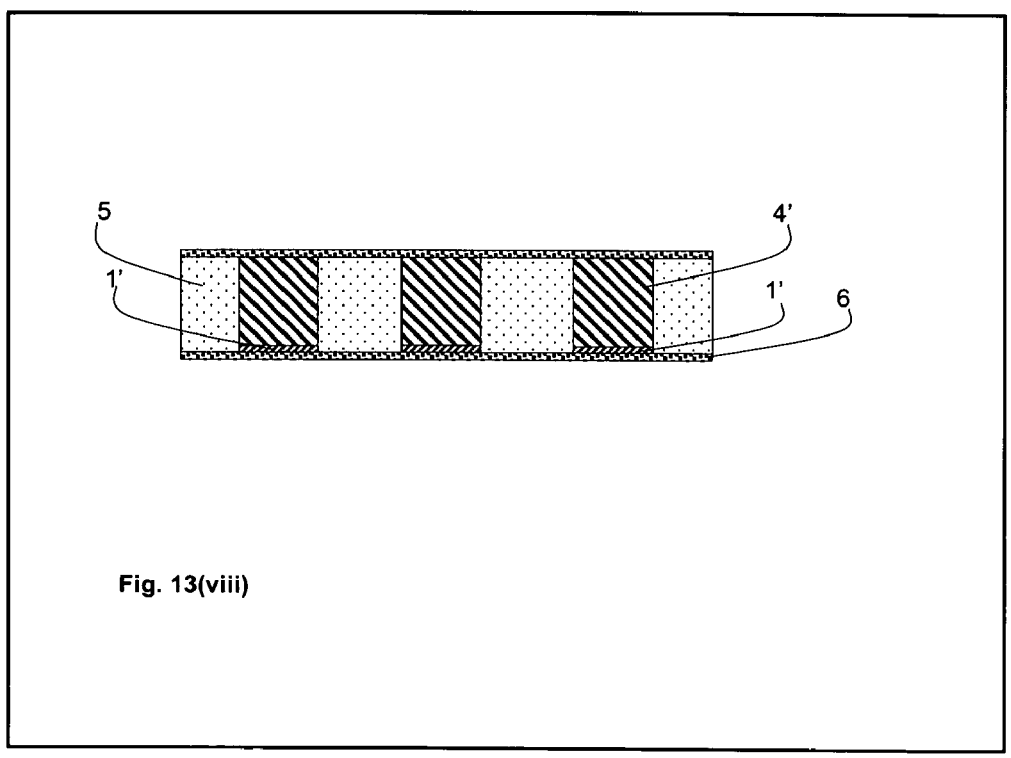
Fig. 13(viii)

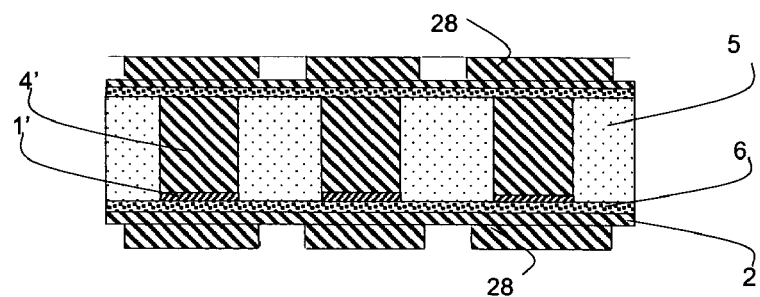
Fig. 13(xii)

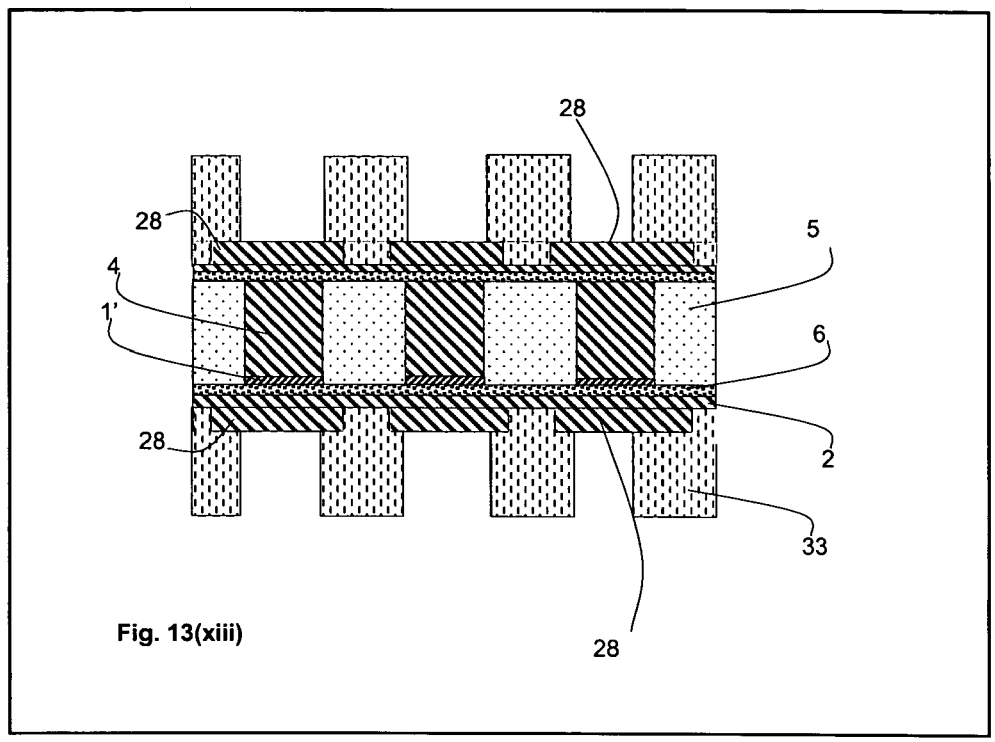
Fig. 13(xiii)
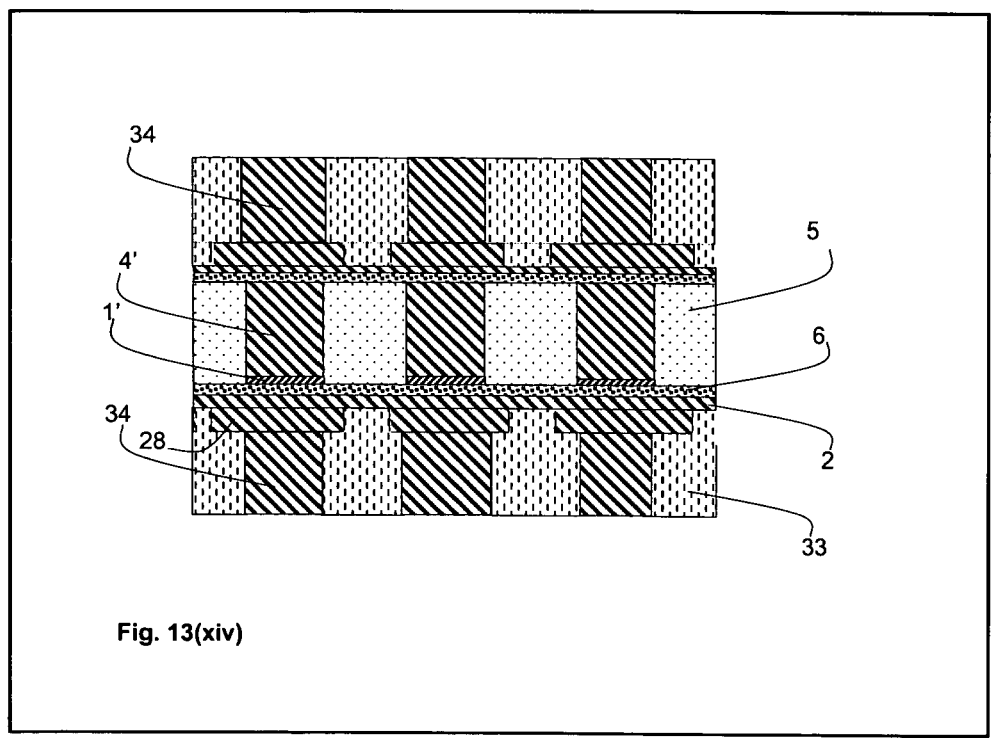
Fig. 13(xiv)

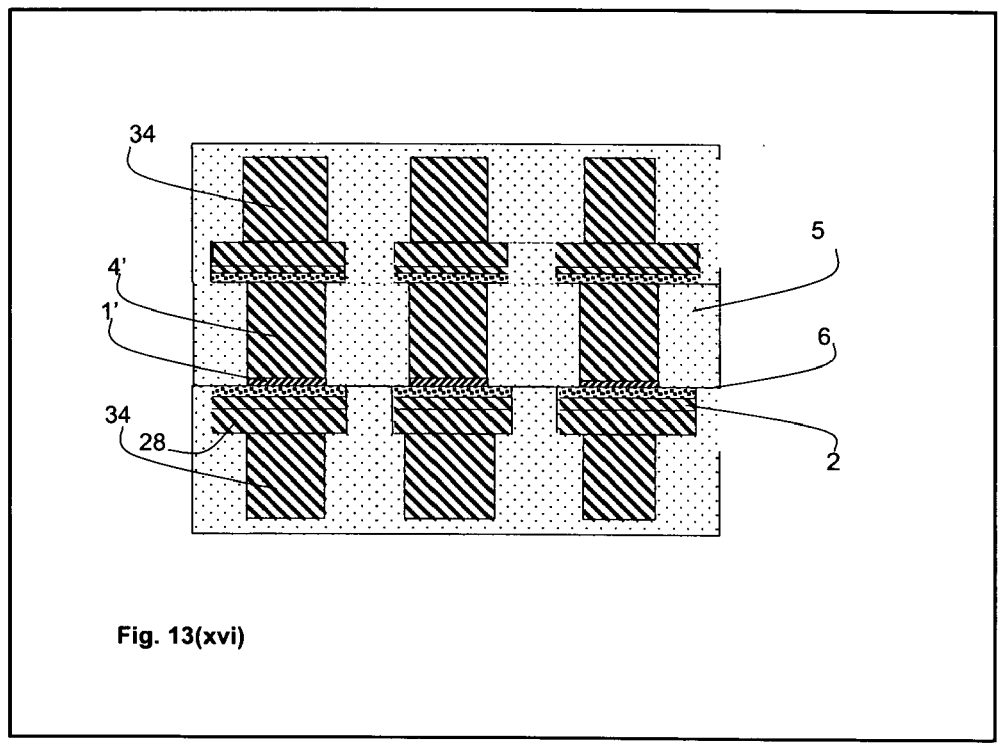
Fig. 13(xvi)

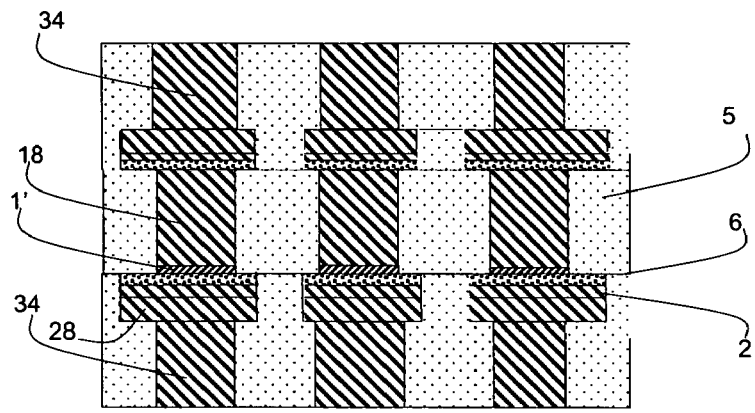
Fig. 13(xvii)
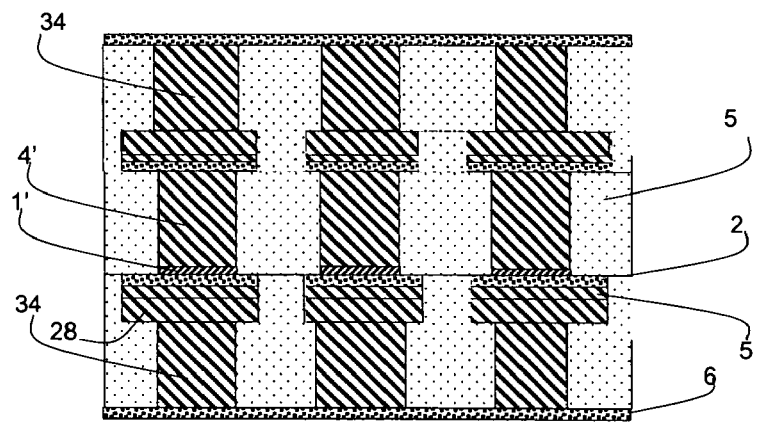
Fig. 13(xviii)

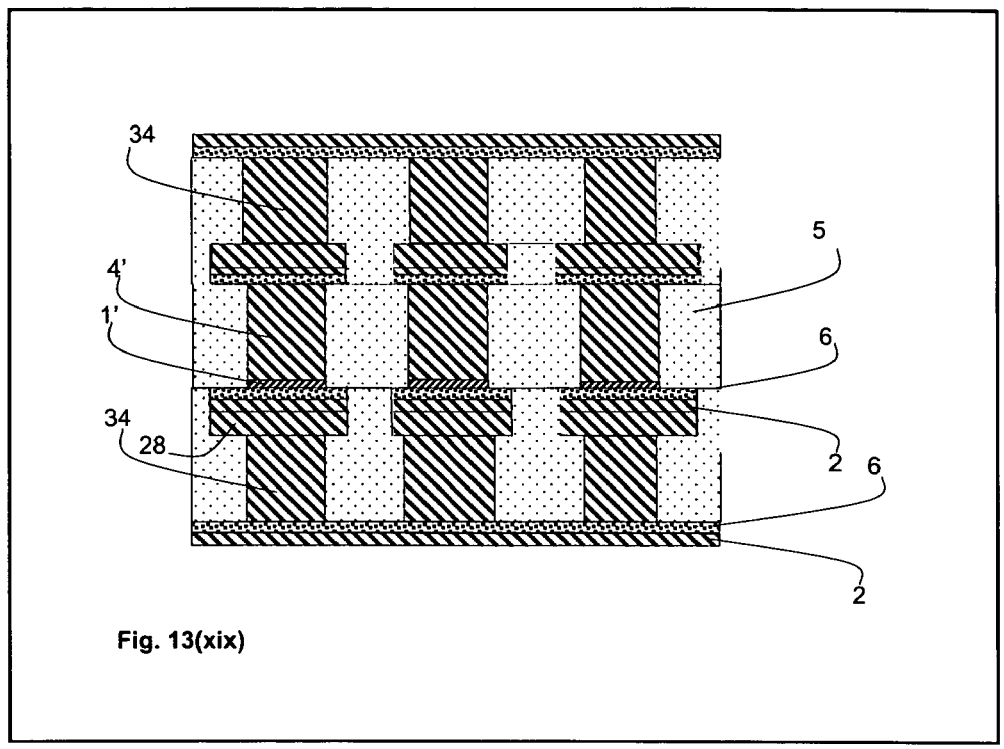
Fig. 13(xix)

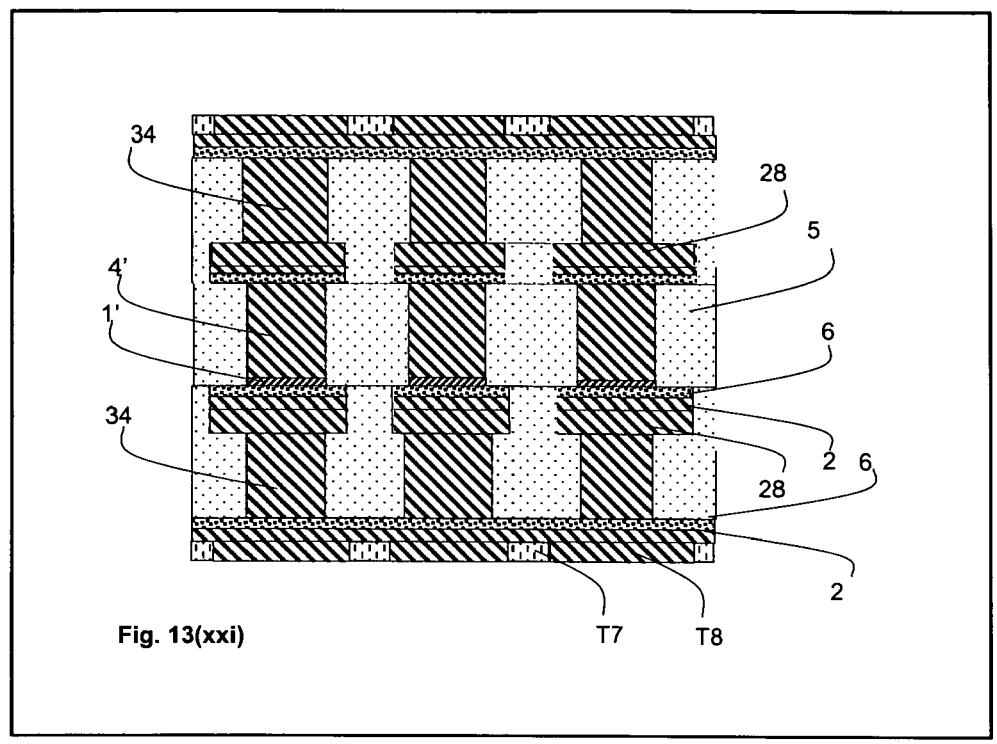
Fig. 13(xxi)
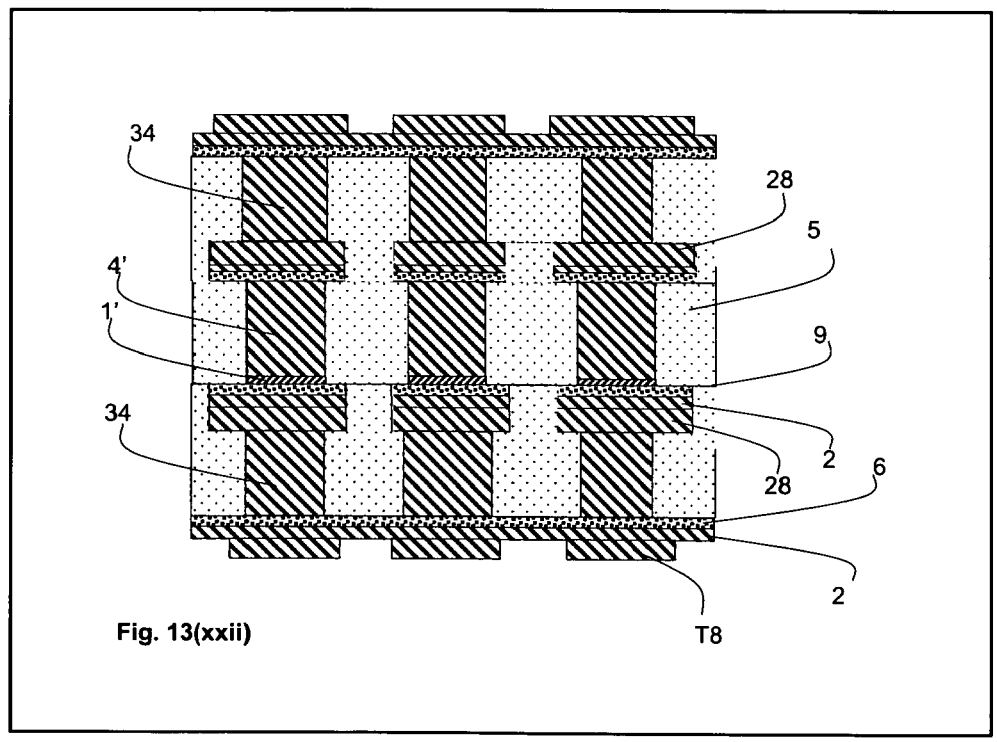
Fig. 13(xxii)

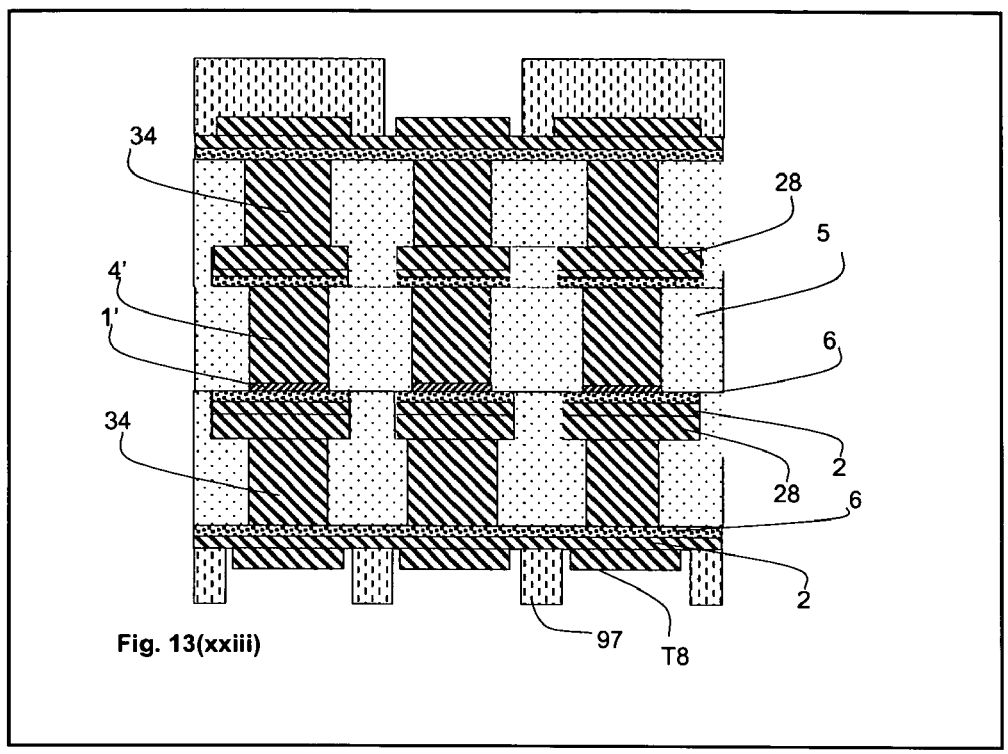
Fig. 13(xxiii)
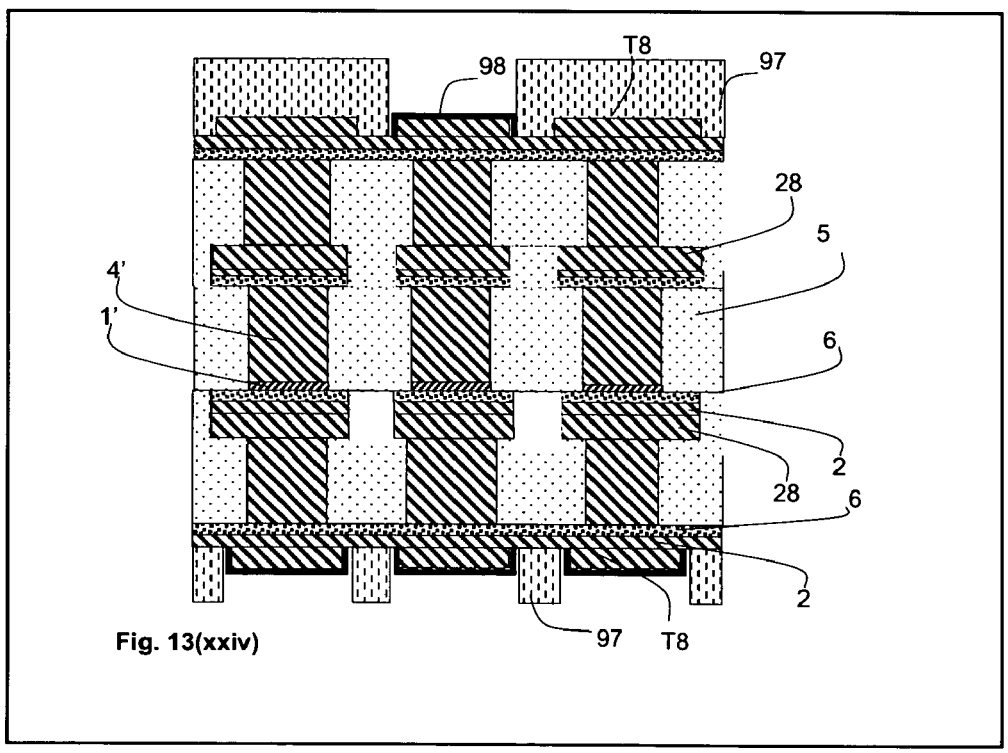
Fig. 13(xxiv)

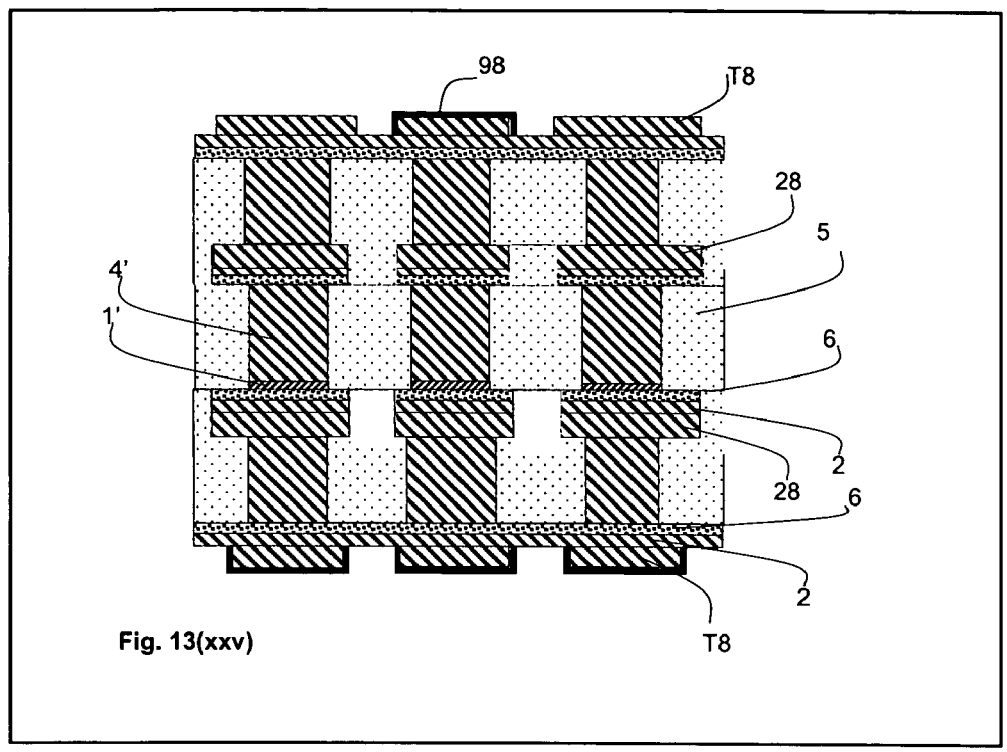
Fig. 13(xxv)
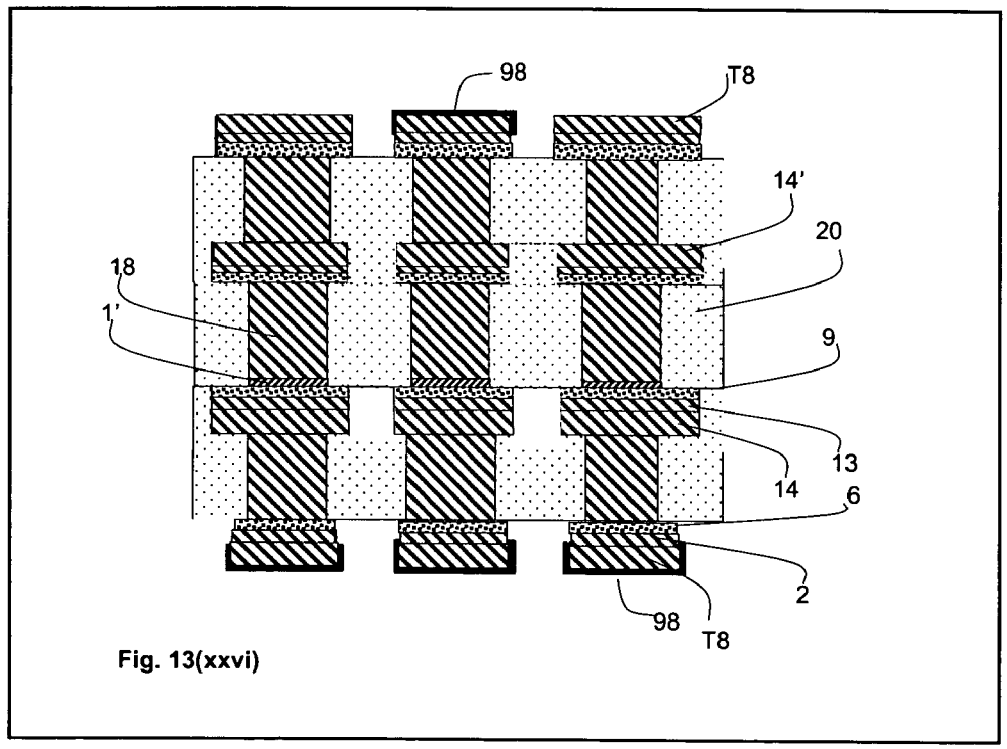
Fig. 13(xxvi)

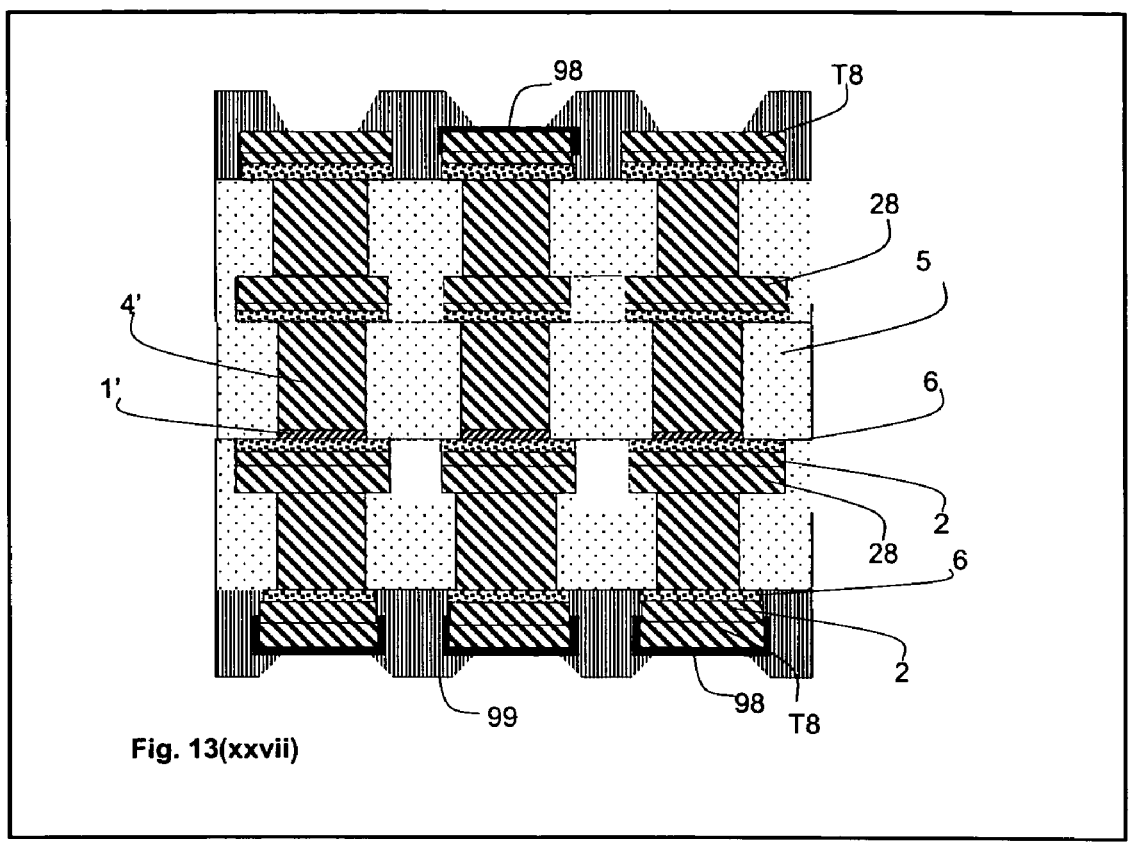
Fig. 13(xxvii)

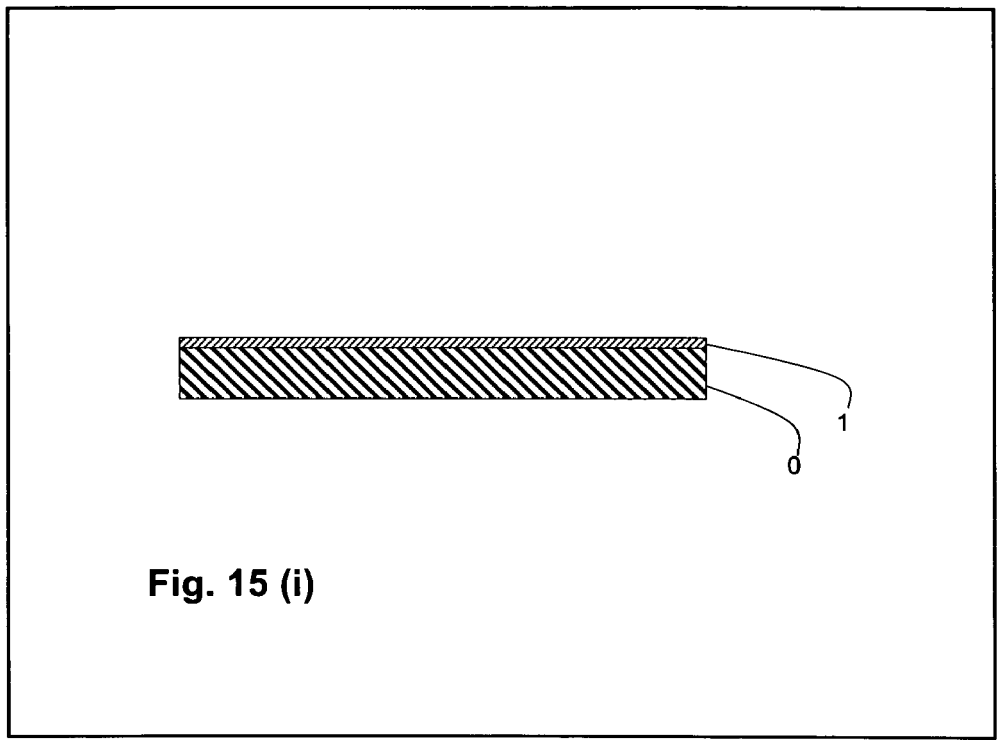
Fig. 15 (i)
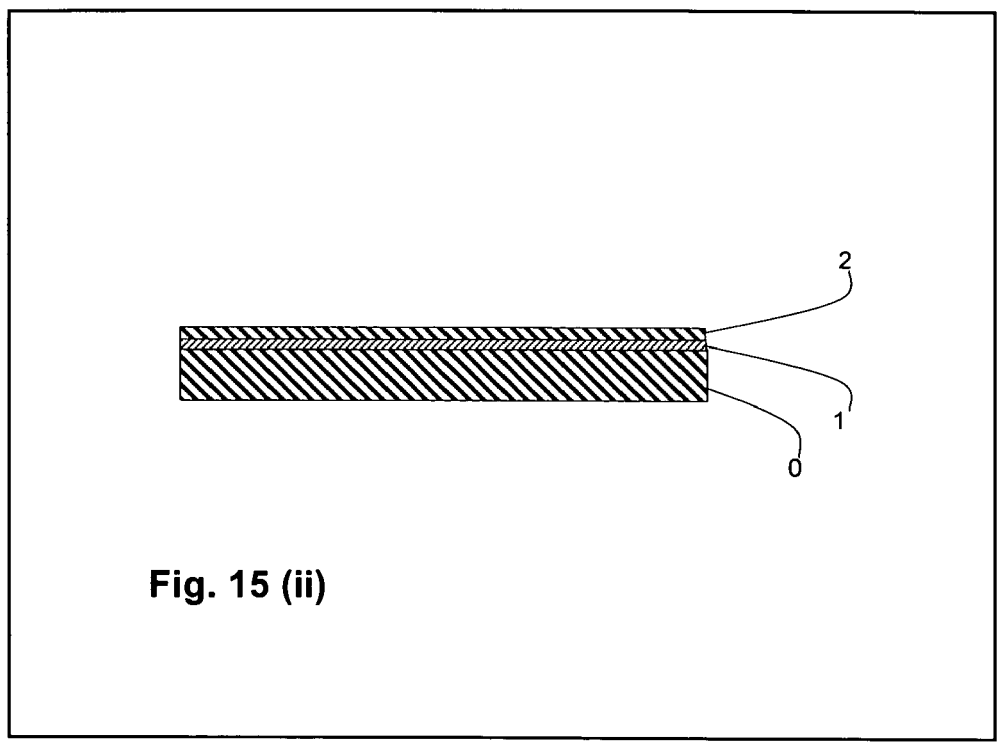
Fig. 15 (ii)

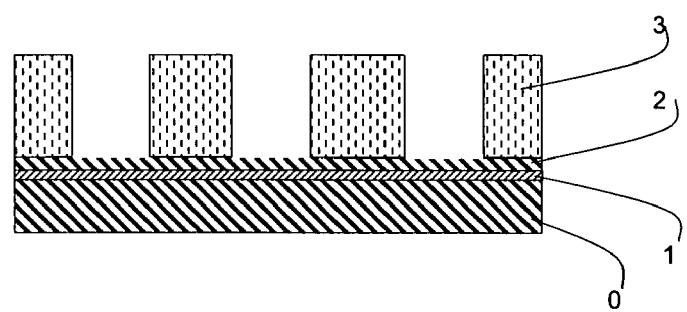
Fig. 15 (iii)
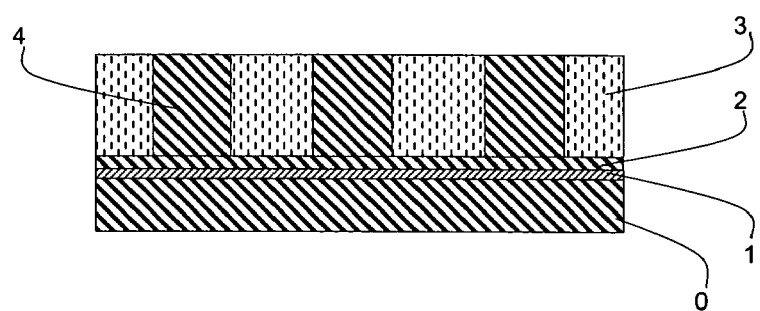
Fig. 15 (iv)

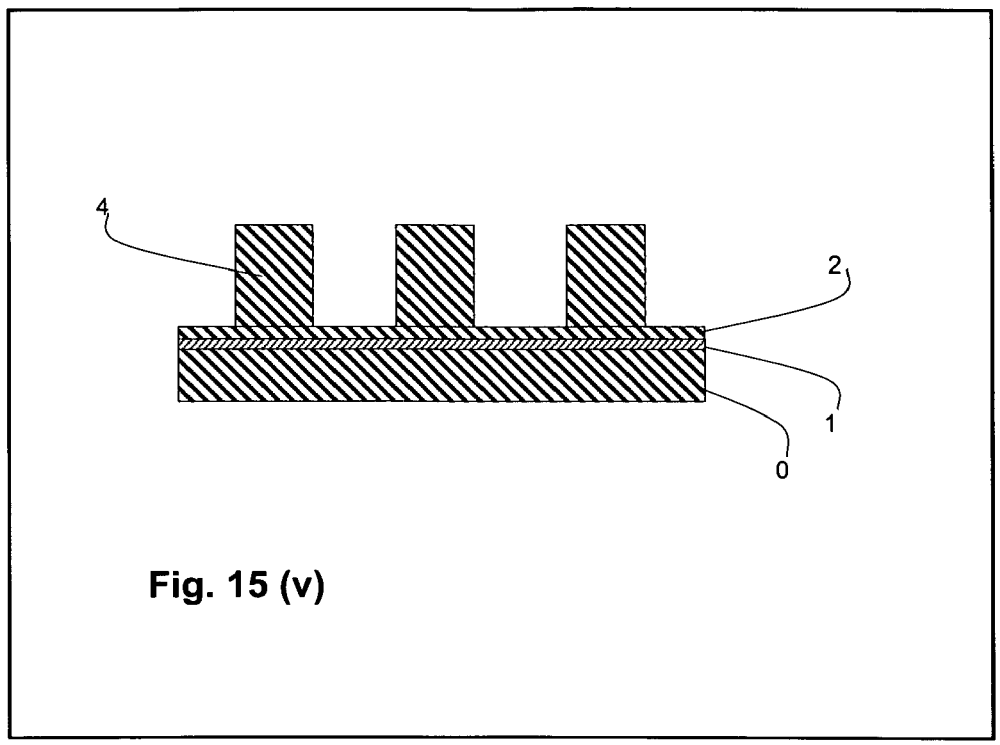
Fig. 15 (v)
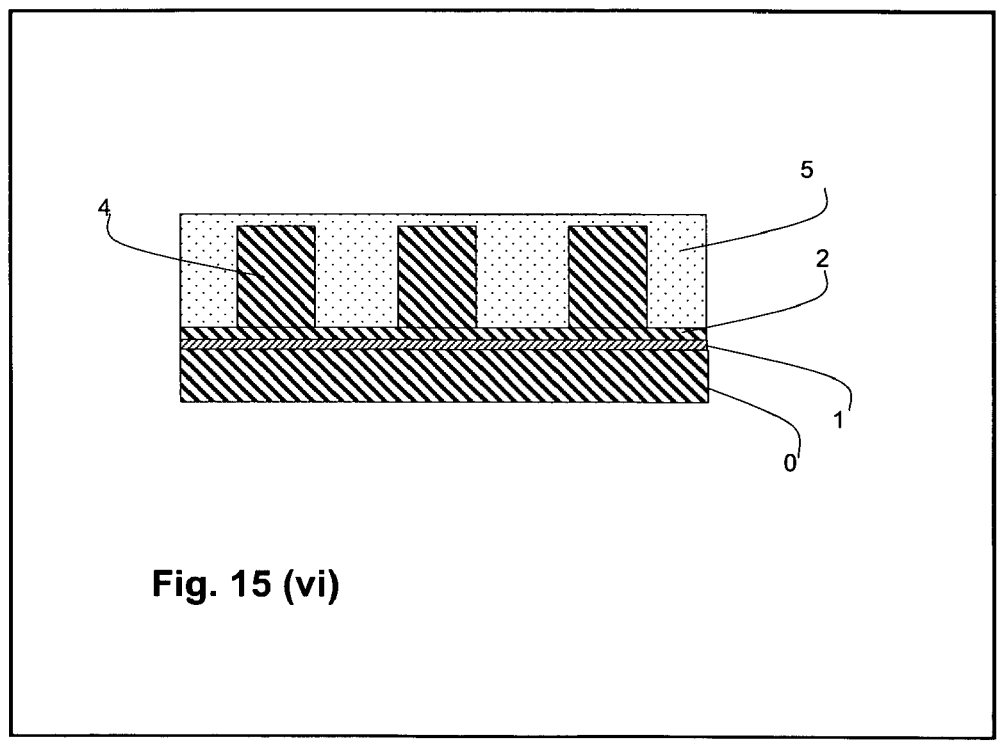
Fig. 15 (vi)

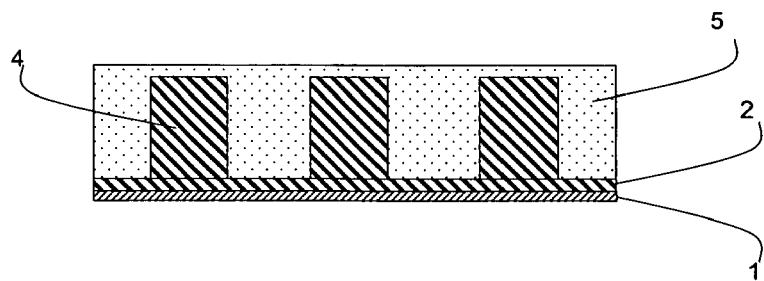
Fig. 15 (vii)
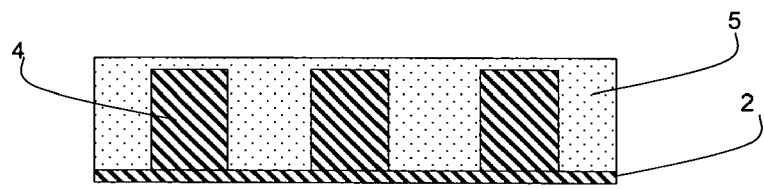
Fig. 15 (viii)

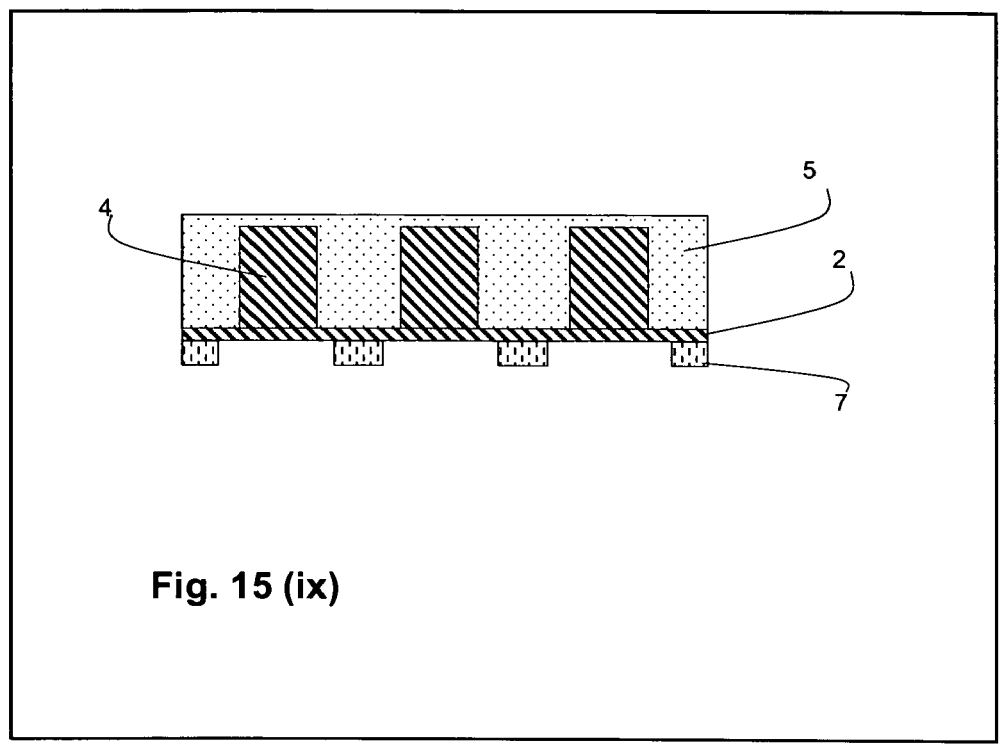
Fig. 15 (ix)
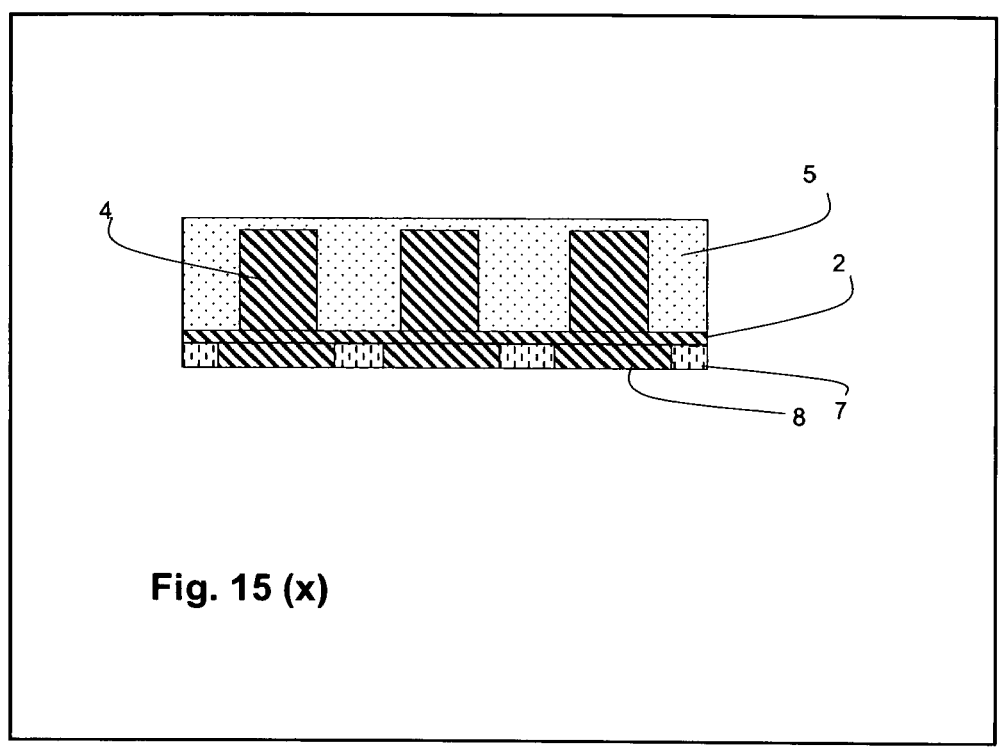
Fig. 15 (x)

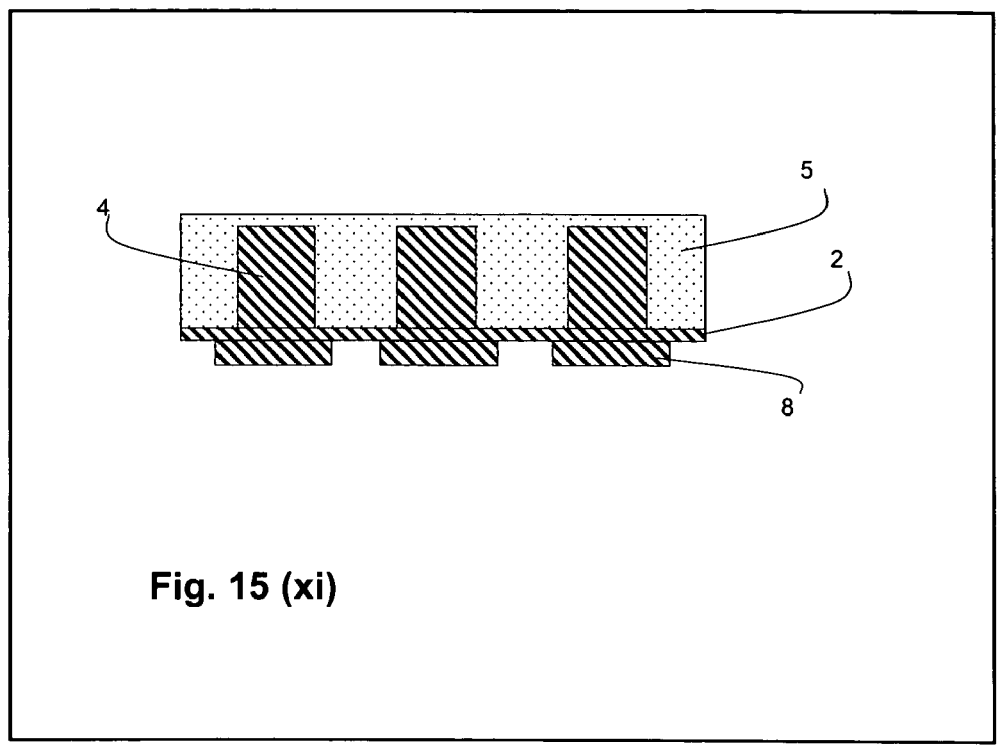
Fig. 15 (xi)
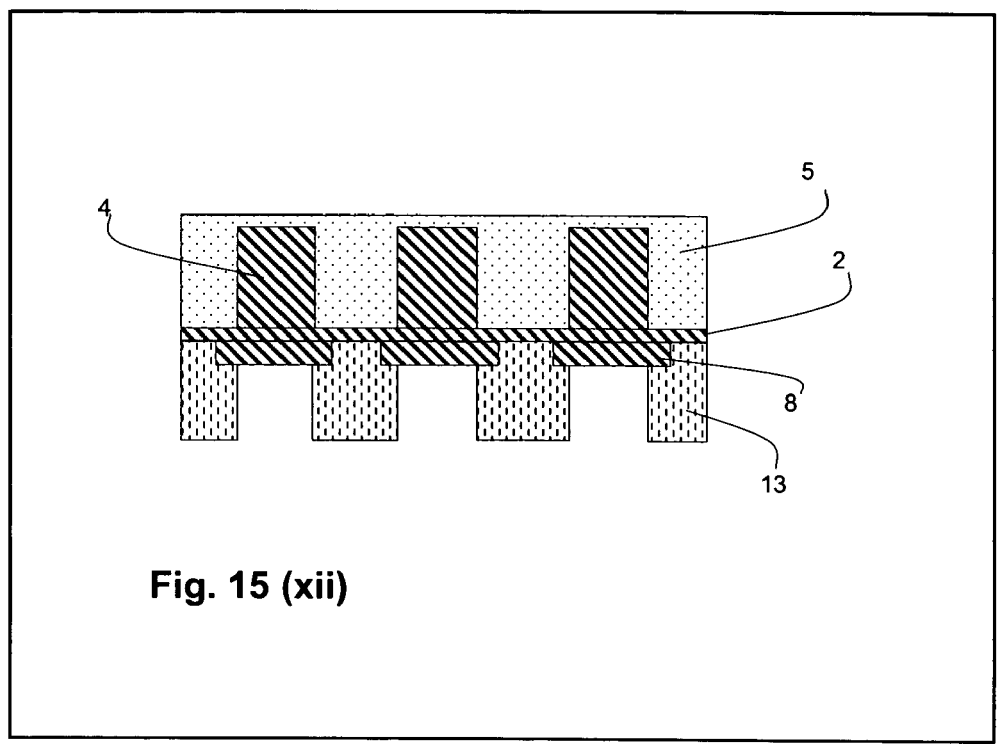
Fig. 15 (xii)

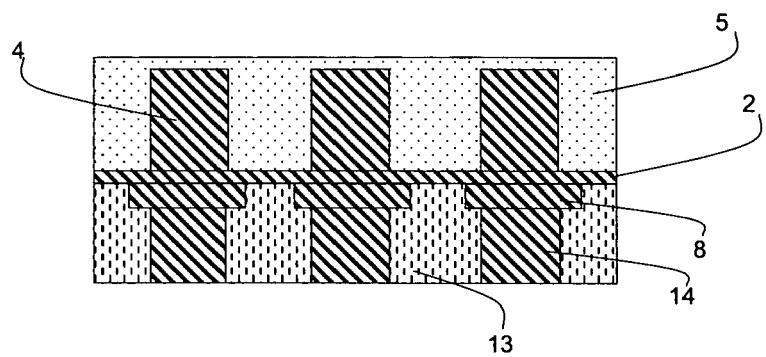
Fig. 15 (xiii)
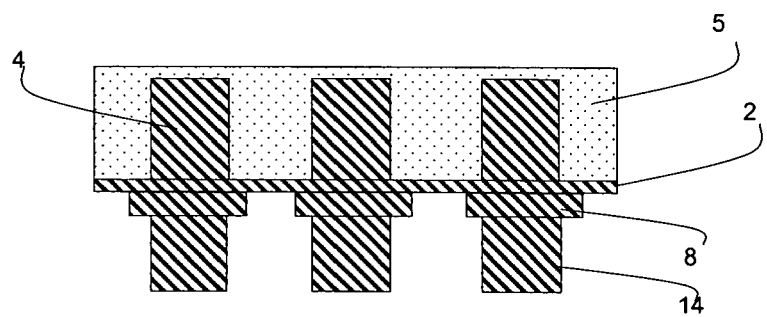
Fig. 15 (xiv)

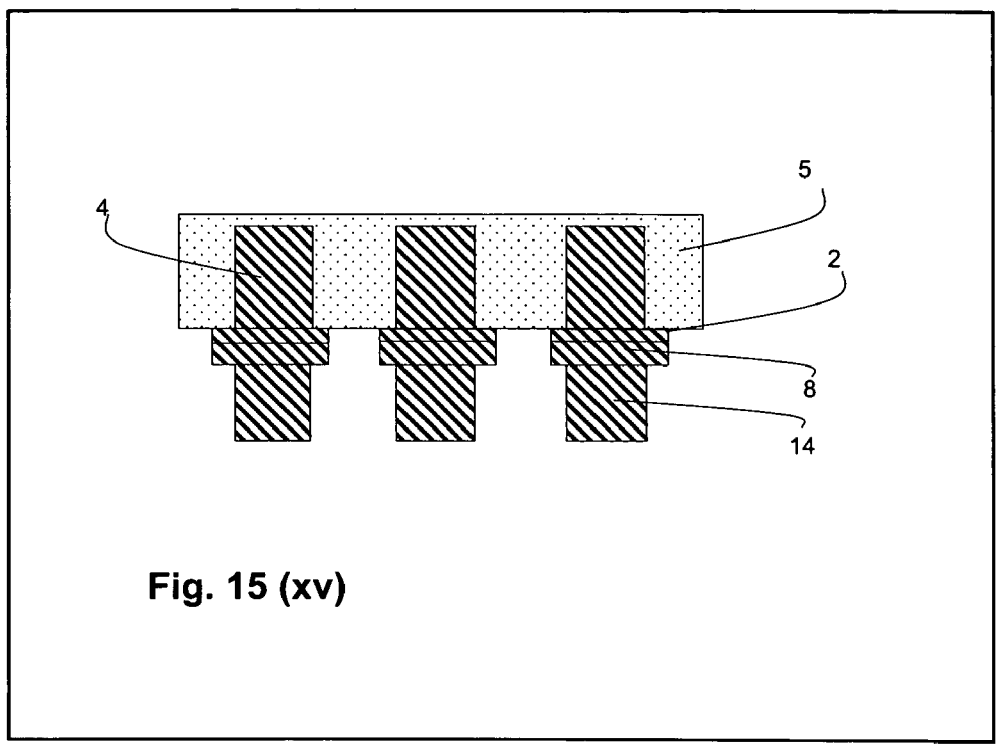
Fig. 15 (xv)
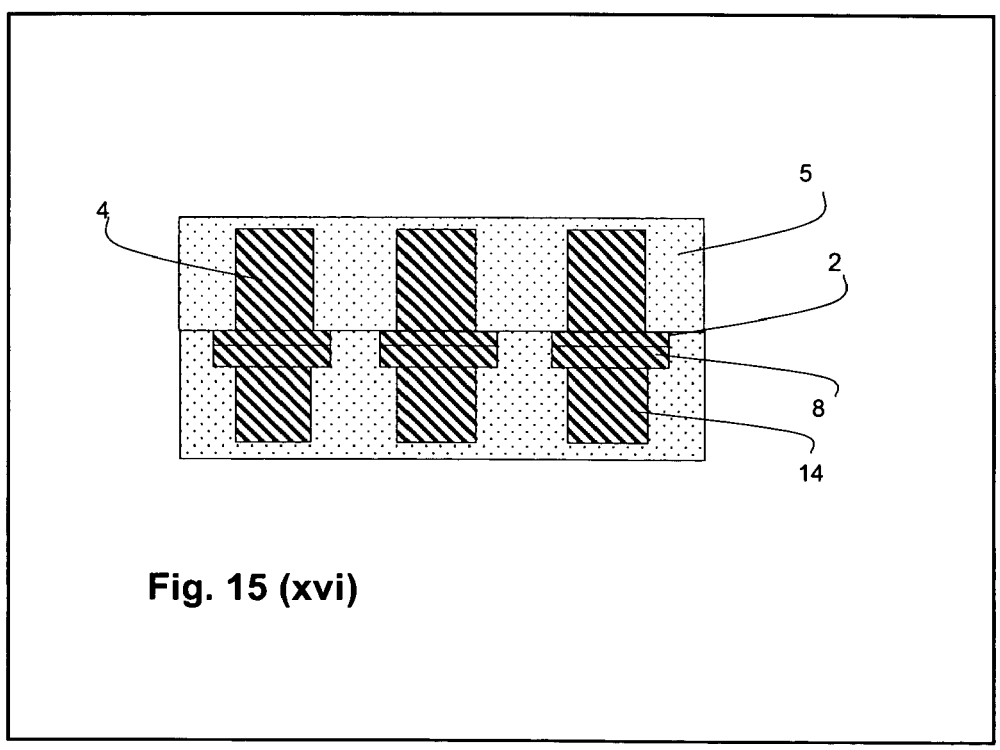
Fig. 15 (xvi)

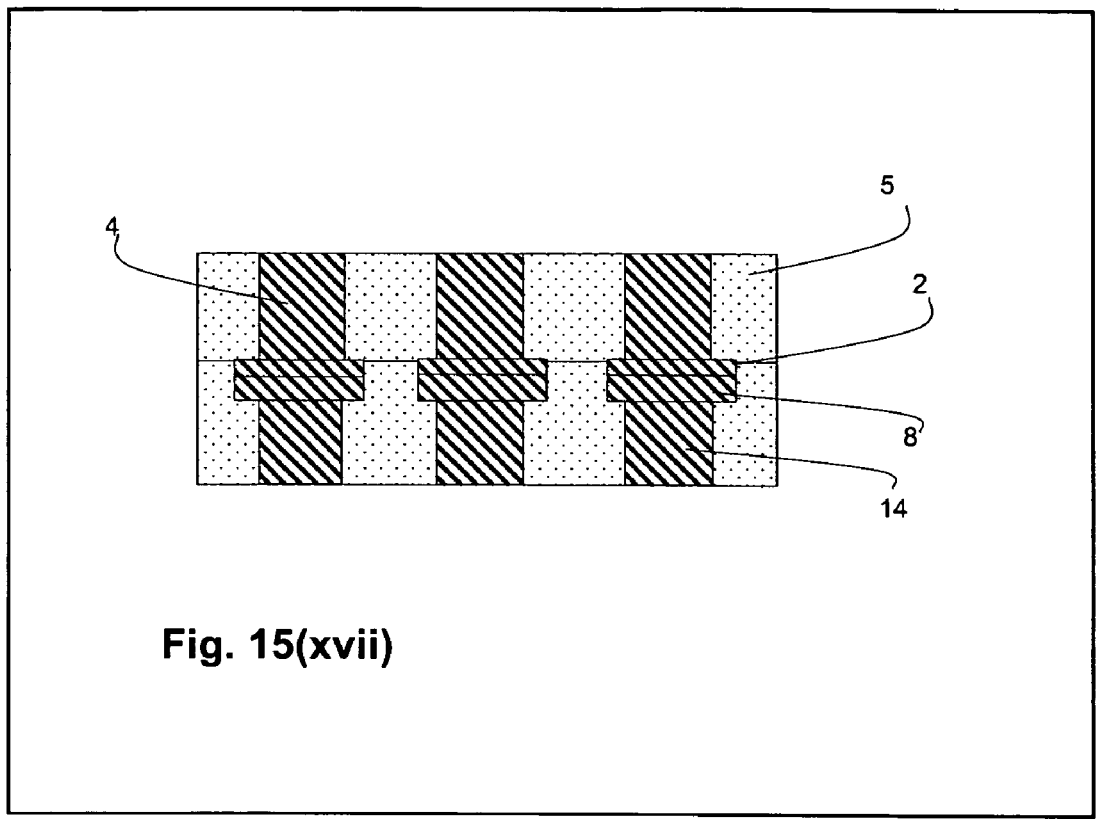
Fig. 15(xvii)

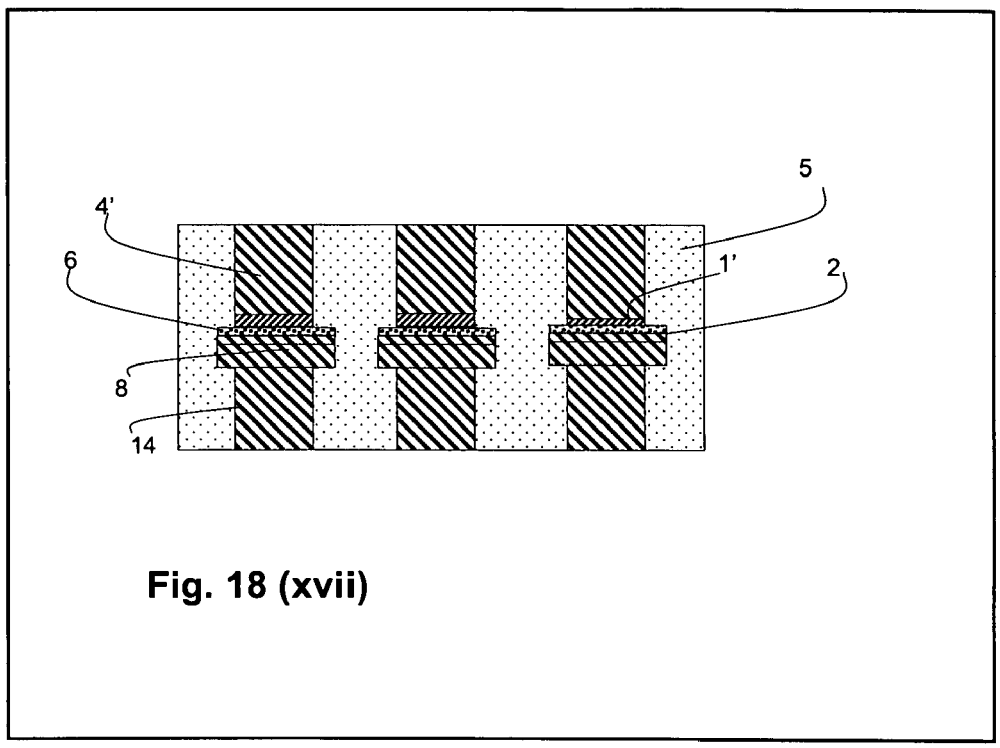
Fig. 18 (xvii)
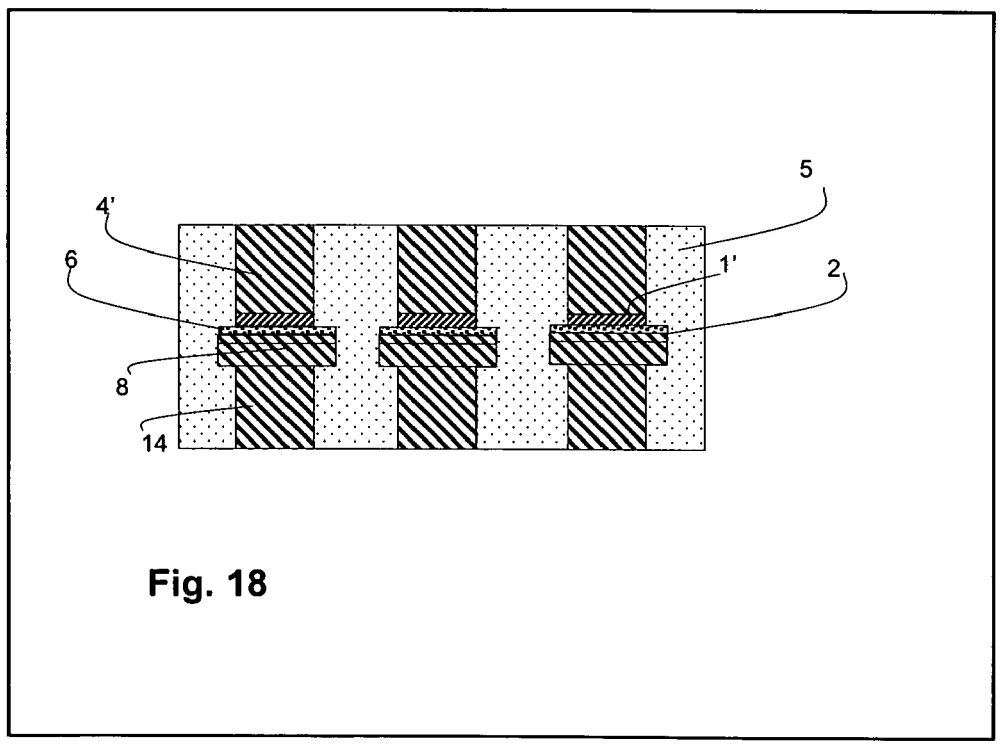
Fig. 18

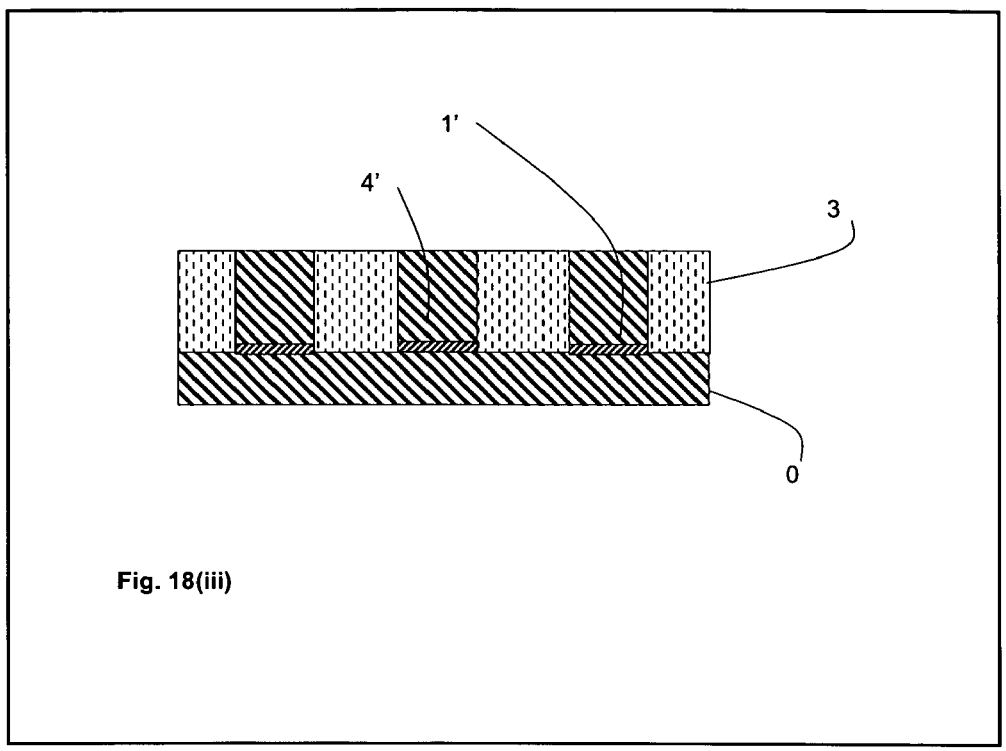
Fig. 18(iii)

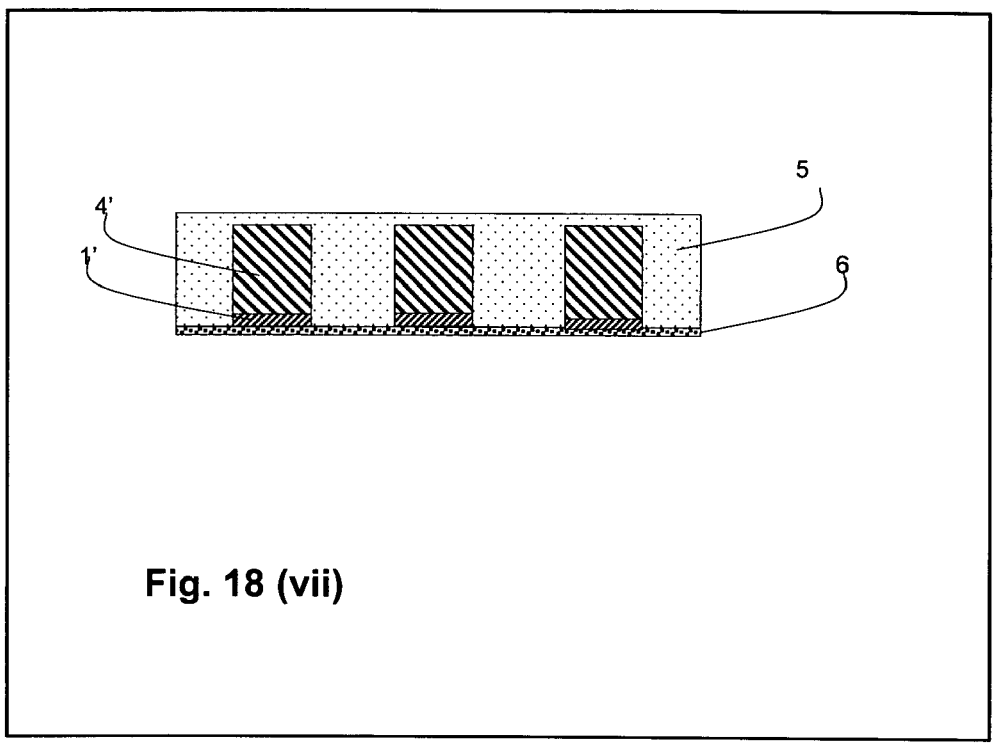
Fig. 18 (vii)
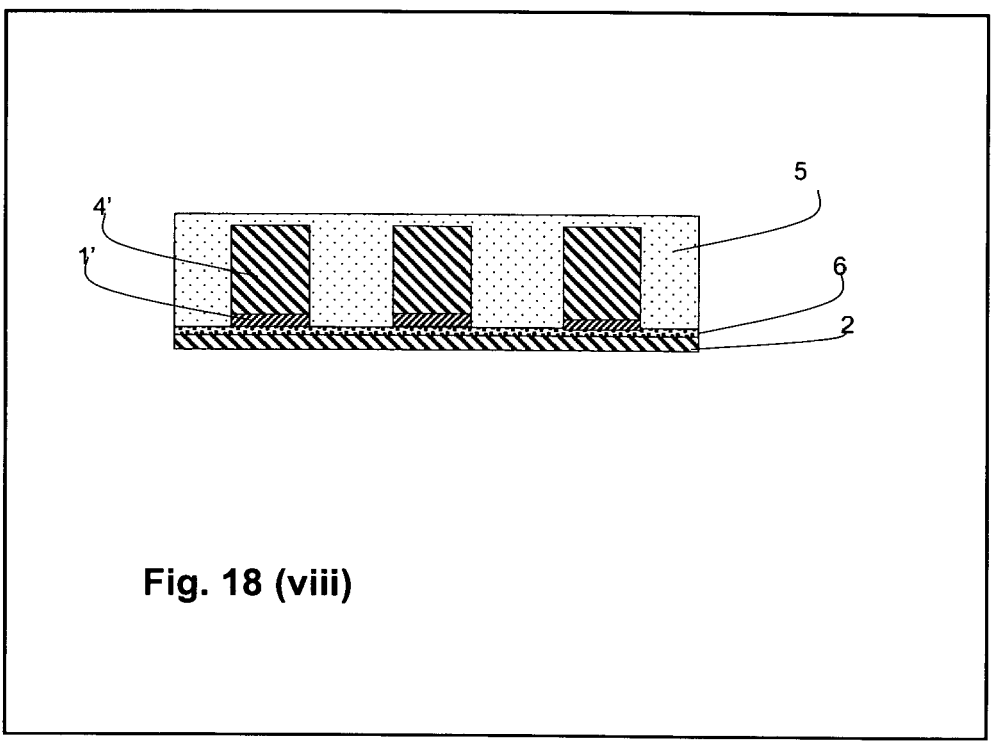
Fig. 18 (viii)

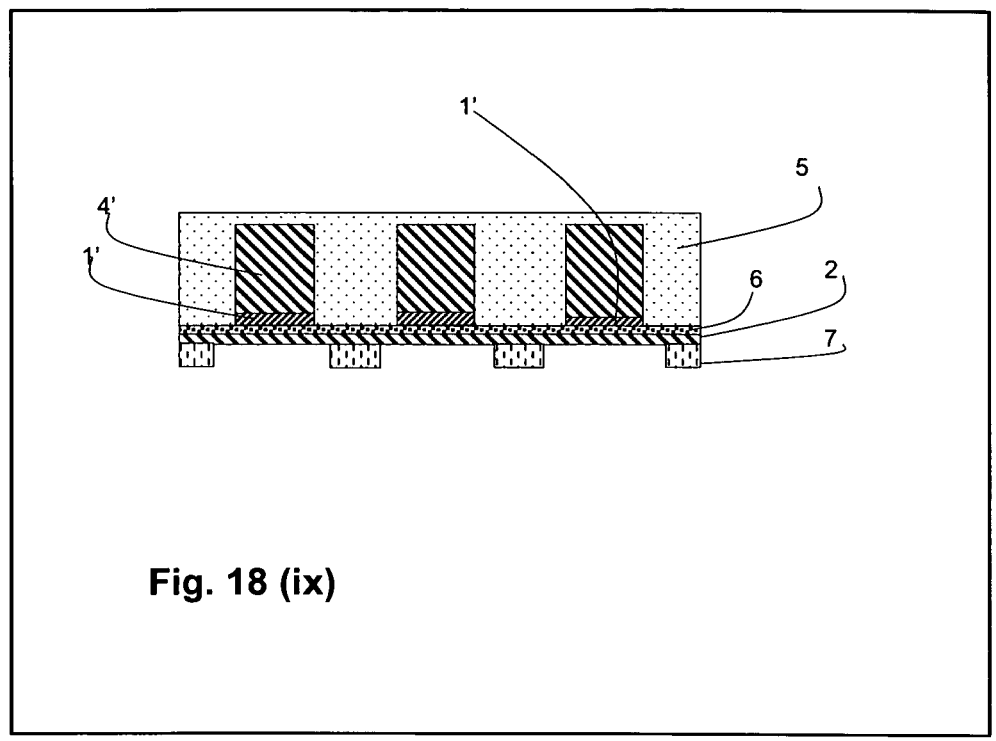
Fig. 18 (ix)
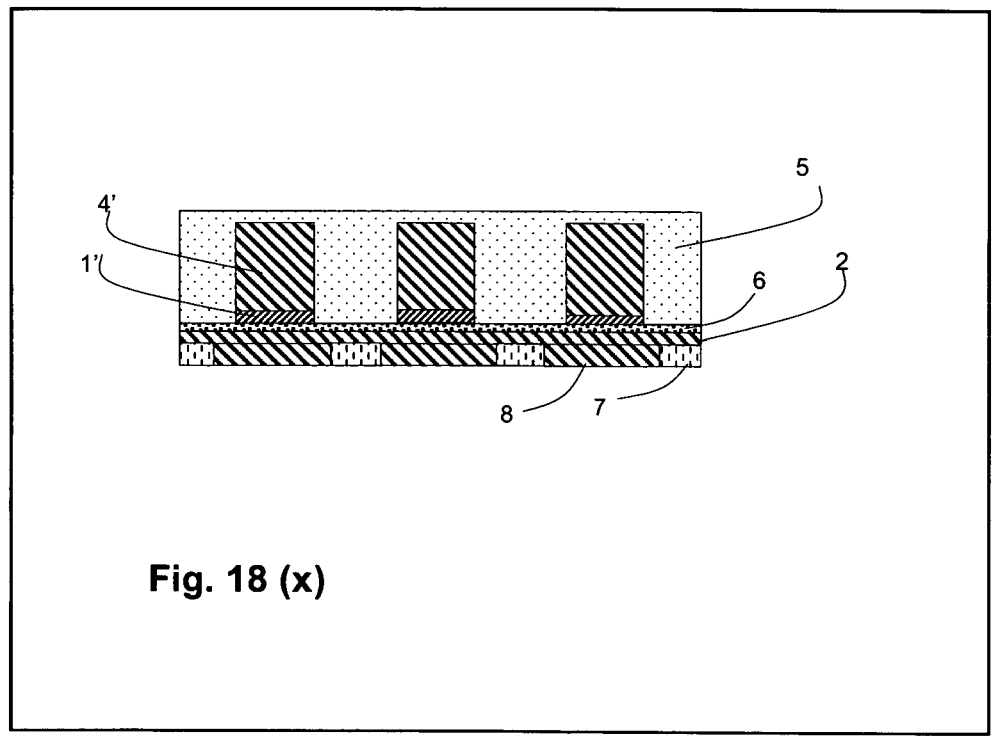
Fig. 18 (x)

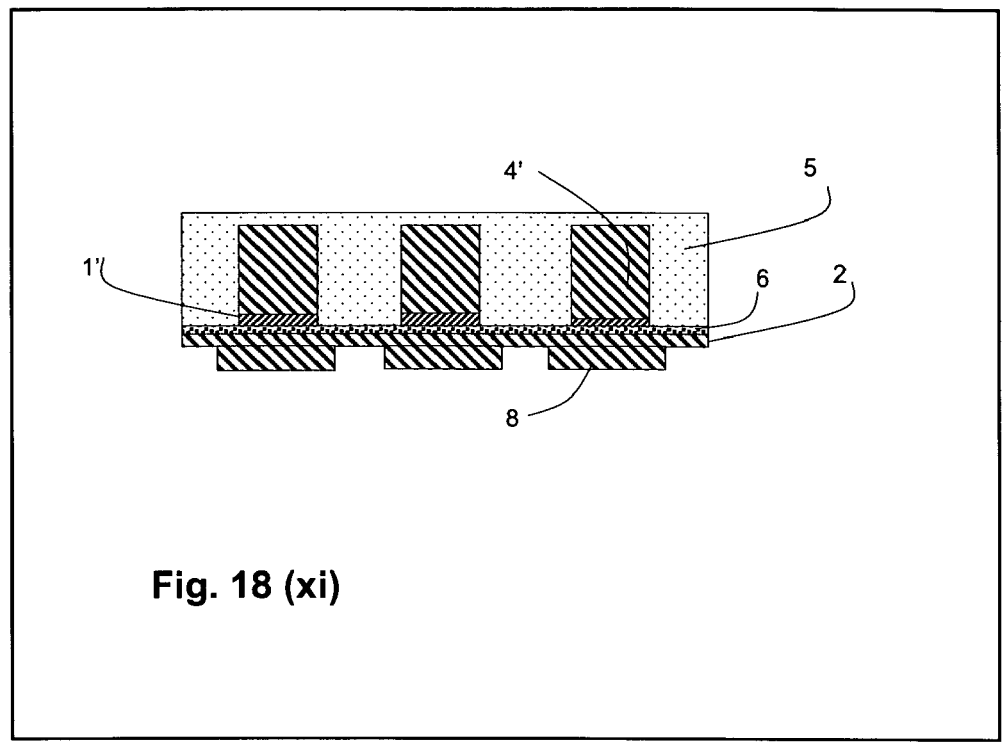
Fig. 18 (xi)
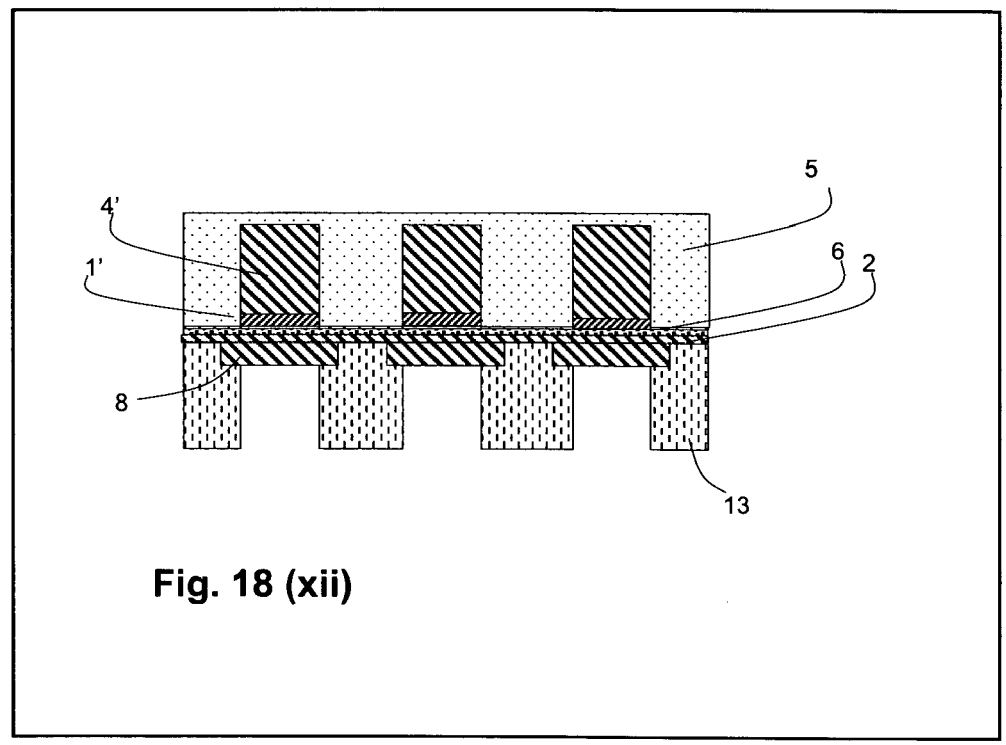
Fig. 18 (xii)

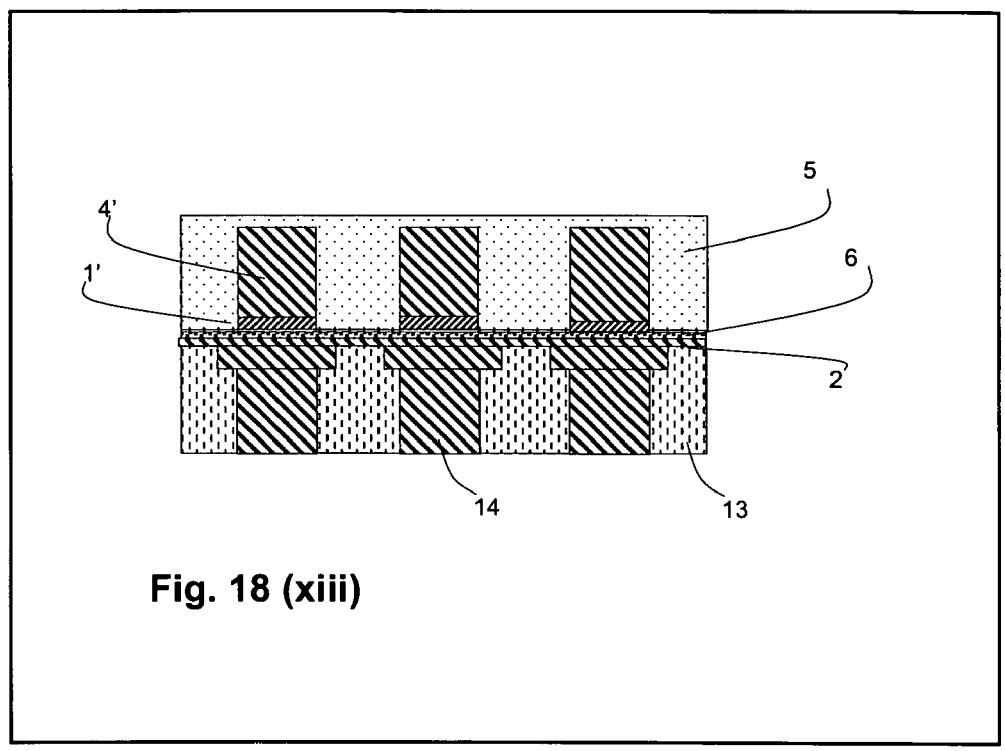
Fig. 18 (xiii)
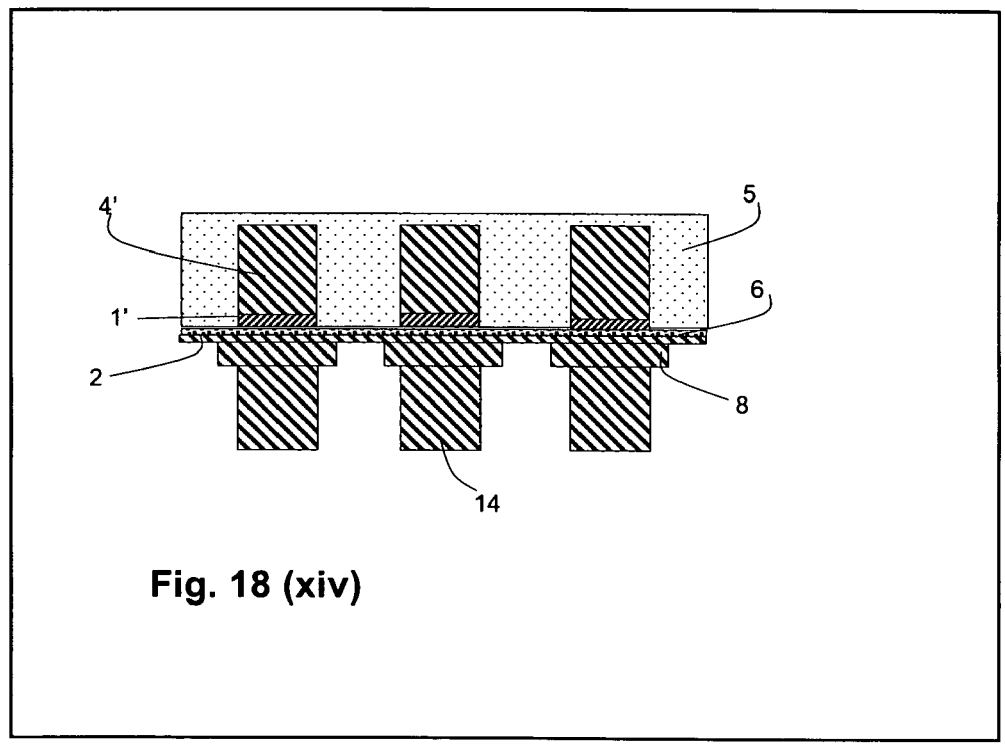
Fig. 18 (xiv)

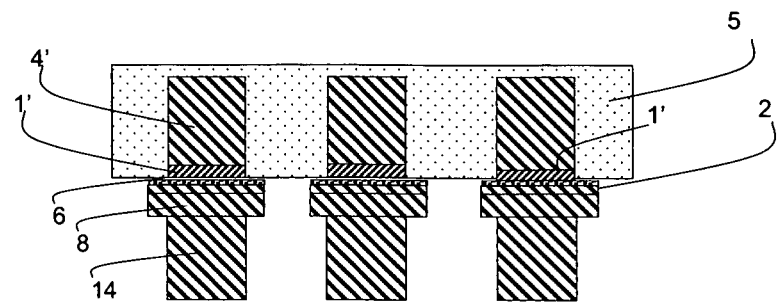
Fig. 18 (xv)
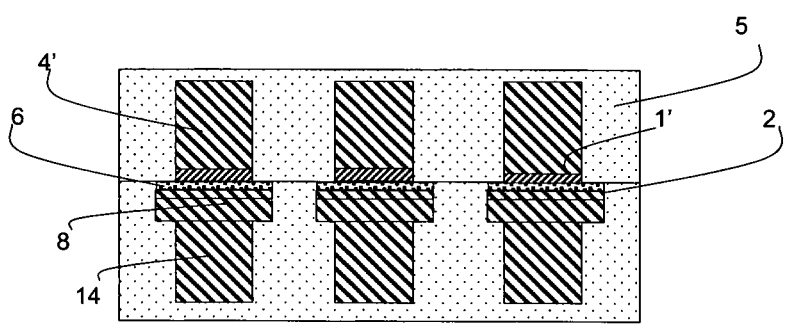
Fig. 18 (xvi)

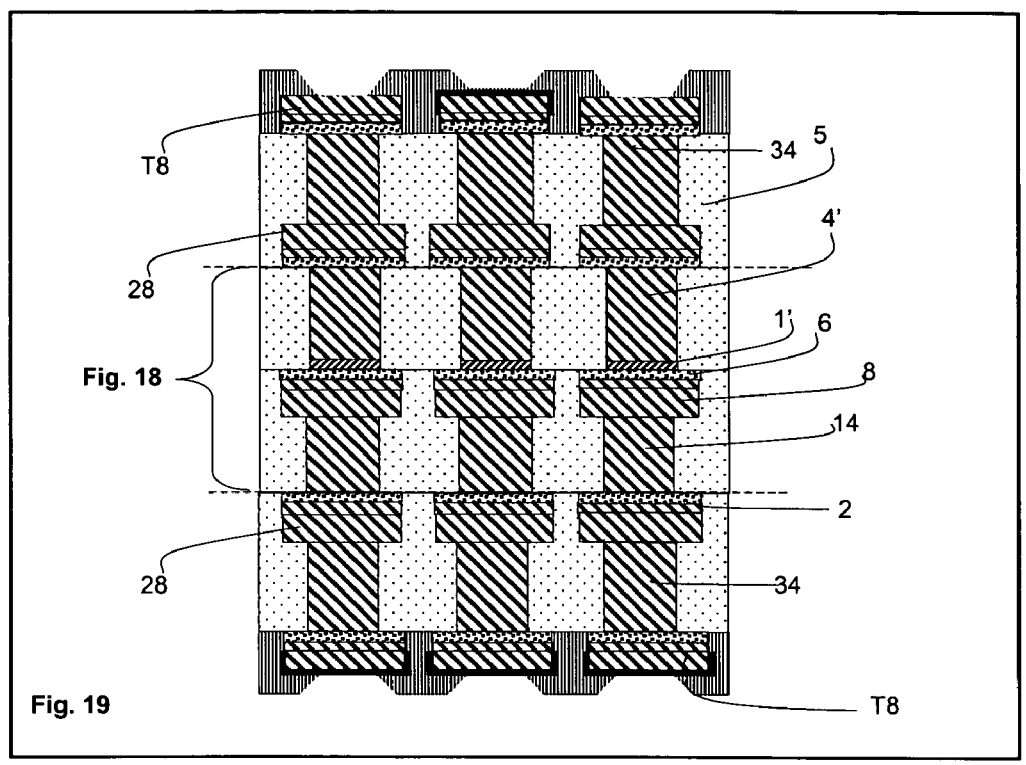
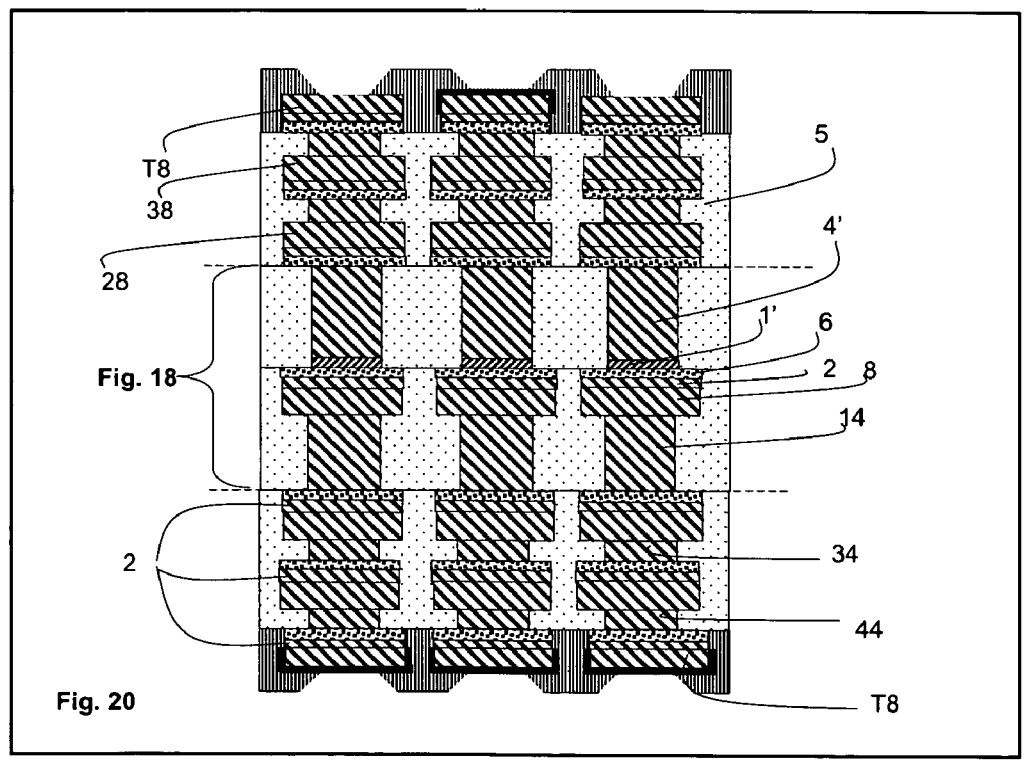

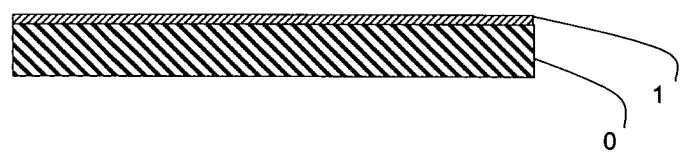
Fig. 21b (i)
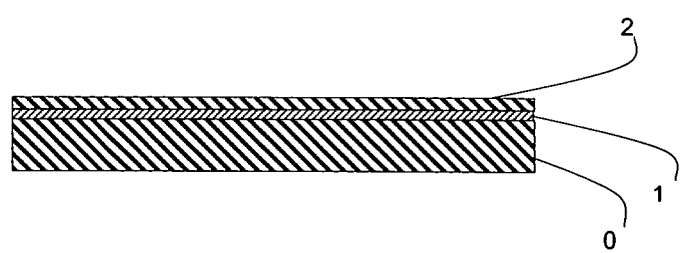
Fig. 21b (ii)

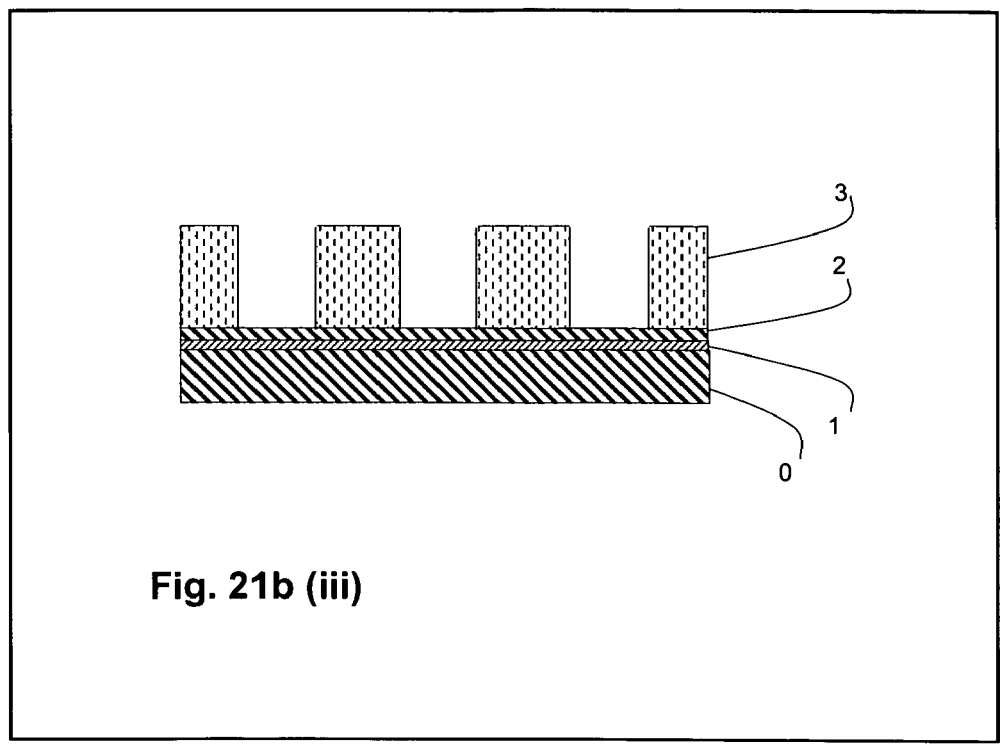
Fig. 21b (iii)
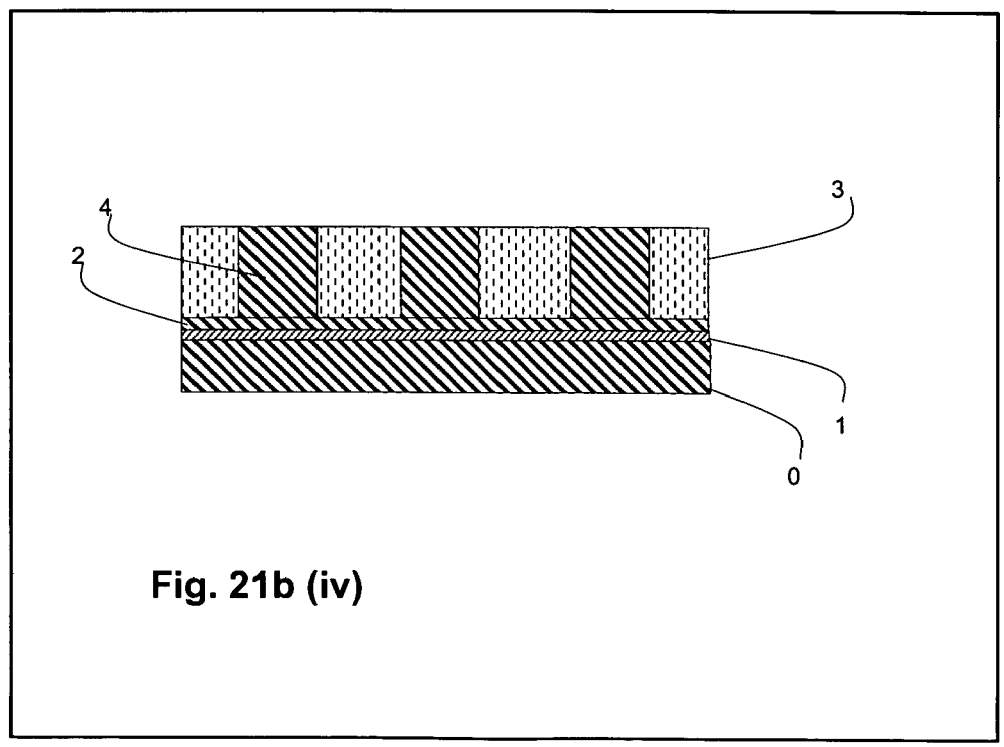
Fig. 21b (iv)

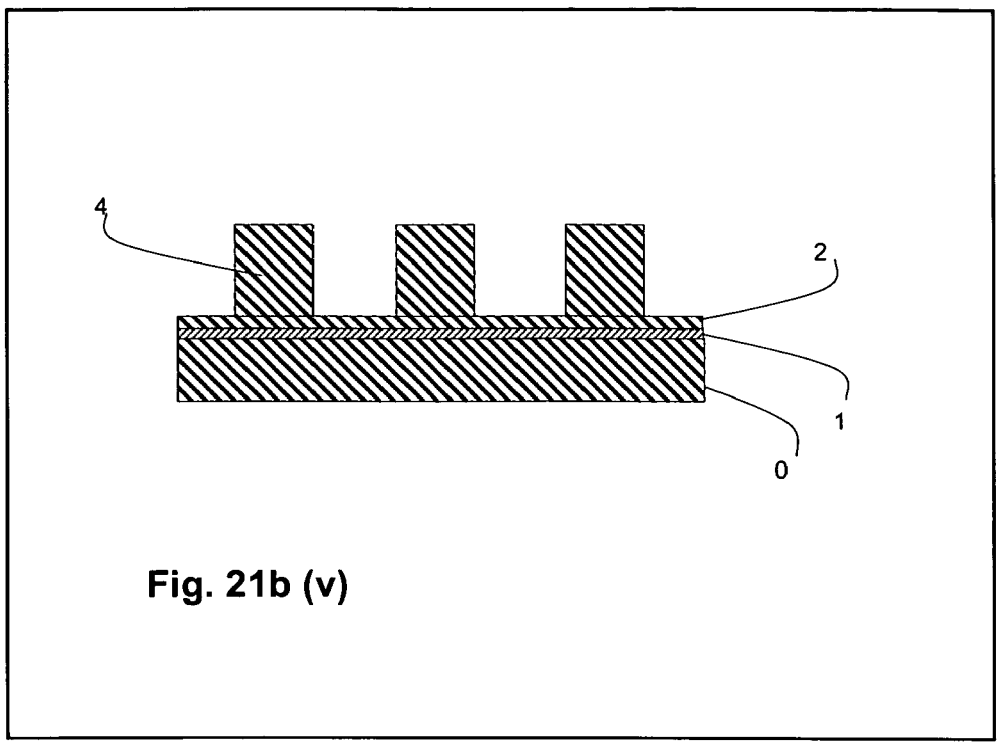
Fig. 21b (v)
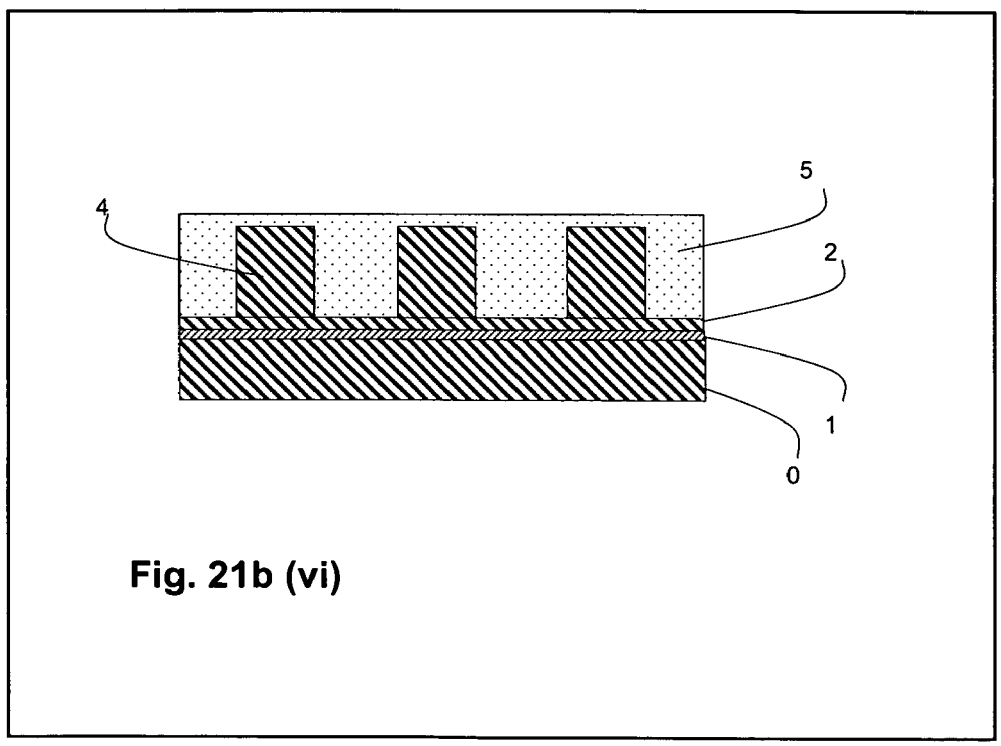
Fig. 21b (vi)

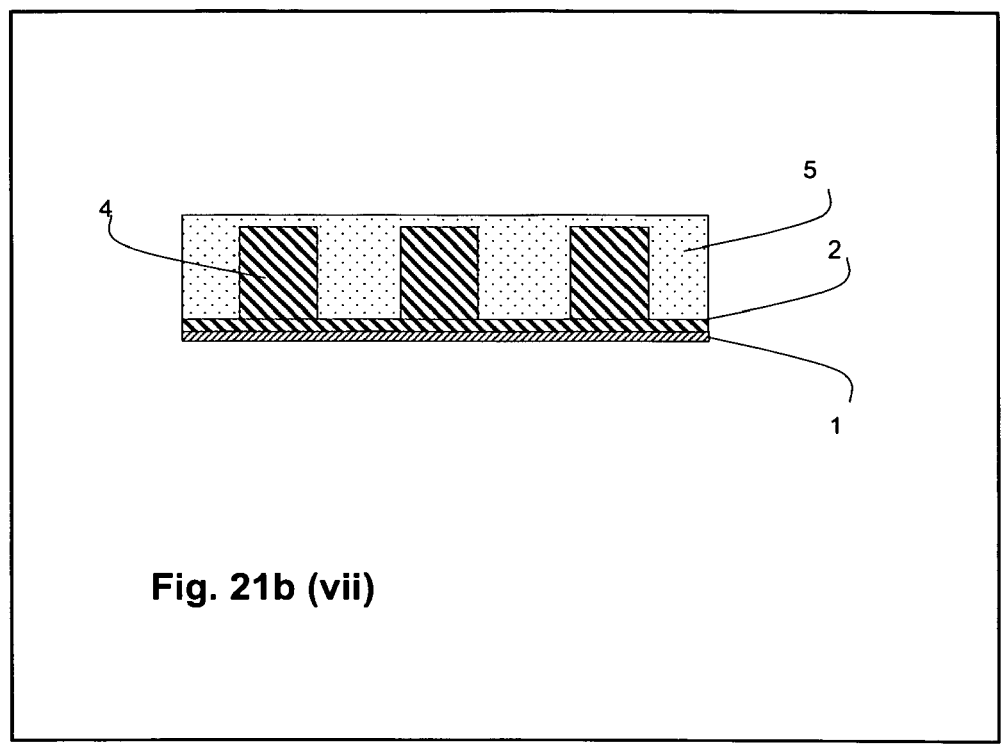
Fig. 21b (vii)
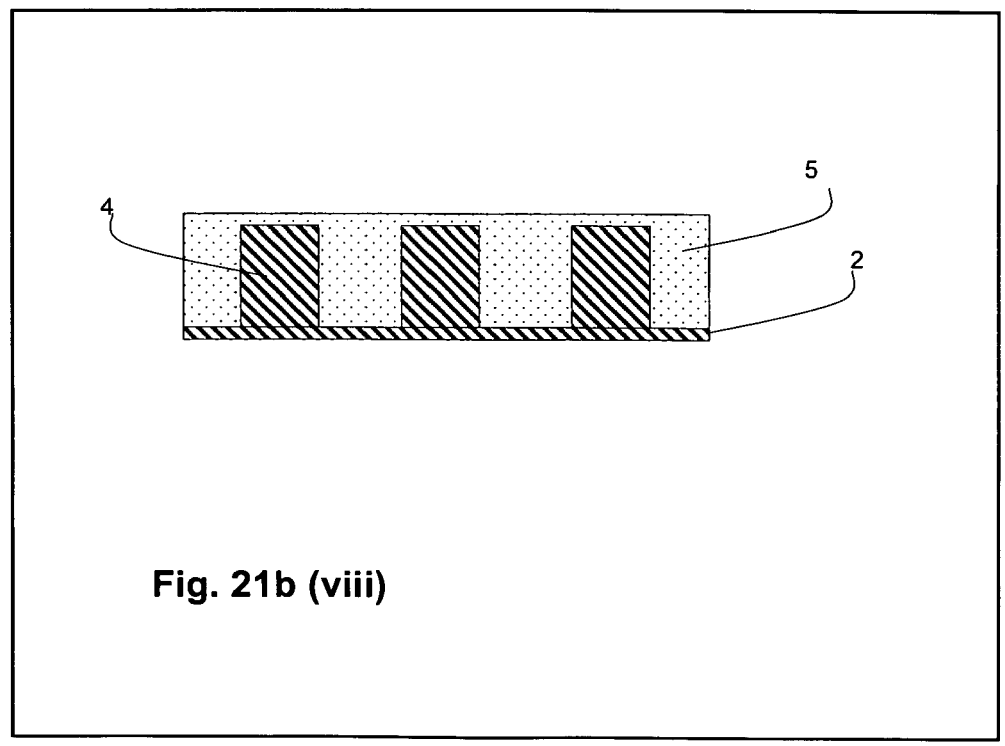
Fig. 21b (viii)

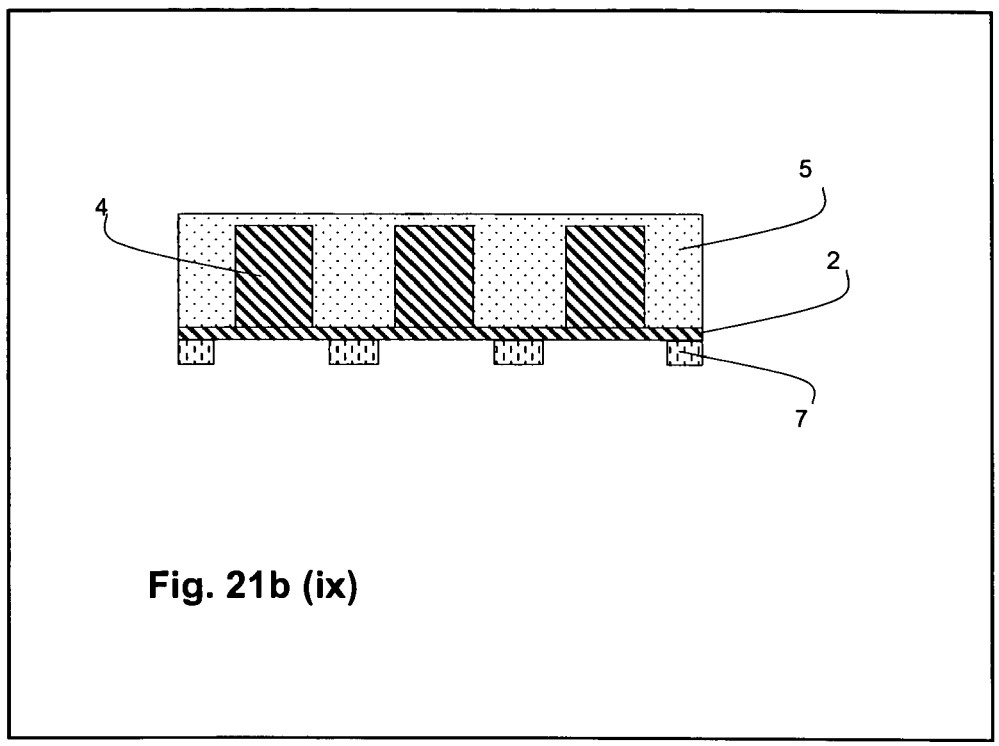
Fig. 21b (ix)
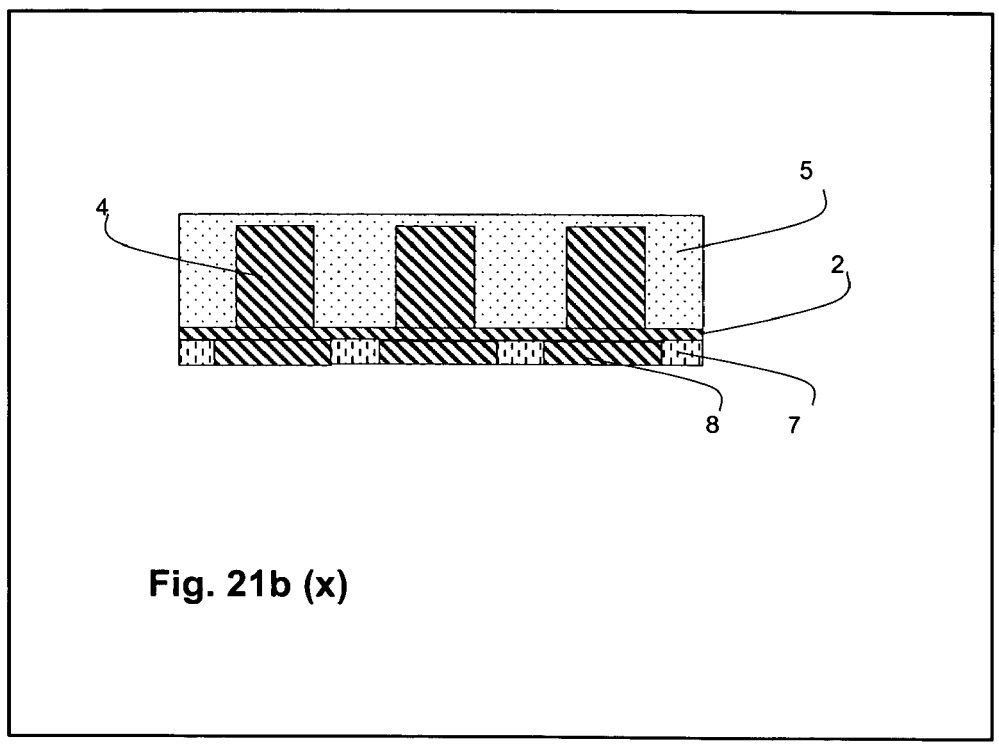
Fig. 21b (x)

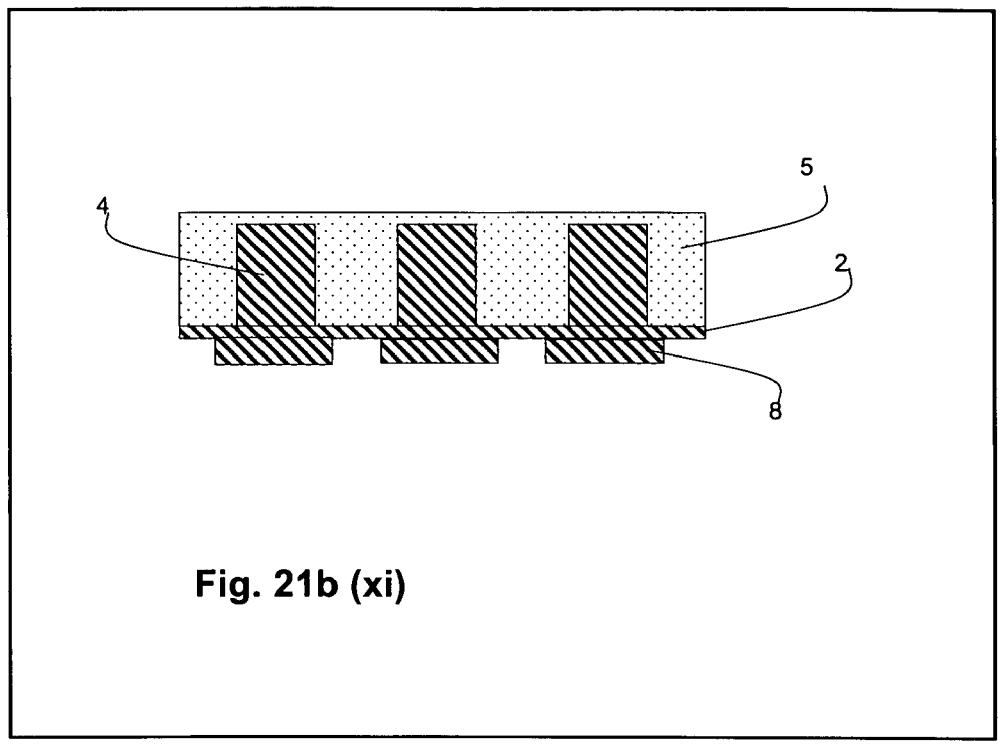
Fig. 21b (xi)
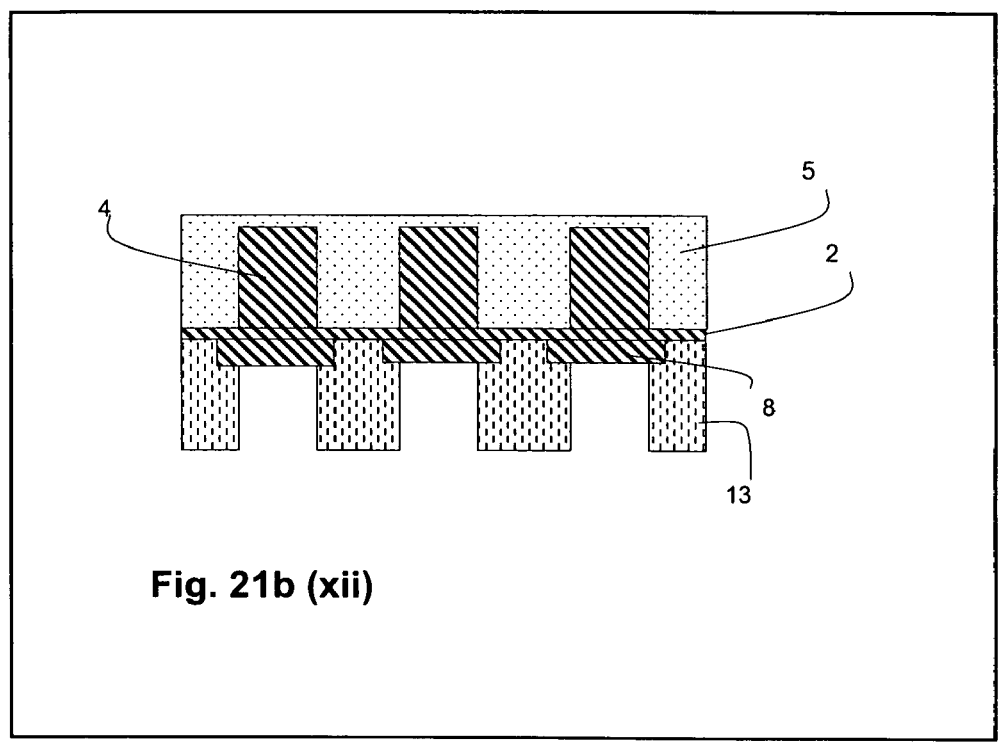
Fig. 21b (xii)

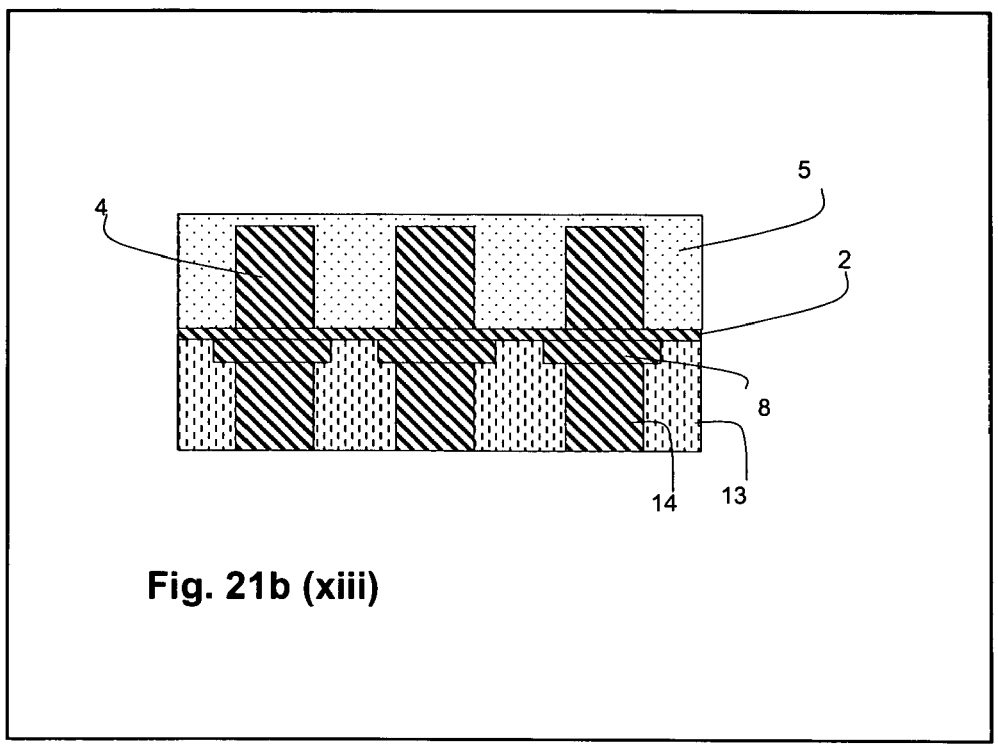
Fig. 21b (xiii)
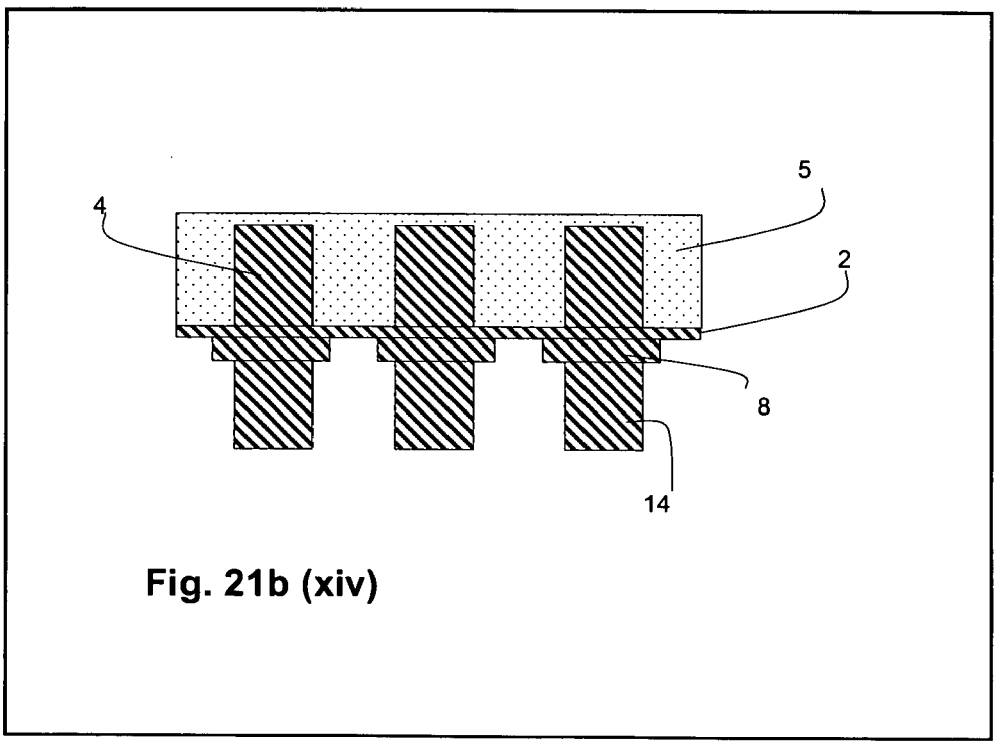
Fig. 21b (xiv)

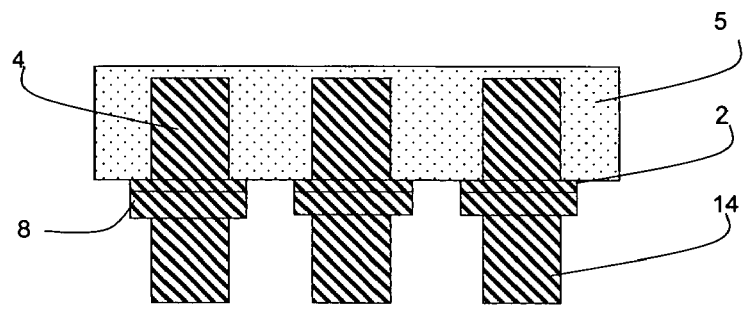
Fig. 21b (xv)
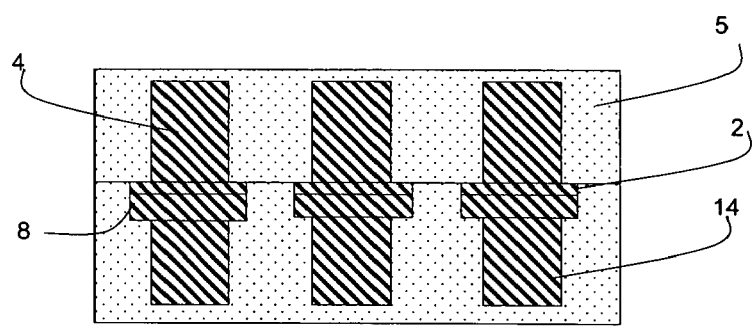
Fig. 21b (xvi)

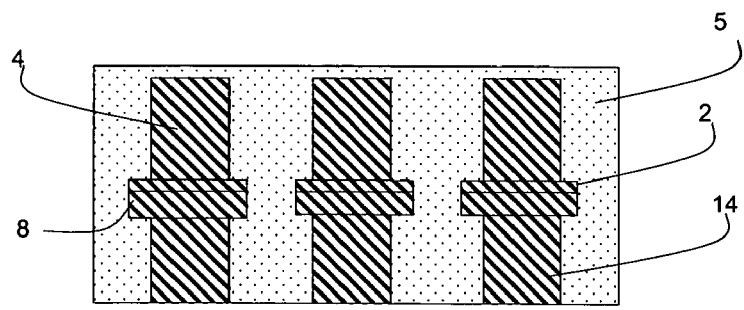
Fig. 21b (xvii)
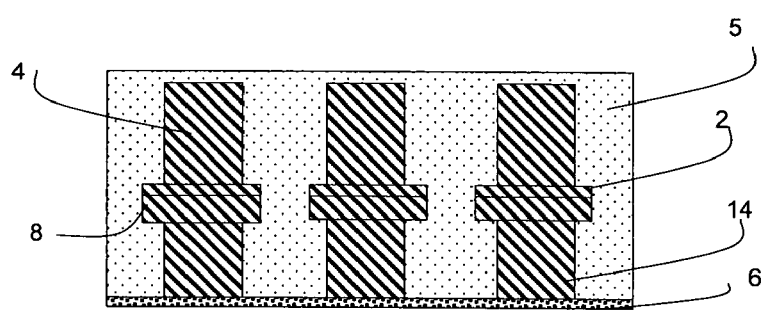
Fig. 21b (xviii)

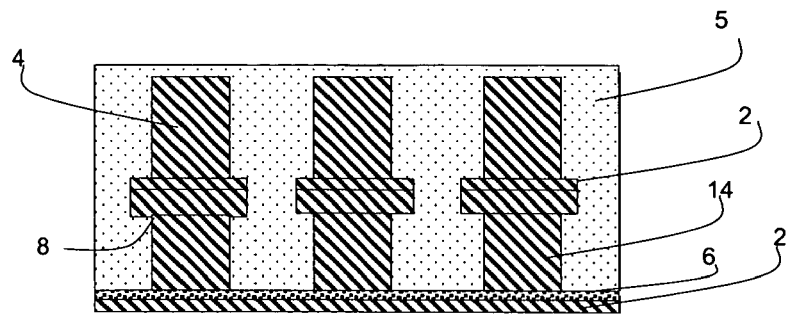
Fig. 21b (xix)
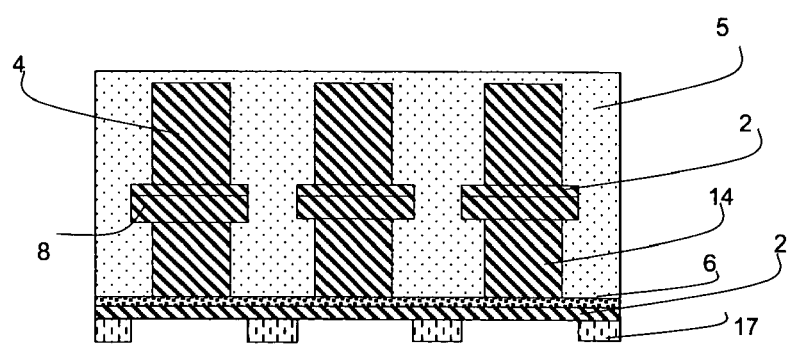
Fig. 21b (xx)

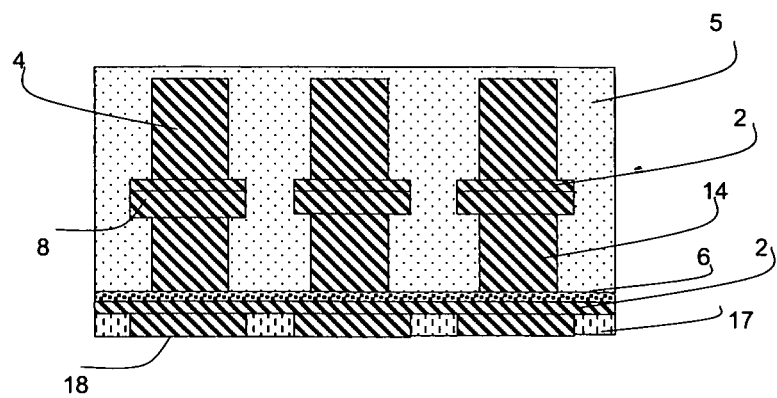
Fig. 21b (xxi)
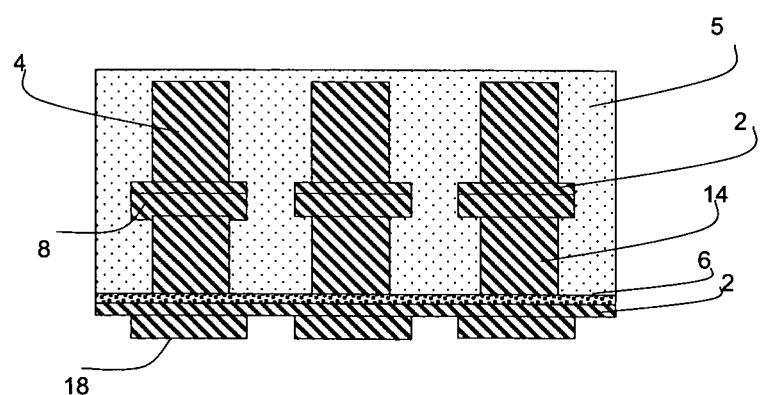
Fig. 21b (xxii)

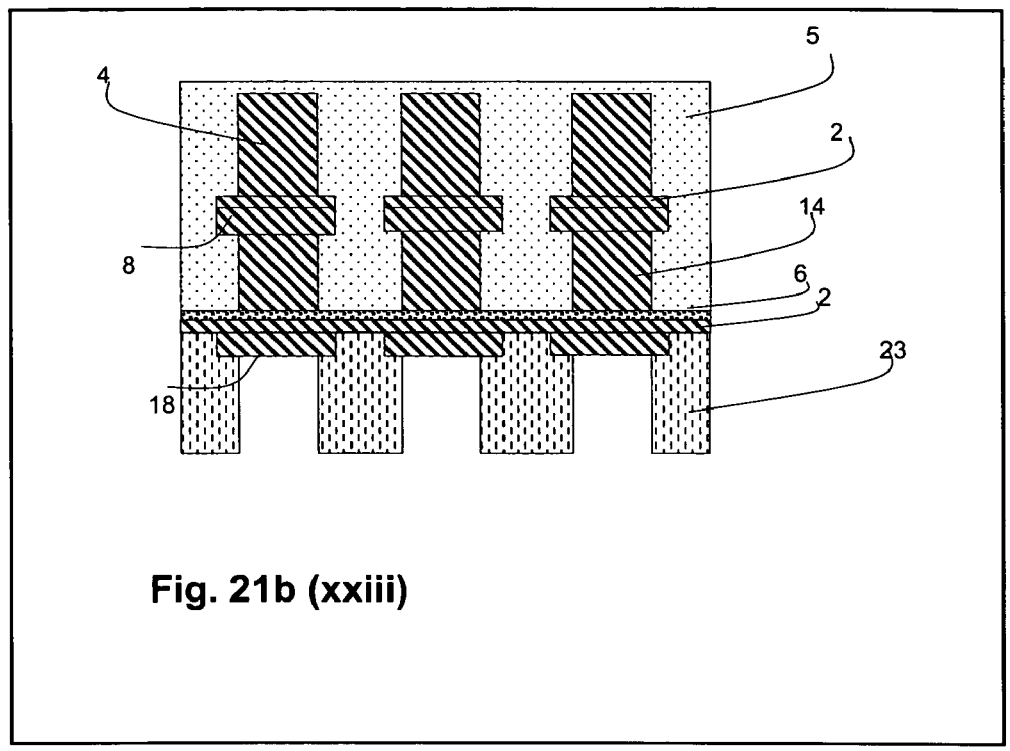
Fig. 21b (xxiii)
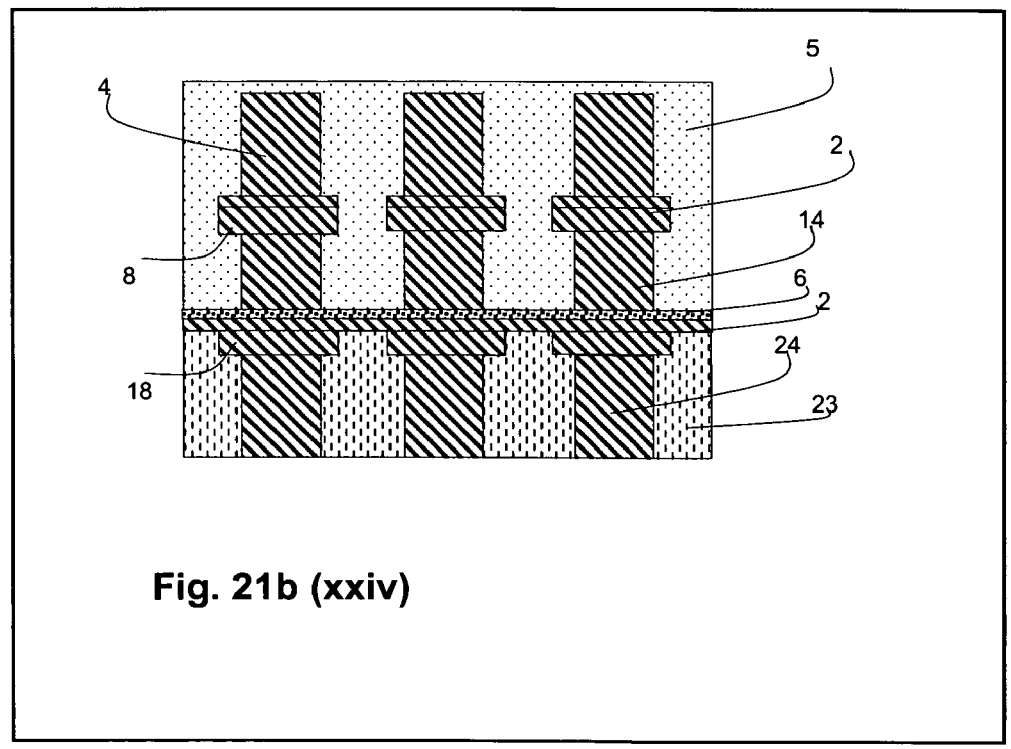
Fig. 21b (xxiv)

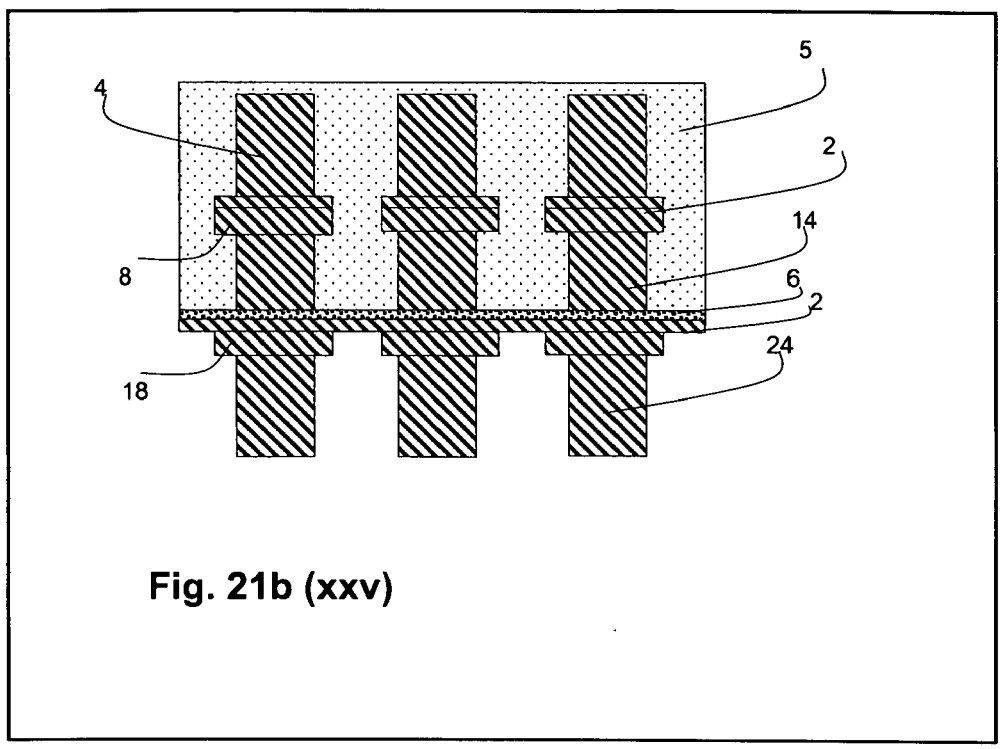
Fig. 21b (xxv)
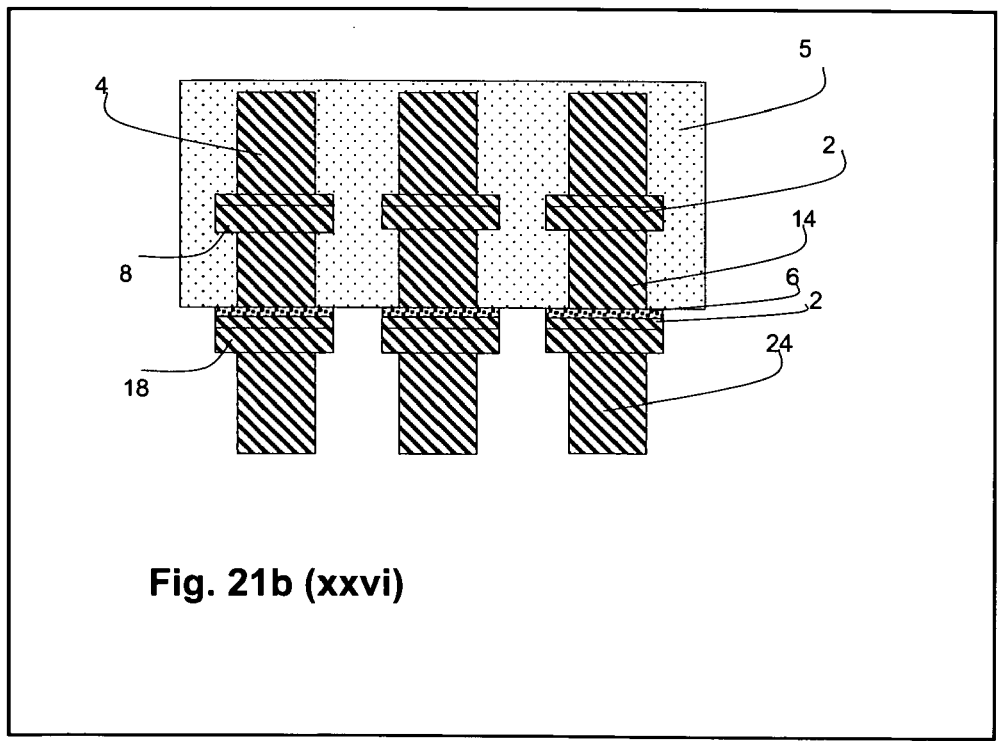
Fig. 21b (xxvi)

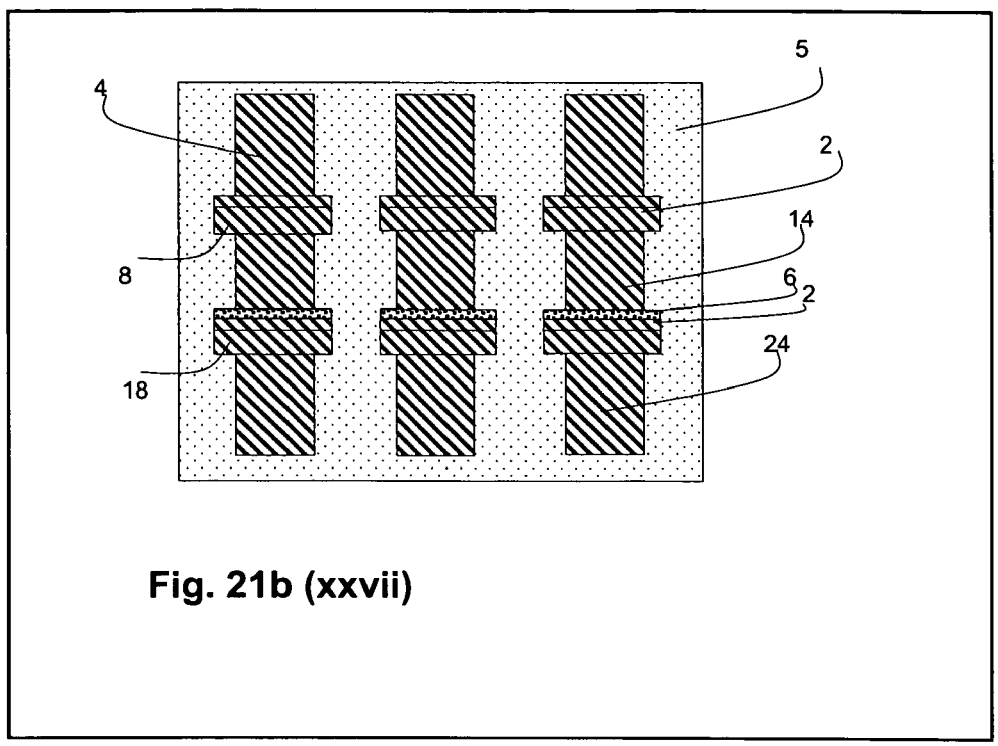
Fig. 21b (xxvii)
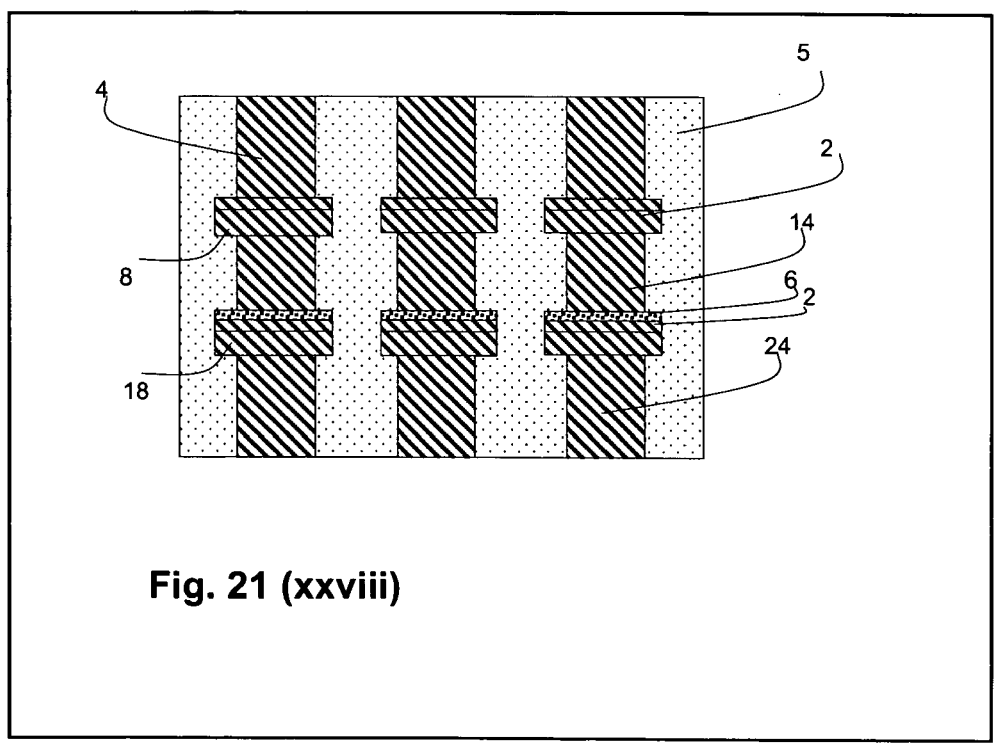
Fig. 21 (xxviii)

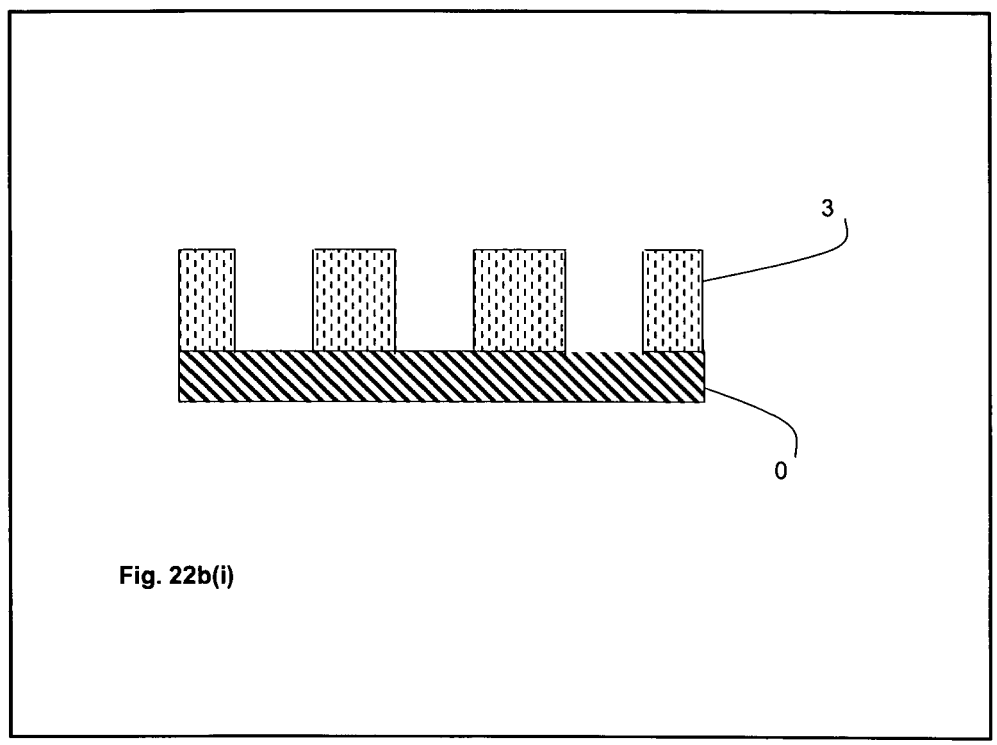
Fig. 22b(i)
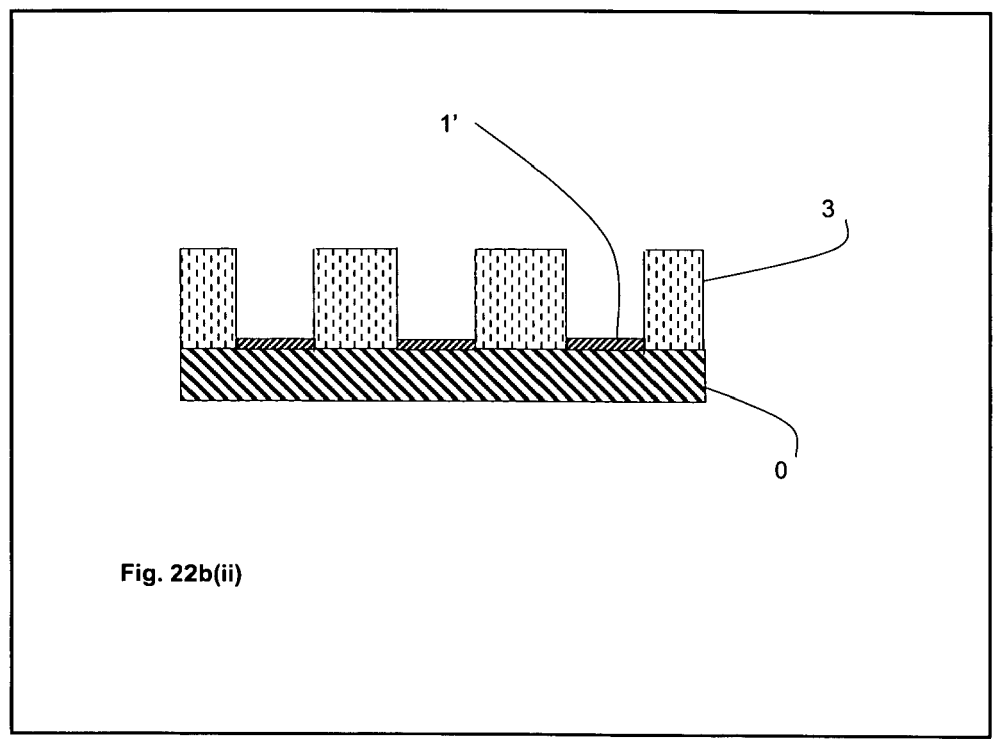
Fig. 22b(ii)

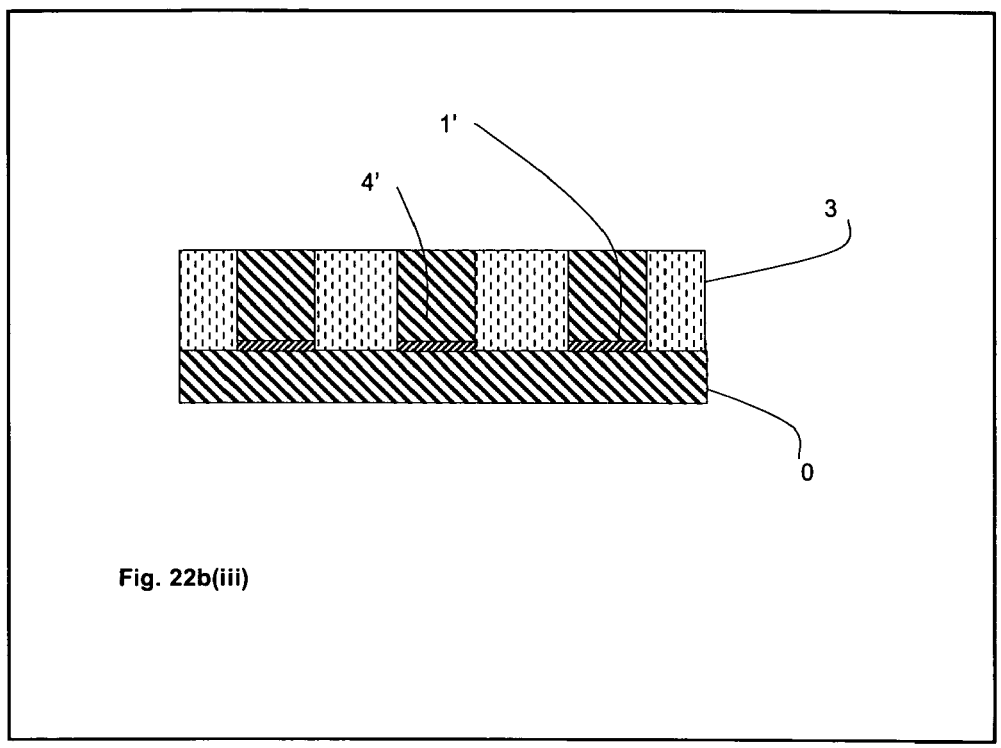
Fig. 22b(iii)
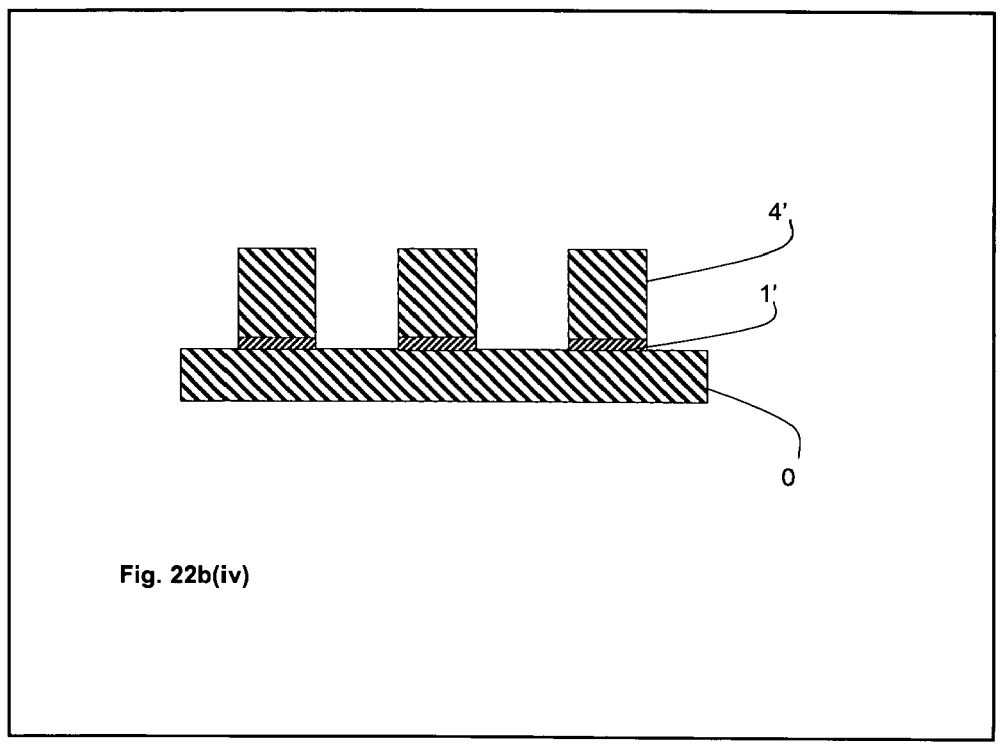
Fig. 22b(iv)

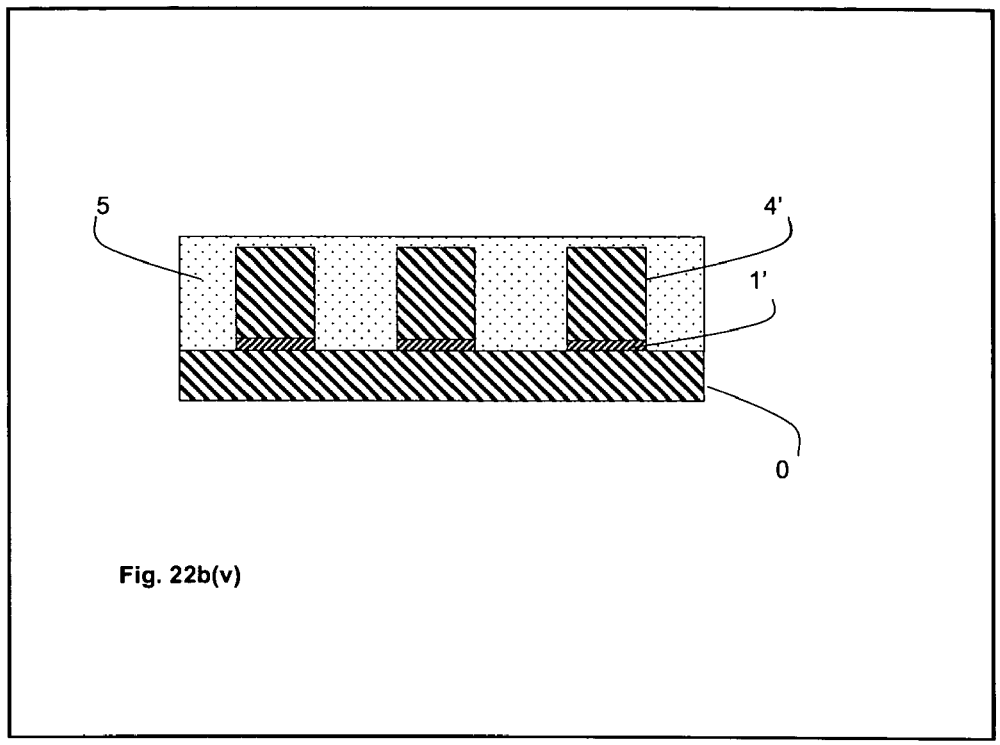
Fig. 22b(v)
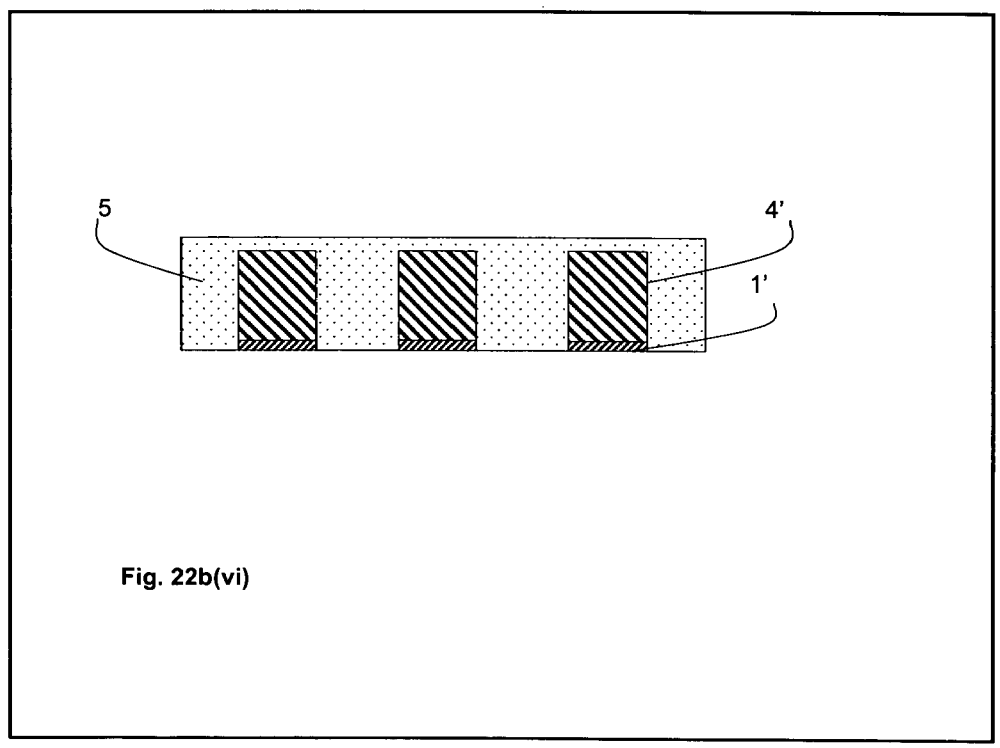
Fig. 22b(vi)

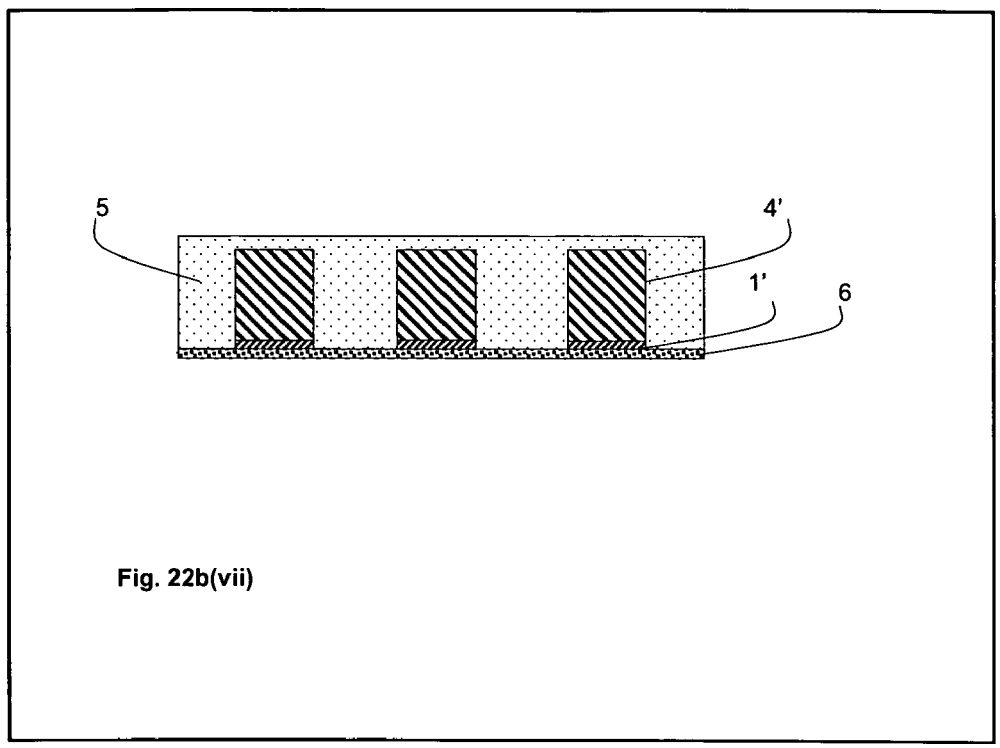
Fig. 22b(vii)
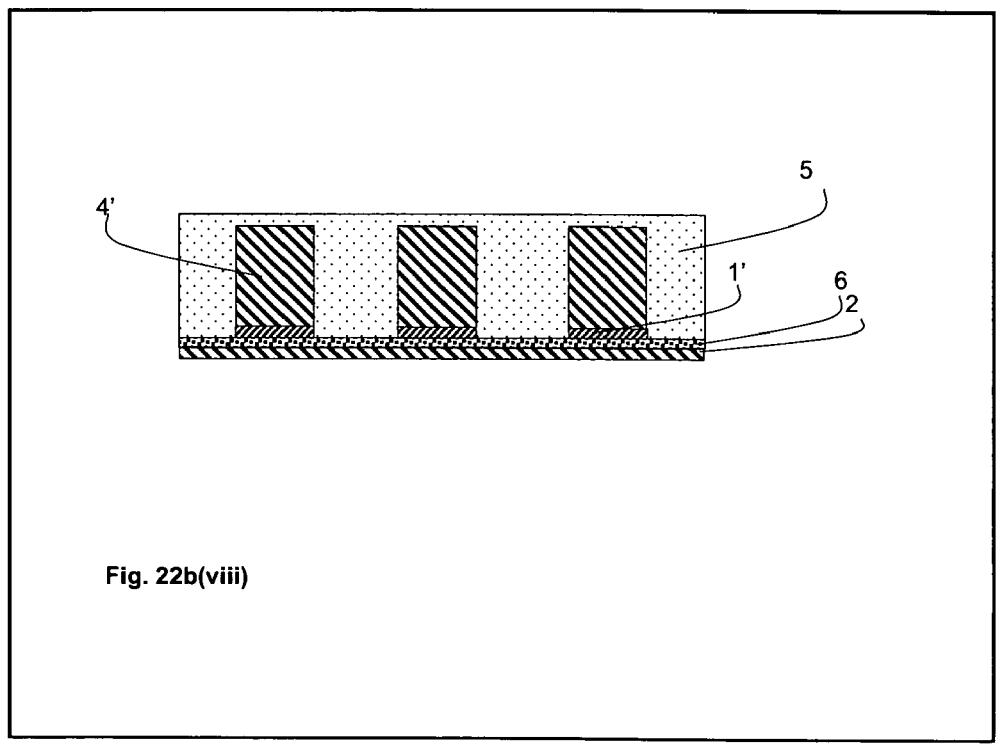
Fig. 22b(viii)

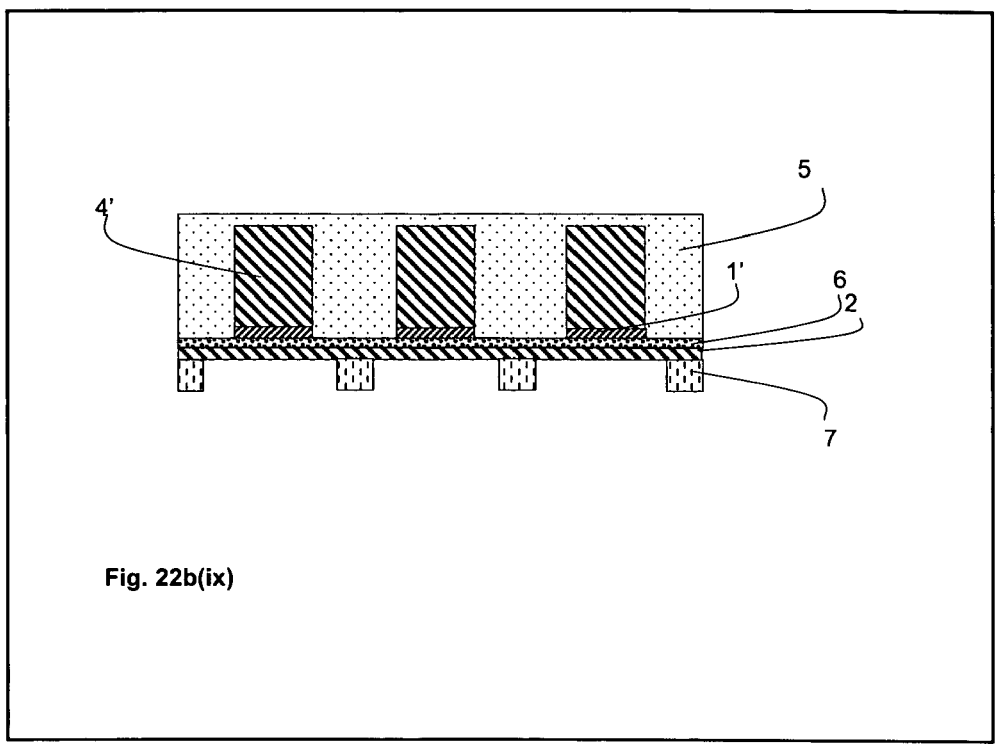
Fig. 22b(ix)
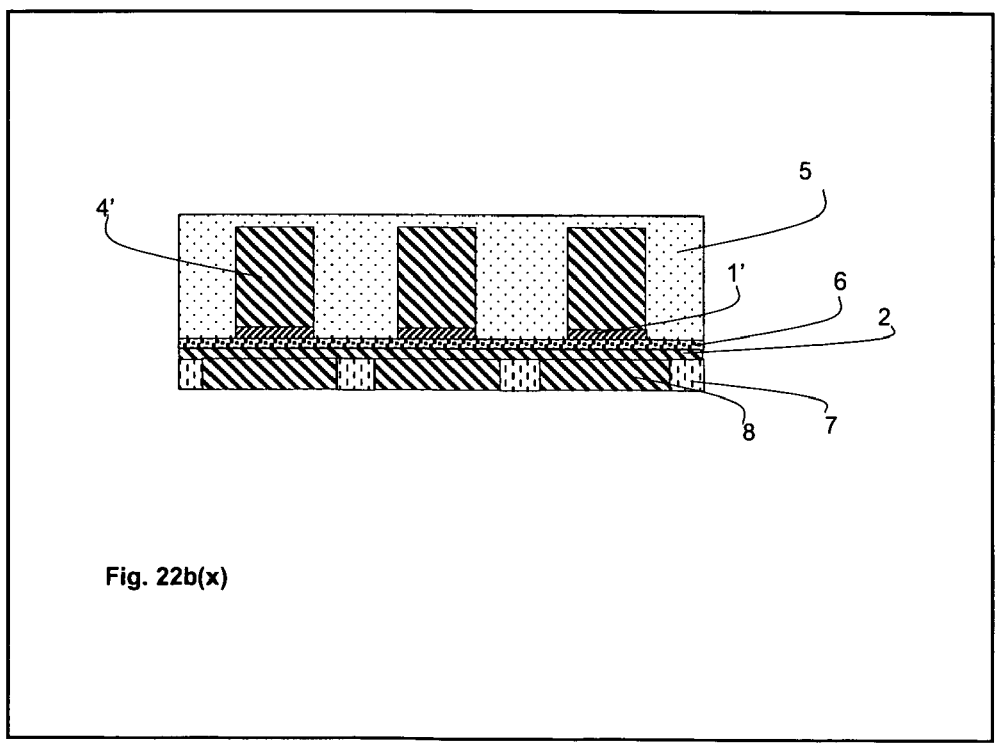
Fig. 22b(x)

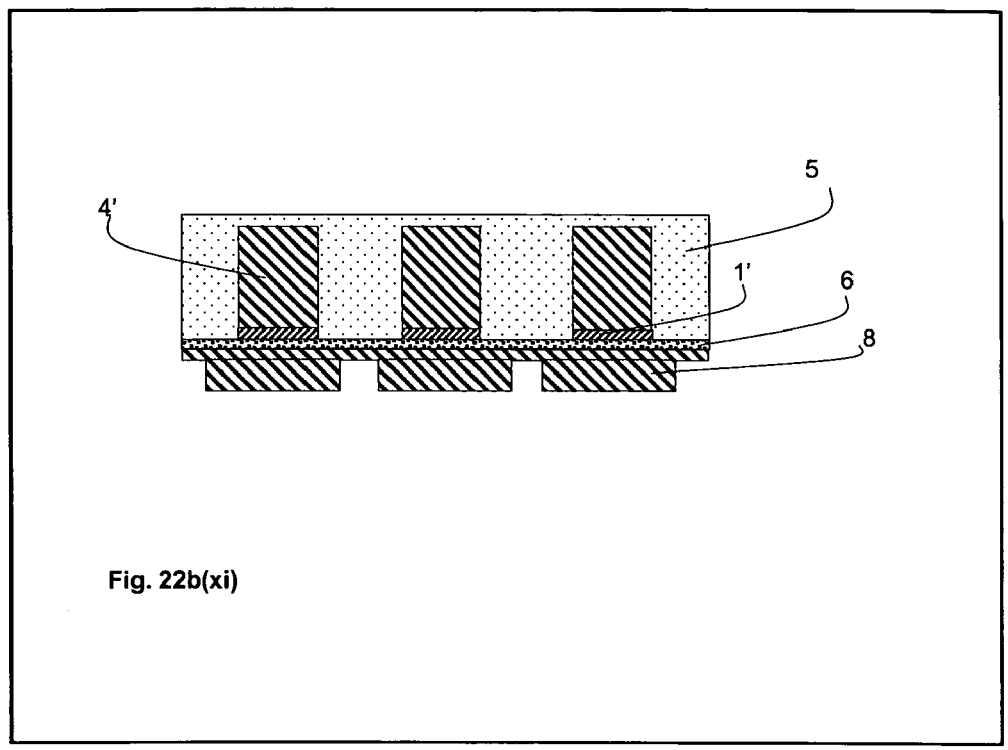
Fig. 22b(xi)
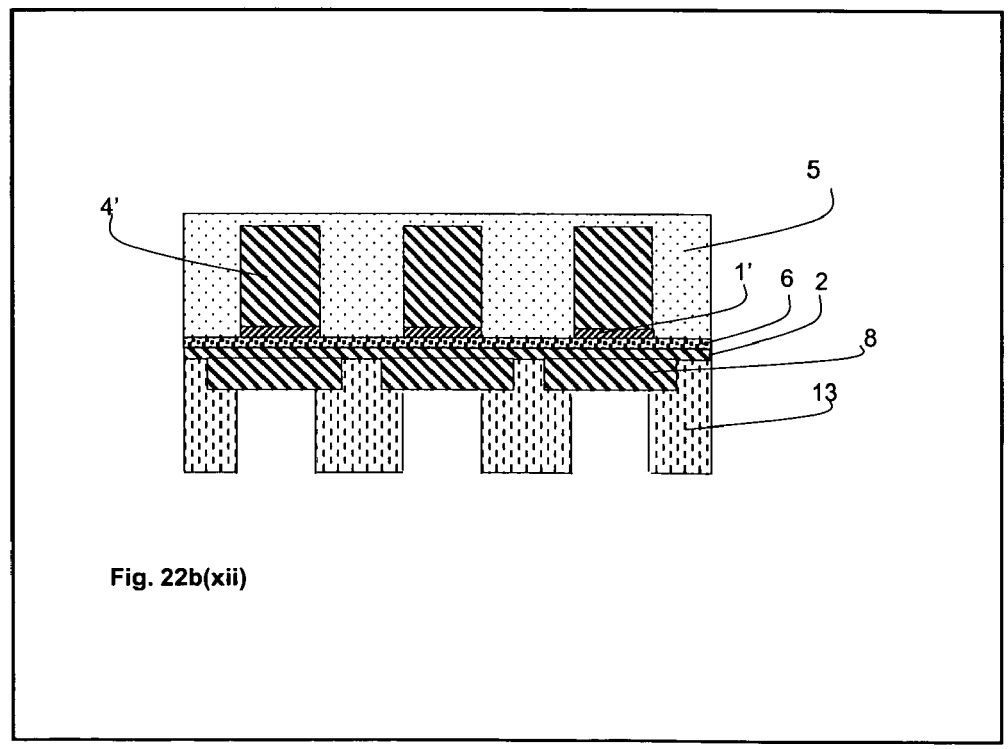
Fig. 22b(xii)

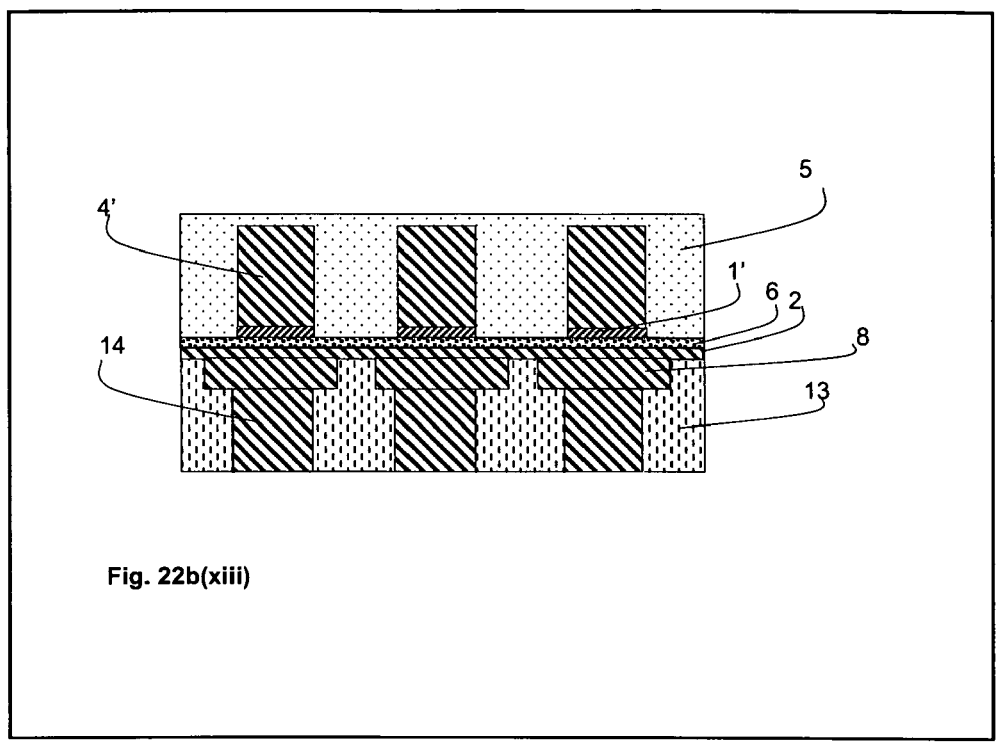
Fig. 22b(xiii)
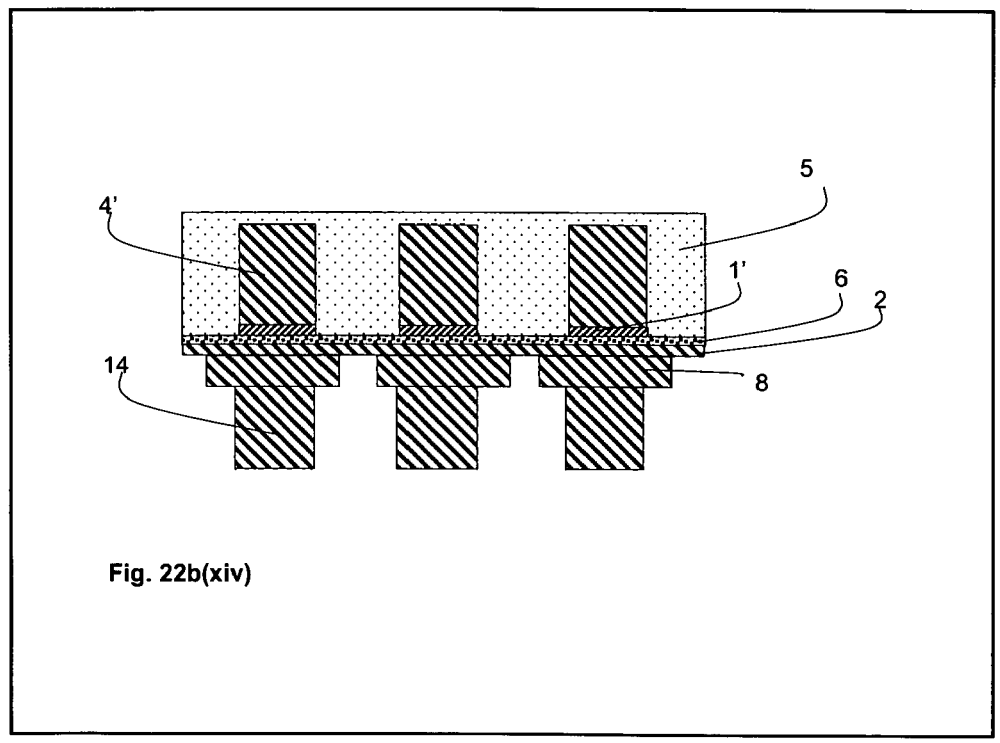
Fig. 22b(xiv)

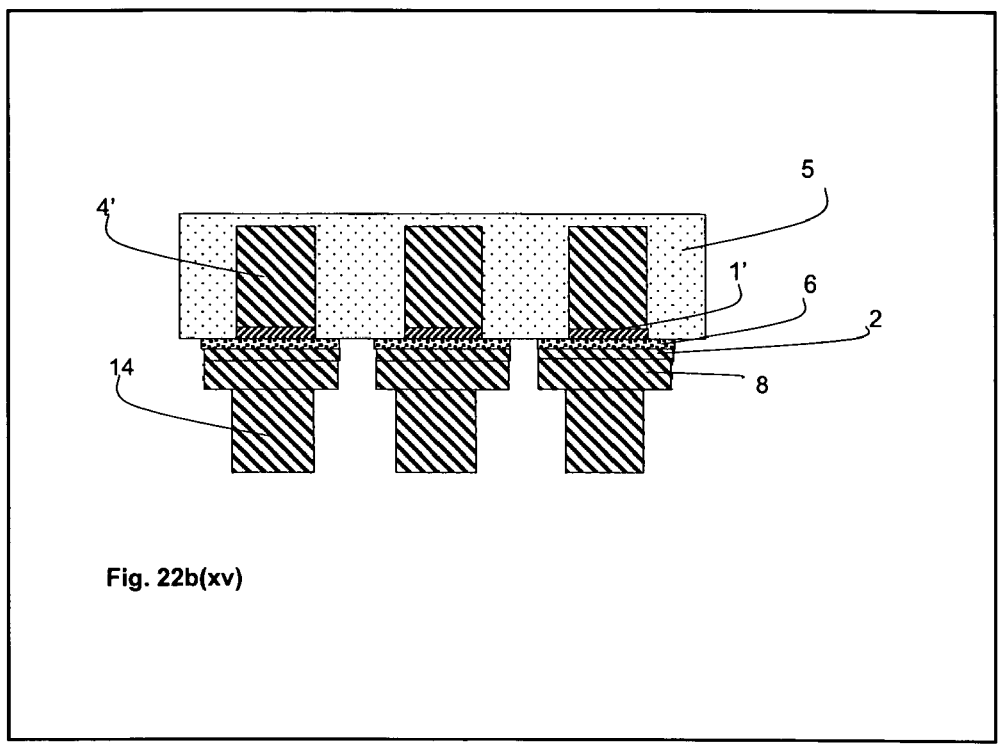
Fig. 22b(xv)
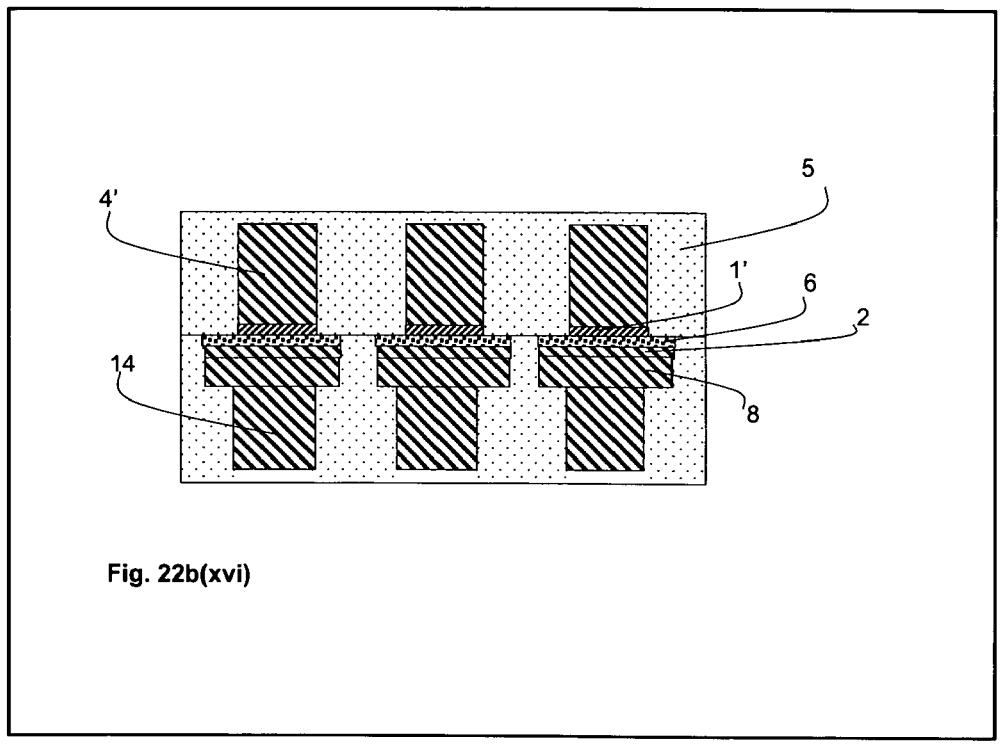
Fig. 22b(xvi)

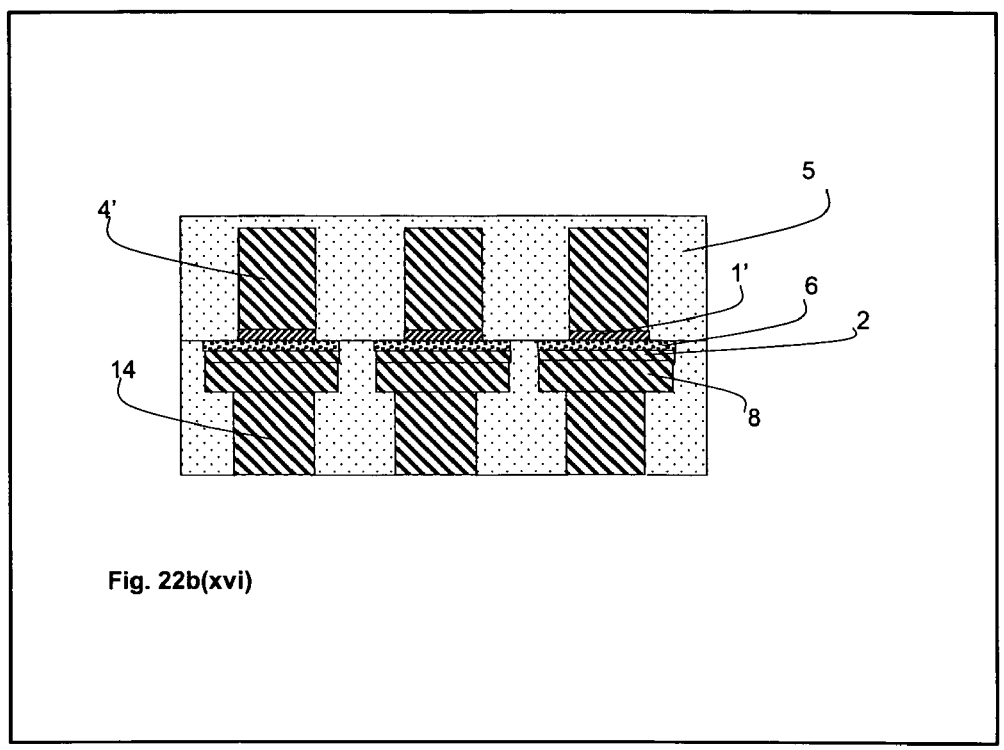
Fig. 22b(xvi)
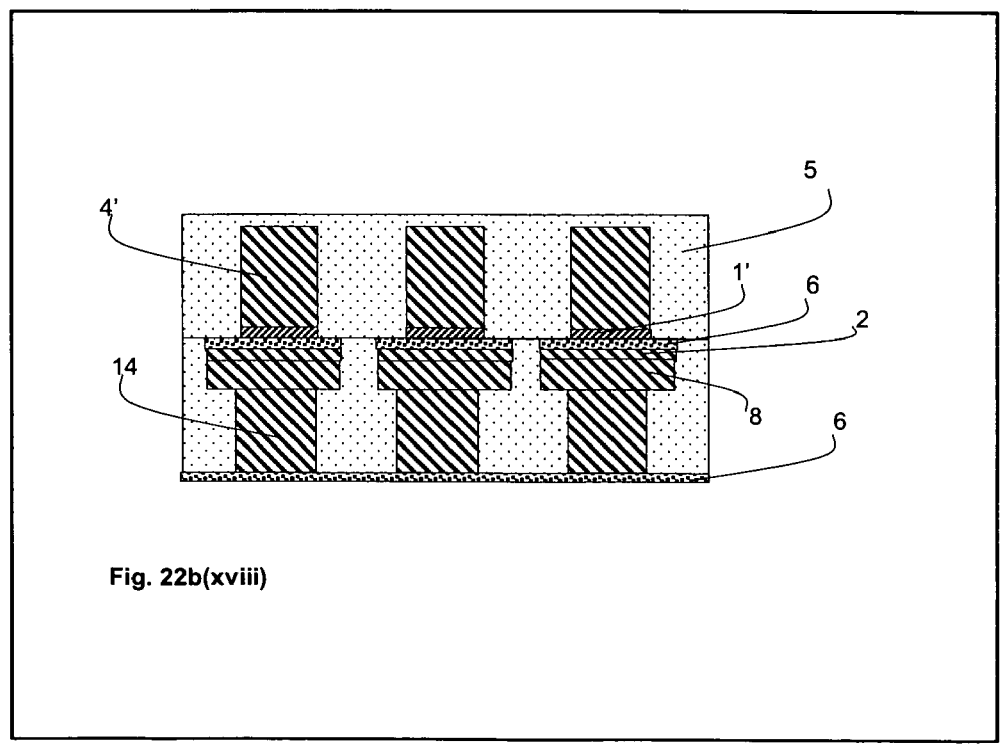
Fig. 22b(xviii)

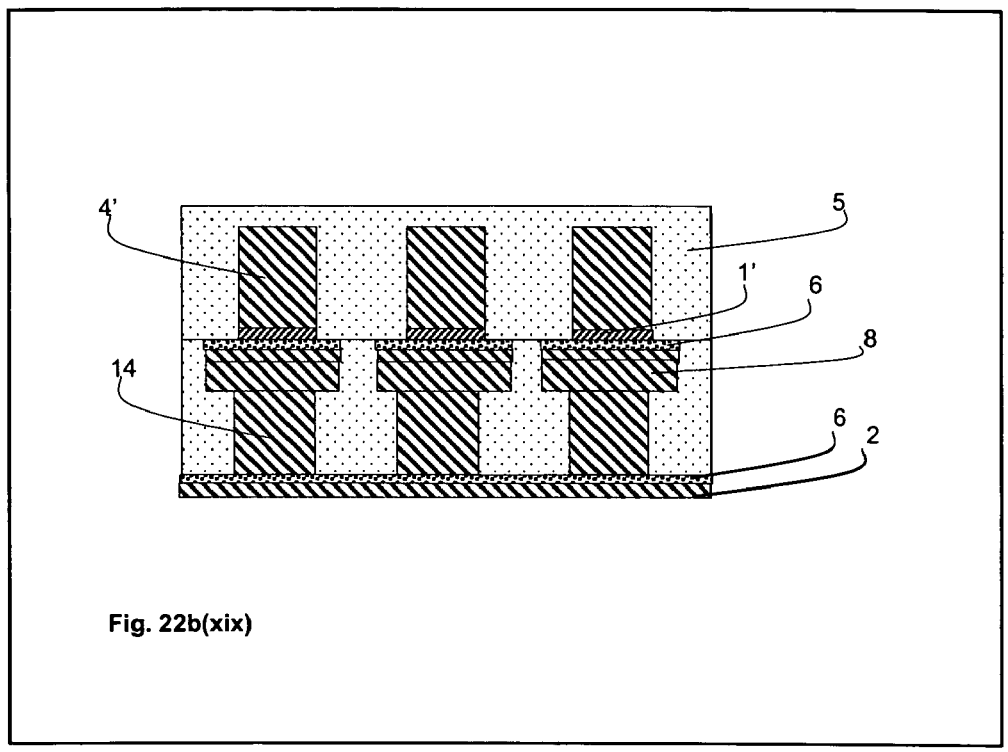
Fig. 22b(xix)
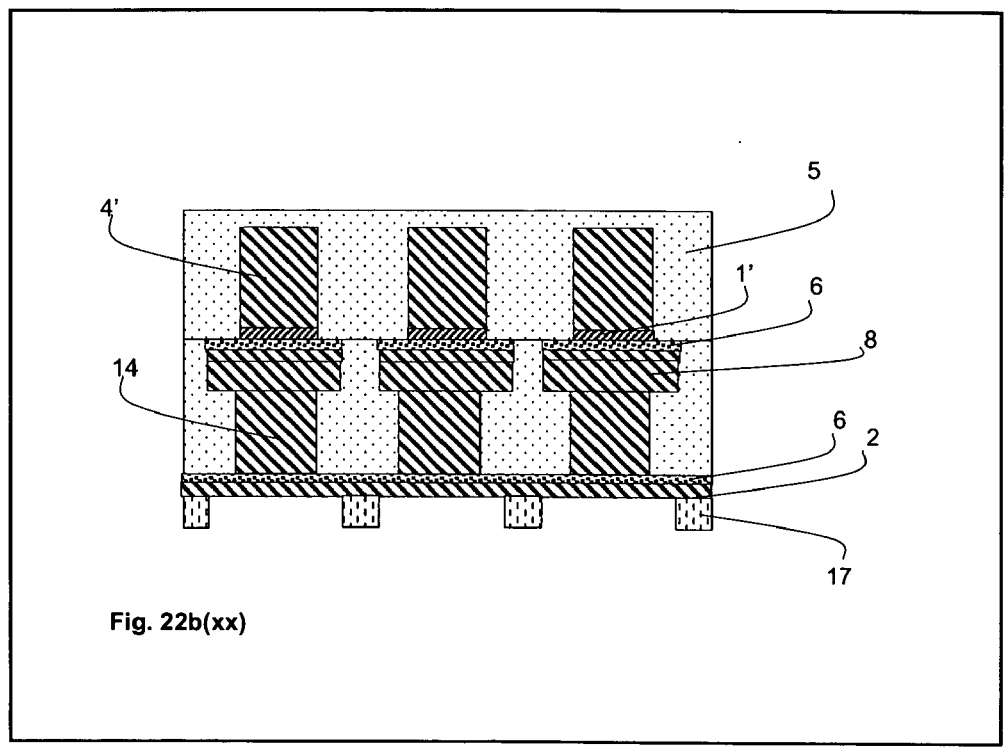
Fig. 22b(xx)

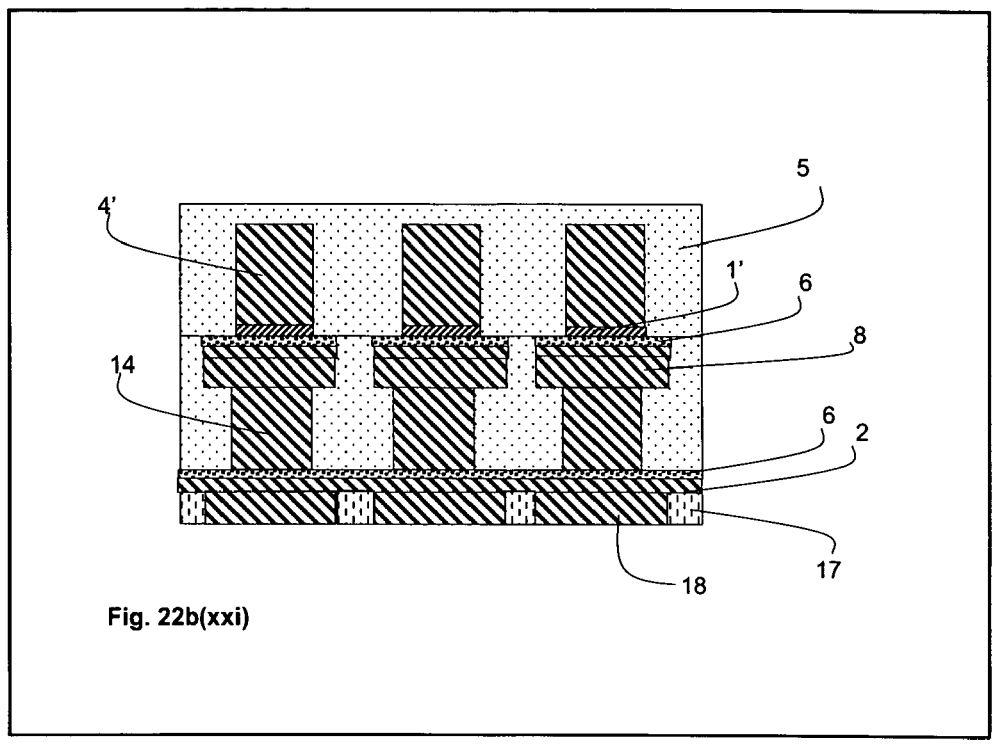
Fig. 22b(xxi)
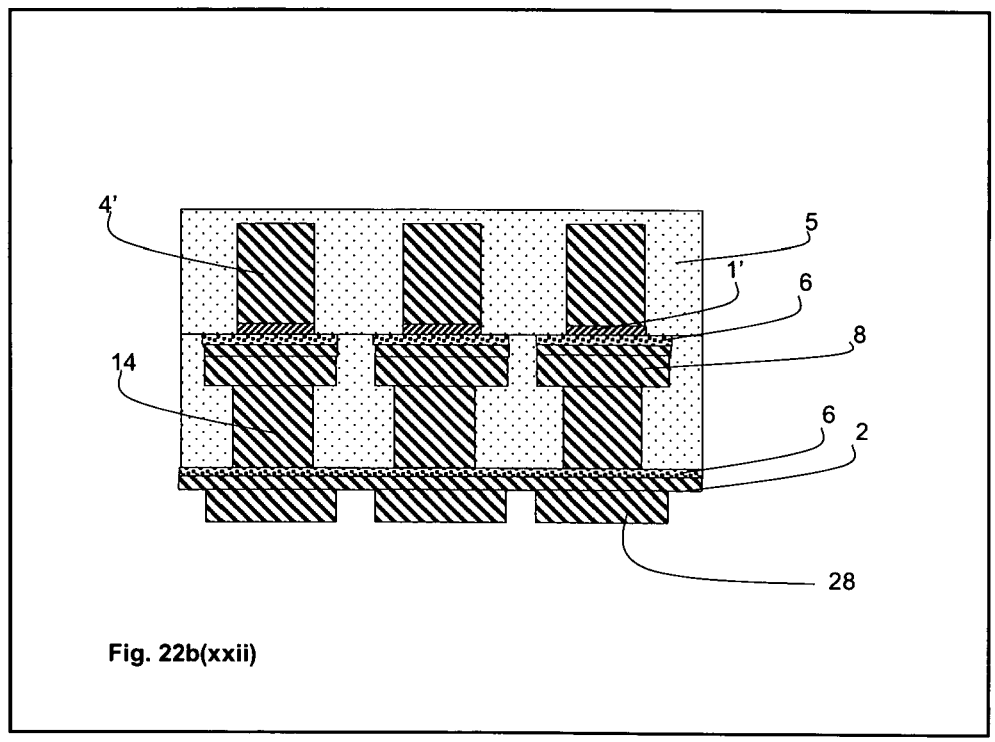
Fig. 22b(xxii)

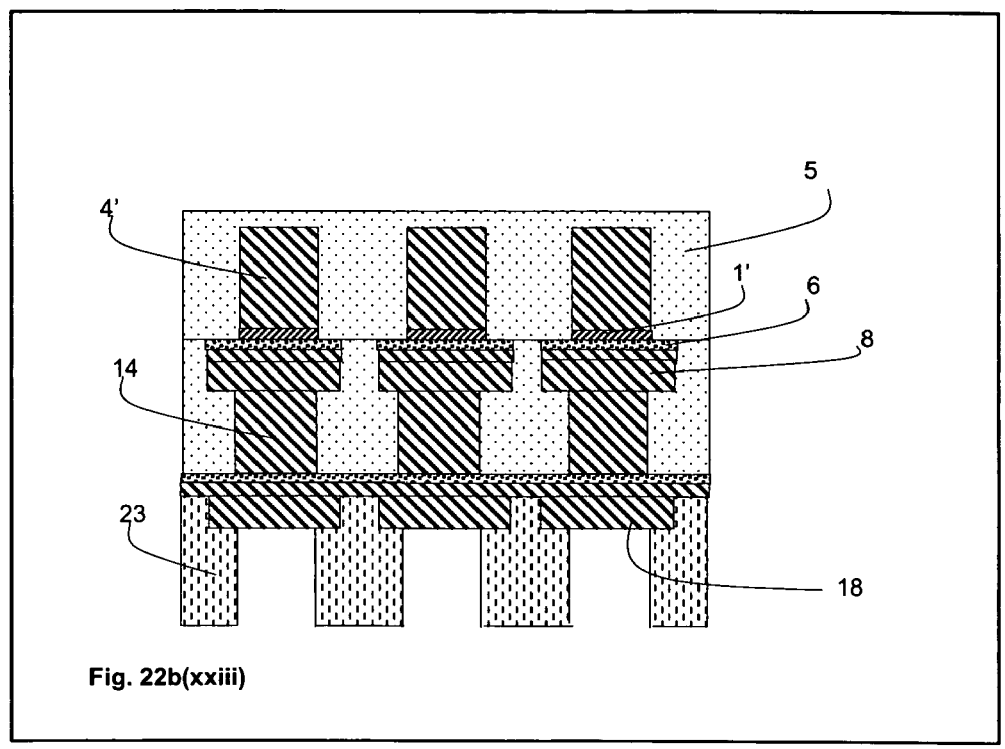
Fig. 22b(xxiii)
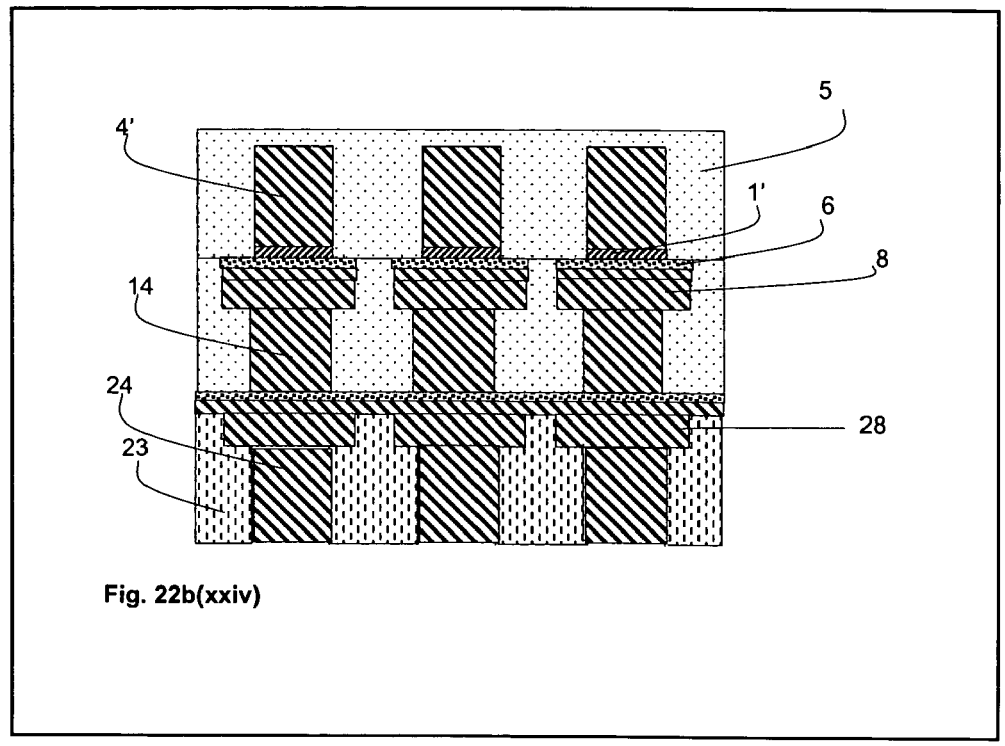
Fig. 22b(xxiv)

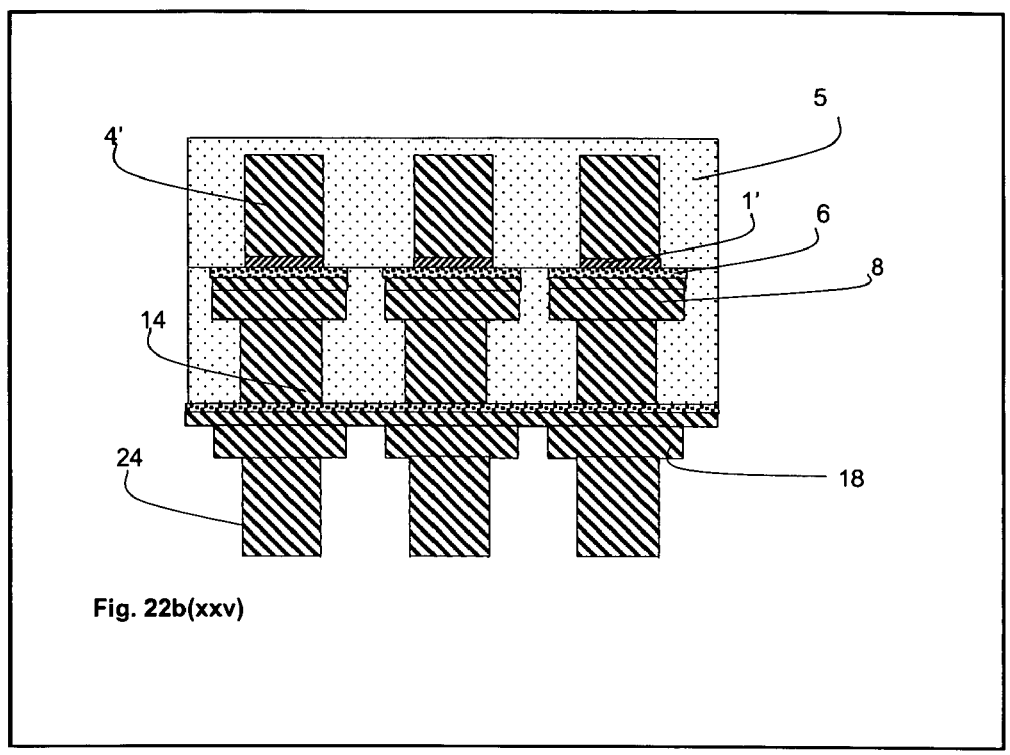
Fig. 22b(xxv)
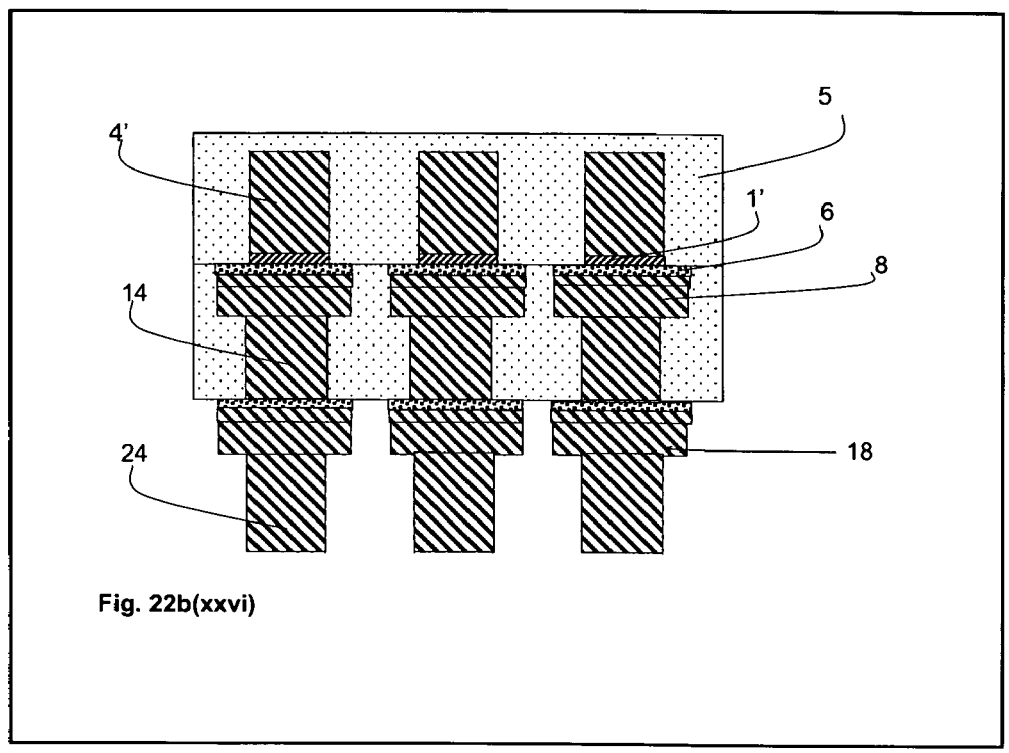
Fig. 22b(xxvi)

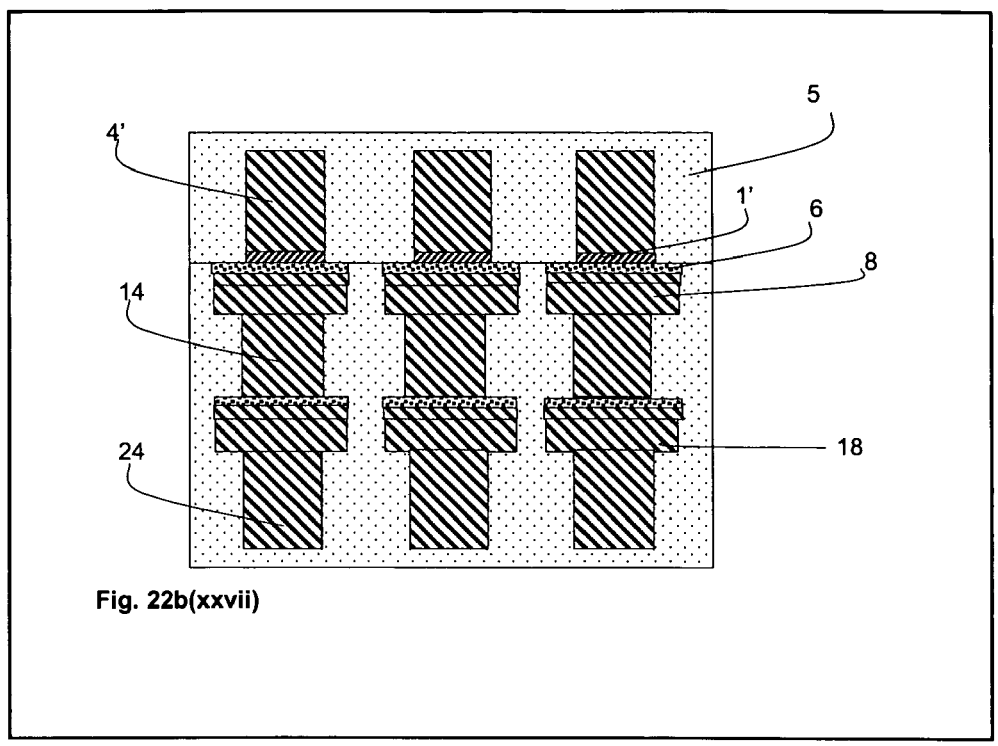
Fig. 22b(xxvii)
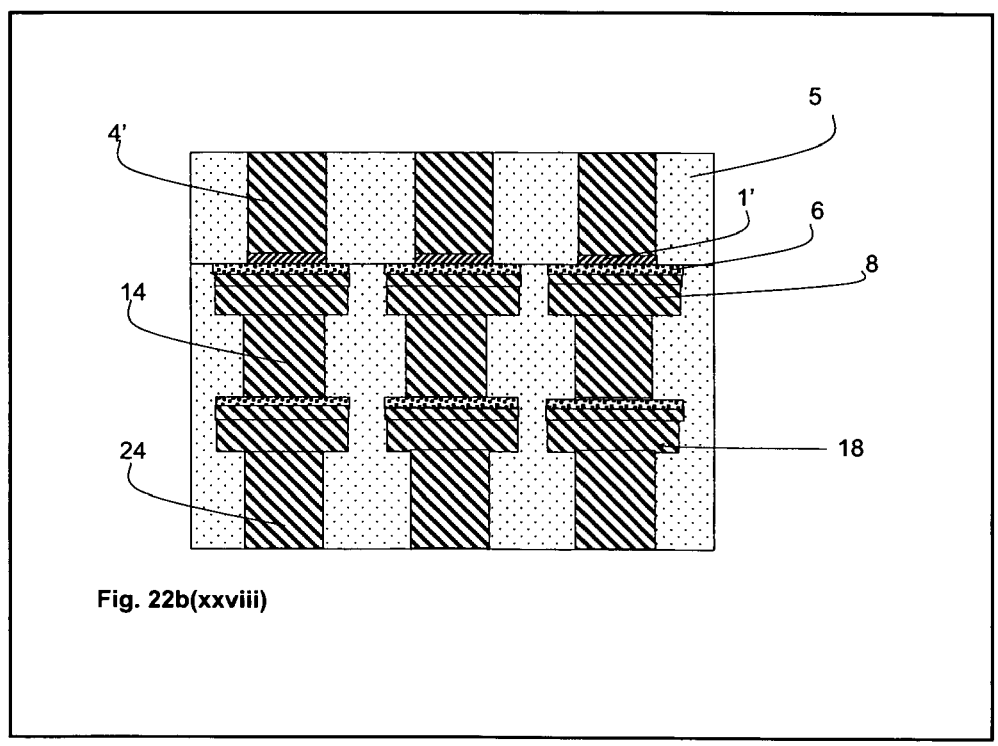
Fig. 22b(xxviii)

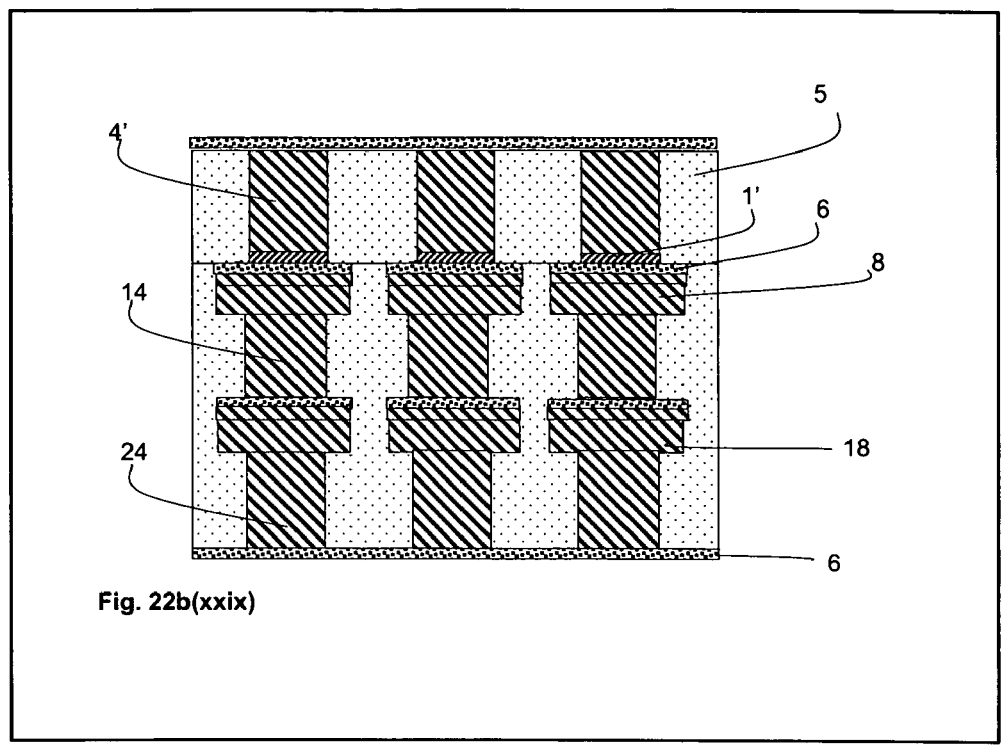
Fig. 22b(xxix)
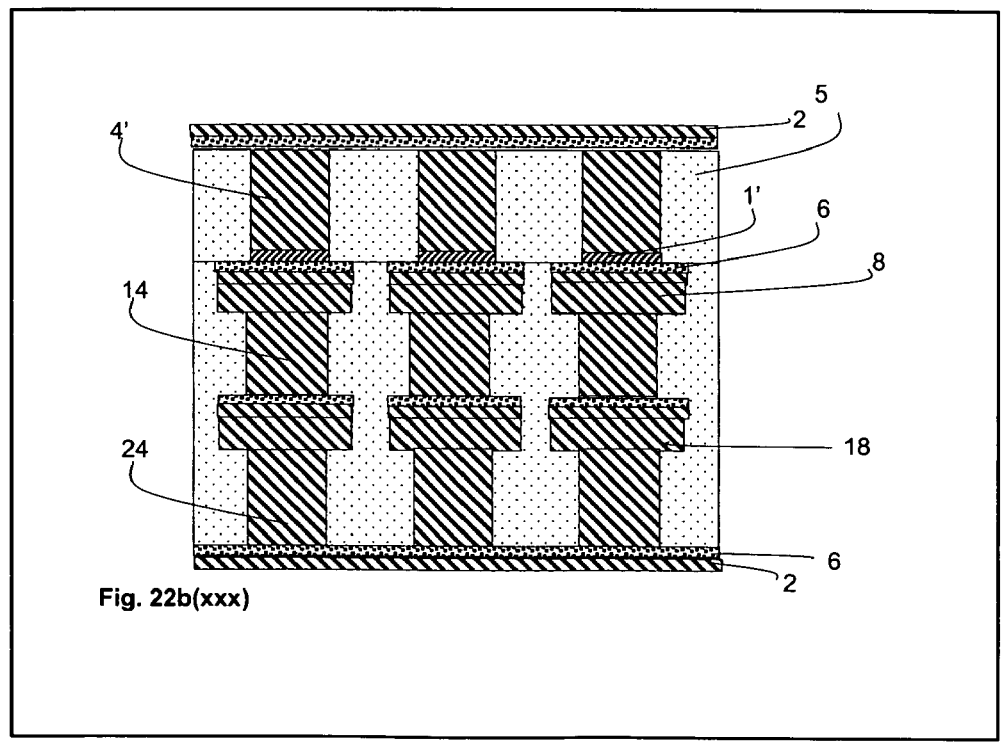
Fig. 22b(xxx)

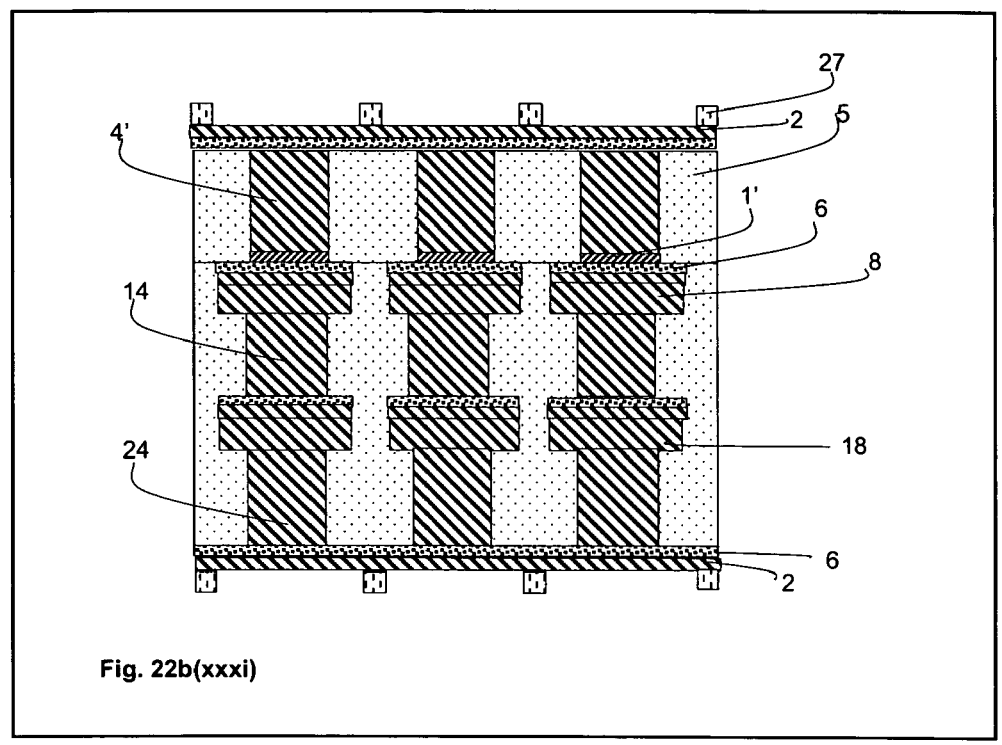
Fig. 22b(xxxi)
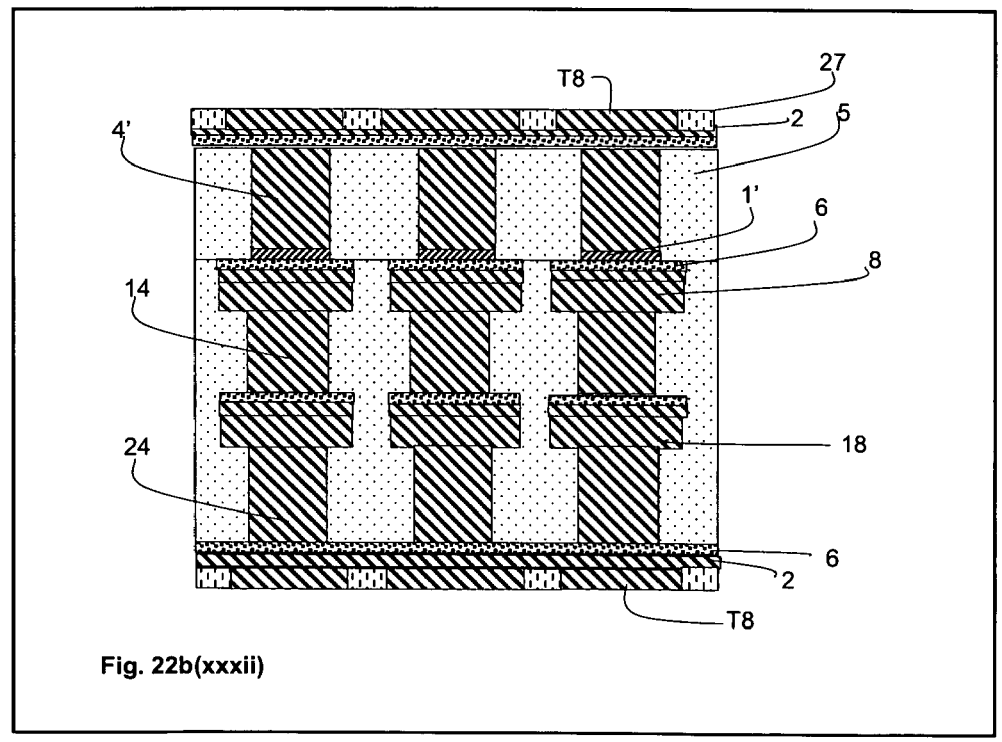
Fig. 22b(xxxii)

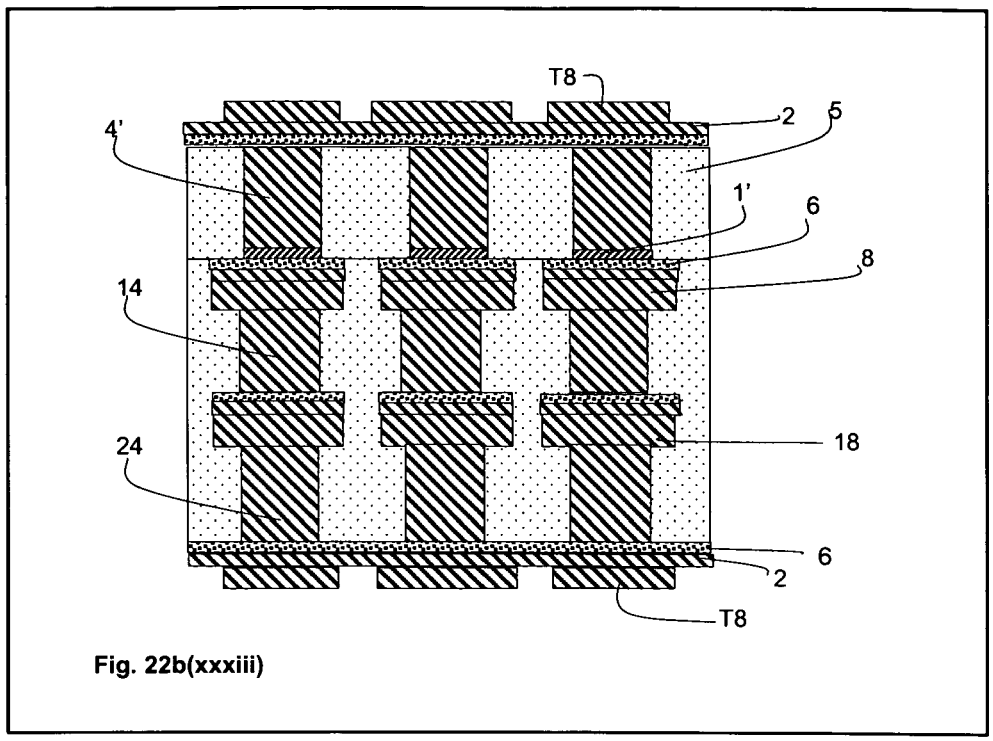
Fig. 22b(xxxiii)
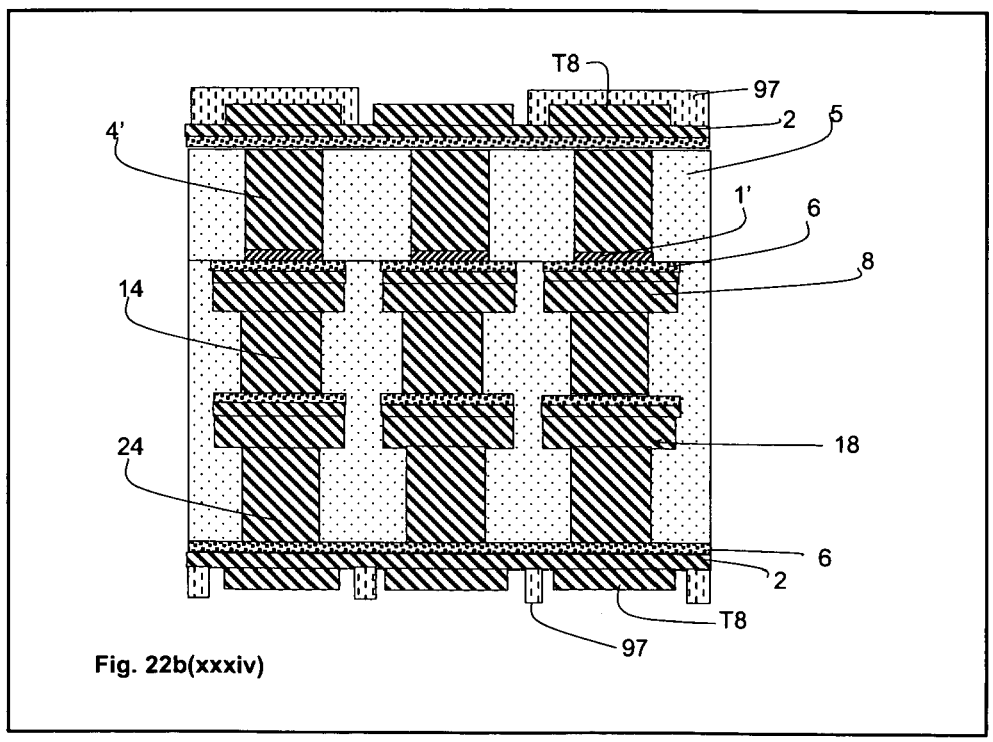
Fig. 22b(xxxiv)

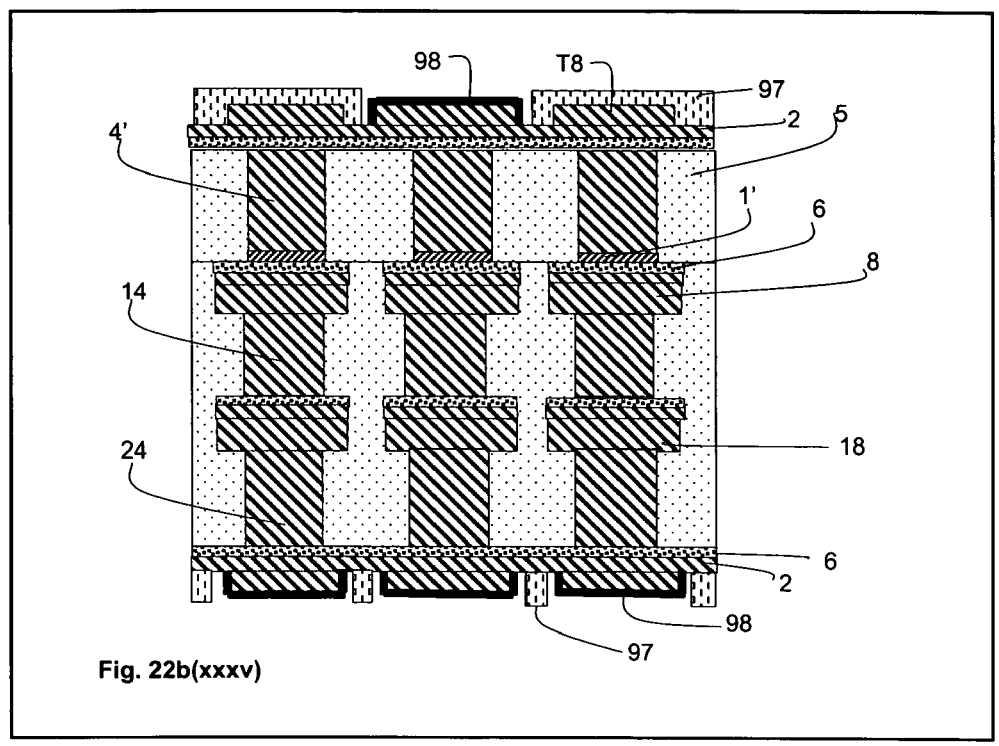
Fig. 22b(xxxv)
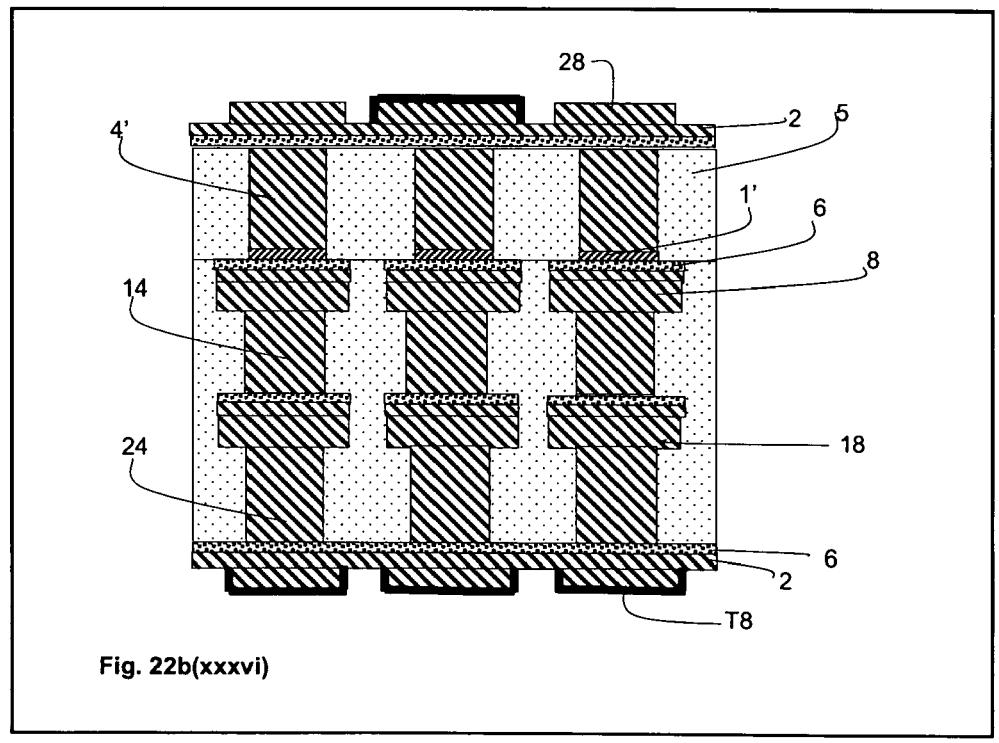
Fig. 22b(xxxvi)

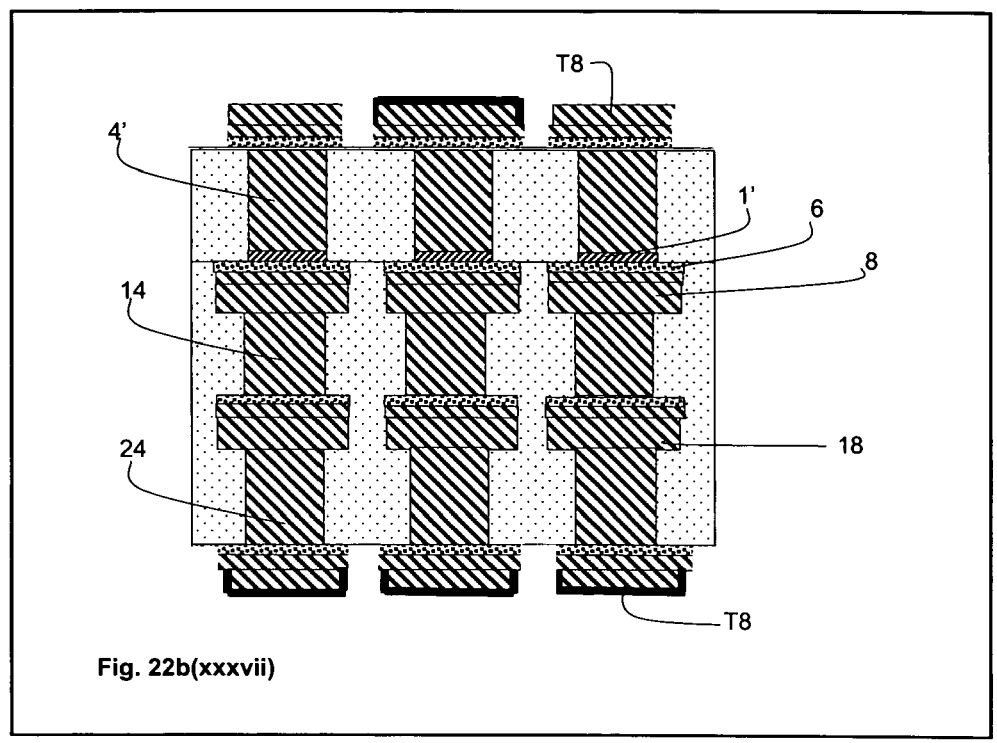
Fig. 22b(xxxvii)
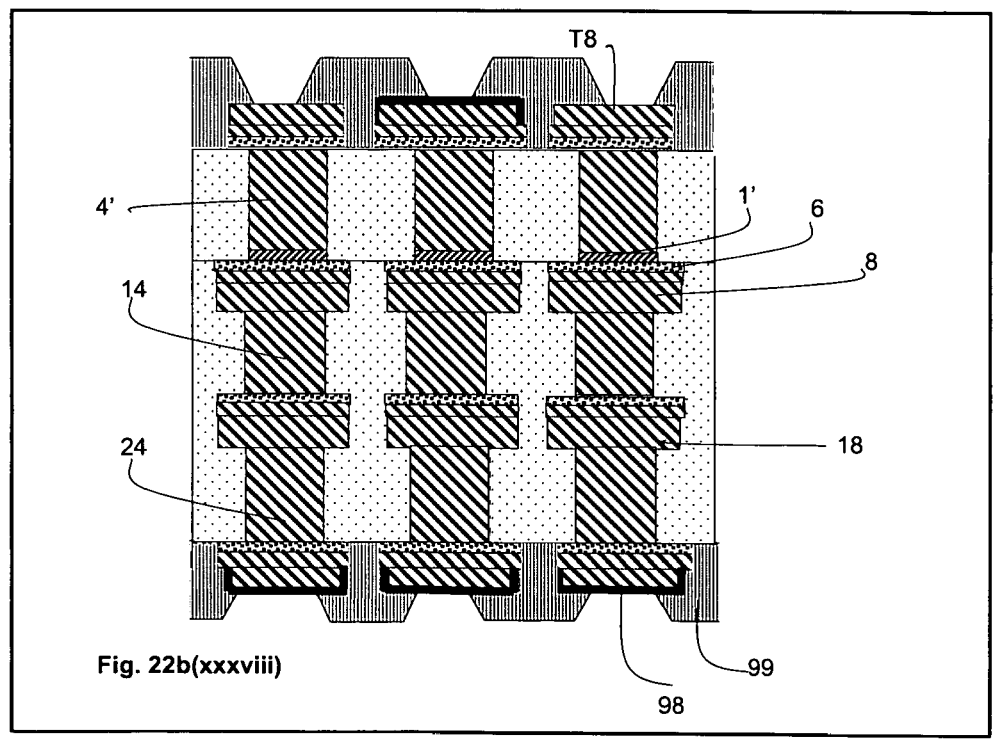
Fig. 22b(xxxviii)

US 7,682,972 B2

ADVANCED MULTILAYER CORELESS SUPPORT STRUCTURES AND METHOD FOR THEIR FABRICATION

FIELD OF THE INVENTION

The present invention is directed to providing support structures for integrated circuits, and to methods for the manufacture thereof.

BACKGROUND

There is a trend towards ever increasing complexity and ever greater miniaturization in the electronics industry. Space is at a premium, particularly in mobile equipment such as cellular phones and portable computers.

Integrated Circuits (ICs) are the heart of these electronic systems. As such, ICs are becoming more and more complex, and include ever larger numbers of transistors, and require increasing numbers of input/output contacts. They are required to operate at ever increasing switching speeds and frequencies, have ever increasing power consumptions and consequently generate ever increasing amounts of heat that requires dissipation.

ICs are connected to power supplies, user interfaces and other components via printed circuit boards (PCBs). To facilitate the connection of the IC to the PCB, it is necessary to provide a plurality of electronic connections. A common solution that has been adopted in order to interconnect the IC and its related PCB involves the usage of an Electronic Substrate. The Electronic Substrate is part of the IC package and replaces the traditional lead-frame as an interposer between the IC and the PCB. Such a substrate may include one, two or many conductor layers isolated by a variety of dielectric material layers, such as ceramic or organic materials. Such substrates generally have conductive arrays of contacts on their undersides. These may be ball contacts, providing a so called BGA (Ball Grid Array) or pins, providing a so-called PGA (Pin Grid Array) for electrical interconnection to the PCB. Alternatively, such substrates may be placed directly onto the PCB, without using balls or pins, providing a so-called LGA, (Land Grid Array) thereby. On its top side, the substrate will generally carry one or more ICs electrically connected thereto by the so-called Wire Bond or by the Flip Chip assembly techniques.

With reference to FIG. 1, an example of a Wire Bond BGA package of the prior art is shown, having a substrate 100; a ball grid array (BGA) of electrically conductive balls 102 that connects the pads 104 on the underside of the substrate 100 to a PCB therebeneath (not shown), and an array of electrically conductive wires, known as wire bonds 106, that connect the top side pads 108 of the substrate 100 to the IC 110. The IC 110 of such a package will usually be protected by a resinous material 112 that is otherwise known as a "molding" material.

With reference to FIG. 2, an example of a Flip Chip BGA package of the prior art is shown, having a Flip Chip BGA substrate 200. Once again, a ball grid array (BGA) 202 of electrically conductive balls is provided, that connects the pads 204 on the underside of the substrate 200 to the PCB therebeneath. Instead of wire bonds however, electrically conductive bumps 206 are provided on the top side pads 208 of the substrate 200, for connecting to the IC 210, by what is known in the art as the Flip Chip process. This process also involves the application of a resin material 212 between the IC 210 and the surface of the substrate 200. In this technology, the resin 212 is generally known as an "under-fill" material.

The resin under-fill 212 acts as a stress buffer, and reduces the fatigue on the IC 210 and the bumps 206 during thermal cycling over the life time of the package 250. Sometimes the Flip Chip package 250 also includes a metal stiffener 216, which is attached to the substrate 200 by an adhesive layer 218, and a lid 220 that is attached to the back of the IC 210 with a thermal adhesive layer 222. The stiffener 216 is used to further stiffen the substrate 200 and helps maintain flatness during subsequent IC assembly processes, while the lid 220 helps dissipate the heat generated by the IC 210 during its operation.

The advanced BGA, PGA, LGA substrates used in Wire Bond and Flip Chip processes described hereabove and illustrated in FIGS. 1 and 2 respectively, generally include two main sections: a so-called "core section" and a "built-up section" that is applied layer by layer thereupon.

With reference to FIG. 3, a detailed example of a typical organic Flip Chip BGA (FCBGA) substrate 300 is shown. The core section 330 of the substrate 300 is constructed out of multiple copper conductor layers 332 that are usually separated by fiber-glass reinforced, organic dielectric material layers 334. The copper conductor layers 332 in the core 330 are electrically connected by Plated Through Holes (henceforth PTH) 336. Generally, in the process of forming the substrate 300, the core section 330 is formed first. PTHs 336 are then formed by mechanically drilling holes, copper plating them and plugging. Next, external copper conductor layers 338 of the core section 330 are constructed. Two built-up sections 340', 340" are then added, one on each side of the core 300. These built-up sections 340', 340" consist of a plurality of conductor copper layers 342, separated from each other by layers 344 of dielectric material, which may be reinforced by fiber-glass. The dielectric layers 344 contain copper plated micro-vias 346, which interconnect between adjacent copper conductor layers. The micro-vias 346 are usually laser drilled and hence are much smaller in diameter than the PTHs 336. This releases valuable space on the substrate's built up sections for applying ICs thereupon. The improved mechanical and electrical characteristics of the dielectrics used in the built-up sections, together with their higher conductor densities, enabled by the usage of the micro-vias 346, allow them, eventually, to reach the density of the IC contacts and to act as intermediating contacts to the PCB.

It will be noted that the core section 330 of such an FCBGA substrate 300 primarily serves as a through interconnect "carrier" for the build-up sections 340', 340", whilst also accommodating the low density power and ground copper conductor layers required to operate the IC.

Due to their finer I/O pitches, modern ICs require very flat, non-warped substrates to ensure the reliability of the package. This is difficult to achieve if the built-up section of the substrate is only formed on one side of the core. In order to create a flat, non-warped substrate during IC assembly processes and thereafter, the built-up sections are preferably built up on both sides of the core, so that a symmetrical structure is fabricated, resulting in a stress-balanced, flat substrate.

There is a cost to building up layers on both sides of the core however. It adds more manufacturing process steps, which, in turn, increases fabrication costs. Since the resulting substrate structure is more complicated, manufacturing yields drop off. Furthermore, the substrate thickness is increased, resulting in less compact, thicker packages that are less desirable for mobile communication and other applications where miniaturization is required. Additionally, it will be appreciated that the thicker the substrate, the greater the total inductance and thermal impedance of the package. This deteriorates the over all performance of the IC. In view of these drawbacks, many attempts have been made to improve on the sandwich structure described above.

One development that attempts to minimize thickness is to construct the substrate without a central core, providing what is known in the art as a "core-less substrate". In this concept, both the central core and the build-up section from the substrate's BGA (or PGA or LGA) side are eliminated, so that the entire substrate consists of one build-up section only, for interconnecting the IC to the PCB. The total substrate thickness is thereby significantly reduced, improving both its thermal impedance and its electrical performance. Furthermore, eliminating the core section of the substrate cuts down the cycle time of the manufacturing process and eliminates the need for mechanically drilled PTHs which are fairly expensive to fabricate.

United States Published Patent Application Number USSN 2002/0001937 to Kikuchi et al. addresses the above issues by describing the manufacturing of multilayer interconnect structures consisting of polymeric insulating layers and metal interconnects on a metal base plate that is subsequently partially removed to create a metal supporting stiffener having an aperture for the IC.

While USSN 2002/0001937 to Kikuchi et al apparently introduces a viable methodology for obtaining a core-less substrate, it nevertheless suffers from a number of drawbacks. Firstly, all the conductor layers of the substrate require expensive thin film interconnects. While conductor layers in the form of thin film interconnects provide better performance due to their improved densities and finer pitches, they are inappropriate to the substrate's power and ground metal planes which are usually low in density and pitch, and building them using expensive thin film technology is cost prohibitive. Furthermore, these layers usually require a certain metal thickness to reduce electrical resistance and to prevent overheating. This can become difficult to achieve when using thin film processing techniques. Furthermore, the Flip Chip bonding process applies a pressure which thin film interconnect structures are ill equipped to withstand. Such pressures tend to distort and/or stretch the interconnect structure, which in thin films are typically less than 100 microns thick. This sometimes causes cracking of the thin film dielectric layers and may lead to operating failure of the IC. Additionally, it will be appreciated that the presence of a metal stiffener adjacent to the IC consumes valuable space on the external surface of the substrate and may limit usage in applications requiring passive components, such as decoupling capacitors, in close proximity to the IC. Furthermore, the large aperture metal stiffener used may make this technology unsuitable for applications requiring, for example, multi chip substrates, low body-sized substrates, substrates supplied in two dimensional matrix arrays or in strip formats.

U.S. Pat. No. 6,872,589 to Strandberg describes a substrate for mounting an IC. Here again, the substrate structure is formed on a metal carrier base which is only partially etched away, leaving a metal stiffener having an aperture for the mounted IC. Although Strandberg's substrate described in U.S. Pat. No. 6,872,589 may be advantageous over that described in USSN 2002/0001937 by offering a lower interconnect layer count, it nevertheless still suffers from all the drawbacks of the structure of USSN 2002/0001937 as detailed above.

In light of the above it is clear that there is still a need for cost-effective, higher performance core-less substrates that can be used in a wide range of applications. To satisfy this need, one promising approach has been to attempt to eliminate the expensive thin film build-up structures described above and to replace them with other, cheaper materials and processes such as those established by and in common use in the printed circuit board (PCB) fabrication industry. Unlike thin film dielectric materials, the advanced dielectric materials used in the PCB industry may be applied by lamination techniques and are available in the form of prepregs which may be reinforced with glass fibers or other reinforcement materials. Proper selection of these dielectrics provides the potential to introduce "self supported" core-less substrate structures that eliminate or at least minimize the need for metal stiffeners. Furthermore, use of relatively low cost, established, PCB oriented processes, is expected to provide cost effective core-less substrates having multiple, low density, low pitch power and ground metal layers combined with high density, fine pitch metal signal layers.

Such laminate structures have been found to be susceptible to warping, particularly in consequence of hot pressing or curing processes. Core-less substrates obtained thereby, typically lack the flatness required for securely and reliably mounting ICs thereupon.

Where such substrates have been built up on one side of a metal carrier base that is subsequently removed prior to IC assembly, or thinned down to provide a stiffener supported substrate, internal unbalanced stresses invariably develop during fabrication. These stresses may be released on removal of the metal carrier, causing substrate curvature and warping. This can result in poor yields when assembling the IC thereupon, and may even lead to non flat packages that cannot then be mounted onto the corresponding PCB.

In an attempt to solve this issue, U.S. Pat. No. 6,913,814 to Ho et al. discloses a lamination process and resultant structure that provides a high density multi-layer substrate having a plurality of laminate layers, wherein each layer thereof is individually formed, and, only then are the layers stacked and laminated together. This approach apparently provides a viable alternative to the asymmetrical, sequentially built up, multi-layer substrates fabricated on a common metal carrier base of the prior art. The technology seems to provide a cost effective organic core-less substrate using tried and tested materials and processes established by the PCB fabrication industry, with solid copper vias replacing the PTHs.

Nevertheless, the technology described in U.S. Pat. No. 6,913,814 to Ho et al. has two major drawbacks: Firstly, in order to construct a structure having a bottom layer with a low pitch BGA thereupon for attachment to a PCB and a high pitch upper IC side, the substrate must be constructed from individual laminae, each having different densities and different dielectric layer thicknesses. Once again this results in an unbalanced, asymmetrical, structure with an inherent tendency to curving. Secondly, as is well known to those experienced in the art, connecting the substrate layers with via-to-pad contacts based upon metal contacts achieved through dielectric materials lamination is unreliable for high performance ICs applications, since these have a tendency towards loss of via contact and resultant package failures. This is especially of concern where high temperature processes are used during IC mounting onto the substrate.

In a co-pending application to the present inventors, IL 171378 filed 11 Oct. 2005 to Hurwitz et al., entitled "Novel Integrated Circuit Support Structures and their Fabrication" a method of fabricating an electronic substrate is described that addresses this issue. The fabrication method comprises the steps of: (a) selecting a first base layer; (b) applying a first etchant resistant barrier layer onto the first base layer; (c) applying a seed layer of copper; (d) building up a first half stack of alternating conductive layers and insulating layers, the conductive layers being interconnected by vias through the insulating layers; (e) applying a second metal base layer onto the first half stack; (f) applying a protective coating of photoresist to the second base layer; (g) etching away the first base layer; (h) removing photoresist; (I) removing the first etchant resistant barrier layer; (j) building up a second half stack of alternating conductive layers and insulating layers, the conductive layers being interconnected by vias through the insulating layers, wherein second half stack has a substantially symmetrical lay up to first half stack; (k) applying an insulating layer onto the second half stack of alternating conductive layers and insulating layers, and (l) removing the second base layer.

The processing method of IL 171378 to Hurwitz et al., essentially consists of building up half the desired structure on a sacrificial substrate, terminating the half structure stack with a thick layer that becomes a second sacrificial substrate, removing the first sacrificial substrate and building down a second half structure stack that is substantially symmetrical to the first half structure stack. Thus the first layers to be applied become the middle layers of the stack.

In theory, the first and second half structure stacks are mirror images of each other and have opposite residual stresses that cancel each other out giving a planar structure that shows no tendency to warp. However, because the stack is fabricated from the center outwards, with one half stack being fabricated first, from the center outwards, followed by the second half stack being fabricated on the first half stack, again from the center outwards, it is difficult to ensure that the processing conditions remain the same for the two half stacks, especially for structures with large numbers of layers. Discrepancies between the two sides typically results in some unbalanced residual stresses in the substrate that may lead to warping, resulting in the substrates that do not reach the strict planarity requirements of advanced IC package constructions, such as Package on Package (PoP), Package in Package (PiP), packages containing stacked ICs, and packages containing several ICs mounted by flip chip processes and others by Wire Bond techniques. For this and other reasons, the processing method of co-pending IL 171378 to Hurwitz et al., though being a major step forward in the art, nevertheless has limited applicability for very complicated, multilayered structures having a large number of active layers, and attempts to fabricate such structures have, in the past, lead to reduced yields.

Thus, despite the developments described above, and the major advantages of IL 171378 to Hurwitz, with regards to reliability due to high levels of planarity and smoothness, there is still a need for quick turnaround manufacturing processes and for chip support structures that are economical to manufacture and give high yields even for high count multilayer structures. The present invention addresses this need and presents new processing techniques and novel structures.

SUMMARY OF THE INVENTION

It is an aim of the invention to provide a novel manufacturing technique for multilayer interconnect support structures that is economical and is particularly suitable for large scale manufacture.

It is a further aim to provide a manufacturing technique that attains high yields.

It is further aim to fabricate arrays of vias between the conductive feature layers without having to 'drill and plate', which are time consuming, expensive techniques that are limited to fabricating via shapes having round cross sections.

It is a specific aim of the manufacturing technique to provide multilayer interconnect support structures having excellent planarity and smoothness.

It is further specific aim of the manufacturing technique to provide multilayer interconnect support structures having high reliability.

It is a specific object of preferred embodiments of the invention to provide a high performance core-less laminated substrate for one or more ICs, that is low in thickness relative to substrates of the prior art, yet having multiple conductive power and ground metal layers and high density, fine pitch conductive signal layers that are electrically interconnected by solid copper vias that may have any desired cross section, not just circular cross sections, surrounded by insulating materials; the substrate being capable of passing electrical signals with minimum loss and providing minimum thermal impedance.

It is another specific object of preferred embodiments of the invention to provide a self-supported, flat, core-less laminated substrate that can accommodate ICs using Flip Chip assembly processes and/or Wire Bond assembly processes.

Preferably such a substrate can be supplied, prior to IC assembly, either in single unit format or in a multiple unit format such as in a matrix array or a strip array.

It is a further specific object to provide a substrate manufacturing technique, and substrates manufactured therefrom that have inner layers that may include substantial layers that are appropriate for use as power and ground metal planes, being low in density and pitch, and having appropriate metal thicknesses to have low electrical resistance, thereby preventing overheating.

It is a further specific object to provide a substrate manufacturing technique, and substrates manufactured therefrom that have one or a plurality of layers applied around a central substructure, on both sides thereof, the layers being simultaneously co-fabricated under identical processing conditions, balancing residual stresses therebetween and obtaining good planarity thereby. In a first aspect, the present invention is directed to a method of fabricating a free standing membrane comprising a via array in a dielectric for use as a precursor in the construction of superior electronic support structures, comprising the stages:

I—fabricating a membrane comprising conductive vias in a dielectric surround on a sacrificial carrier, and II—Detaching the membrane from the sacrificial carrier to form a free standing laminated array.

In one embodiment, stage I comprises the sub-steps of: (I) Panel plating a barrier metal layer onto a sacrificial carrier;

(ii) Applying a seed layer of copper onto the barrier layer;

(iii) Applying, exposing and developing a photoresist layer onto the copper seed layer to form patterns;

(iv) Pattern plating copper vias into the photoresist patterns;

(v) Stripping away the photoresist layer leaving the upstanding copper vias, and (vi) Laminating a dielectric material layer over the copper vias, such that the free standing membrane formed thereby comprises a copper via array in a dielectric matrix.

In another embodiment, stage I comprises the sub-steps of:

(I) Applying, exposing & developing a photoresist layer directly onto a sacrificial carrier to form patterns;

(ii) Pattern plating a barrier metal into the patterns thus formed;

(iii) Pattern plating copper vias onto the pattern plated barrier metal;

(iv) Stripping away the photoresist layer and baring the copper vias;

(v) Laminating a dielectric material layer over the bare copper vias, and

Step II comprises the step of (vi) Removing the sacrificial carrier,

Such that the resulting electronic substrate comprises a copper structure in a dielectric matrix having a layer of barrier metal included within the copper structure.

In a second aspect, the present invention is directed to providing a free standing via membrane comprising a via array surrounded by a dielectric material, fabricated by the method described hereinabove.

In a third aspect, the present invention is directed to providing a method of fabricating an electronic substrate comprising at least the stages of:

I—Fabricating a membrane comprising conductive vias in a dielectric surround on a sacrificial carrier;

II—Detaching the membrane from the sacrificial carrier to form a free standing laminated array;

V—Thinning and planarizing;

VI—Building-up, and

VII—Terminating.

Typically, the conductive vias are fabricated from copper applied by a plating technique selected from the list of electroplating and electroless plating.

In some embodiments, stage I comprises the sub-steps of:

(I) Panel plating a barrier metal layer onto a sacrificial carrier;

(ii) Applying a seed layer of copper onto the adhesive metal layer;

(iii) Applying a photoresist layer onto the seed layer and patterning the photoresist;

(iv) Plating copper vias into the photoresist pattern;

(v) Stripping away the photoresist leaving the upstanding copper vias, and (vi) Laminating a dielectric material over the copper vias;

And stage II comprises the sub-steps of (vii) Removing the sacrificial carrier, and (viii) Removing the barrier metal layer, Such that the resulting electronic substrate comprises a copper structure in a dielectric matrix.

Typically, in such embodiments, the barrier metal layer has at least one of the following characteristic (a) the barrier metal layer is selected from the list of tantalum, tungsten, chromium, titanium, a titanium-tungsten combination, a titanium-tantalum combination, nickel, gold, nickel layer followed by gold layer, a gold layer followed by a nickel layer, tin, lead, tin layer followed by a lead layer, tin-lead alloy, and tin-silver alloy and is applied by a physical vapor deposition process;

(b) the barrier metal layer is selected from the list of nickel, gold, a nickel layer followed by gold layer, a gold layer followed by a nickel layer, tin, lead, tin layer followed by a lead layer, tin-lead alloy, and tin-silver alloy and is applied by a plating method selected from the list of electroplating and electroless plating, and (c) the barrier metal layer has a thickness in the range of 0.1 μm to 5 μm.

Optionally, the method comprises additional stage III of adding a metal feature layer and a further via layer to form an inner substructure comprising a center metal feature layer membrane surrounded by via layers, such that the electronic substrate built up therearound has an odd number of metal feature layers.

Typically stage III comprises the sub-steps of:

(a) applying, exposing and developing photoresist to form a feature pattern;

(b) applying a copper layer into the feature pattern;

(c) stripping away the photoresist, (d) applying exposing and developing a second layer of photoresist to form a via pattern;

(e) applying copper into the via pattern to form copper vias;

(f) stripping away the second layer of photoresist;

(f) etching the copper seed layer, and (g) laminating with dielectric material.

Optionally, the method comprises stage IV of adding a further inner feature layer followed by a further inner via layer to form an inner substructure comprising a central via layer surrounded by feature layers, such that the electronic substrate built up therearound has an even number of metal feature layers.

Typically, stage IV of adding a further features layer and a further via layer, comprises the steps of:

(h) thinning and planarizing the laminated dielectric material applied in step (g) to expose the outer surface of the vias applied in step (e);

(I) applying an adhesion metal layer such as titanium, chrome, or nickel chrome, for example, onto the exposed outer surface of vias and laminated dielectric material therearound;

(j) applying a copper seed layer onto the adhesion layer;

(k) applying, exposing and developing a second feature layer of photoresist onto the copper seed layer to form a second feature pattern;

(l) applying a metal feature layer into the second feature pattern;

(m) stripping away the second feature layer of photoresist;

(n) applying exposing and developing a third via layer of photoresist to form a third via pattern;

(o) applying copper into the third via pattern to form a third layer of copper vias;

(p) stripping away the third layer of photoresist;

(q) etching away the copper seed layers and adhesion metal layer, and (r) laminating a dielectric material layer thereover.

Optionally, stage (h) of thinning and planarizing the laminated dielectric material applied in step (g) comprises a technique selected from the list of mechanically grinding, chemical mechanical polishing (CMP), dry etching and multiple stage processing using two or more of these techniques.

In a second family of embodiments, stage I comprises the sub-steps of:

(I) Applying, exposing and developing a photoresist material directly onto a sacrificial carrier to form a pattern;

(ii) Pattern plating a barrier metal into the pattern thus formed;

(iii) Plating copper vias onto the pattern plated barrier metal;

(iv) Stripping away the photoresist and baring the copper vias;

(v) Laminating a dielectric material over the bare copper vias, and

Step II comprises the step of (vi) Removing the sacrificial carrier,

Such that the resulting electronic substrate comprises a copper structure in a dielectric matrix having a layer of barrier metal included within the copper structure.

In such embodiments, typically the barrier metal layer has at least one of the following characteristics:

(a) the barrier metal layer is selected from the list of nickel, gold, a nickel layer followed by a gold layer, a gold layer followed by a nickel layer, tin, lead, tin layer followed by a lead layer, tin-lead alloy, and tin-silver alloy and is applied by a plating method selected from the list of electroplating, electroless plating, and combinations of electroplating and electroless plating;

(b) the barrier metal layer has a thickness in the range of 0.1 μm to 5 μm.

Optionally, the method of fabrication comprises additional stage III of adding a first metal feature layer and a second via layer to form an inner substructure comprising a center metal feature layer membrane surrounded by via layers, such that the electronic substrate built up therearound has an odd number of metal feature layers.

Typically, stage III of adding a first metal feature layer and a second via layer to form an inner substructure comprising a center metal feature layer membrane surrounded by via layers, comprises the steps of:

(vii) applying an adhesive metal layer such as titanium, chrome, or nickel chrome, for example, to surface exposed by step (vi), the exposed surface comprising ends of vias coated with barrier metal, surrounded by dielectric material;

(viii) applying a seed layer of copper onto the adhesive metal layer;

(ix) applying, exposing and developing a first feature photoresist layer to form a feature pattern;

(x) applying a copper layer into the feature pattern;

(xi) stripping away the first feature photoresist layer;

(xii) applying exposing and developing a second via layer of photoresist to form a second via pattern;

(xiii) applying copper into the second via pattern to form a second layer of copper vias;

(xiv) stripping away the second via layer of photoresist, and (xv) etching away the copper seed layer;

(xvi) removing the adhesion metal layer, and (xvii) laminating a dielectric material over the exposed second layer of vias.

In some embodiments, the fabrication method of the invention further comprises stage IV of adding a second feature layer and a third via layer to form an inner substructure comprising two feature layers around a central via layer, such that the electronic substrate built up therearound has an even number of metal feature layers.

Stage IV of adding a further feature layer and a third via layer, optionally comprises the steps of:

(xviii) thinning and planarizing the laminated dielectric material applied in step (xvii), thereby exposing the outer surface of the via layer applied in step (xiii);

(xix) applying an adhesion metal layer, such as titanium, chrome, or nickel chrome, for example, onto the exposed via surfaces and onto the laminated dielectric material therearound;

(xx) applying a copper seed layer onto the adhesion layer;

(xxi) applying, exposing and developing a further layer of photoresist to form a feature pattern;

(xxii) applying copper into the feature pattern of step (xxi) to form a second feature layer;

(xxiii) stripping away the further layer of photoresist of step (xxi);

(xxiv) applying exposing and developing another layer of photoresist to form a third via pattern;

(xxv) applying copper into the third via pattern to form a third layer of copper vias;

(xxvi) stripping away the another layer of photoresist;

(xxvii) etching away the adhesion metal and seed layers, and (xxviii) laminating a dielectric material layer thereover.

Typically the dielectric material used throughout, is a fiber reinforced resin composite.

Optionally, the dielectric material comprises a resin selected from the list of thermoplastic resins, thermosetting polymeric resins and resins having mixed thermoplastic and thermosetting properties.

In preferred embodiments, the dielectric material further comprises inorganic particulate fillers and the dielectric material is further characterized by having at least one of the following characteristics:

(a) the inorganic particulate fillers comprise particles of a ceramic or glass;

(b) particle sizes of the order of single microns, and (c) 15% to 30% of particulate filler by weight.

In preferred embodiments, the dielectric material is a fiber matrix composite material and further comprises fibers selected from the list of organic fibers and glass fibers as chopped fibers or continuous fibers arranged in cross-plied arrangements or as woven mats.

Optionally and preferably, the dielectric material is a prepreg comprising a fiber mat that is pre-impregnated with a partially cured polymeric resin.

Typically, stage II of detaching the laminated columnar via structure from the sacrificial carrier to form a free standing laminated array comprises etching the sacrificial carrier away by an etching process.

Typically, stage V and other thinning and planarizing steps of the invention, comprises the step of thinning and planarizing dielectric, to expose outer via surfaces therebeneath, using a technique selected from the list of mechanically grinding, chemical mechanical polishing (CMP), dry etching and multiple stage processing using two or more of these techniques.

Usually, the method further comprises an additional stage VI, of building up feature and via layers on both sides of the membrane.

Optionally, the additional stage VI comprises the steps of:

(a) Applying adhesion metal layers selected from the list of titanium, chrome, or nickel chrome on both sides of planarized inner substructure;

(b) Applying a copper seed layer onto the adhesion layer;

(c) Applying, exposing and developing first outer photoresist patterns for first outer feature layers;

(d) Pattern plating first outer feature layers into the first photoresist patterns;

(e) Stripping away the first outer photoresist patterns for first outer feature layers;

(f) Applying, exposing and developing second outer photoresist patterns for first outer via layers;

(g) Pattern plating first outer copper vias into second outer photoresist patterns;

(h) Stripping away second outer photoresist patterns;

(I) Etching away the copper seed layers and adhesion metal layers;

(j) Laminating a dielectric material over the exposed copper features and vias, and (k) Planarizing and thinning down the dielectric material until the outer faces of the vias are exposed.

Optionally, steps (a) to (k) of claim 23 are repeated one or more times, thereby building up additional outer layers as desired.

Stage VII of terminating may comprise the steps of:

(I) Applying outer adhesion metal surface layers, such as titanium, chrome, or nickel chrome, for example, to outer layers of stacked structure;

(ii) Applying outer copper seed layers onto the outer adhesion metal surface layers;

(iii) Applying, exposing and developing photoresist layers to provide patterned structures;

(iv) Applying copper pads and lines within the patterned structures;

(v) Stripping away the photoresist layers;

(vi) Applying exposing and developing masking photoresist layers so as to mask the copper lines and copper seed layers and to expose copper pads to provide final metal patterning;

(vii) Electroplating termination layers onto exposed copper pads—the termination layers being fabricated from a metal selected from the list of nickel, gold, tin, lead, silver, palladium, nickel-gold, tin-silver and alloys thereof;

(viii) Stripping away the masking photoresist layers;

(ix) Removing exposed copper seed layers and exposed adhesion metal layers;

(x) Applying exposing and developing solder mask layers so to mask copper lines and expose termination metal layers.

Alternatively, stage VII of terminating the electronic support structure comprises the steps of:

(I) applying outer adhesion metal surface layers to outer layers of stacked structure;

(ii) applying outer copper seed layers onto the outer adhesion metal surface layers;

(iii) applying outer photoresist layers to the outer copper seed layers;

(iv) exposing and developing the outer photoresist layers to provide patterned structures;

(v) applying copper pads and lines within the patterned structures;

(vi) removing the outer photoresist layers;

(vii) removing exposed copper seed layers and exposed adhesion metal layers;

(viii) applying exposing and developing solder mask layers so to mask copper lines and expose copper pads, and (ix) electroless plating termination layers onto exposed copper pads, said termination layers being fabricated from a metal selected from the list of nickel, gold, tin, lead, silver, palladium, nickel-gold, tin-silver, alloys and tarnish resistant polymer materials.

In a further aspect, the present invention is directed to a structure having an even number of feature layers, as fabricated by the method hereinabove.

In a further aspect, the present invention is directed to a structure having an odd number of feature layers, as fabricated by the method hereinabove.

In a further aspect, the present invention is directed to a structure fabricated by the method hereinabove that is substantially symmetrical.

BRIEF DESCRIPTION OF THE FIGURES

For a better understanding of the invention and to show how it may be carried into effect, reference will now be made, purely by way of example, to the accompanying drawings.

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention; the description taken with the drawings making apparent to those skilled in the art how the several forms of the invention may be embodied in practice.

In particular, it will be noted that the cross-sections of the various layers and stacks are schematic illustrations only and are not to scale, with thicknesses being greatly exaggerated. Also, the substrates and fabrication techniques described herein are applicable to a large number of end products, and no attempt has been made to show the structure of the conductive features within each layer.

Figure 1:
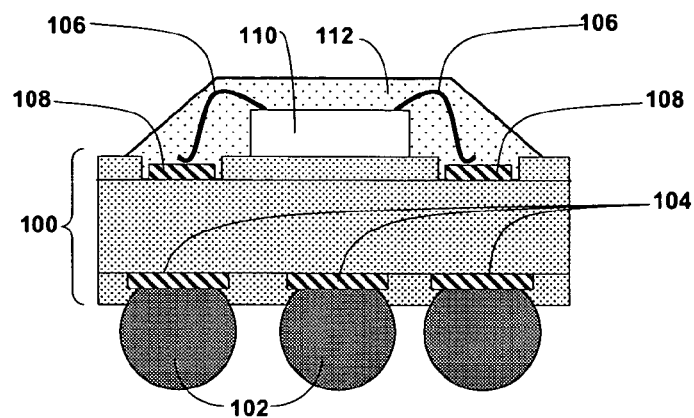
Figure 2:
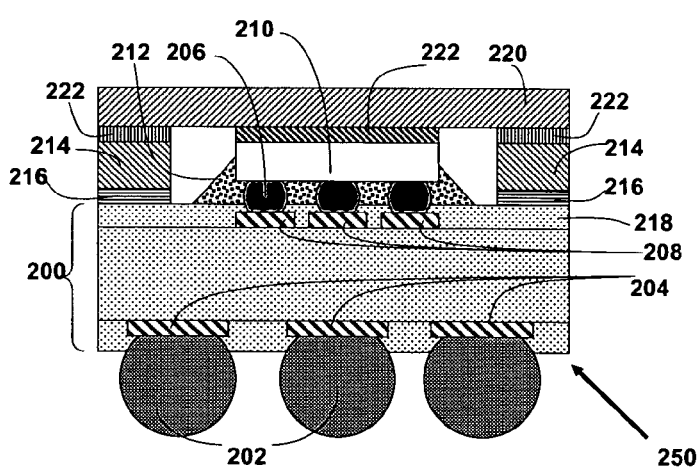
Figure 3:
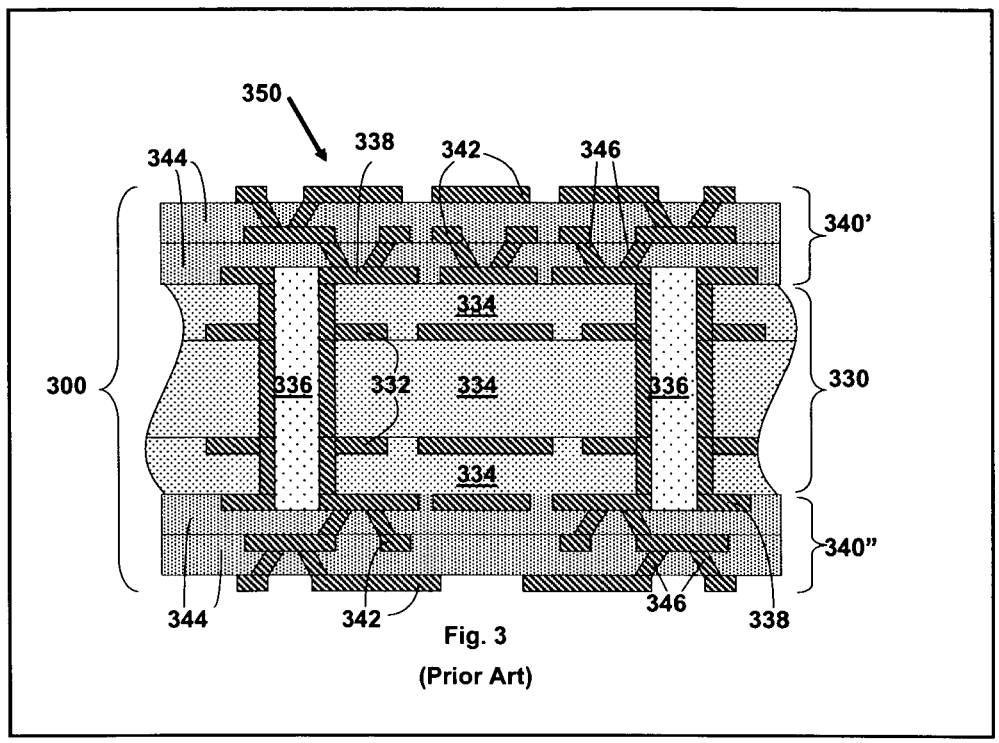
Figure 4:
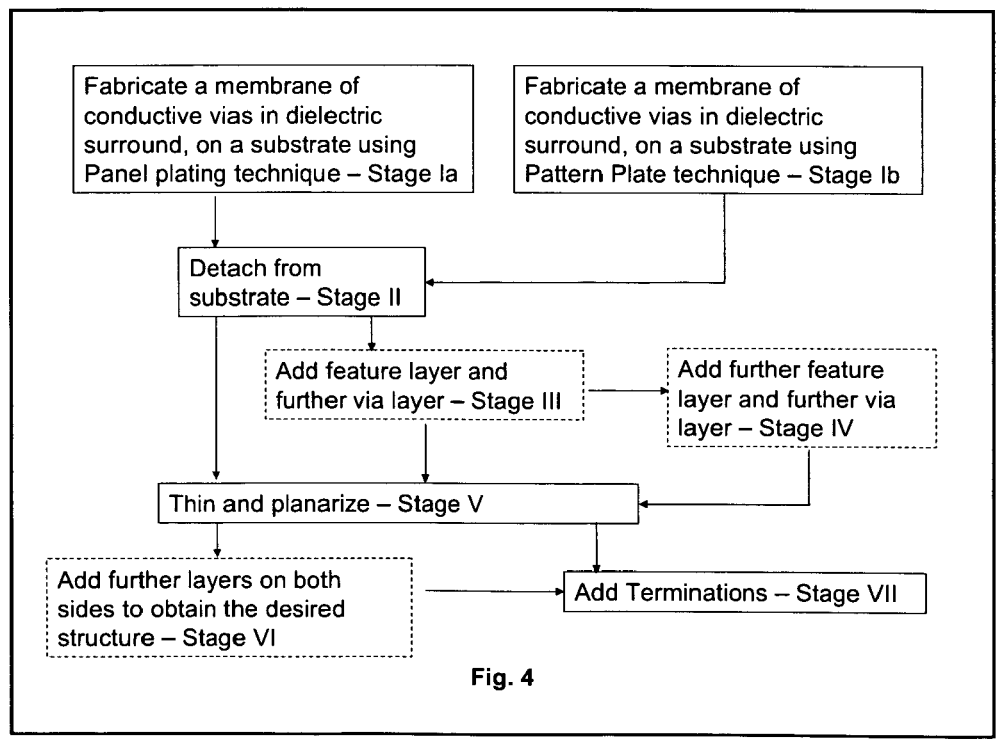
Figure 5A:
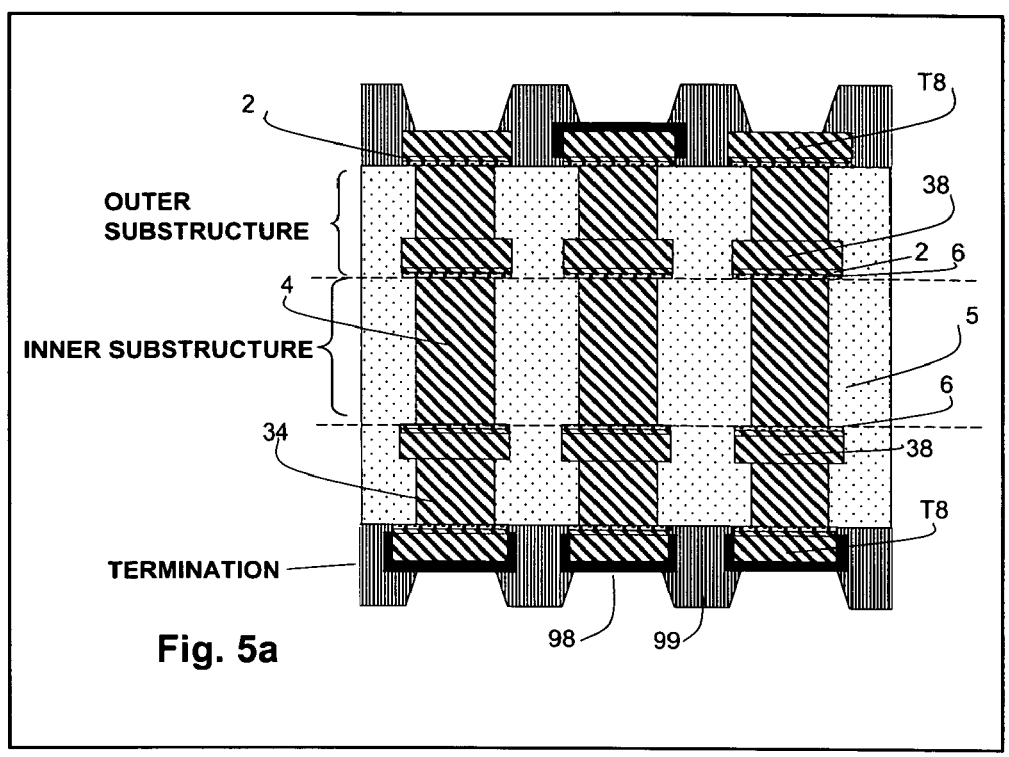
Figure 5B:
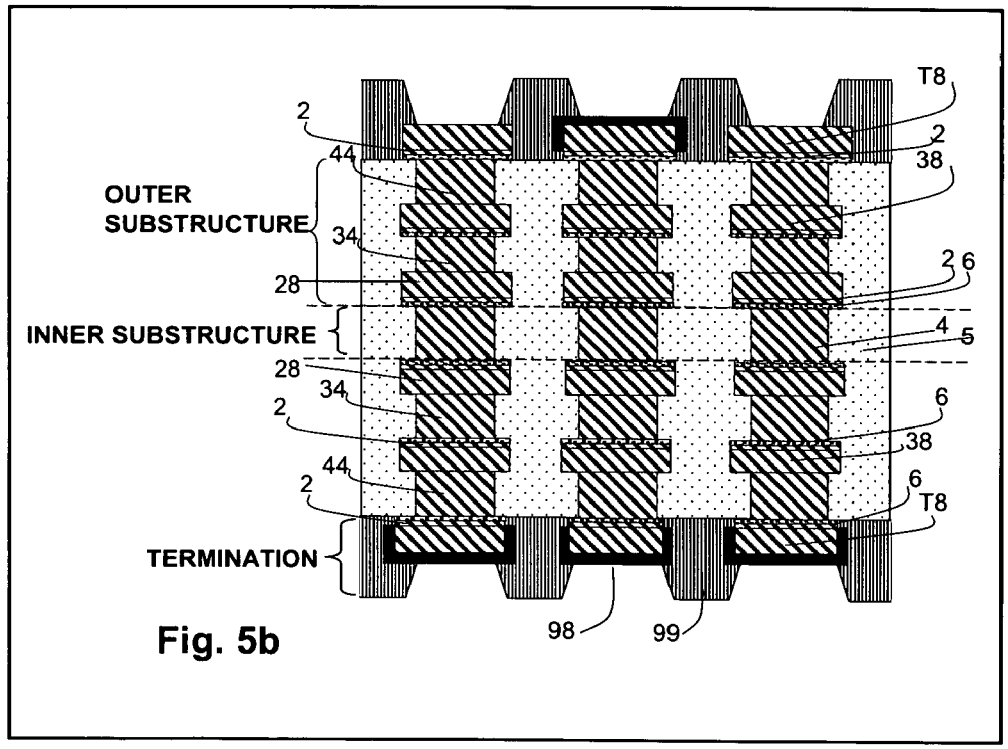
Figure 6:
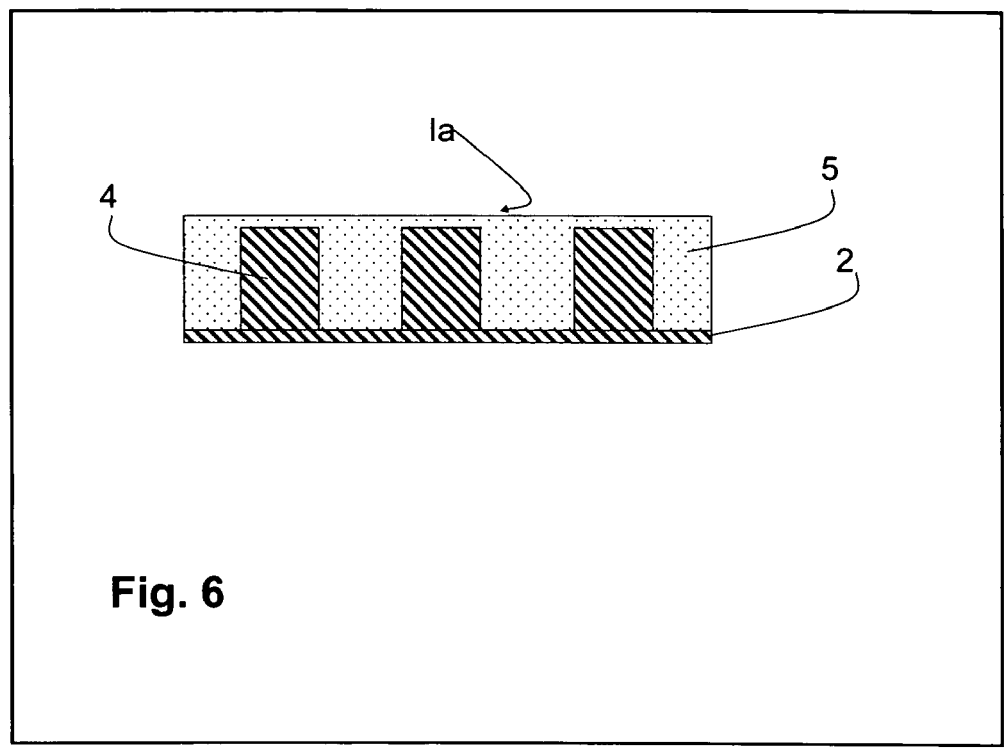
Figure 8:
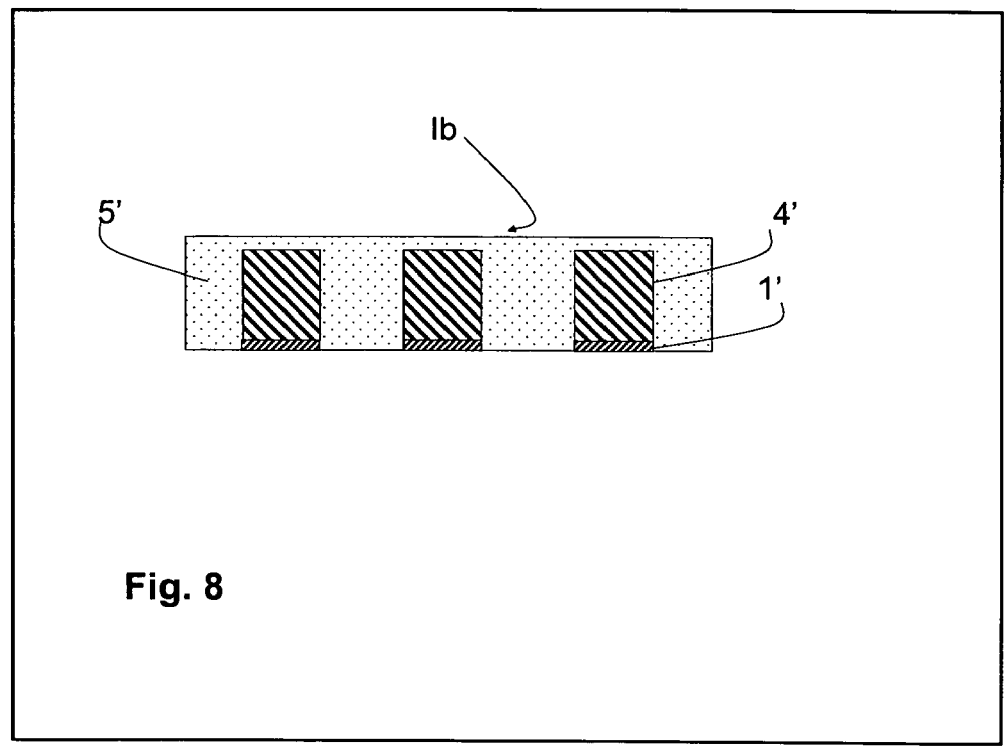
Figure 7:
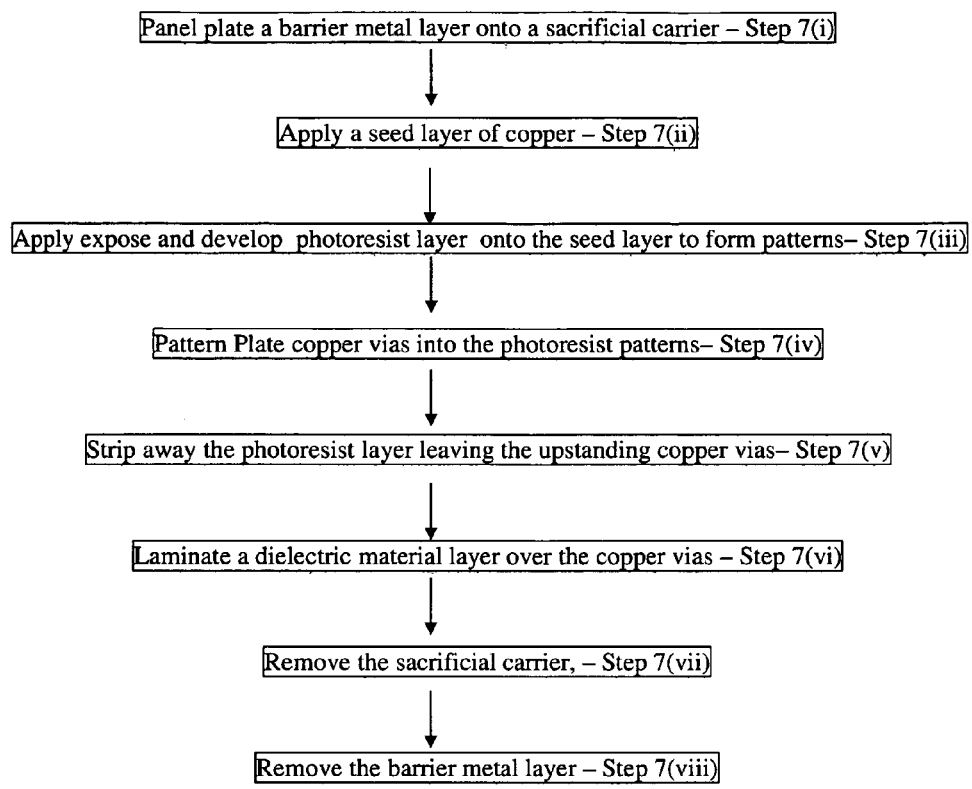
Figure 7I:
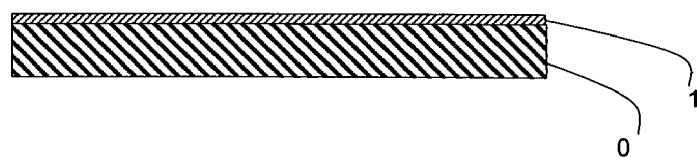
Figure 7:
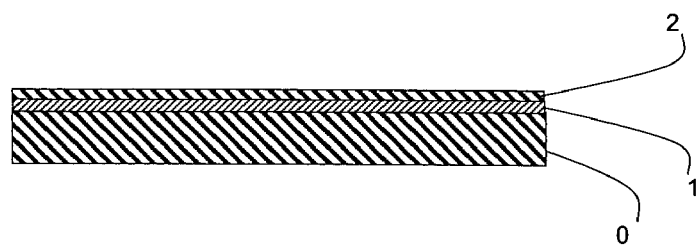
Figure 7:
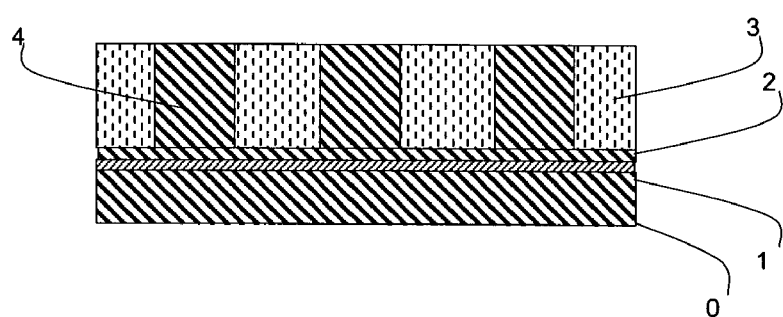
Figure 7V:
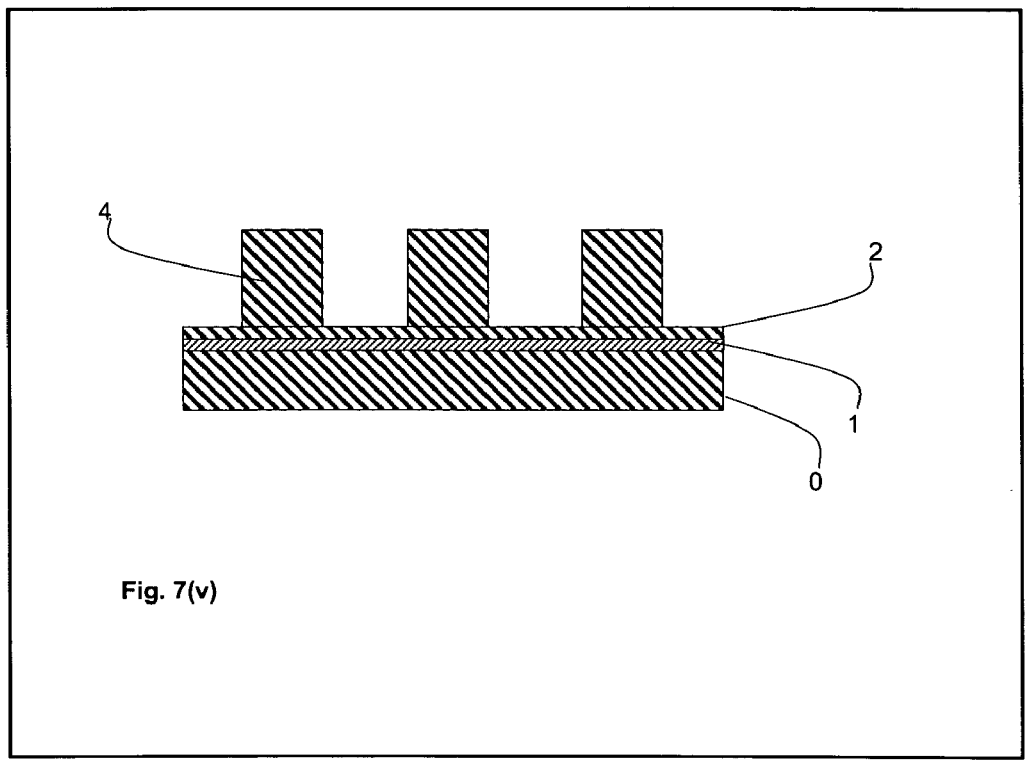
Figure 7:
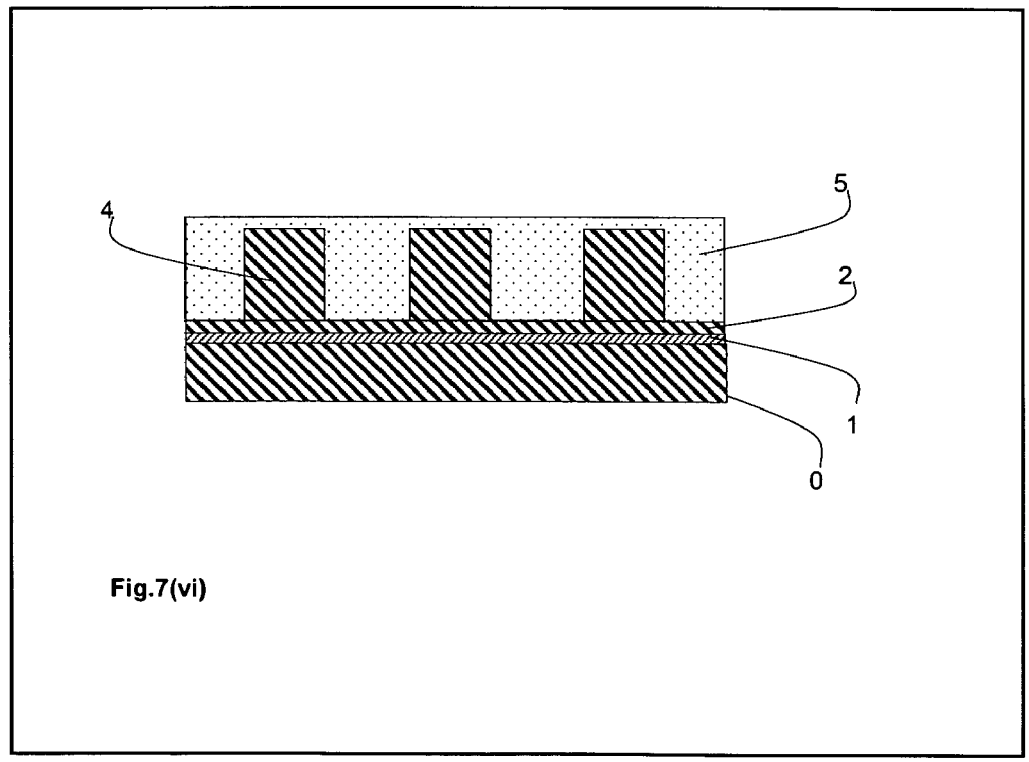
Figure 9:
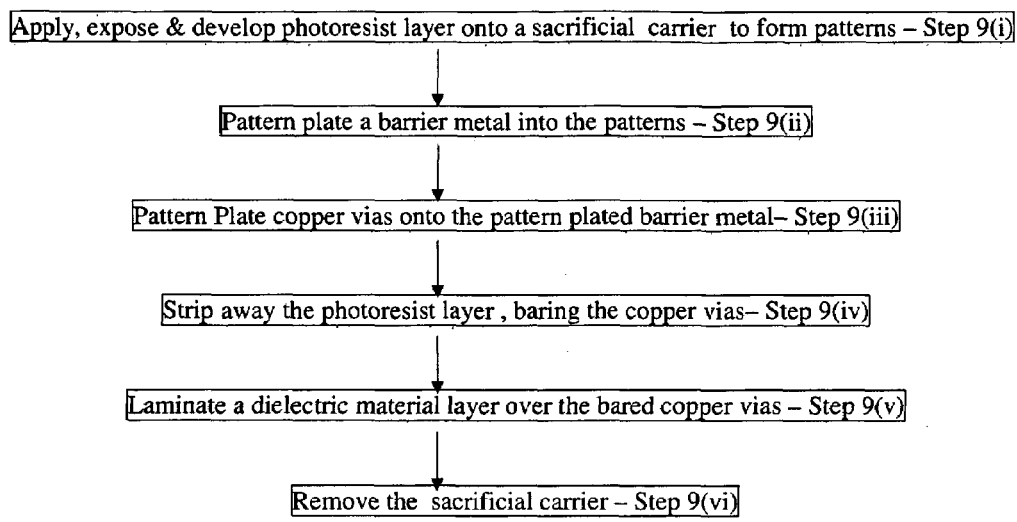
Figure 9I:
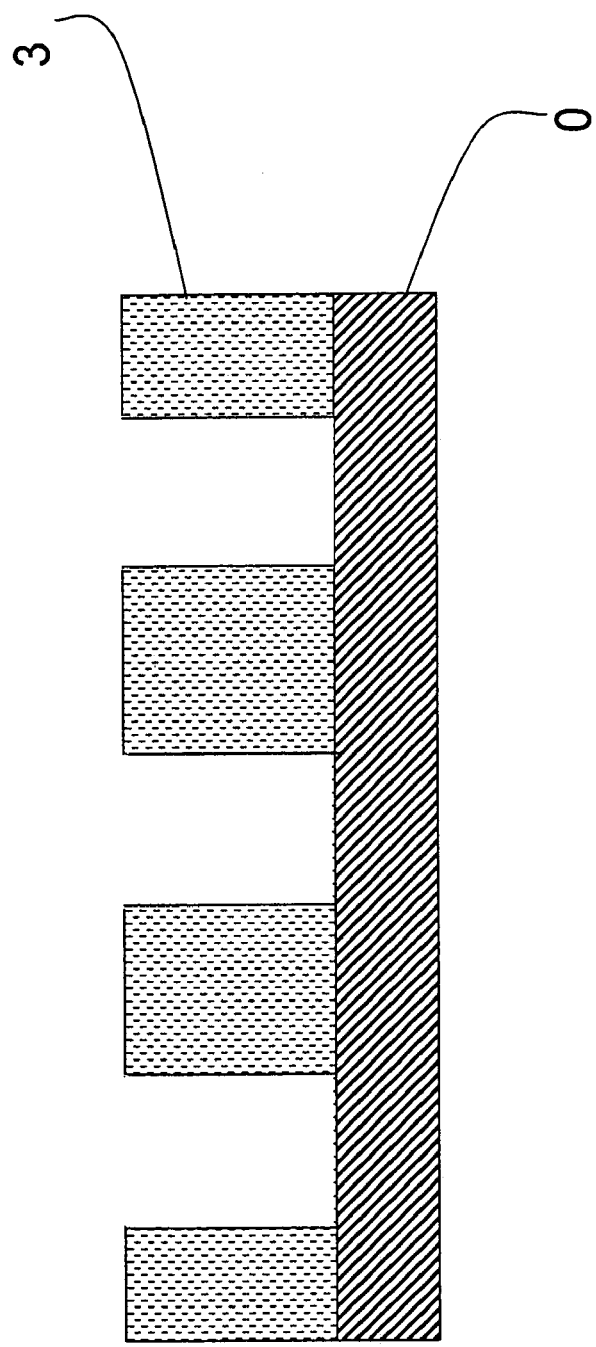
Figure 9:
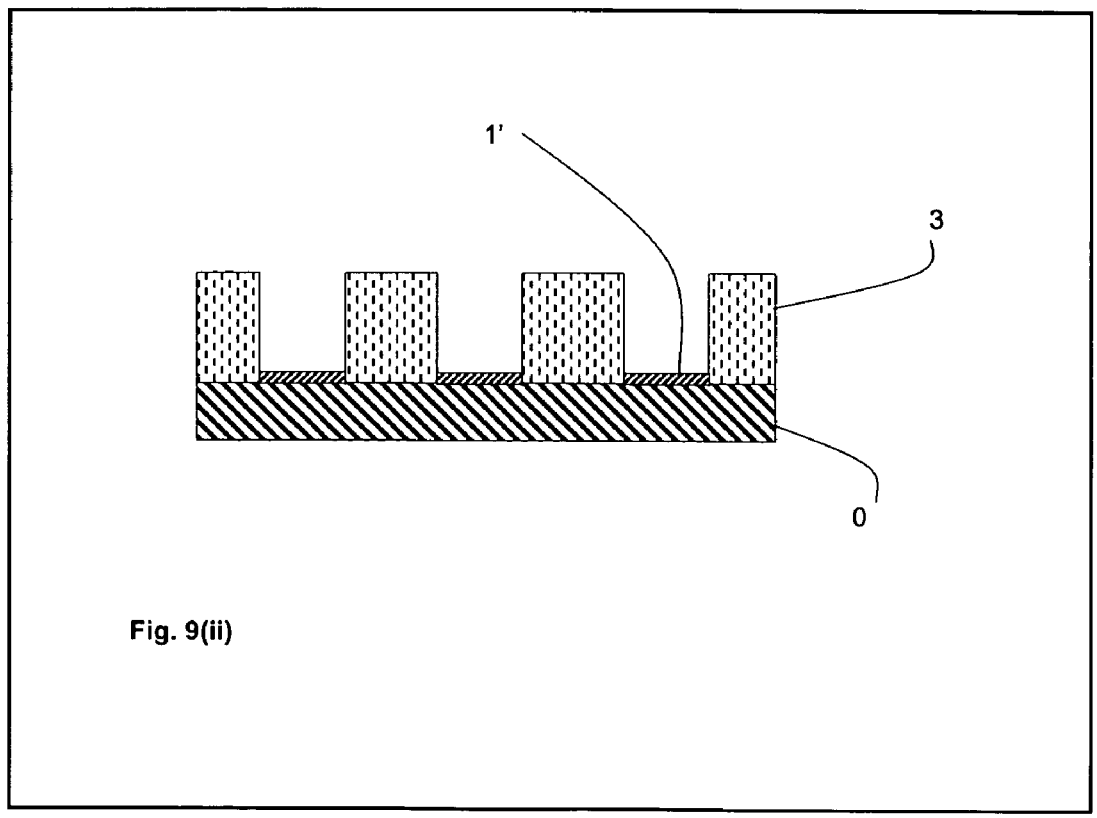
Figure 9:
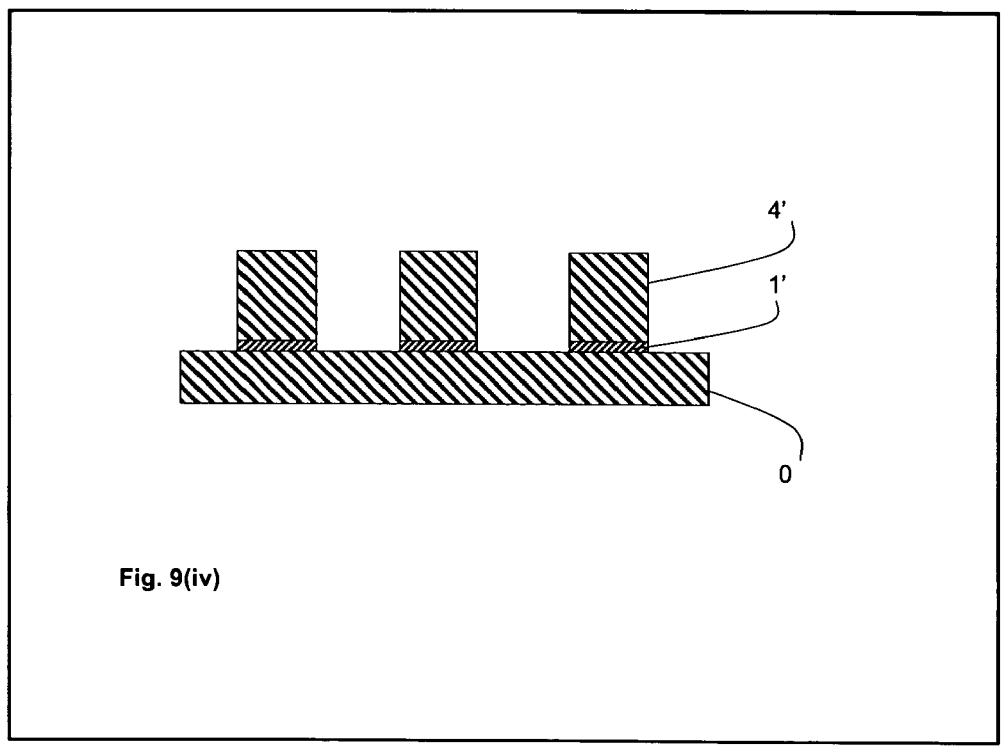
Figure 10:
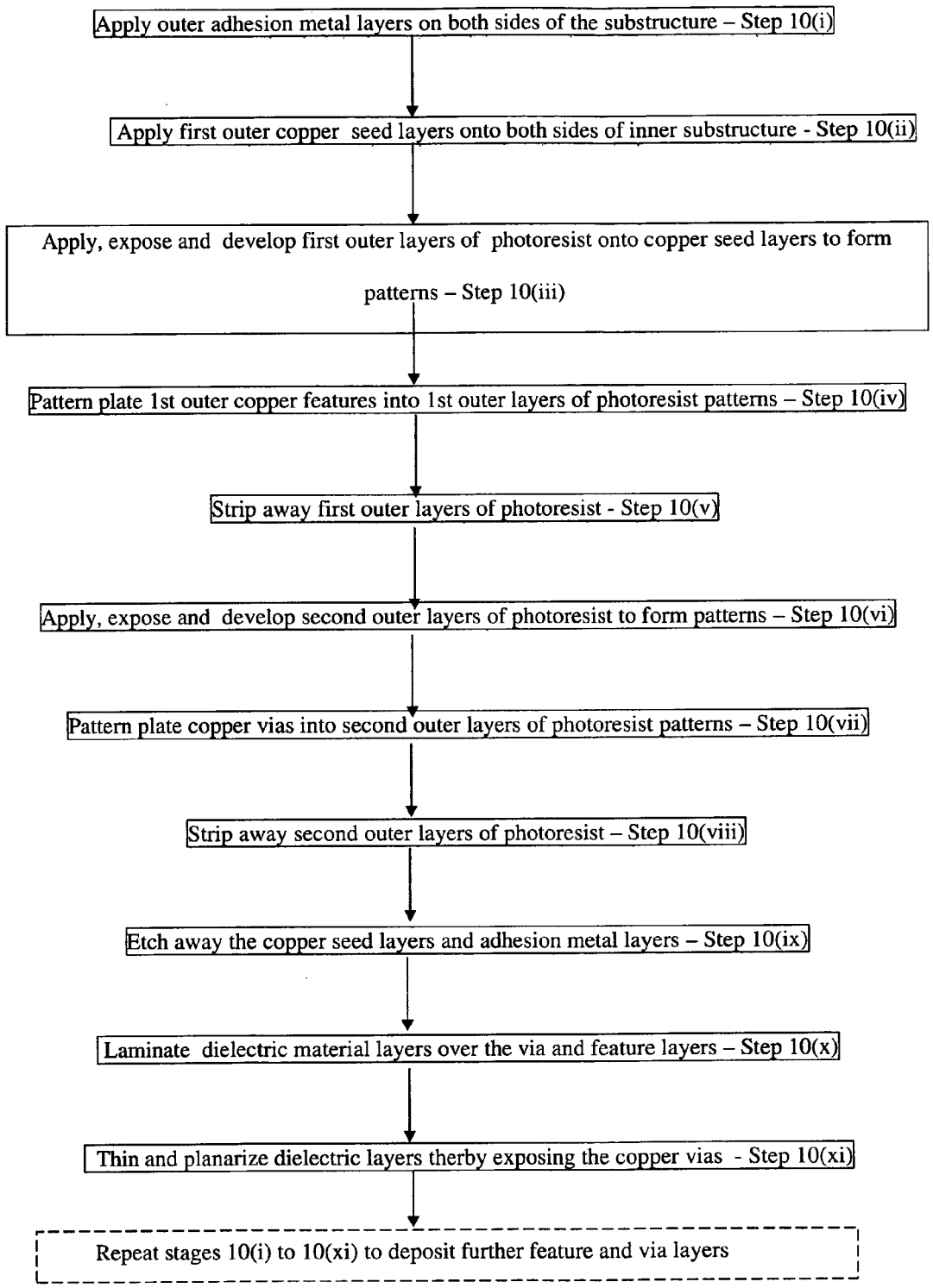
Figure 10I:
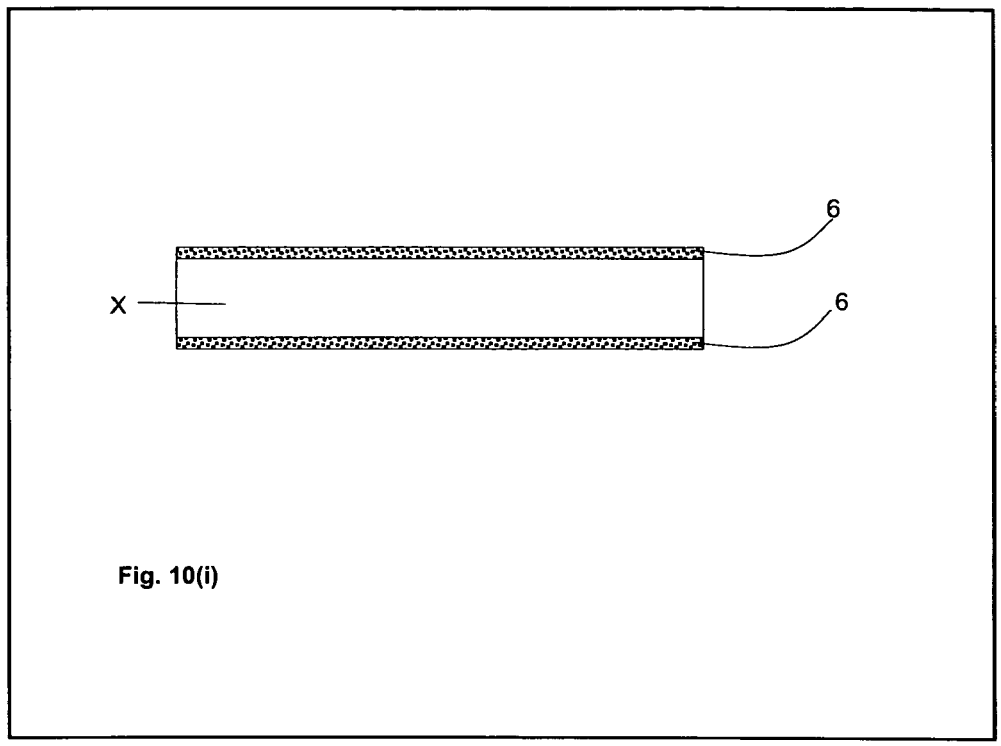
Figure 10:
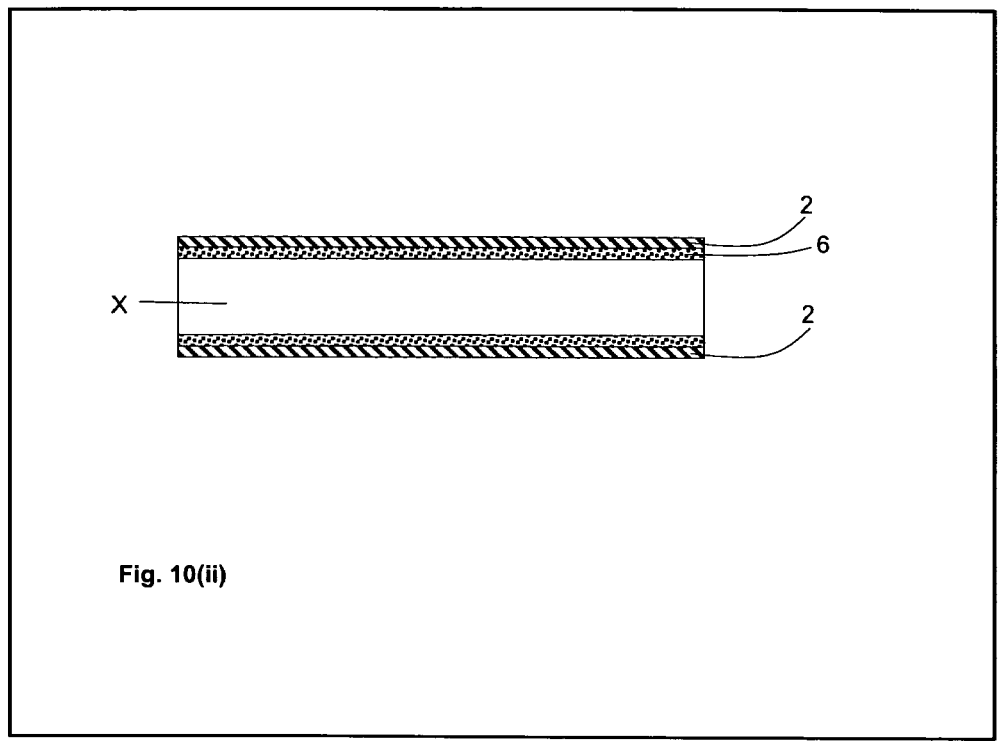
Figure 10:
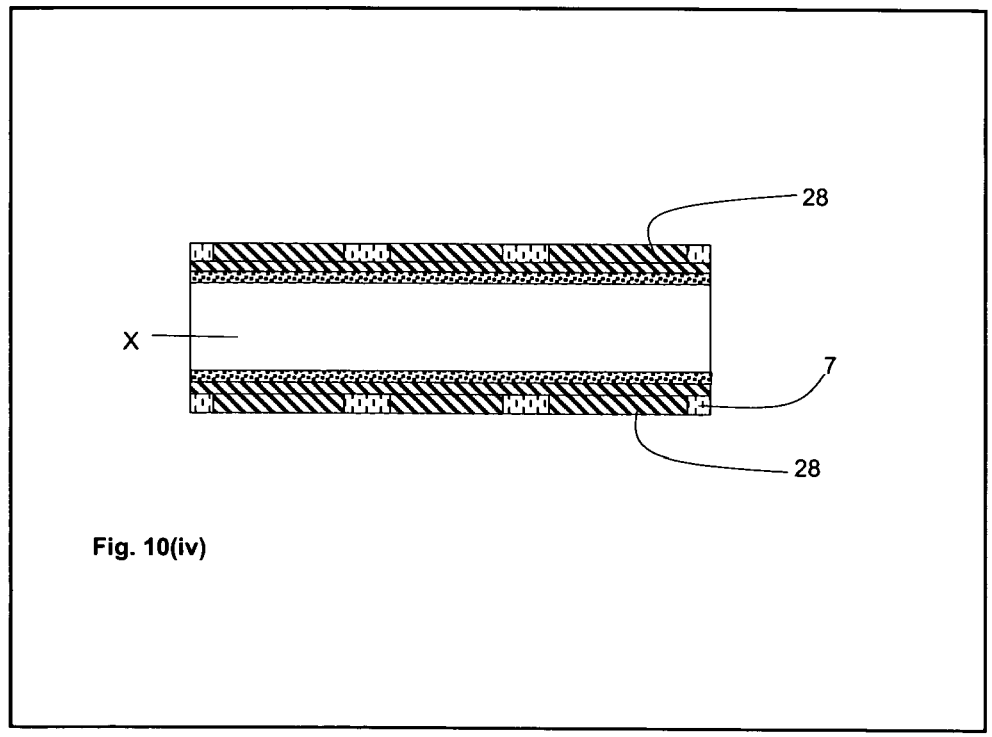
Figure 10V:
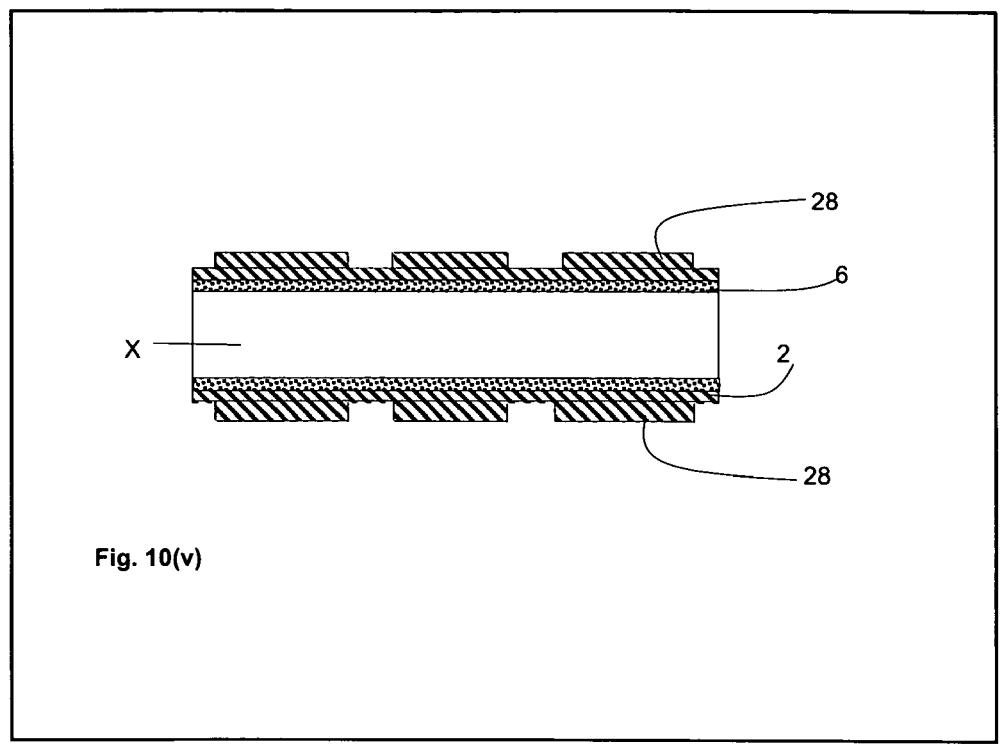
Figure 10:
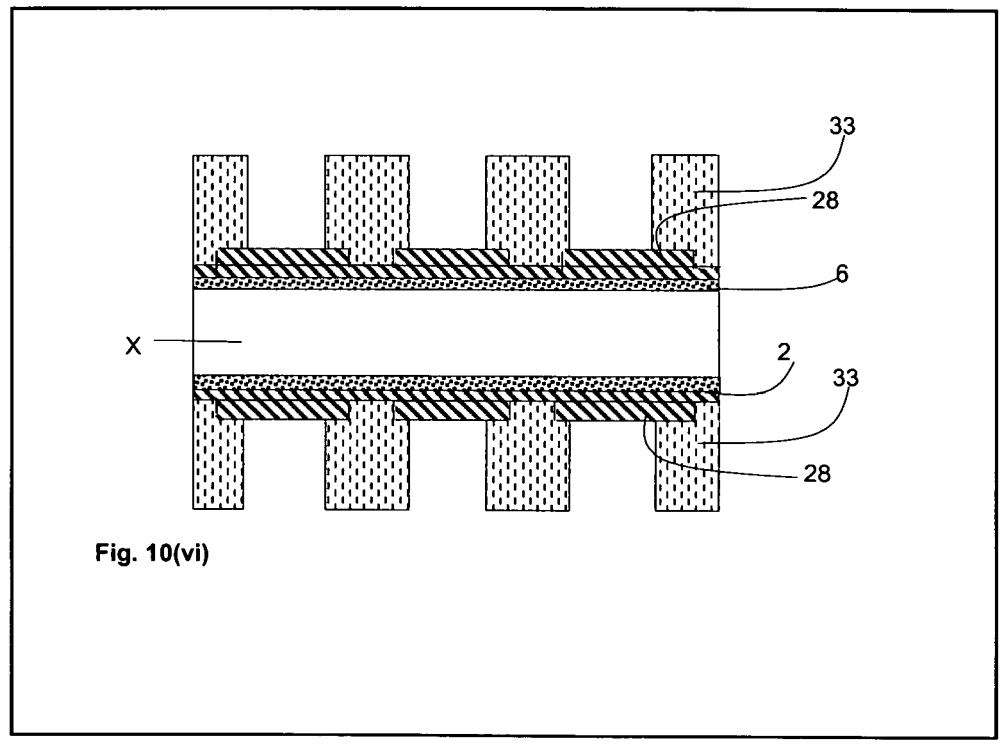
Figure 10:
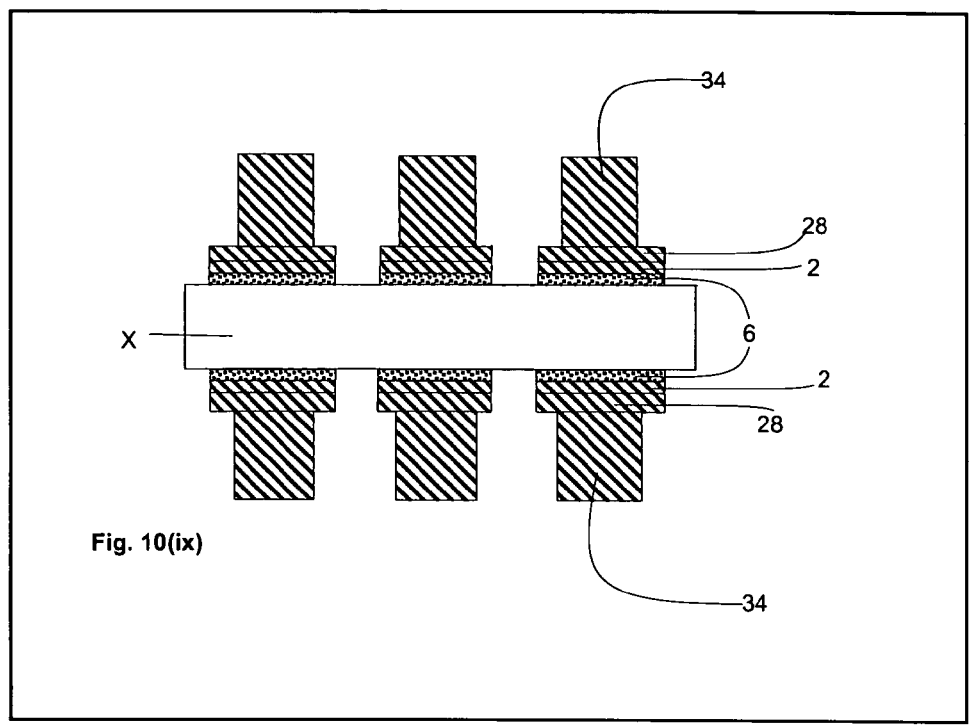
Figure 10X:
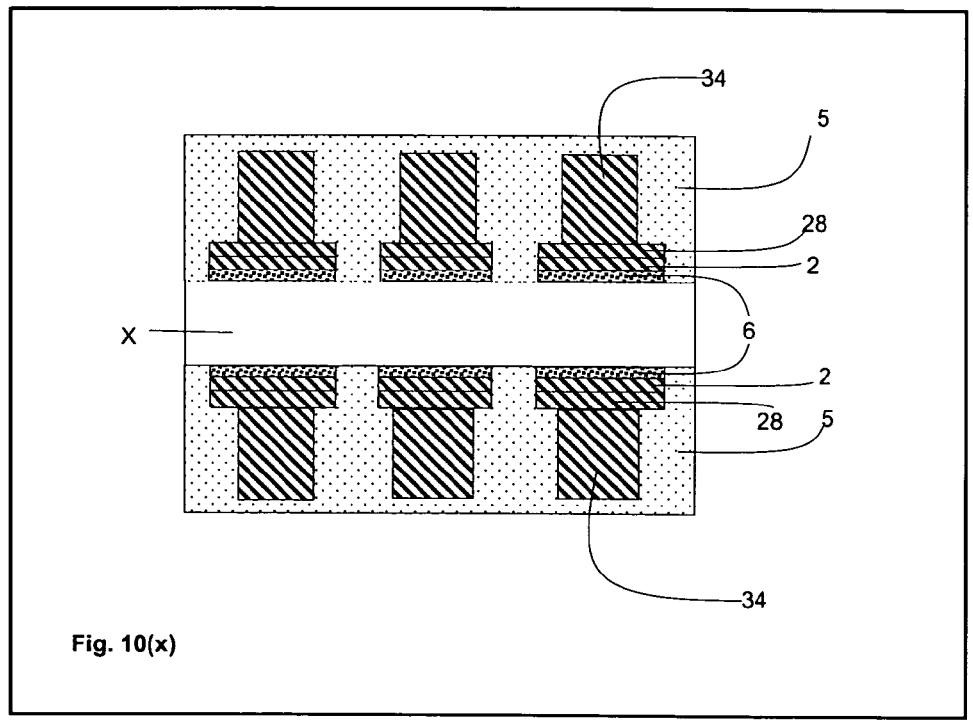
Figure 10:
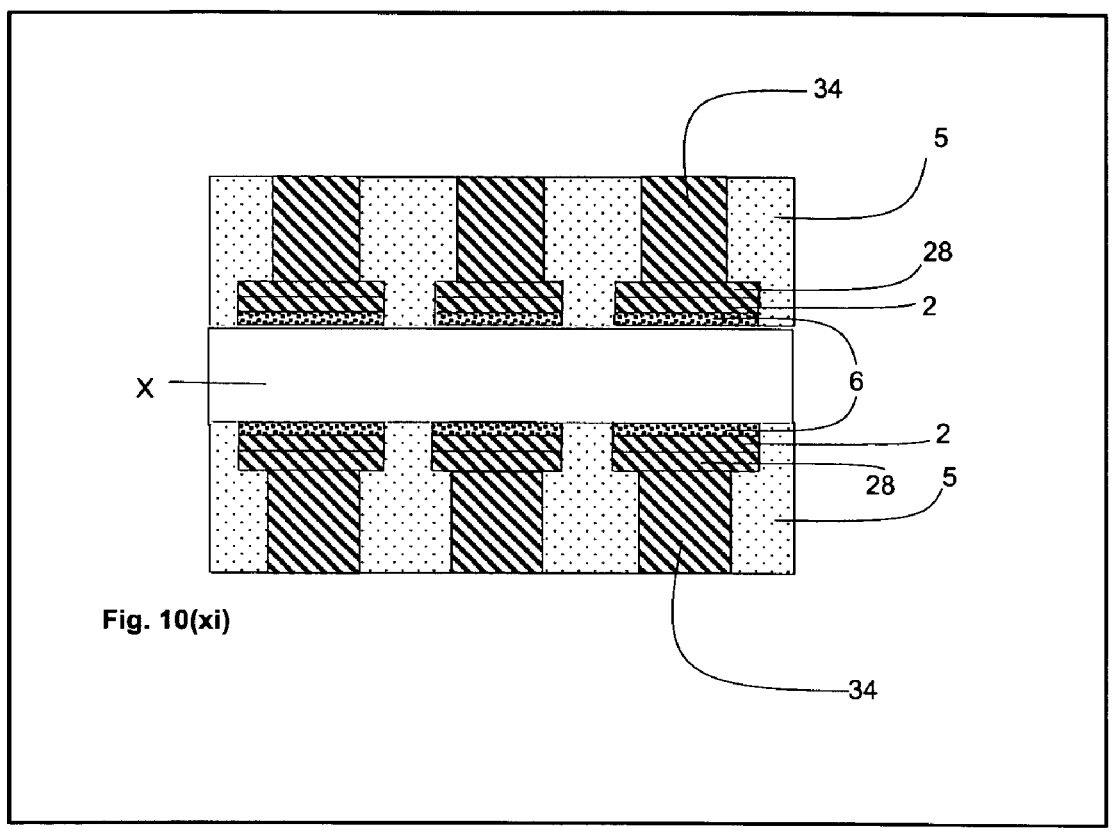
Figure 11:
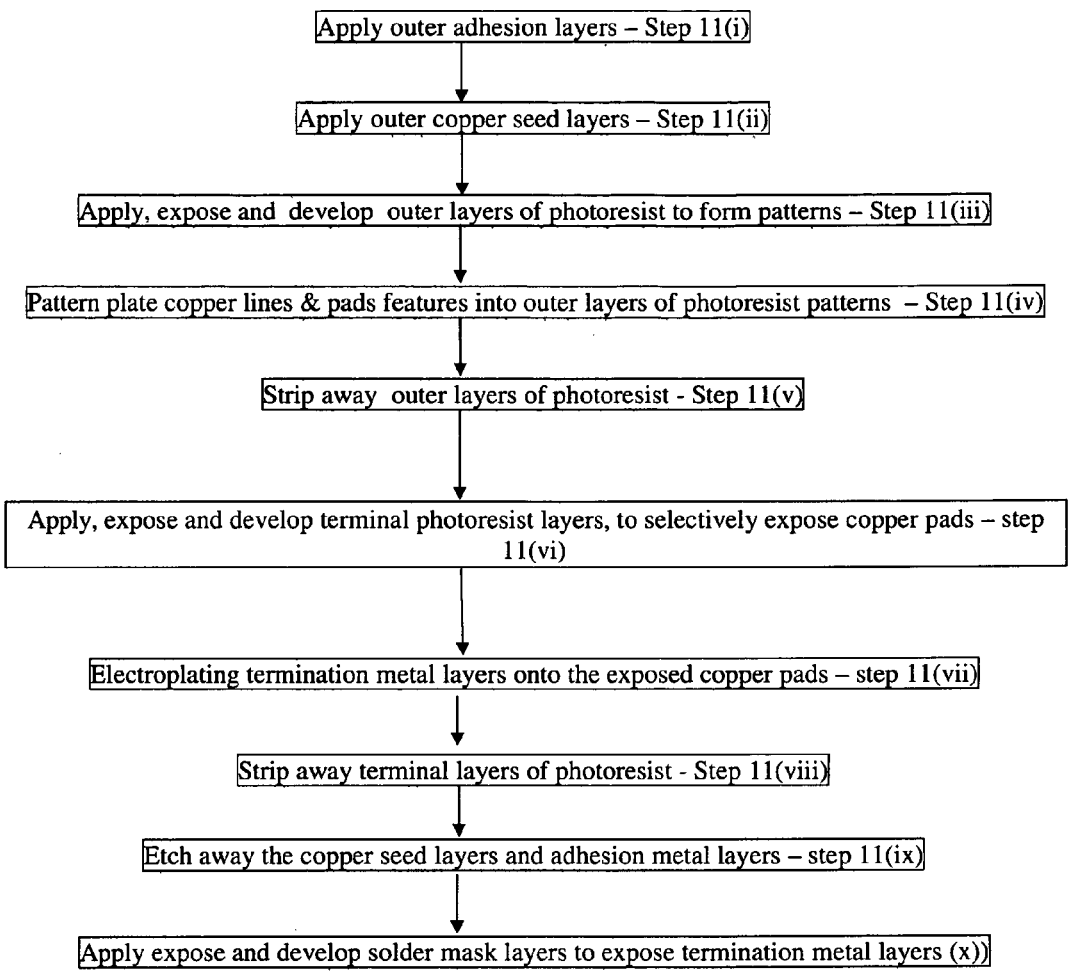
Figure 11I:
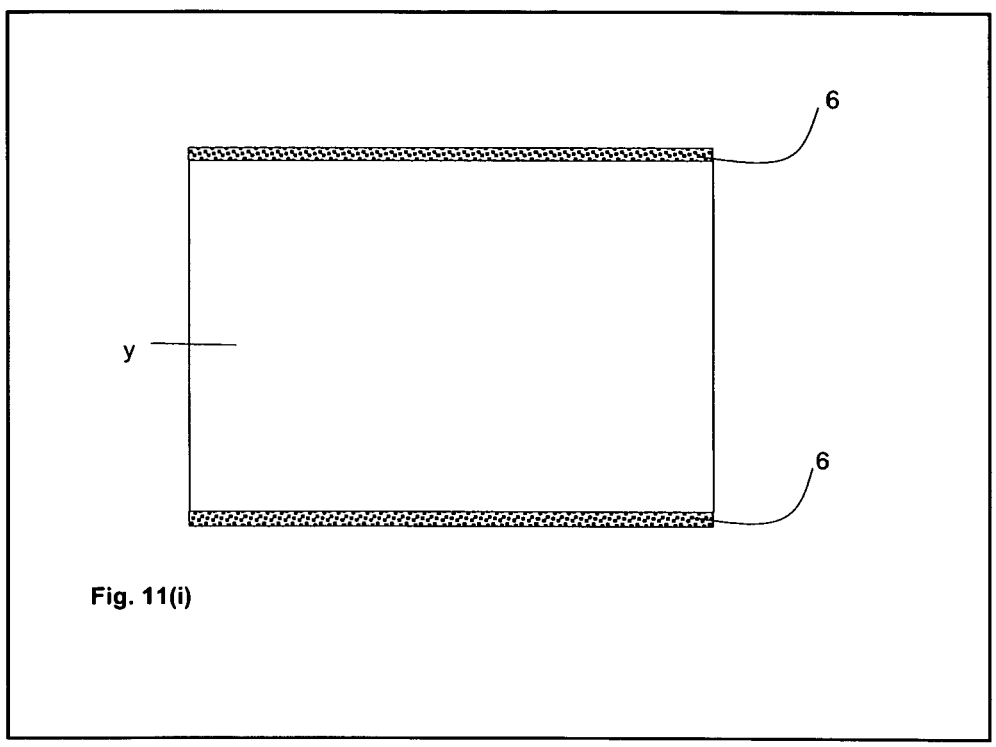
Figure 11:
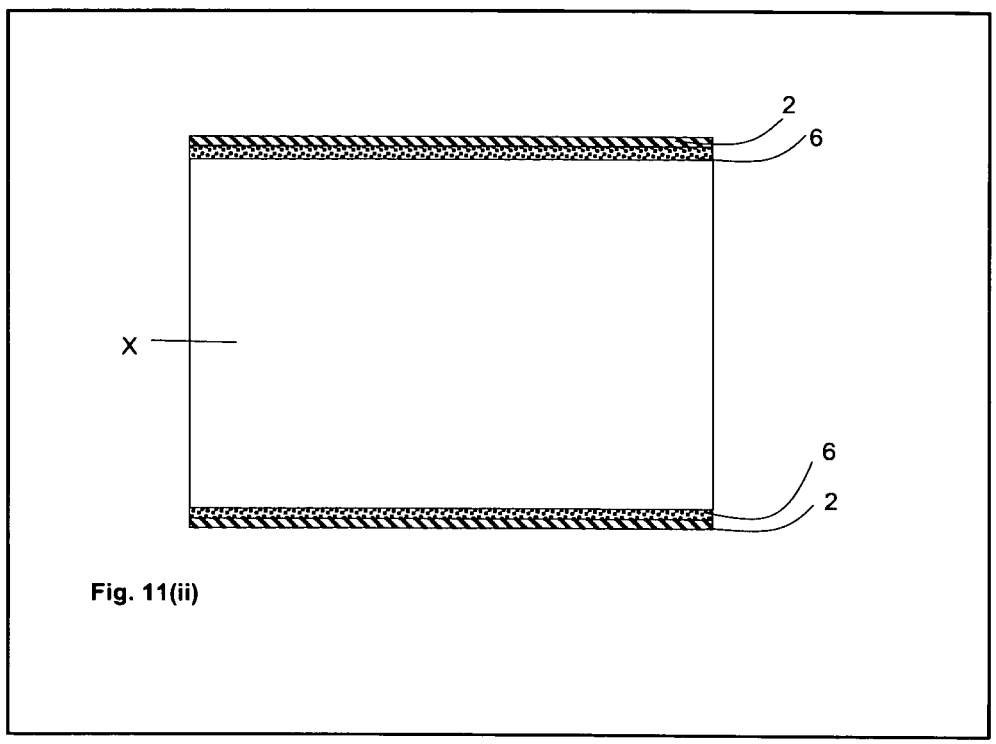
Figure 11:
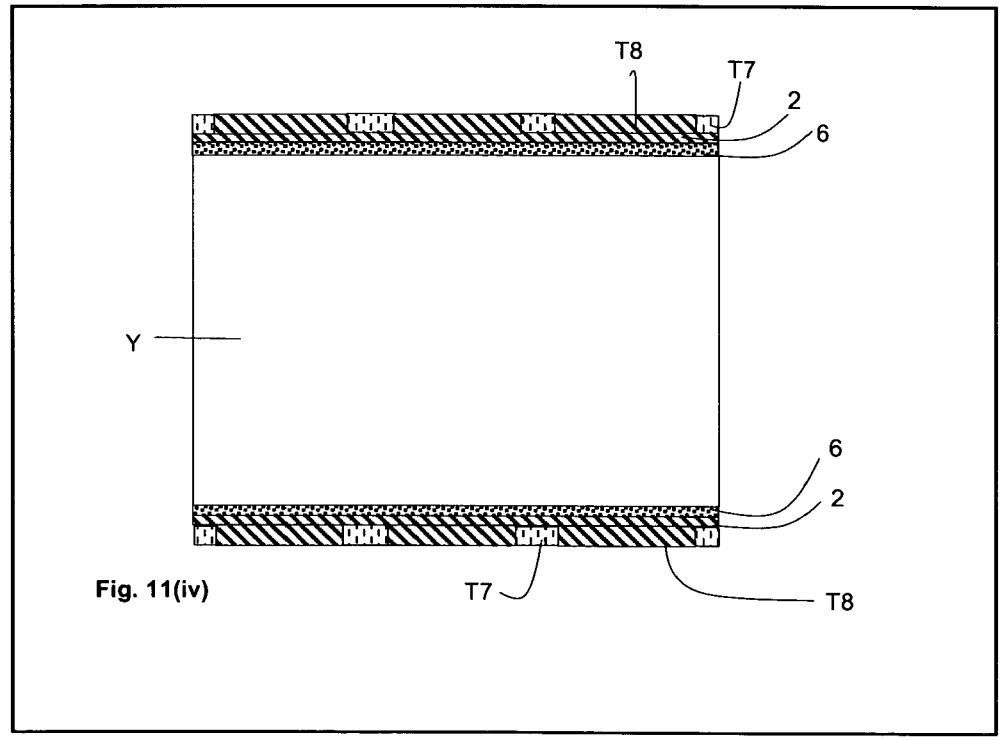
Figure 11V:
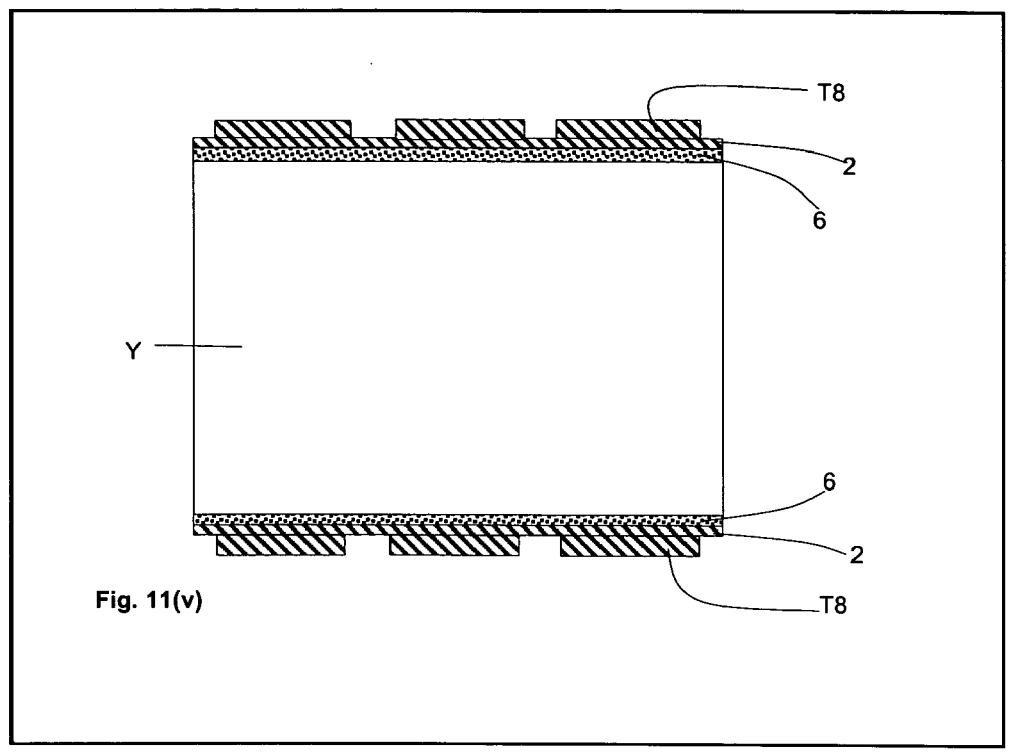
Figure 11:
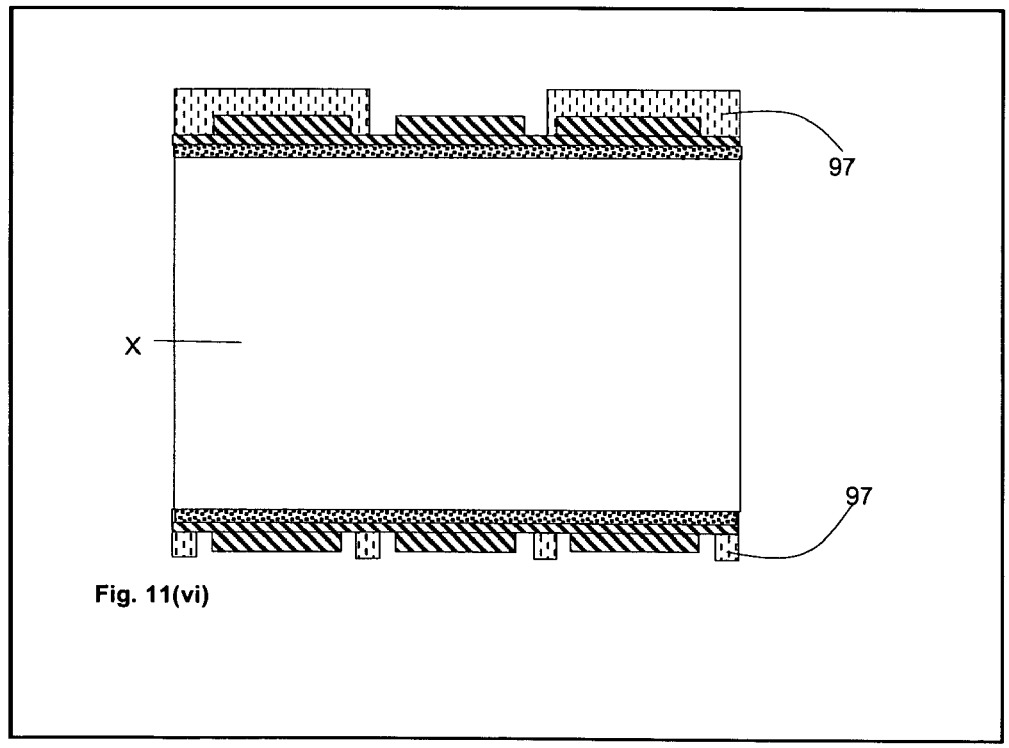
Figure 11:
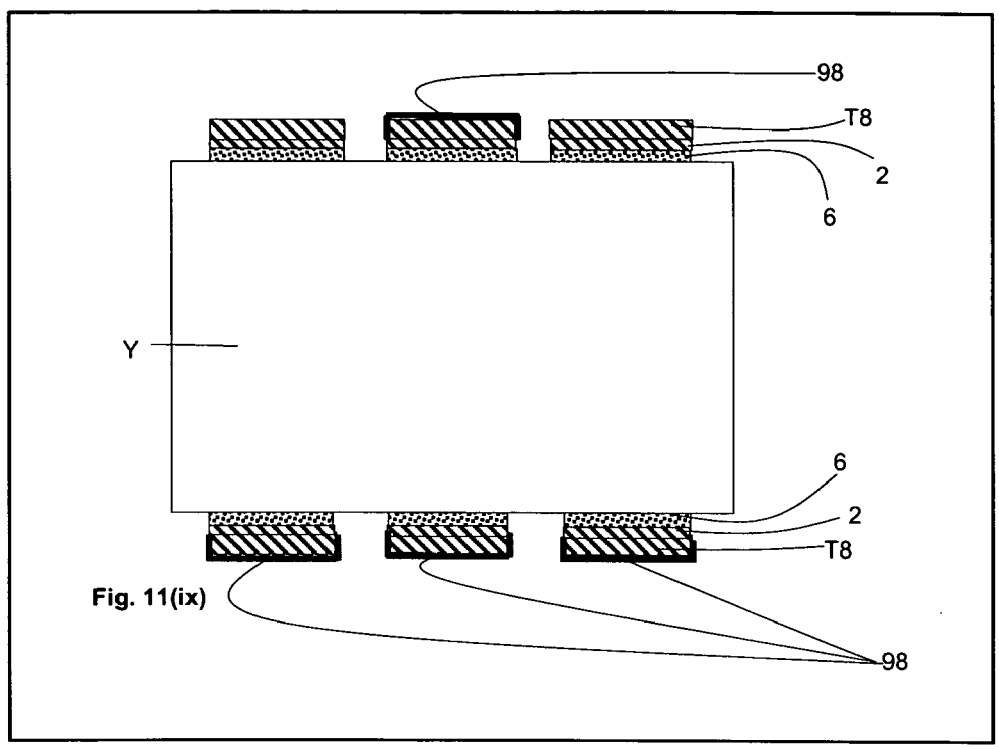
Figure 11X:
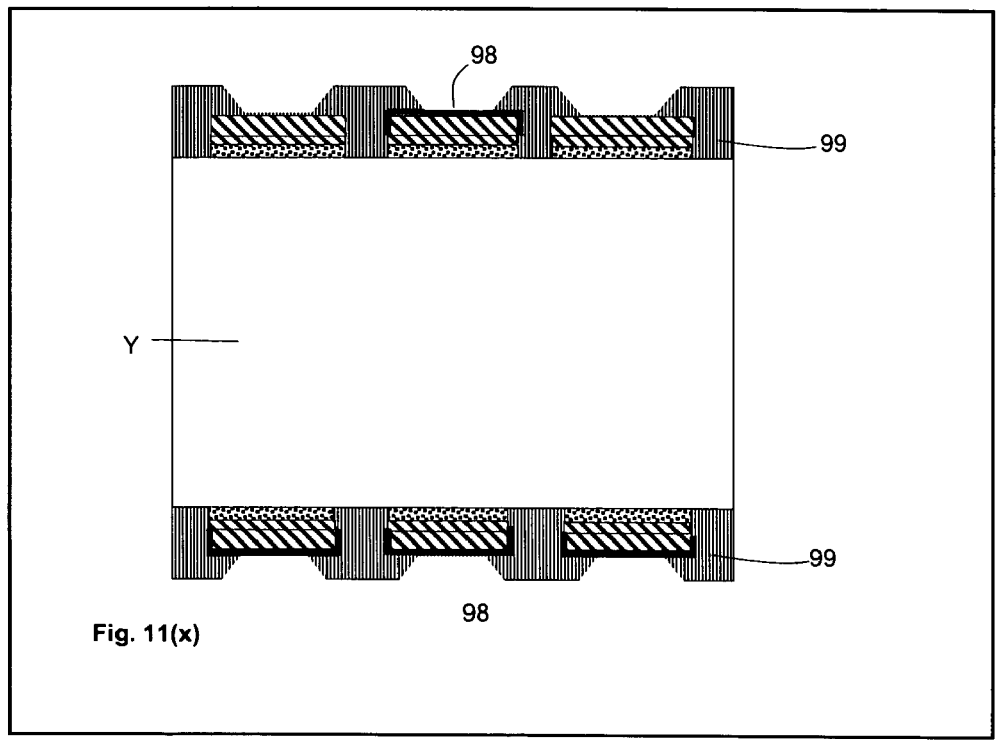
Figure 12:
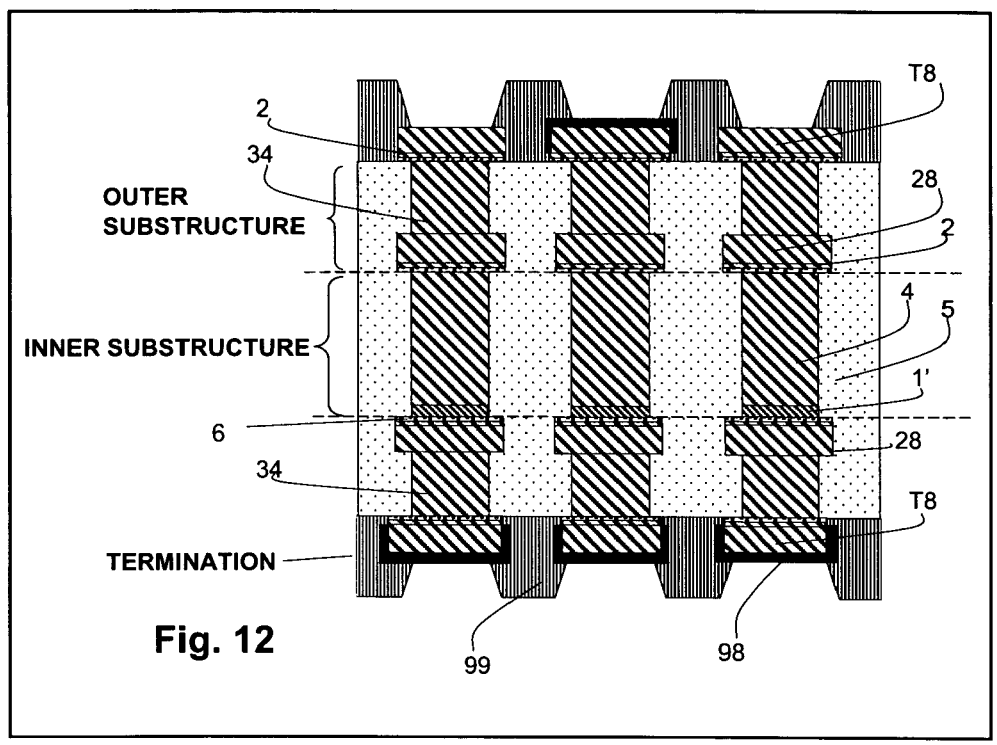
Figure 14:
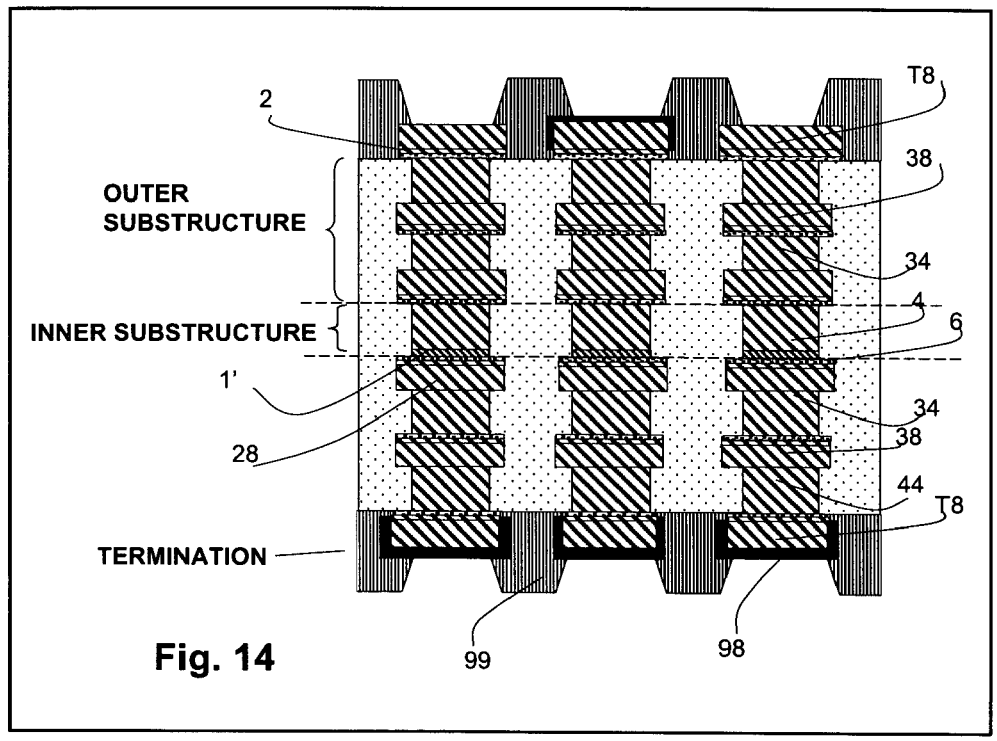
Figure 13:
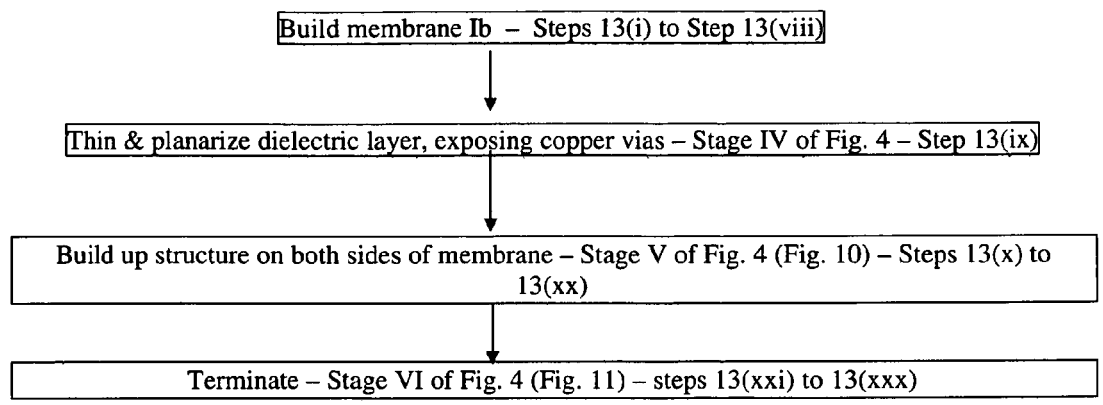
Figure 14A:
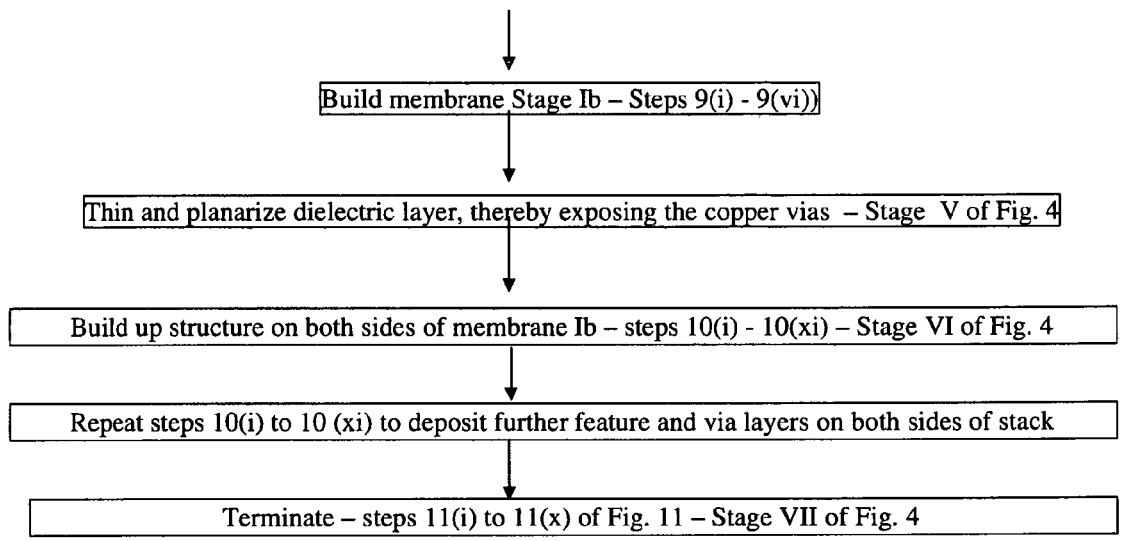
Figure 13I:
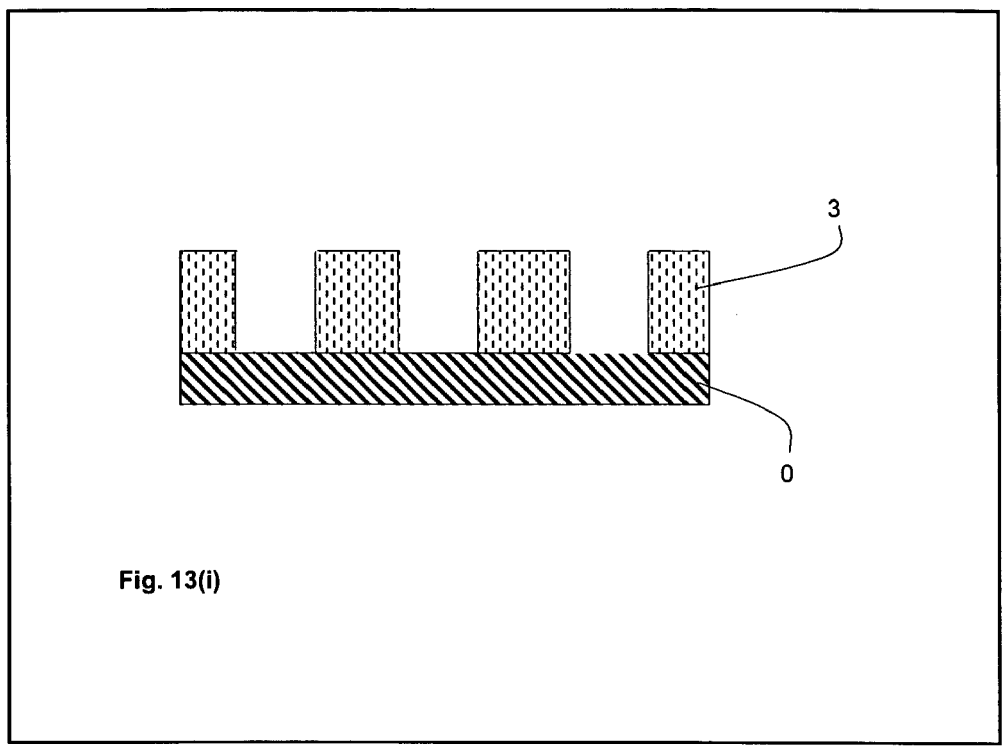
Figure 13:
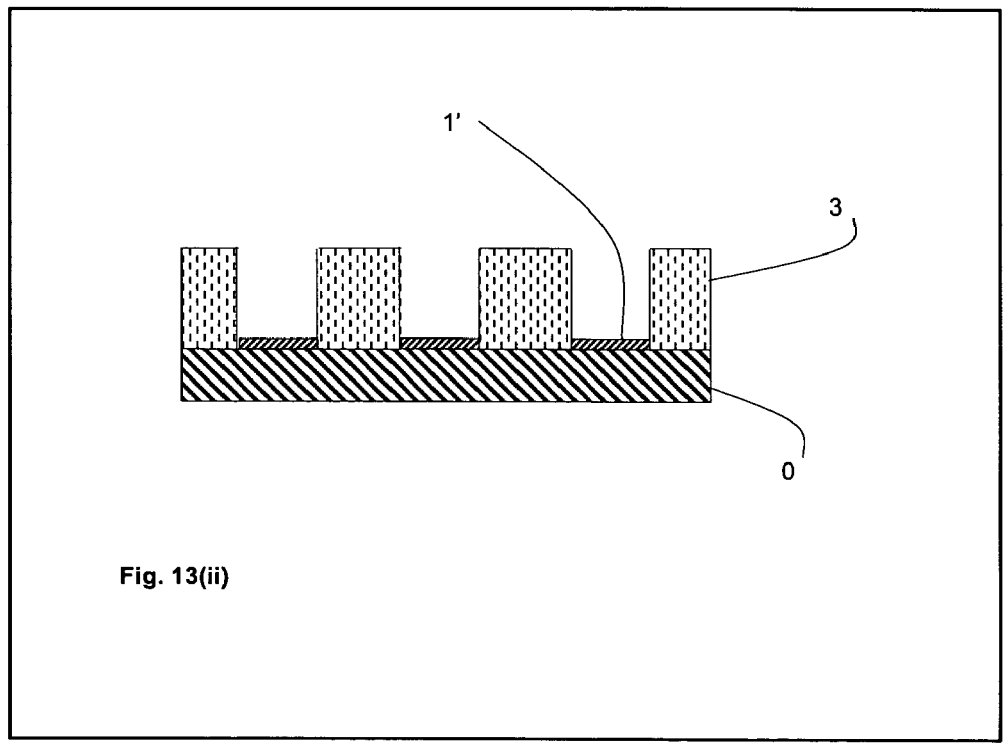
Figure 13:
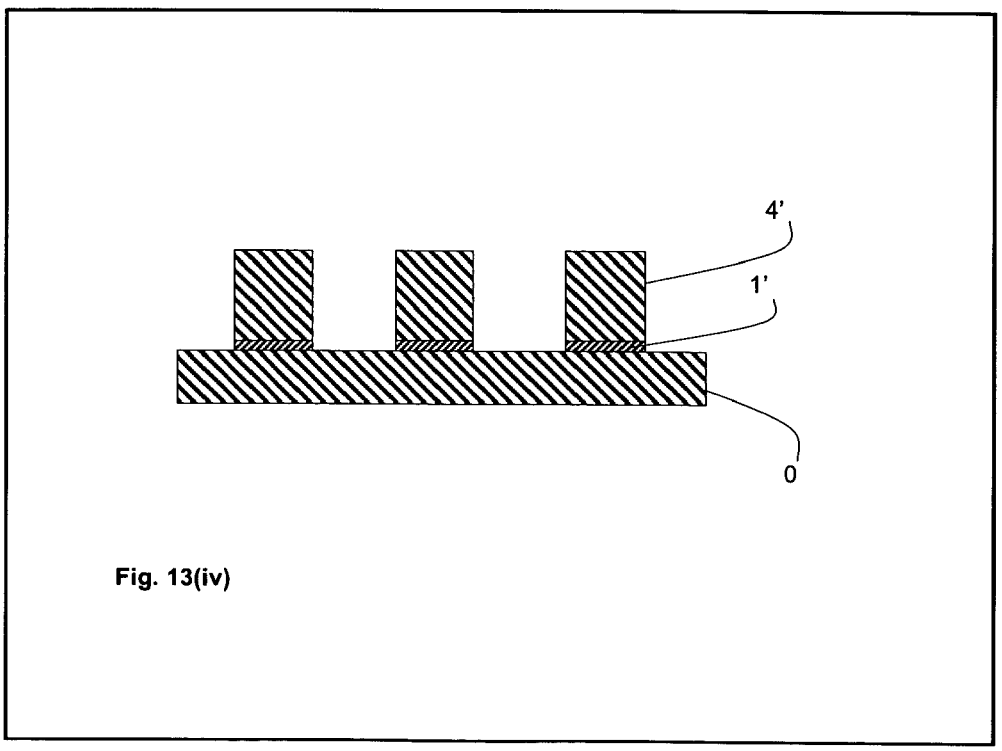
Figure 13V:
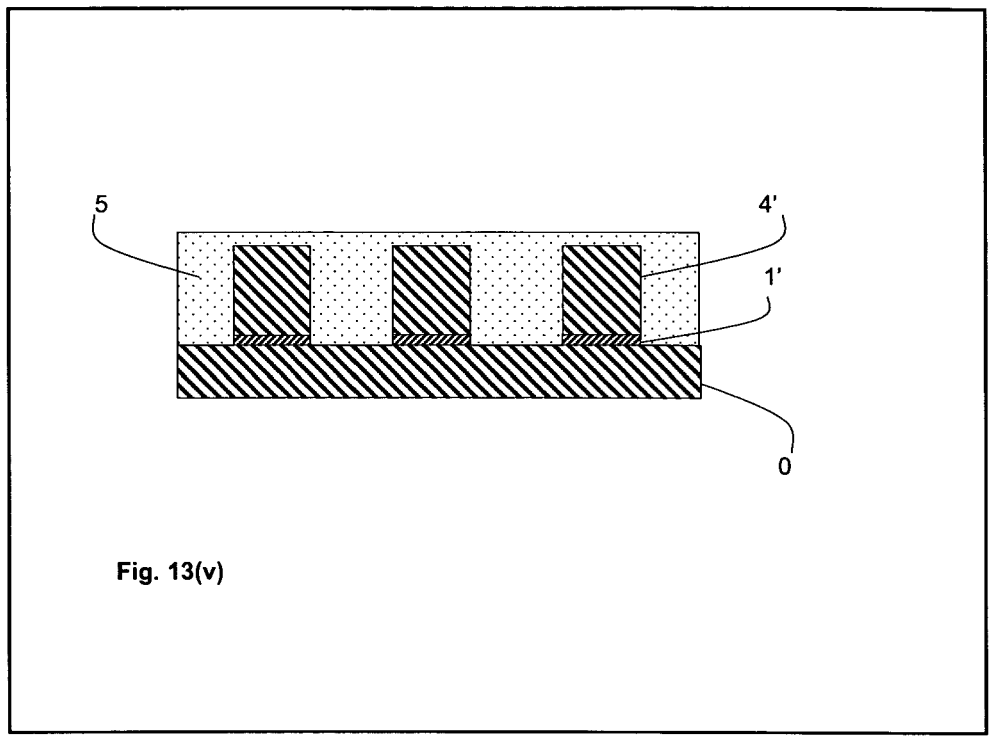
Figure 13:
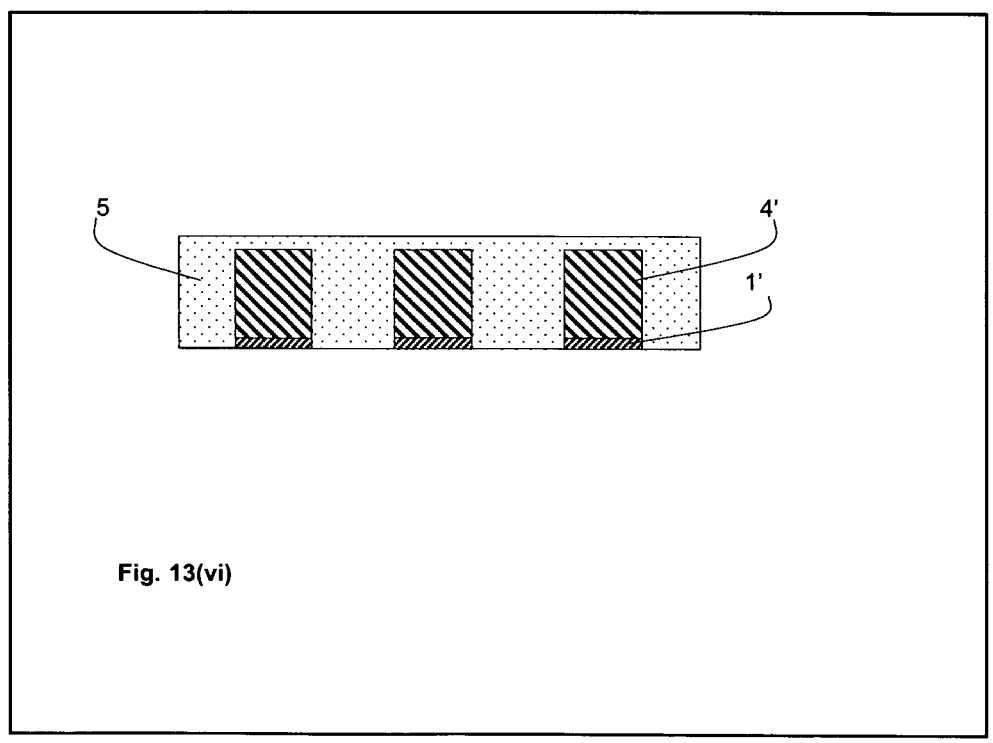
Figure 13:
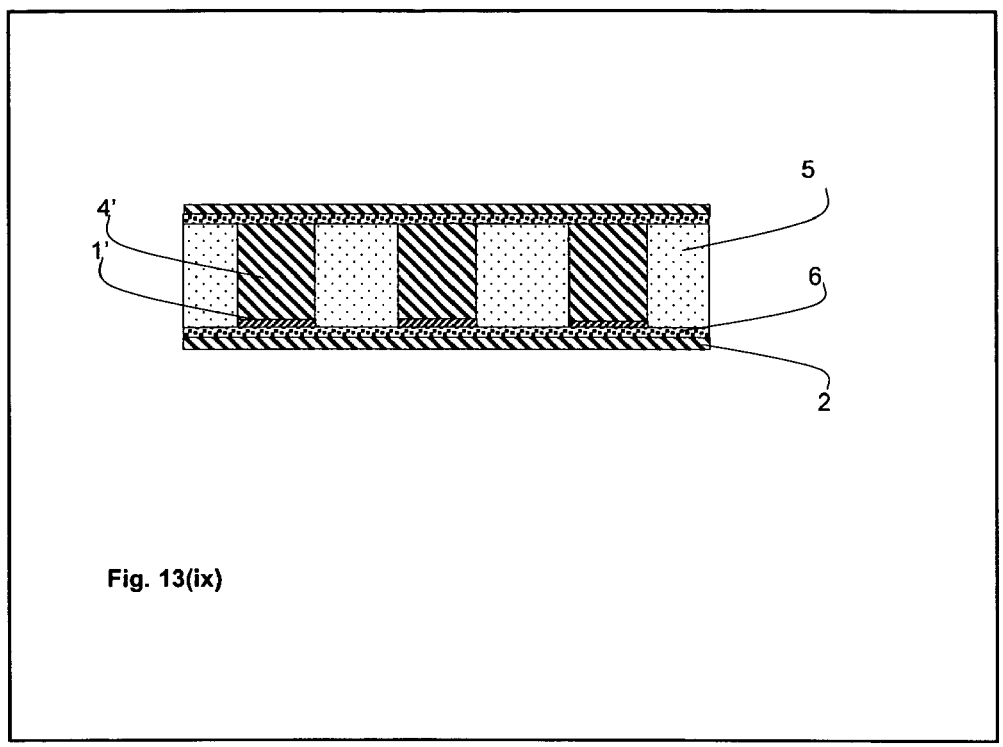
Figure 13X:
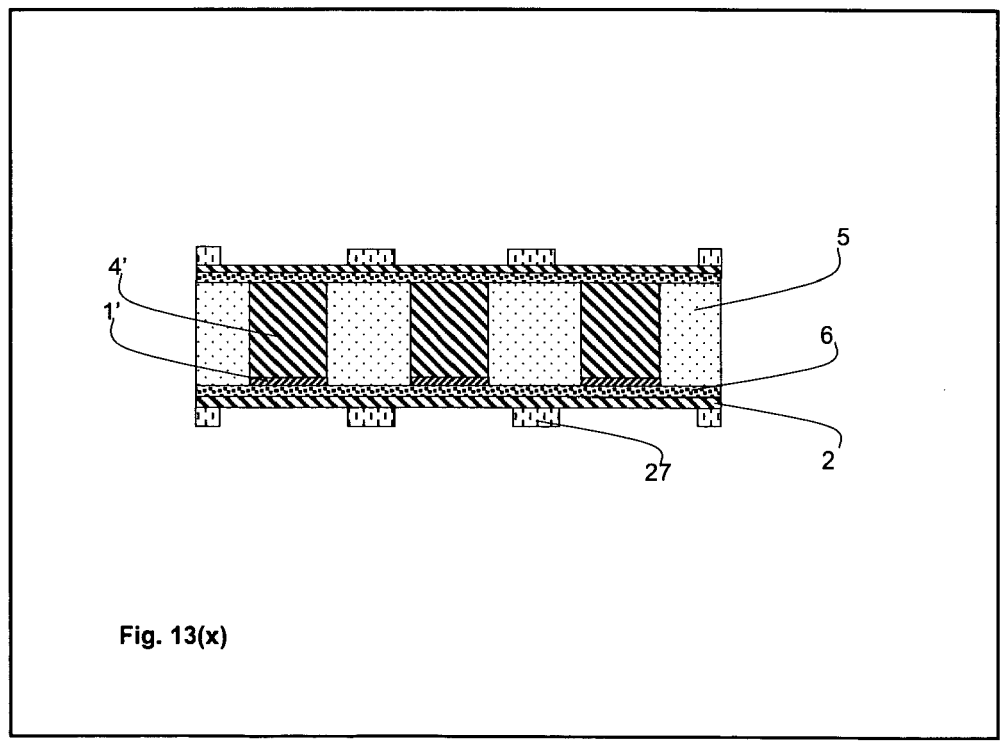
Figure 13:
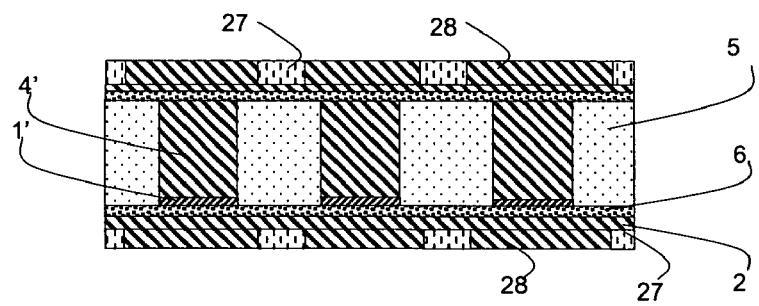
Figure 13:
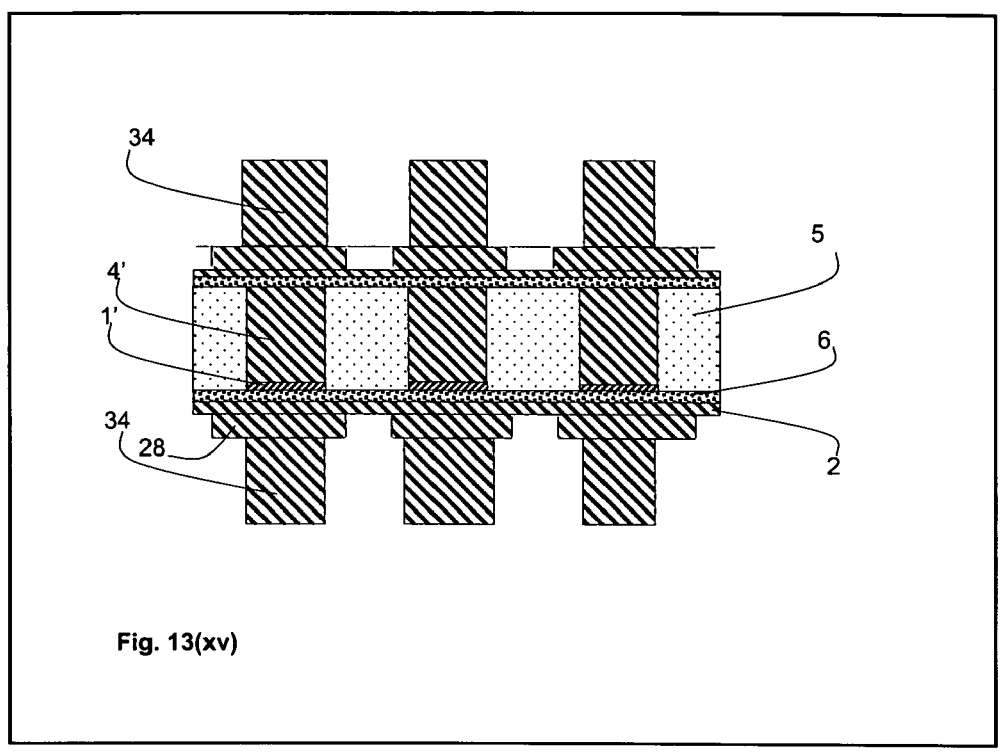
Figure 13:
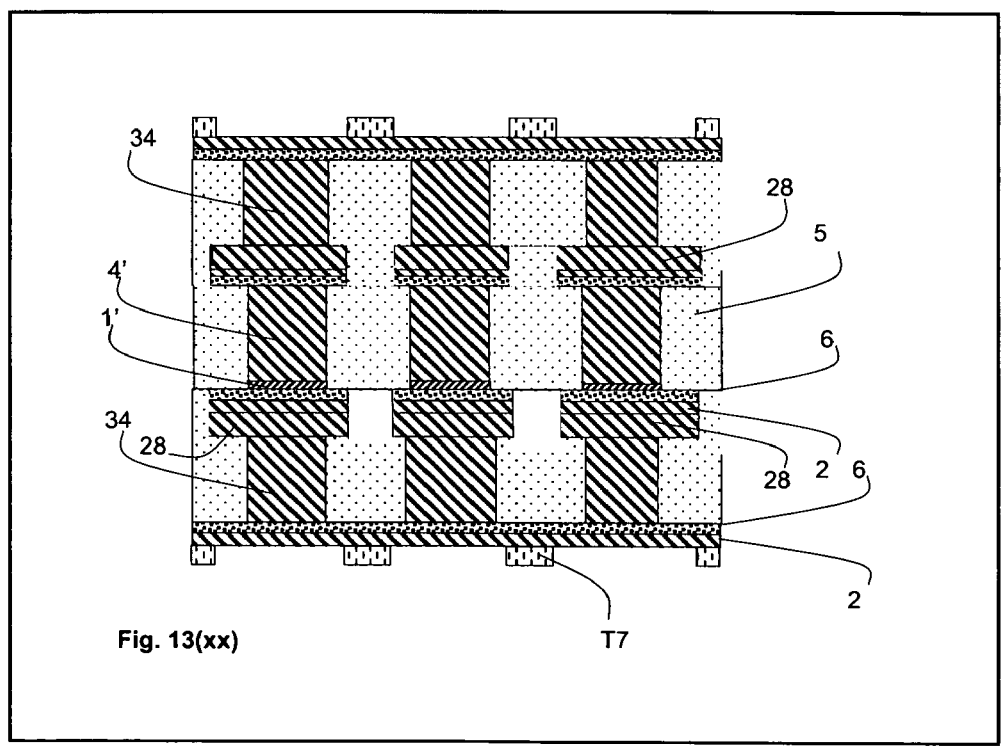

In the accompanying drawings:

FIG. 1 is a schematic cross section through a wire bonded IC BGA package structure of the prior art;

FIG. 2 is a schematic cross section through a Flip Chip BGA package structure of the prior art;

FIG. 3 is a schematic cross section through a typical, organic Flip Chip BGA (FCBGA) substrate type support structure of the prior art;

FIG. 4 is a basic flowchart showing the necessary (solid lines) and optional (with dashed lines) macro stages of the manufacturing process for manufacturing support structures of the present invention;

FIG. 5a is a schematic cross section through a "2-0-2" symmetrical, coreless support structure having two feature layers applied on each side of a via in dielectric membrane, in accordance with one embodiment of the present invention;

FIG. 5b is a schematic cross section through a "3-0-3" symmetrical, coreless support structure having three feature layers applied on each side of a via in dielectric membrane in accordance with a second embodiment of the present invention;

FIG. 6 is a is a schematic cross section through a free standing via in dielectric membrane that is a novel precursor of the various support structure embodiments;

FIG. 7 is a flowchart showing the processing steps for fabricating the free standing membrane of FIG. 6;

FIG. 7(i) to 7(viii) is a series of schematic cross-sections showing the intermediate structures as fabricated by the intermediate processing steps of FIG. 7;

FIG. 8 is a schematic cross section through a free standing membrane that is a variant of the membrane of FIG. 6;

FIG. 9 is a flowchart showing the processing steps for fabricating the free standing, variant membrane of FIG. 8;

FIG. 9(i) to 9(vi) is a series of schematic cross-sections showing the intermediate structures as fabricated by the intermediate processing steps of FIG. 7;

FIG. 10 is a flowchart of the process showing how a free standing membrane structure or other inner substructure may be built up into a substantially symmetrical structure by co-application of via layers and feature layers on both sides thereof;

FIG. 10(i) to 10(xi) show the intermediate structures produced by the corresponding steps of FIG. 10;

FIG. 11 is a flowchart showing one processing route for terminating the structure of FIG. 10(xi);

FIG. 11(i) to 11(x) show the intermediate structures produced by the corresponding steps of FIG. 11;

FIG. 12 is a schematic cross section through a "2-0-2" symmetrical, coreless support structure having a barrier metal layer included therein, that results from applying the processing steps of FIG. 10 to the variant membrane of FIG. 8;

FIG. 13 is a flowchart showing one processing route for fabricating the "2-0-2" structure of FIG. 12;

FIGS. 13(i) to 13(xxvii) show the intermediate structures produced by corresponding steps of FIG. 13;

FIG. 14 is a schematic cross section through a "3-0-3" symmetrical, coreless support structure having a barrier metal layer included therein, that results from applying the processing steps of FIG. 10 to the variant membrane of FIG. 8;

FIG. 14a is a flowchart showing one processing route for fabricating the structure of FIG. 14.

Figure 15:
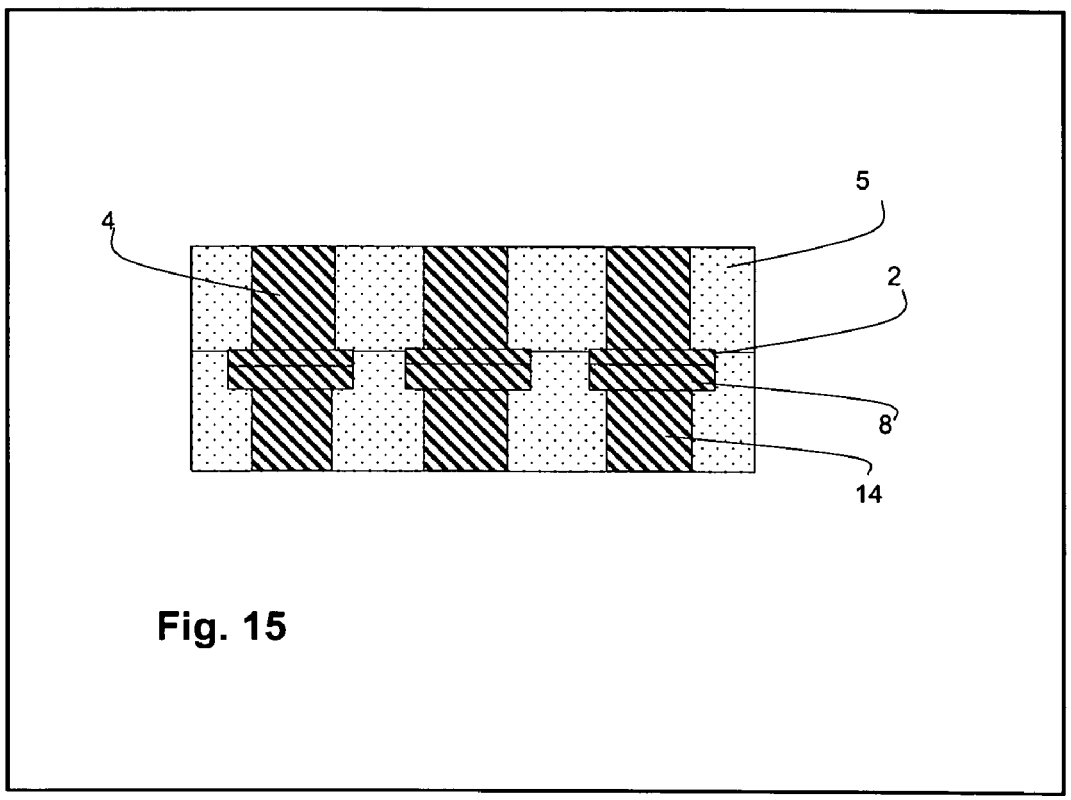
Figure 15A:
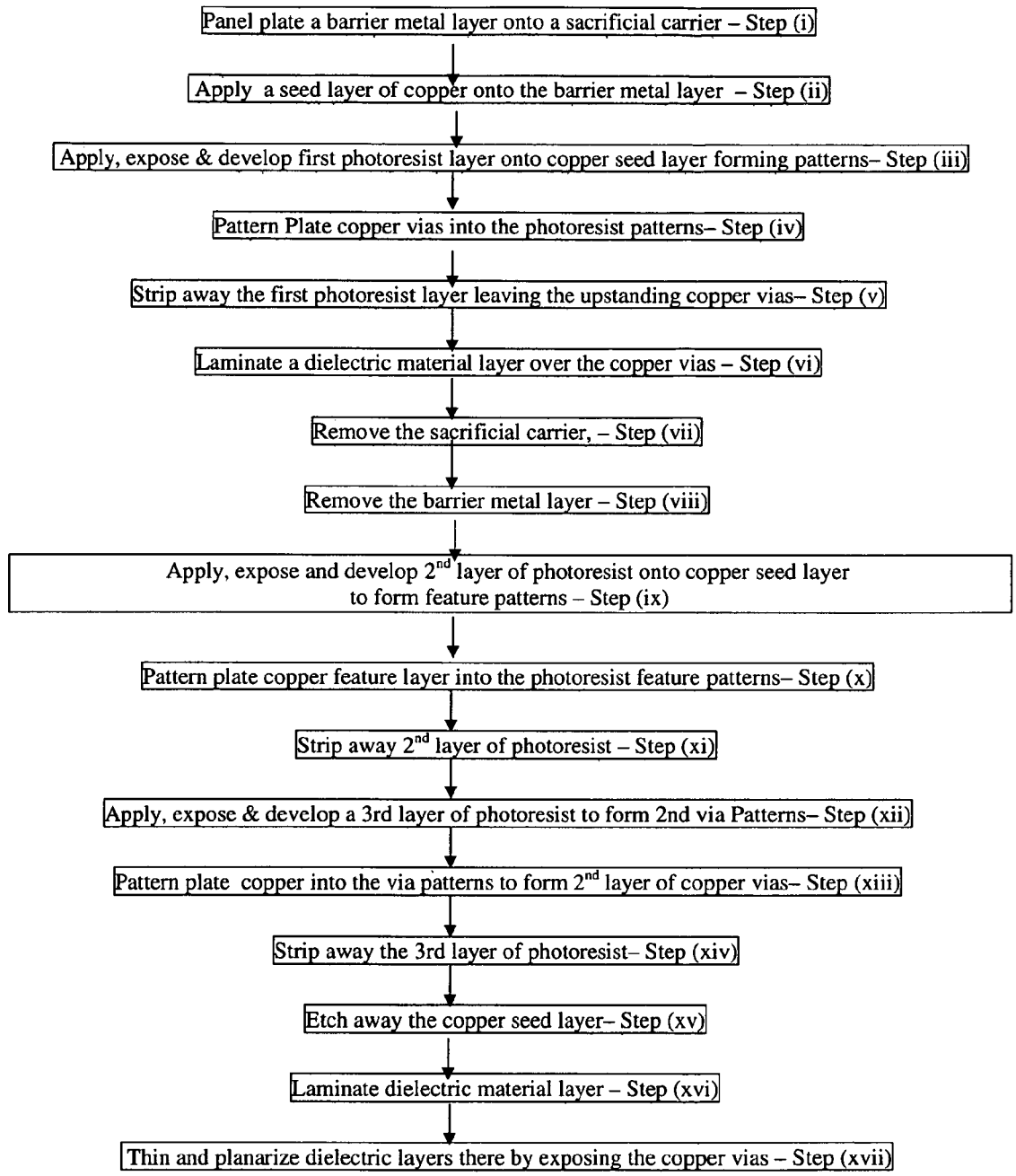
Figure 16:
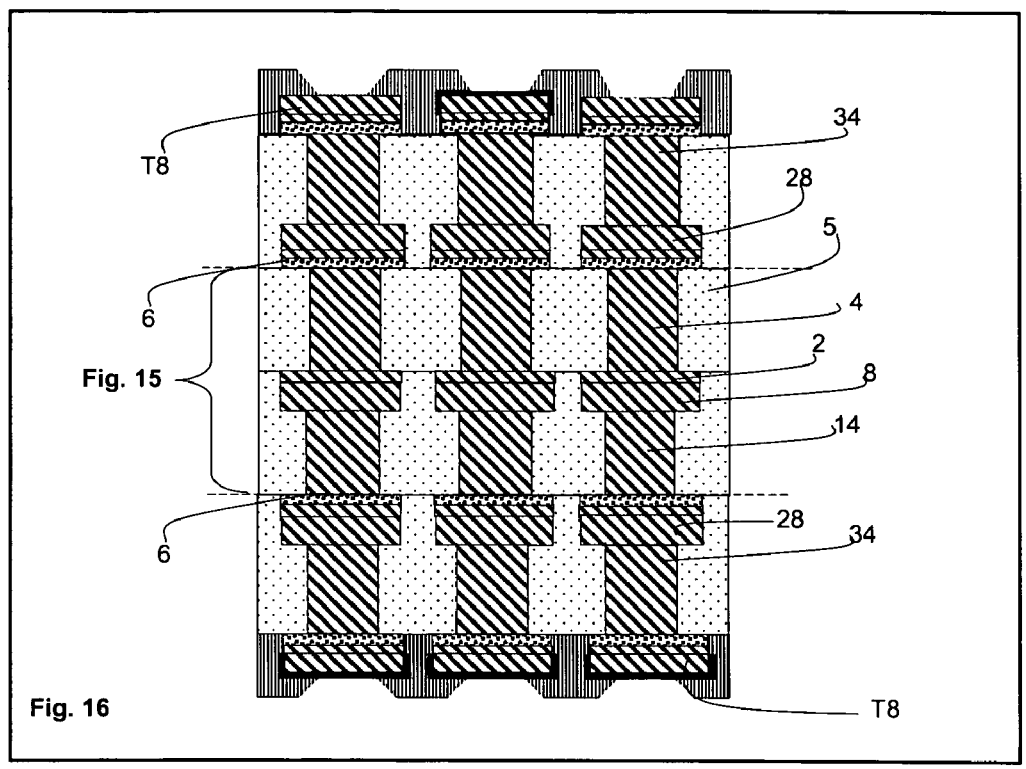
Figure 17:
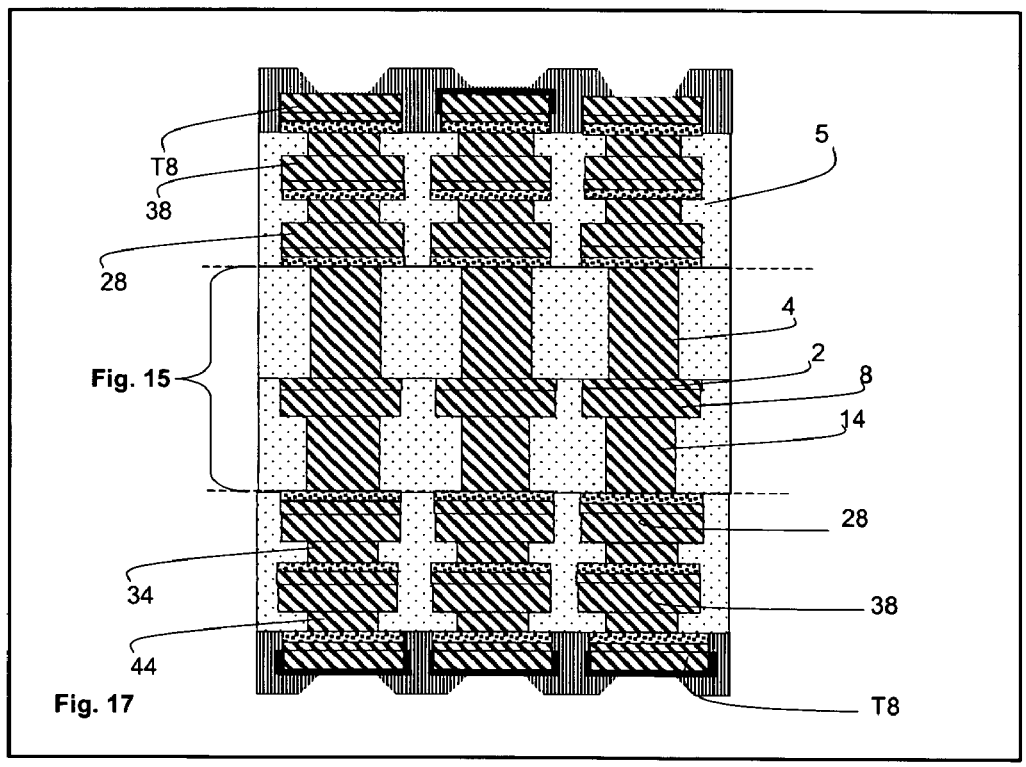
Figure 18A:
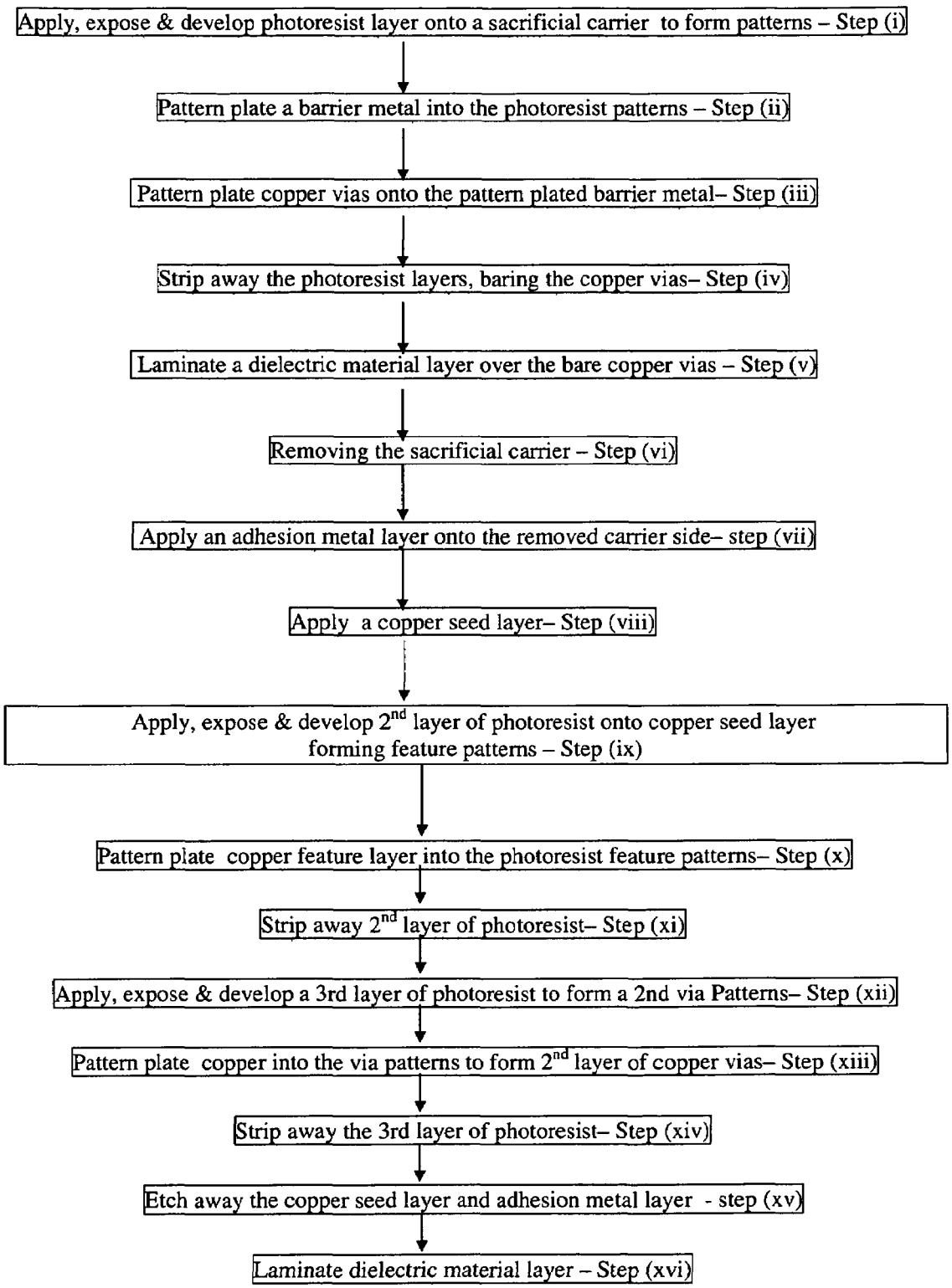
Figure 18I:
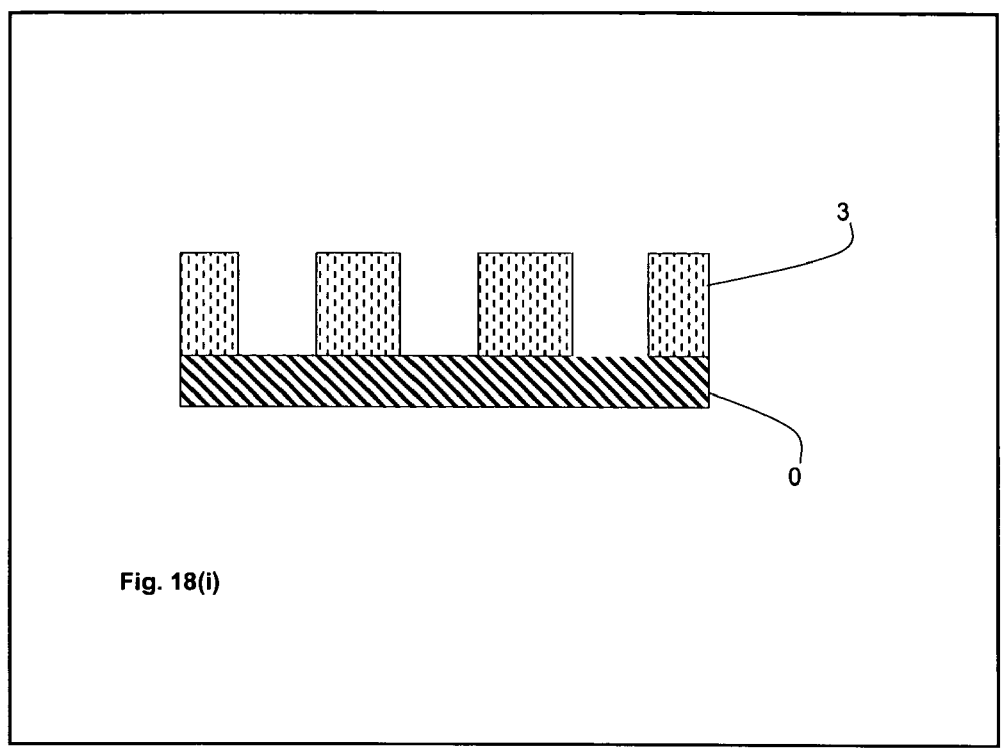
Figure 18:
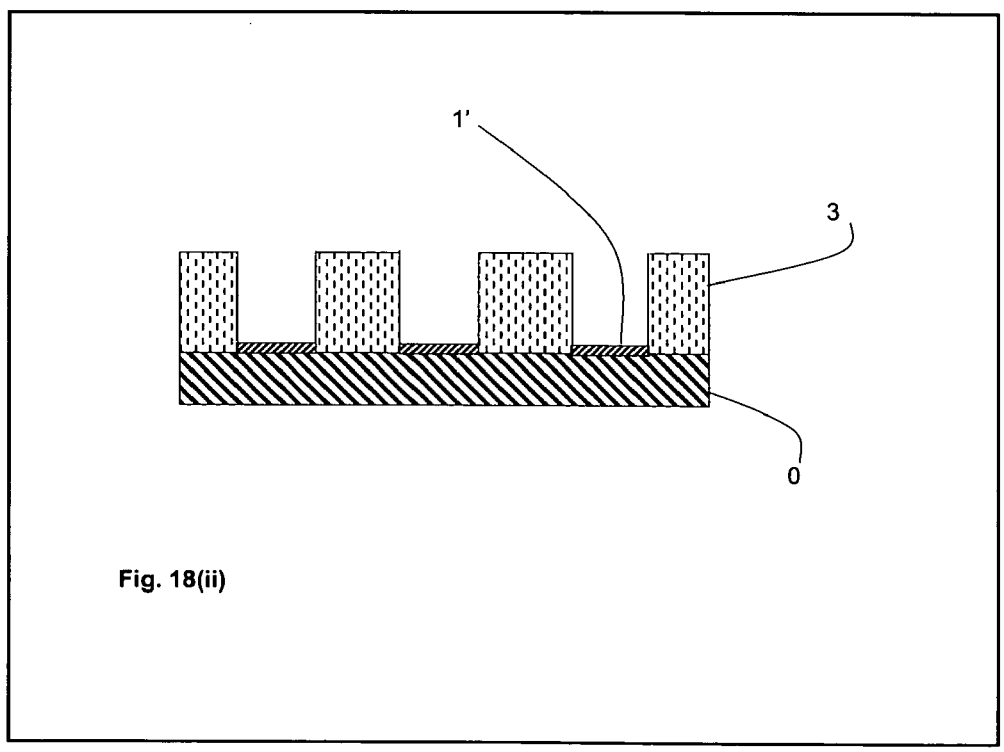
Figure 18:
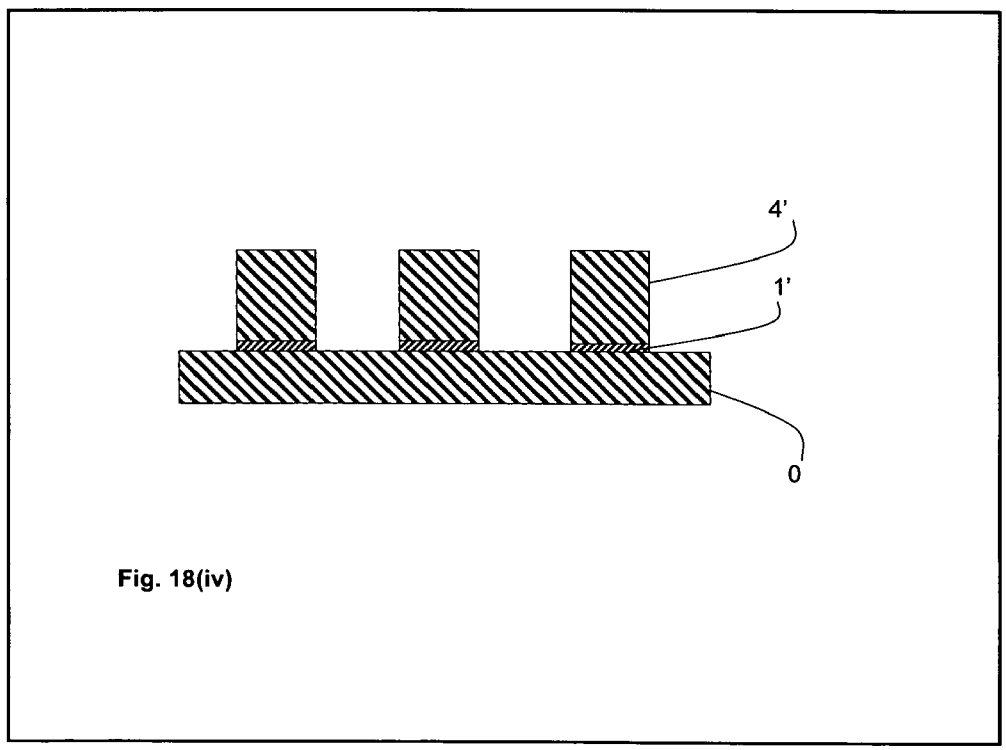
Figure 18V:
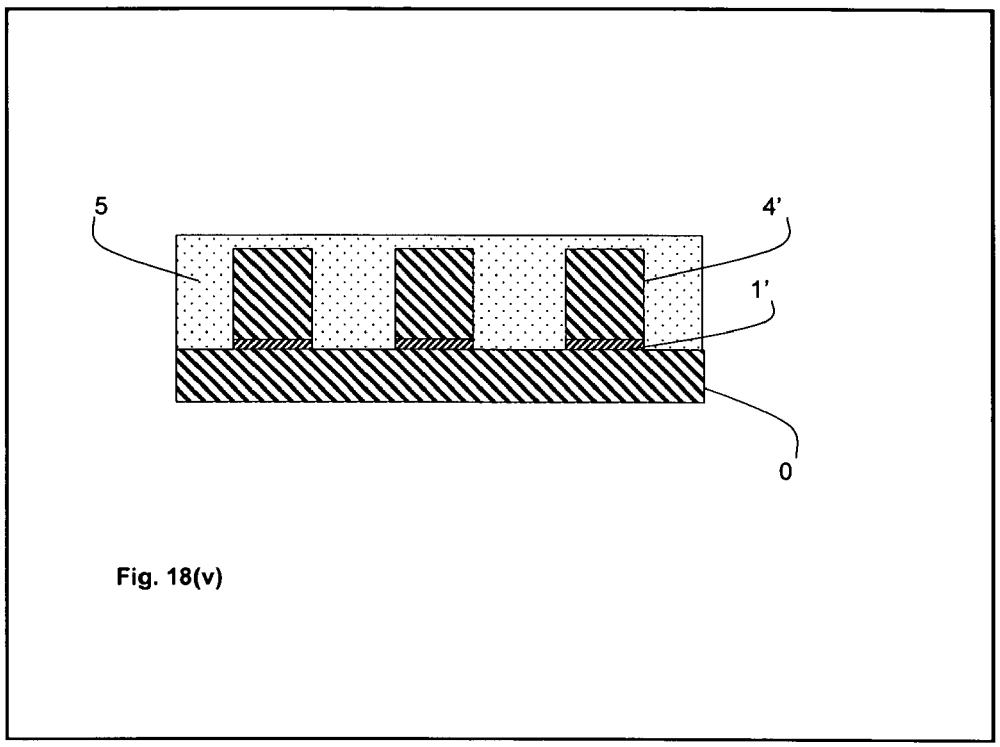
Figure 18:
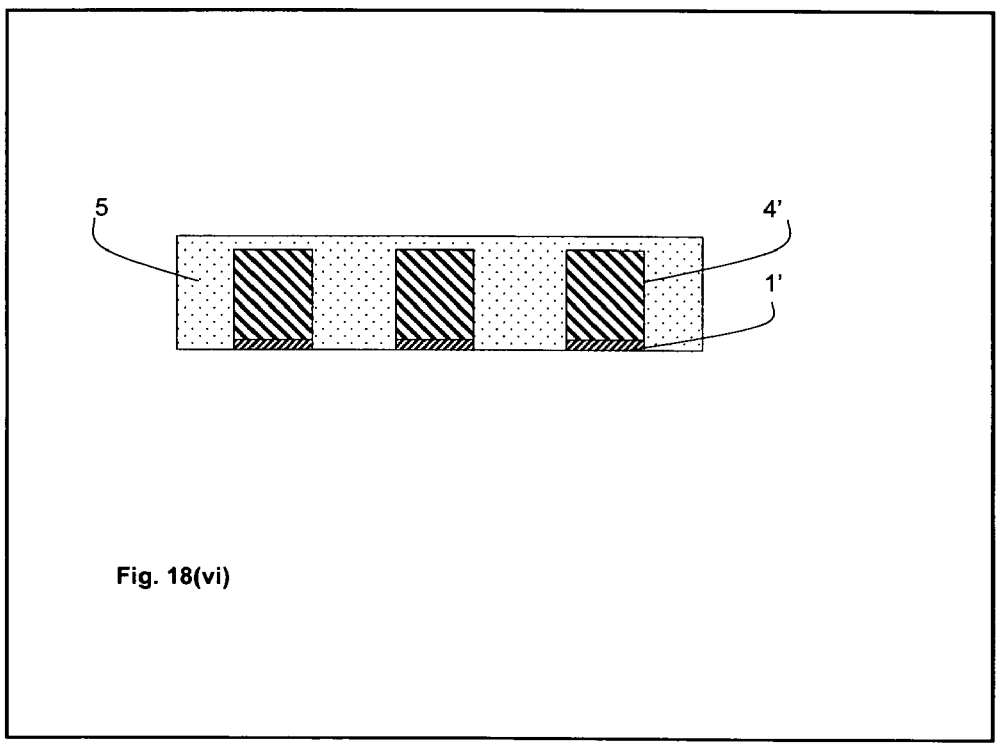
Figure 21:
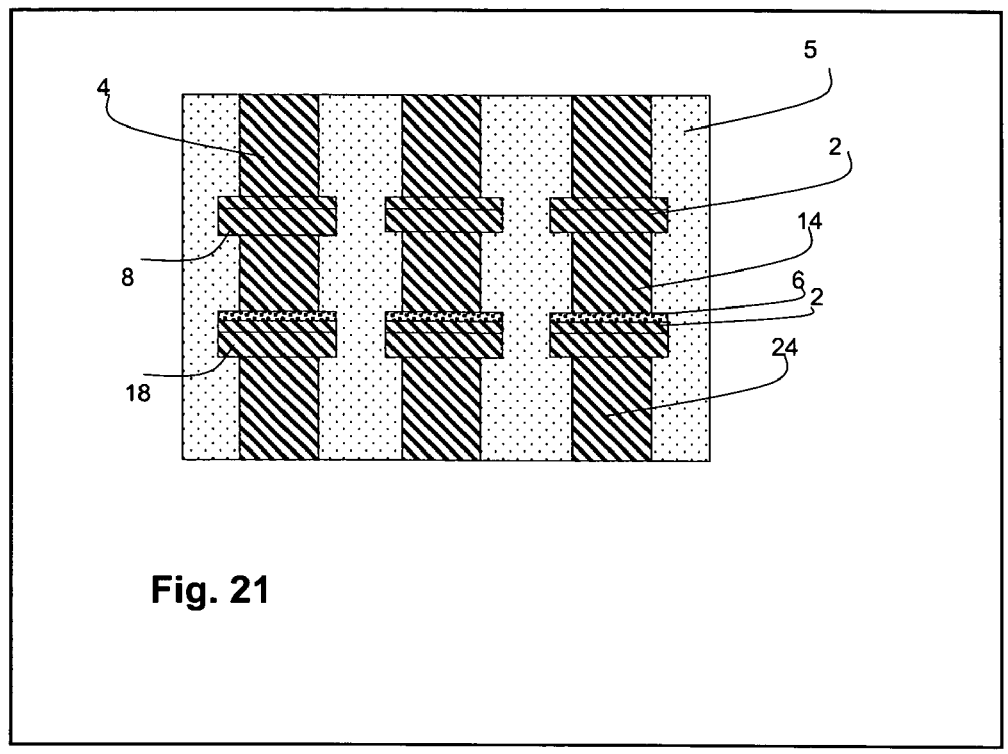
Figure 22:
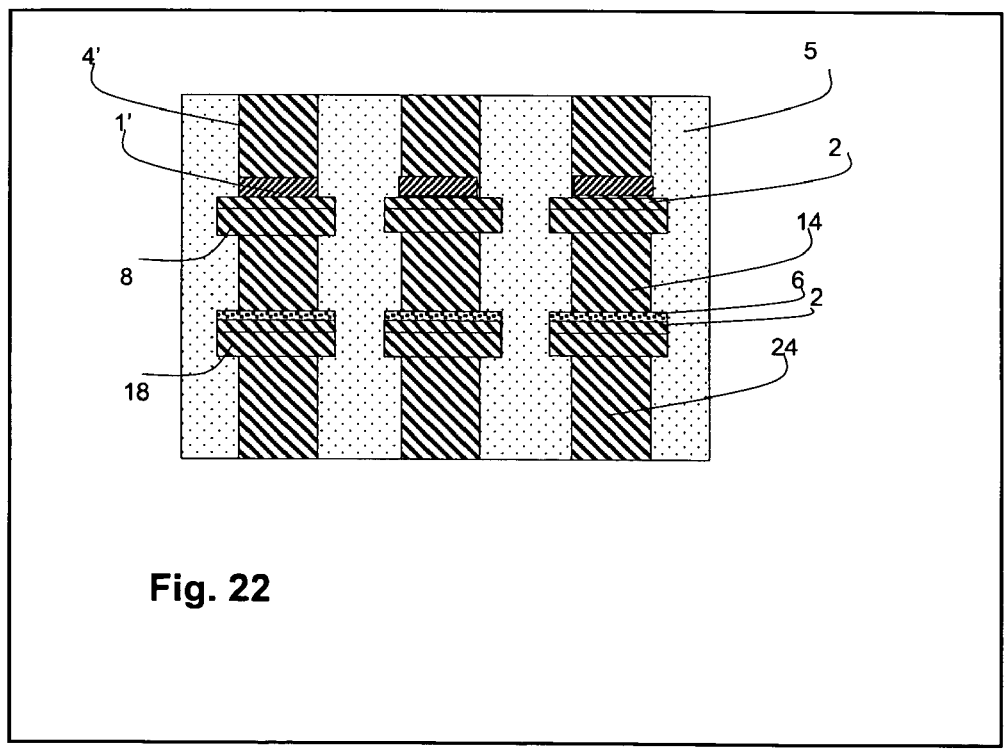
Figure 21A:
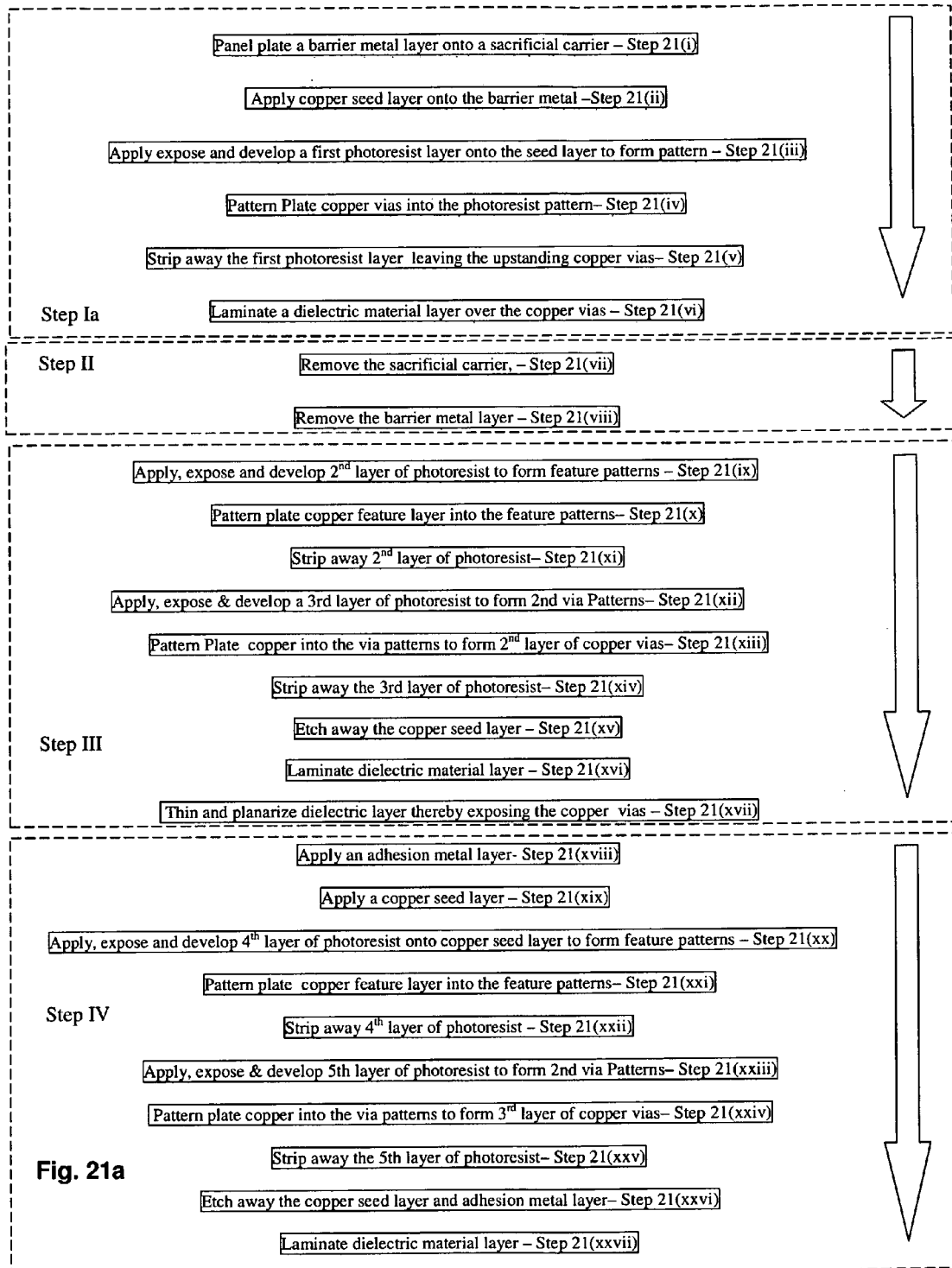
Figure 22A:
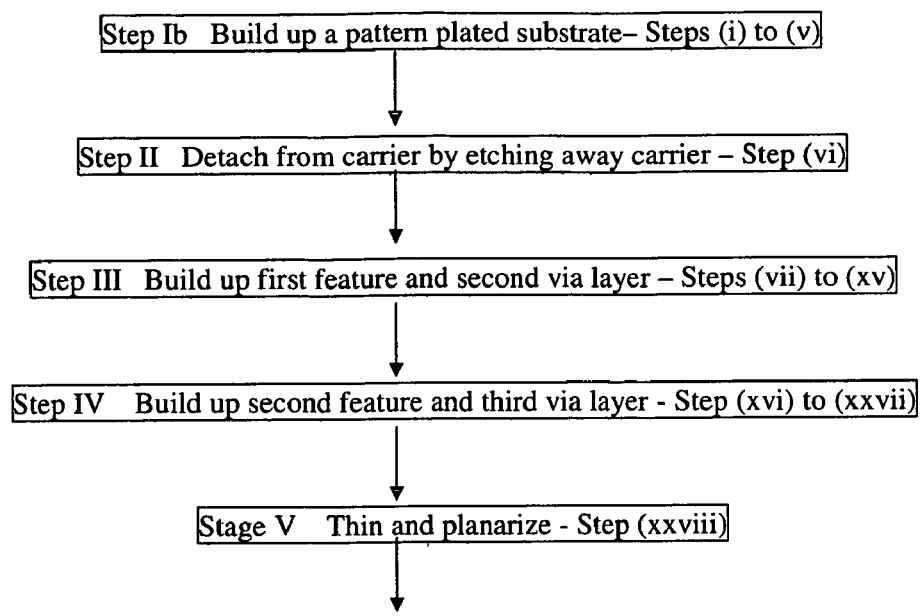
Figure 23:
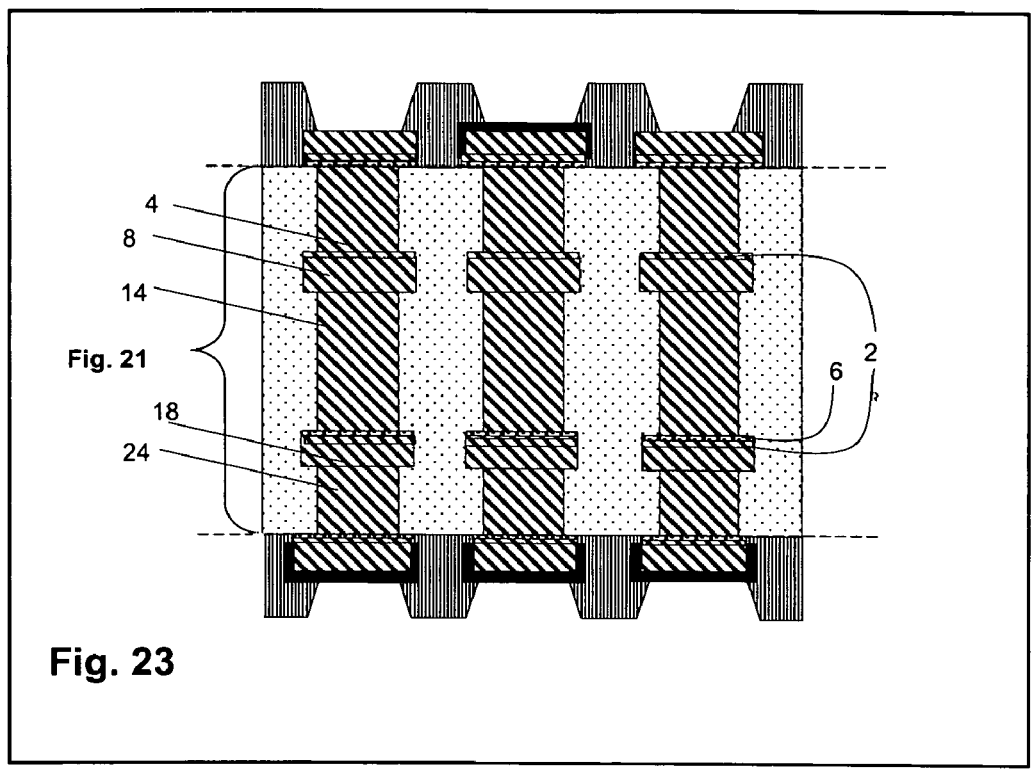
Figure 24:
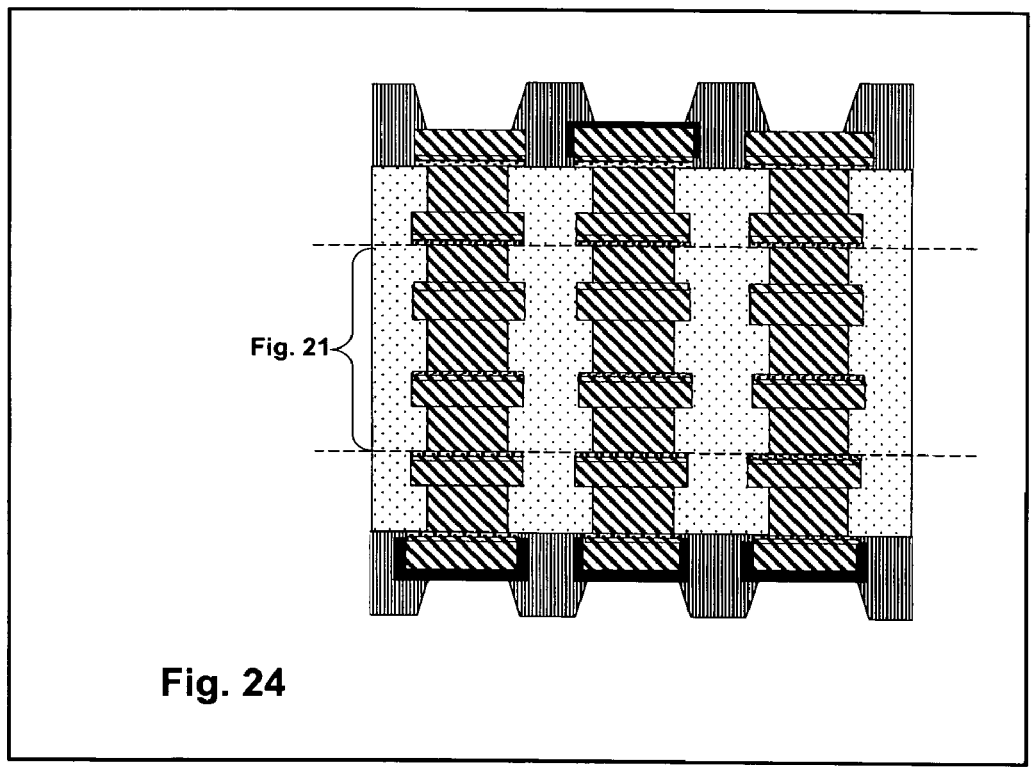
Figure 25:
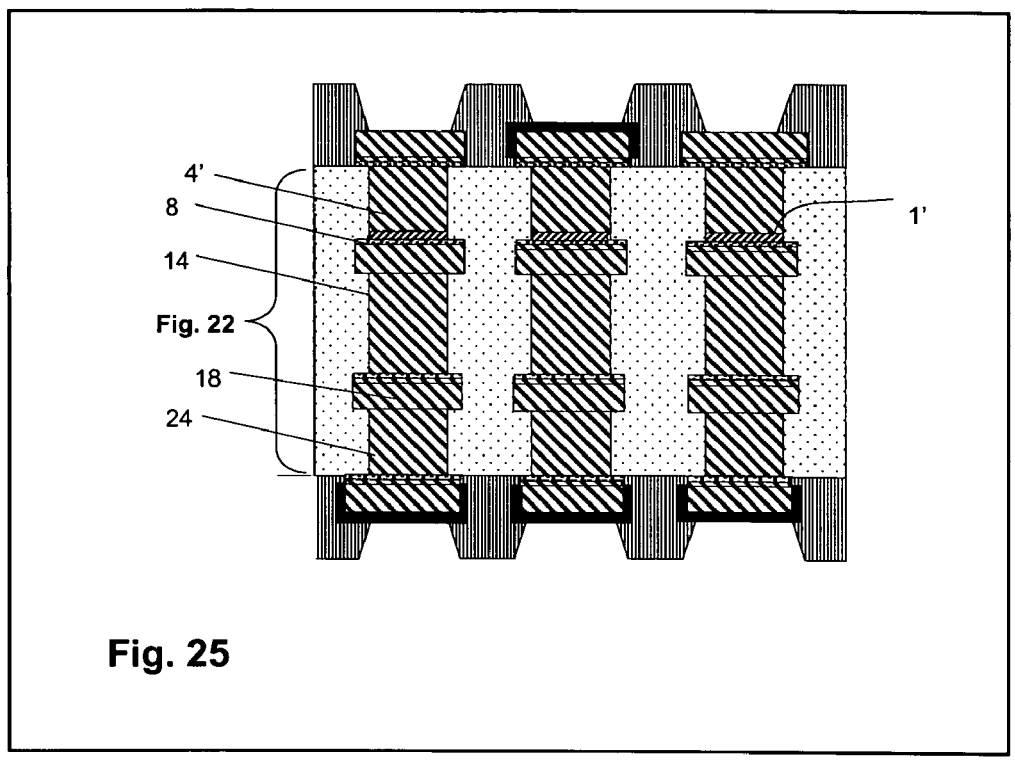
Figure 26:
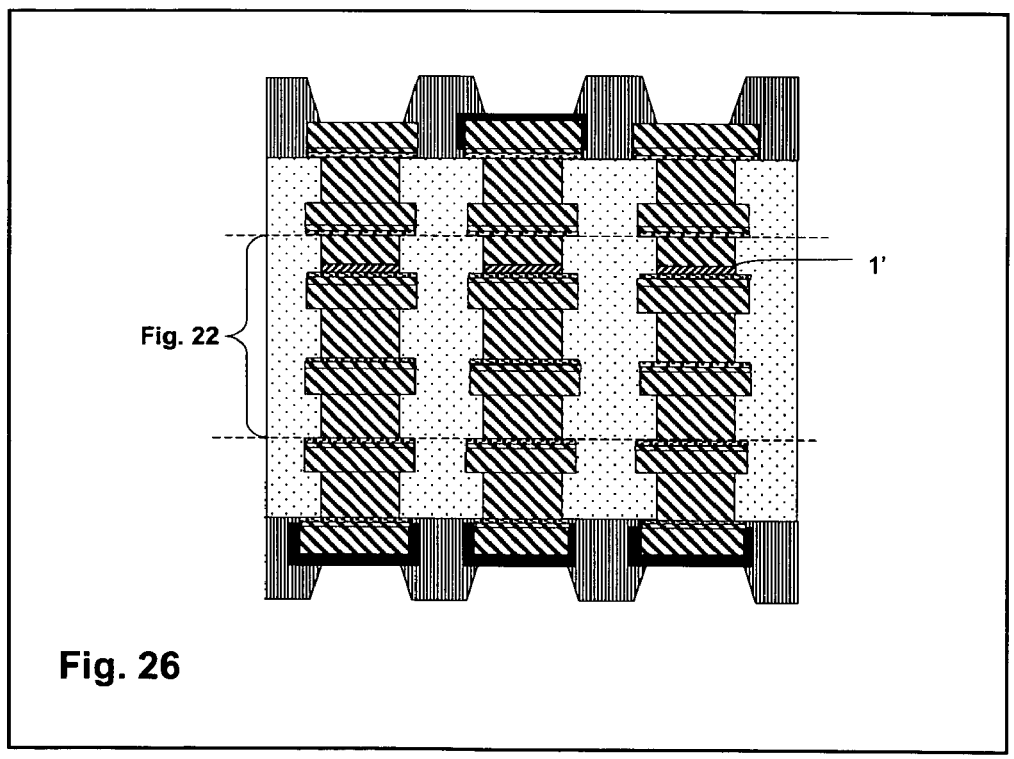

FIG. 15 is an odd layered symmetrical inner support substructure built up from via in dielectric membrane of FIG. 6;

FIG. 15a is a flowchart showing a processing route for converting the membrane Ia of FIG. 6 into an odd inner layer substructure of FIG. 15;

FIG. 15(i) to 15(xvi) show the intermediate structures produced by corresponding steps of FIG. 15a;

FIG. 16 shows a 2-1-2 structure built around the inner substructure of FIG. 15;

FIG. 17 shows a 3-1-3 structure built around the inner substructure of FIG. 15;

FIG. 18 is a variant odd layered symmetrical inner support substructure built up from via in dielectric membrane of FIG. 8;

FIG. 18a is a flowchart showing a processing route for converting the membrane Ib of FIG. 6 into the odd inner layer substructure of FIG. 18;

FIG. 18(i) to 18(xvi) show the intermediate structures produced by corresponding steps of FIG. 18a;

FIG. 19 shows a 2-1-2 structure built around the inner substructure of FIG. 18;

FIG. 20 shows a 3-1-3 structure built around the inner substructure of FIG. 18;

FIG. 21 is a semi-symmetrical inner substructure "-2-" having two feature layers built up on one side of via in dielectric membrane of FIG. 6;

FIG. 21a is a processing route for building up the membrane of FIG. 6 into the semi-symmetrical inner substructure of FIG. 21;

FIG. 21b(i) to 21b(xxviii) show the intermediate structures produced by corresponding steps of FIG. 21a;

FIG. 22 is a variant semi-symmetrical inner substructure "-2-" corresponding to that of FIG. 21, but built up from pattern plated membrane of FIG. 8;

FIG. 22a is a processing route for building up the membrane of FIG. 8 into the semi-symmetrical inner substructure of FIG. 22;

FIG. 22b(I) to 22b(xxxviii) show the intermediate structures produced by corresponding steps of FIG. 22a and then on to FIG. 25;

FIG. 23 is a schematic cross-section through a 1-2-1 semi-symmetrical support structure similar to FIG. 5a, mutatis mutandis, but fabricated by adding outer layers to the substructure of FIG. 21 and thus not truly symmetrical;

FIG. 24 is a schematic cross-section through a 2-2-2 semi-symmetrical support structure similar to FIG. 5a, mutatis mutandis, but fabricated by adding outer layers to the substructure of FIG. 21 and thus not being truly symmetrical;

FIG. 25 is a schematic cross-section through a "1-2-1" semi-symmetrical support structures similar to "2-0-2" of FIG. 12, mutatis mutandis, but showing the pattern plated barrier metal included layer from the first stages of the fabrication remain trapped within the structure in a different location, reflecting the non-symmetrical build up, and FIG. 26 is a schematic cross-sections through a "2-2-2" semi-symmetrical support structures similar to the "3-0-3" of FIG. 14, mutatis mutandis, but showing the pattern plated barrier metal included layer from the first stages of the fabrication remain trapped within the structure in a different location, reflecting the non-symmetrical build up.

Similar shading is used for the same materials throughout the schematic cross-sections, with a diagonal hatching from top left to bottom right indicating copper, a reverse hatching from top right to bottom left, indicating barrier metal, a speckled shading indicating adhesion metals, a polka dot indicating dielectric material, a close vertical hatching indicating solder mask, a solid black indicating termination material, and a shading of short stretcher bonded vertical lines indicating photoresist. Likewise a consistent numbering scheme is used throughout to indicate corresponding layers in the various buildups and structures.

It will further be appreciated that the termination metal, the adhesion metal and the barrier metal may but need not all be different metals in specific embodiments, although, none of these will be copper. Choices of suitable metals are discussed in the description hereinbelow.

DESCRIPTION OF THE PREFERRED EMBODIMENTS

The present invention relates to a novel processing method for fabricating electronic substrates and to the novel substrates obtainable by that method. Some of the fabrication steps, such as the steps of application of photoresist, its exposure, developing and subsequent removal are not described herein in any detail since the various alternative materials and processing routes are well known, and their detailing will render this description unnecessarily cumbersome. Suffice to say, when designing a specific process for a specific product, persons of the art will make appropriate selections from the various alternative materials and processing routes using well established considerations based on parameters such as batch size, substrate complexity and component resolution. Furthermore, the actual architecture of the substrate is not described. Rather, a general method is provided that may be used to produce a variety of chip support structures. What is described hereinbelow is a novel, generic method for fabricating multilayer substrates of alternating conductive layers interconnected by vias through insulative layers to provide a three dimensional stacked substrate, and variants thereof.

FIG. 4 is a generalized flowchart showing the key steps of a generalized processing method for fabricating substrates of this type. The method comprises the stages of: Fabricating a membrane of conductive vias in dielectric surround on a sacrificial carrier, either by a panel plating technique—Stage Ia, or by a pattern plating technique Ib. The two techniques, and their relative merits are discussed hereinbelow.

The membrane is now detached from the sacrificial carrier—Stage II, releasing residual stresses before they become locked in to the multilayer structure grown thereupon by adding further layers. In this manner, high planarity may be achieved. Optionally, for multilayer embodiments, one or two additional layers may be built up on one side of the membrane, as described in Optional stages III and IV, described herebelow. The structure may then be thinned and planarized—Stage V forming a flat, planar inner substructure, on to which further pairs of layers may be co-applied on both sides thereof to obtain the desired structure—Stage VI. Such a processing route leads to (at least substantially) symmetrical structures. Two such structures are shown in FIGS. 5a and 5b, and described hereinbelow. In FIGS. 5a and 5b, Stage V of planarizing follows immediately after Stage III, directly onto the free standing membrane, giving even numbers of metal feature layers, the so-called 2-0-2 and 3-0-3 structures, having two and three symmetrical metal feature layers built up onto a via in dielectric membrane.

Thus with reference to FIG. 5a, an exemplary even symmetrical structure is shown, which is a laminated array consisting of two pairs of metal feature layers 28, T8 . . . connected by copper vias 4, 34. The 4 layer structure of FIG. 5a has two outer metal feature layers 28, T8 co-applied on each side of a copper via-in-dielectric membrane substructure, and may thus be termed a 2-0-2 support structure. Adhesion layers 6 and copper seed layers 2 are also shown. The structures are terminated with termination metal 98 and solder mask 99, choices and application processes for which are discussed hereinbelow.

A six layer structure is shown in FIG. 5b, having 3 outer metal feature layers 28, 38, T8 co-applied in pairs on each side of the copper via-in-dielectric membrane inner substructure, and may be termed a 3-0-3 structure. Both the 2-0-2 support structure of FIG. 5a and the 3-0-3 support structure of FIG. 5b have symmetrical build ups around a copper via 4 in dielectric 5 membrane. The substrate has three active layers 28, 38, T8 on each side of the laminated array. The active layers 28 on the two sides of the laminated array are identical, being co-applied (i.e. simultaneously deposited) as described hereinbelow.

Symmetrical structures of FIG. 5a and FIG. 5b each consist of plated copper layers 28, (38) T8, vias 4, 34, (44) and dielectric 5, which is preferably a fiber reinforced polymer composite, as discussed hereinbelow.

This basic structure is, however, capable of some variation. For example, referring back to FIG. 4, depending on the exact structure desired, an additional metal feature layer and a via layer—Step III may be added prior to Step—V, to create a symmetrical, odd inner substructure; shown in FIG. 15, that can be built up into the so-called 2-1-2 or 3-1-3 structures shown in FIGS. 16 and 17 respectively.

Where an even structure is required, but where strict symmetry is not required, a second additional metal feature layer and core layer may be added—Step IV after step III and before step V. This results in the semi-symmetrical inner substructure shown in FIG. 21, which is sturdier and easier to work with than the via-in dielectric membrane of FIG. 6, but, is, however not truly symmetrical.

The heart of the invention is thus the fabrication of a free standing membrane comprising an array of vias held together by a dielectric material. One embodiment of this free standing membrane is shown in FIG. 6, and an alternative version is shown in FIG. 8. These free standing membranes are the foundation on which all the structures described hereinafter are built, and their fabrication are the essential steps of the processing routes disclosed hereinbelow.

The generalized process essentially consists of fabricating an array of copper structures consisting of layers 8, (18) . . . and vias 4, (14, 24) on a sacrificial substrate 0, surrounding the array with a dielectric 5 that is preferably a fiber reinforced composite insulating material applied by a lamination technique, and, after detaching from the sacrificial carrier 0, converting the membrane into an inner substructure and building up a multilayer structure by applying further layers (28, 38), T8 and vias 38 (48) onto both sides thereof, onto which terminations 98 and soldermask 99 and may be applied to create a support structure that may be used as a chip support.

Adhesion layers 6 are used to help the copper adhere to other materials. Pattern plated barrier layers 1' may be included within the copper structures, due to processing requirements. As both adhesion layers 6 and barrier layers 1' are both thin layers of typically high purity conductive metals, resistances of the conductive structures are hardly affected.

By fabricating free standing multilayer substrates having symmetrical lay ups with at least a substantially symmetrical substructure based on a laminated array of vias in a dielectric with outer layers simultaneously co-applied on both sides, the residual stresses resulting from shrinkage of the polymer resin of the dielectric on curing tend to cancel each other out, and high planarity results with high yields, allowing the multilayer substrate of the present invention to be used as an intermediary between ICs and printed circuit boards, providing good contact with both.

The inner substructure may be the laminated array, which is typically a via layer 4 encapsulated in a dielectric 5. Metal feature layers 28 may be applied onto the inner substructure, on both sides thereof (see FIG. 10) followed by termination (see FIG. 11). This variant produces essentially symmetrical, thin, support structures having even numbers of metal feature layers. By co-applying additional pairs of outer layers 38, 48 . . . around the growing structure, more complicated structures may be formed.

For some applications, only an odd number of metal layers are actually required. The even layer processing route may be used of course, with one metal feature layer simply not being utilized for distributing carrying signals in the XY plane.

However, to save on wastage and to keep the thickness of the support structures thus formed as thin as possible, the process route may be modified to produce support structures incorporating inner substructures having a central metal feature layer sandwiched between vias, giving a single metal feature layer 8 substructure around which outer layers may be deposited. In this manner, substantially symmetrical structures with central metal feature layers 8 and an odd total number of metal layers are fabricated.

The structures fabricated by the manufacturing processes of the present invention are largely free from residual stresses and resultant warpage, particularly where relatively complex structures are fabricated, since the initial laminated array membrane is detached from the sacrificial carrier, alleviating residual stresses by allowing the unrestricted membrane to straighten, contract or expand. Only then is the membrane built up into an inner substructure onto which outer layers are co-applied on both sides thereof to give the full structure. Since the outer layers are co-applied on both sides at once, they give rise to similar stresses on each side of the inner substructure. These balance each other out and thus have no tendency to cause the substructures so formed to warp, maintaining planarity thereby.

With reference to FIG. 6, the core structure of the present invention is a free-standing membrane Ia that comprises an array of vias 4 surrounded by a dielectric material 5, standing on a copper seed layer 2. Free standing membrane Ia, and variant Ib shown in FIG. 8 and described hereinbelow, are the basic foundation onto which a plethora of substrates of the invention may be built up.

FIG. 7 is a flowchart illustrating one processing route for fabricating the free standing membrane Ia of FIG. 6. For ease of understanding, the build up and intermediate structures are shown in FIGS. 7(I) to 7(viii). Thus referring to FIGS. 7 and 7(I) to 7(viii), a barrier metal layer 1 is panel plated onto a sacrificial carrier 0, that is typically copper—step 7(I). The sacrificial carrier 0 typically has a thickness in the range between 75 µm and 600 µm and may be fabricated from copper or a copper alloy, such as brass or bronze for example. The barrier metal 1 may be tantalum, tungsten, chromium, titanium, a combination of titanium-tungsten or of titanium-tantalum, nickel, gold, nickel layer followed by a gold layer, a gold layer followed by a nickel layer, tin, lead, a tin layer followed a lead layer, tin-lead alloy and tin-silver alloy for example, and, in all cases may be applied by a physical vapor deposition process (PVD) such as sputtering. Where the barrier metal 1 of step 7(I) is nickel, gold, a nickel layer followed by a gold layer, a gold layer followed by a nickel layer, tin, lead, a tin layer followed by a lead layer, tin-lead alloy and tin-silver alloy, it may alternatively be applied by electroplating or electroless plating or by a combination of electroless and electroplating, for example. Typically the barrier metal 1 has a thickness in the range of from 0.1 µm to 5 µm.

An adhesion metal layer may be applied to the barrier metal layer 1. Such an adhesion metal layer helps copper to be deposited on other materials than copper itself. However, careful selection of appropriate barrier metal 1 makes this superfluous. A seed layer of copper 2 is then applied onto the barrier metal 1—Step 7(ii). Copper seed layer 2 typically has a thickness in the range of 0.2 µm to 5 µm and may be applied by a physical vapor deposition process (PVD) such as sputtering followed by electroplating or electroless plating or by a combination of electroless and electroplating. A photoresist pattern 3 is applied thereupon—step 7(iii) by coating a layer of photoresist, exposing and developing a pattern therewithin, using techniques widely established in the fabrication of electronic substrates and devices. Copper vias 4 are now applied into the photoresist pattern 3—step 7(iv), onto the copper seed layer 2, which aids adhesion thereof. The copper vias 4 are typically applied by electroplating, with the technique of electroplating into a photoresist pattern being known herein as pattern plating.

The photoresist 3 is stripped away—step 7(v) leaving the upstanding copper vias 4. A dielectric material 5 is laminated over the copper vias 4—Step 7(vi). The dielectric material 5 may comprise a thermoplastic matrix material such as Teflon and derivatives thereof, or a thermosetting polymeric resin such as bismaleimide triazine, epoxy resins, polyimide resins, mixtures thereof, or a resin having mixed thermoplastic and thermosetting properties. Preferably the polymeric resin of dielectric material 5 includes inorganic particulate fillers, usually of a ceramic or glass, having particle sizes of the order of single microns, specifically, between 0.5 microns and 5 microns; the polymeric matrix containing 15% to 30% of particulate filler by weight.

In preferred embodiments, dielectric material 5 is a fiber matrix composite material including organic fibers such as polyamide fibers (Kevlar) or glass fibers. Such fibers may be chopped fibers or continuous fibers arranged in cross-plied arrangements or as woven mats. Cross plied and woven fiber mats pre-impregnated with partially cured polymeric resins are available as prepregs.

In most preferred embodiments, at least two woven fiber prepregs of fibers—matrix composite materials having ceramic fillers in the polymer matrix are used. Suitable candidate epoxy and polyamide matrix woven prepregs are available from Arlon Inc. Rancho Cucamonga, Calif., USA. These prepregs are applied onto the copper substructure of vias, and are cured by a hot press lamination process. The continuous fibers running though the insulating layers provide additional strength and stiffness, allowing the overall structure to be thinner, and further facilitate the attainment of planarity. The sacrificial carrier 0 is removed by a wet etch process, with the barrier layer 1 fabricated in step 7(I) acting as an etch stop—step 7(vii). The sacrificial carrier 0 is usually copper or a copper alloy, and the appropriate etchant will depend on the barrier layer 1 chosen. For example, where the barrier layer 1 is tantalum, the wet etch process for step 7(vii) of etching away the sacrificial carrier 0 might be exposing to a solution of ammonium hydroxide at an elevated temperature. The barrier metal layer 1 is now removed—step 7(viii). Where the barrier layer is tantalum, for example, it may be removed by plasma etching using a mixture of $CF_4$ and Ar, typically having a $CF_4$ to argon ratio of between 1:1 and 3:1; other barrier metals being removable by other known techniques.

With reference to FIG. 8, an alternative version (Ib—see FIG. 4) of the free standing membrane core structure of FIG. 6 (Ia—See FIG. 4) is presented. As with Ia shown in FIG. 6, alternative free standing membrane Ib consists of copper vias 4' surrounded by a dielectric material 5, mutatis mutandis. However, each copper via 4' stands on a thin layer of barrier metal 1' which is subsequently built into the substrates of the invention that are fabricated therearound.

The alternative structure Ib shown in FIG. 8 may be fabricated by the process shown in flowchart of FIG. 9, and is built up from intermediate steps shown in FIG. 9(I) to FIG. 9(vi).

Figure 9V:
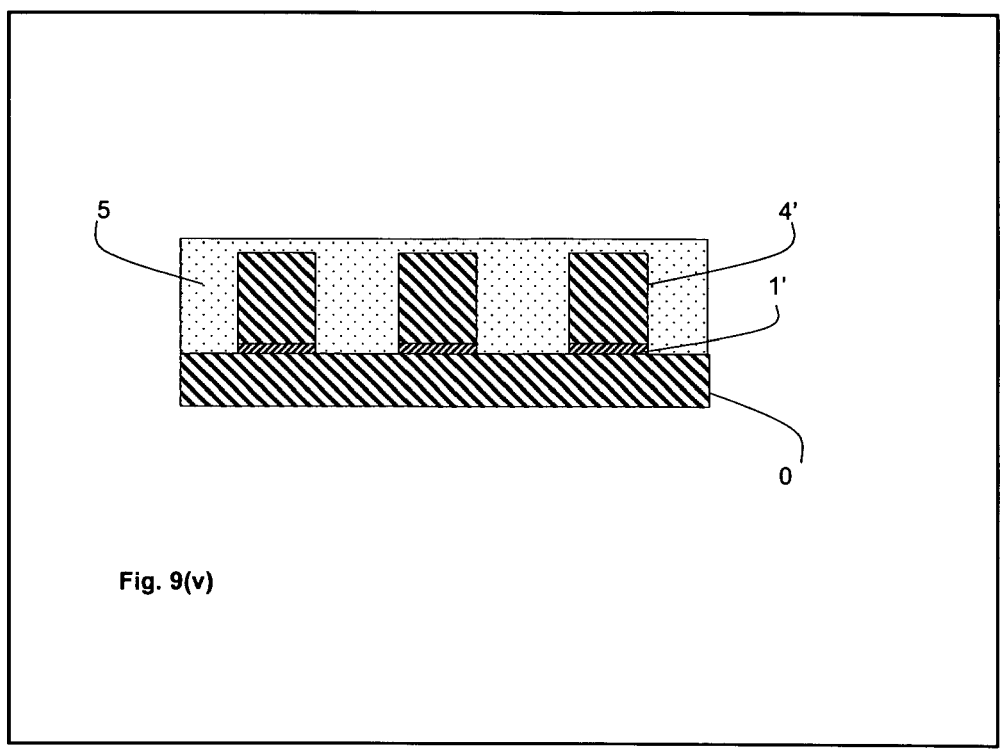
Figure 9:
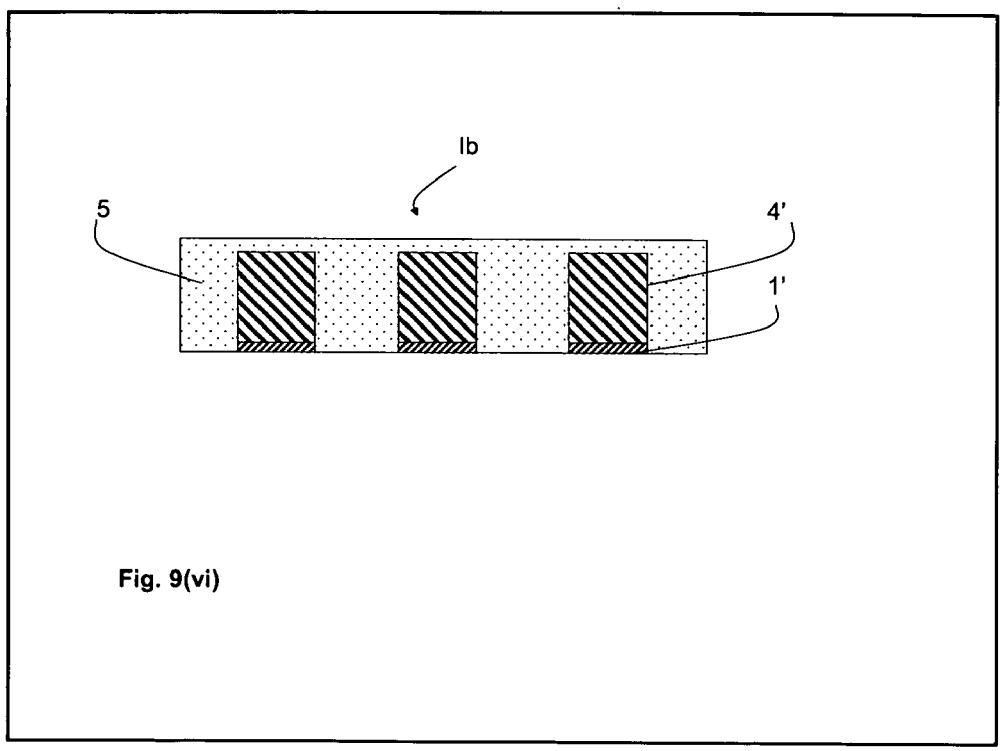

Thus, with reference to FIGS. 9, 9(I) to 9(vi), a photoresist material 3 is applied, exposed and developed directly onto the sacrificial carrier 0-9(I). Barrier metal 1' is applied into the pattern thus formed—9(ii) and copper vias 4' are pattern plated onto the pattern plated barrier metal 1'-9(iii), typically by electroplating copper thereonto, as with processing route described above with reference to FIG. 7, mutatis mutandis. The photoresist 3 is stripped away—9(iv), and a dielectric material 5 is laminated over the bare copper vias 4'—FIG. 9(v). Finally, the sacrificial carrier 0 is removed—FIG. 9(vi). Choices for dielectric material 4, barrier metal 1' and processing routes are as per Ia (FIG. 7), mutatis mutandis.

Depending on whether panel plating (FIG. 7) or pattern plating (FIG. 9) technologies are used, and whether the final structure is required to have an odd or even number of metal feature layers, the various support structures of the invention and the processing route chosen for their fabrication may vary somewhat. Essentially, therefore, the present invention, as described hereunder, is a generic technology incorporating a family of variant processing routes, and the structures resultant therefrom.

Referring to FIG. 10, inner substructures X may be built up by co-applying metal feature layers 28 on each side of the inner structure X to provide a 1-X-1 coreless support structure—Stage V of FIG. 4. If the metal feature layers 28 are followed by co-application of vias 34 and further metal feature layers 38 (se FIG. 5a) on each side, a "2-X-2" coreless support structure results. There are a number of possible variant inner substructures X, which may be built up on one side of membrane Ia or Ib. Some of the variant inner substructures are described hereinbelow, with reference to the examples.

With reference to FIG. 10, the steps of co-applying outer feature and via layers are as follows:

Firstly, adhesion metal layers 6 are applied on both sides of the planarized inner substructure X—10(i). The adhesion metal layers 6 help copper to adhere, and are particularly important when depositing copper onto a dielectric material 20. The adhesion metal layers 6 are typically fabricated from titanium, chrome, or nickel chrome. The adhesive metal layers 6 are followed by copper seed layers 2-10(ii). Next, photoresist patterns 7 are applied, exposed and developed—Step 10(iii), into which copper features 28 are pattern plated—Step 10(iv). The photoresist layers 7 is stripped away—Step 10(v)

A pair of second layers of photoresist 33 are applied, exposed and developed, Step 10(vi), into which copper vias 34 are pattern plated—Step 10(vii). The second photoresist layers 33 are stripped away—Step 10(viii) and the copper seed layers and adhesion metal layers are etched away—Step (ix). Note, the seed layers are typically very much thinner than the copper features that are pattern plated thereabove, although this is not clear from the schematic cross-sections of FIG. 10(i) to 10(xi), which are not to scale. Next, dielectric material layers 5 are laminated over the metal feature layers 28 and the via layers 34 thereabove on each side of the growing stack—Step 10(x). The dielectric material layers 5 are planarized and thinned down until the outer edges of the vias 34 are exposed—Step 10(xi).

By co-application of additional pairs of outer features layers 38, 48 . . . (See FIG. 5b) on each side of the growing structure, more complicated structures are formed. Thus, depending on the final structure desired, further via layers and conductive features may be applied by repeating steps 10(i) to 10(xi) as necessary.

Finally, the substrate comprising the inner section structures and outer structures is terminated. FIG. 11 shows the steps of one termination process, and FIG. 11(i) to 11(x) schematically shows the terminations steps thereof.

Thus with reference to FIG. 11 and FIGS. 11(I) to 11(x), termination stage (VII) is a multi-step process that includes the steps of: first applying outer adhesion metal surface layers 6 to the outer layers of stacked structure—Step 11(I). Then, applying outer copper seed layers 2 onto the outer adhesion metal surface layers 6-1(ii). This is followed by applying photoresist layers T7 to the outermost copper seed layers 13, which are exposed and developed to provide a patterned structure—11(iii). Copper pads and lines T8 are now applied within this patterned structure—11(iv). The photoresist layers T7 are stripped away—11(vi). A final photoresist layer 97 is applied, exposed and developed to expose the copper pads T8-11(vi), and termination layers 98 are pattern electroplated onto the exposed copper pads T8-11(vii). The termination metal layers 98 may be nickel, gold, or a nickel layer followed by a gold layer, tin, lead, silver, palladium or alloys thereof. The copper seed layers 2 and outer adhesion metal layers 6 are now etched away—11(ix). Solder mask layers 99 are applied, exposed and developed to selectively expose the underlying copper pads T8 and termination metal layers 98-11(x).

Thus, starting with the membrane Ia and performing steps 10(I) to 10(xi), twice, followed by steps 11(I) to 11(x), the 2-2-2 structure of FIG. 5(b) is obtained.

There are various other materials and processing routes available for the termination stage. One such termination route involves applying conductor layers to outer surfaces (top and bottom) of the stacked structure by: (a) Thinning the substrate dielectric material on both sides, by mechanically grinding, by chemical mechanical polishing (CMP) or by dry etching or by combination of the above, to expose the surface of copper vias, (b) Applying outer adhesion metal surface layers to outer layers of stacked structure; (c) Applying outer copper seed layers onto the outer adhesion metal surface layers; (d) Applying photoresist layers to the outermost copper seed layers; (e) Exposing and developing the photoresist layers to provide a patterned structure; (f) Applying copper pads and lines within this patterned structure; (g) Removing these outer photoresist layers to leave copper seed layers, copper pads and lines; (h) Etching exposed copper seed layers and exposed adhesion metal layers (I) Applying exposing and developing solder mask layers so to mask copper lines and expose copper pads. (j) Electroless plating termination layers onto exposed copper pads;

The termination layers being fabricated from a metal selected from the list of nickel, gold, tin, lead, silver, palladium, nickel-gold, tin-silver, alloys and tarnish resistant polymer materials.

Unfortunately, although the structures of FIG. 5a and 5b are, in many ways, optimal, in some cases the electrical design of the substrate might require that the thickness of the laminated array layers (designated as "inner substructures" in FIG. 5a and 5b) are reduced as much as possible. This risks the yield of the above detailed processing route due to the fragile nature of these inner substructures. The process flow described hereinabove is, however, capable of some variation, solving the problem described above and leading to slightly different structures.

EXAMPLES

With reference to FIG. 12, a schematic cross section through a "2-0-2" symmetrical, coreless support structure having a barrier metal layer 1' included therein, those results from applying the processing steps of FIG. 10 and FIG. 11 to the variant membrane Ib of FIG. 8. The variant structure of FIG. 12 is similar to that of FIG. 5a, but includes barrier metal layers 1'. It is fabricated by applying the macrostages Ib, II, V, VI and, VII of FIG. 4.

Referring to FIGS. 13 and 13(I) to 13(xxvii), the process for fabricating the "2-0-2" symmetrical, coreless support structure of FIG. 12 is shown. The steps of constructing the structure of FIG. 12 are first building membrane Ia—steps 13(I) to 13(vi), that are equivalent to the steps of FIG. 9(I) to 9(vi) for fabricating the membrane 8, mutatis mutandis. The structure of 13(vi) is now planarized and thinned, thereby exposing the copper vias—step 13(vii). This step is essentially that of Stage V of FIG. 4. The planarized inner substructure formed thus far is now build up on both sides by applying the building up process of FIG. 10, such that intermediate structures 13(viii) to 13(xviii) result from applying steps 10(I)-10(xi) of FIG. 10—Stage VI of FIG. 4. As shown in FIG. 13(xix) to 13(xxviii) the "1-0-1" structure of FIG. 13(xviii) is now terminated by applying the termination process of FIG. 11, steps 11(I) to II(x), giving variant 2-0-2 structure shown in FIG. 12 structure 13(xxiii) to 13(xxvii).

FIG. 12 is very similar to FIG. 5a, however, the barrier layer inclusions 1' from the pattern plating process for forming the free-standing via membrane (see FIG. 9(vi)) remain and become incorporated in the finished structure.

Since barrier metal 1' is conductive, for many applications, its incorporation is not problematic, and the reduction in residual stress resulting from its incorporation is most desirable. FIG. 14 is a schematic cross section through a "3-0-3" symmetrical, coreless support structure that may be fabricated by the process of FIG. 13, comprising process 9, followed by process 10, steps 13(viii) 13(xvii) being repeated, followed by process 11.

FIG. 14a is a flowchart showing one processing route for fabricating the structure of FIG. 14 by applying the processing steps of FIG. 10 and FIG. 11 to the membrane of FIG. 6.

FIG. 16 shows a 2-1-2 structure, wherein the inner substructure includes one central metal feature layer 8 surrounded by two via layers 4, 14 and FIG. 15a shows the processing steps used in its fabrication.

With reference to FIG. 15a the steps of fabricating the inner core substructure for odd layer symmetrical layups consists of the following stages:

Firstly, a barrier metal layer 1 is panel plated onto a sacrificial carrier 0—Step (I). Next, a seed layer of copper 2 is applied onto the barrier metal 1—Step (ii). A first photoresist pattern 3 is laid onto the seed layer 2, exposed and developed to provide a via pattern—Step (iii). Copper vias 4 are constructed by electroplating or electroless plating copper into the photoresist pattern 3—Step (iv). The first photoresist pattern 3 is stripped away leaving the upstanding copper vias 4—Step (v). Dielectric material 5 is laminated over the copper vias—Step (vi), and the sacrificial carrier 0 is removed—Step (vii), followed by removal of the barrier metal layer 1—Step (viii). At this stage, the structure thus formed is identical to that of Ia, shown in FIG. 6, and the processing follows the method of FIG. 7, mutatis mutandis.

Before going on to step V of FIG. 4, and grinding down the dielectric to planarize same and expose the copper vias 4, the inner substructure X (see FIGS. 10(I) to 10(xi)) is built up on the face exposed by removal of the barrier layer 1 by adding a metal feature layer 8 followed by a second via layer 14 (Stage III of FIG. 4). The build up proceeds as follows: a 2nd layer of photoresist 7 is applied, exposed and developed to form a feature pattern—Step 10(ix), and a copper feature layer 8 is applied into the feature pattern—Step 10(x). The 2nd layer of photoresist 7 is stripped away—Step 10(xi) and a 3rd layer of photoresist 13 is applied—Step 10(xii), covering the spaces between the features, and, after exposure & developing, forming a 2nd via Pattern over the feature layer 8.

Copper is applied into the via pattern to form a 2nd layer of copper vias 14—Step 10(xiii), and the 3rd layer of photoresist 13 is stripped away—Step 10(xiv) exposing the copper of the features 8 and vias 14. The copper seed layer 2 is etched away—Step 10(xv), and the features 8 and vias 14 are laminated with a dielectric material 5—Step 10(xvi). The dielectric layer is now thinned and planarized to allow further buildup thereupon—Step 10(xvii).

Referring back to FIG. 4, after fabricating the membrane Ia, to create this symmetrical inner substructure having an odd number of feature layers—Step III is added prior to Step V.

FIG. 16 shows a 2-1-2 structure built around the inner substructure of FIG. 15, by the addition of two rows of vias 28, T8 on each side thereof, by the processes of FIGS. 10 and 11.

Referring now to FIG. 17, further feature layers may be added to provide a 3-1-3 structure, that is built up as per the structure of FIG. 16 mutatis mutandis, with a repeat of the subprocess shown in FIG. 10, for building up further outer feature layers 38 and via layers 44 on both sides of the inner substructure.

Once again, with reference to FIG. 18, a variant odd layered symmetrical inner support substructure is shown, based on the pattern plated via in dielectric membrane of FIG. 8. Referring to FIGS. 18 and 18(I) to (xvii), the manufacturing of the variant odd layered symmetrical inner support substructure of FIG. 18 start with fabrication of a pattern plated via in dielectric membrane Ib of FIG. 8 (steps 18(I) to 18(vi)), corresponding to steps 9(I) to 9(vi), mutatis mutandis. Membrane Ib is built up on one side only as follows: An adhesion metal layer 6 is applied instead of the stripped away copper carrier 0—Step (vii) a copper seed layer 2 is applied to the adhesion metal layer 6—Step (viii). A second layer of photoresist 7 is applied, exposed & developed to form a feature pattern—Step (ix). Copper is applied into the feature pattern to form a feature layer 8—Step (x). Now the second layer of photoresist 7 is stripped away—Step (xi), and a third layer of photoresist 13 is applied, exposed & developed to form a second via pattern—Step (xii). Copper is pattern plated into this second via pattern to form a second layer of copper vias 14—Step (xiii). The third layer of photoresist 13 is stripped away—Step (xiv), and the copper seed layer 2 and adhesion layer 6 are etched away—Step (xv). Now the inner support substructure thus formed is laminated with a dielectric material 5, typically by applying layers of prepreg—Step (xvi). The laminated stack may be ground down on both sides to expose the copper vias 4', 14—Step (xvii).

Referring to FIG. 19, once again, a variant "2-1-2" structure is possible that is built up from the odd layered symmetrical inner support substructure of FIG. 18 with barrier metal layers 1' included therewithin, by grinding the structure of FIG. 18 on both sides to remove dielectric 5, planarizing and exposing the outer edges of the vias 4', 14 thereby (Step V), followed by addition of outer layers 28 and vias 34 as per FIG. 16, mutatis mutandis.

Referring to FIG. 20, once again, variant "3-1-3" structure is possible that is built up from the odd layered symmetrical inner support substructure of FIG. 18 with barrier metal layers 1' included therewithin, by grinding the structure of FIG. 18 on both sides to remove dielectric 5, planarizing and exposing the outer edges of the vias 4', 14 thereby (Step V), followed by addition of outer layers 28, 38 and vias 34, 44 by repeating the steps of process 10, as per FIG. 17, mutatis mutandis.

Referring back to the 2-0-2 and 3-0-3 even layered structures of FIGS. 5a and 5b, the membranes Ia and Ib shown in FIGS. 6 and 8 may be very fragile, such as in cases where a minimal thickness of these substructures is required due to design considerations for specific applications, and going from step II to step V of FIG. 4 may result in low yields. Thus although building up the via in dielectric membranes Ia and Ib of FIGS. 6 and 8 by co-application of feature layers on both sides thereof gives a symmetrical structure with desirous properties, once again, depending on materials, tolerances and dimensions, etc., it may be necessary in some applications, to modify the process, sacrificing absolute symmetry for ease of fabrication and higher yields.

Where the thickness of vias 4 (4') and choice of dielectric 5 do not provide a laminar membrane Ia (Ib) having sufficient integrity to allow the dielectric 5 to be ground down thereby exposing the copper vias 4 (4') it may be required to build up a thicker structure on one side of the membrane Ia (Ib), prior to grinding away the excess dielectric 5 to expose the vias 4 (4'), by continuing fabrication on one side of the structure, using the non ground excess dielectric material that covers the vias 4 (4') as a stiffener.

Thus where a structure having an even number of metal feature layers is required, and a low thickness membrane is required due to electrical considerations, and in order to increase yields, after stage II a first inner feature layer 8 and second via layer 14 is formed—Stage III (see FIG. 15), onto which a second metal feature layer 18 and a third via layer 24 may be added—Stage IV. This provides a semi-symmetrical inner layer structure "-2-", having two feature layers 8, 18, that, after thinning and planarizing—stage V, may be built up further by codepositing outer feature layers 28, 38 . . . and outer via layers 34, 44 . . . by the process of FIG. 10, repeating if necessary, followed by terminating with the process of FIG. 11.

Referring to FIG. 21, a substantially symmetrical inner substructure "-2-" is shown that may be built up starting from the membrane Ia of FIG. 6.

Substantially symmetrical inner substructure "-2-" may be built up into four and six metal feature layer structures having "1-2-1" and "2-2-2" constructions which are practically identical to the "2-0-2" and "3-0-3" constructions shown in FIGS. 5a and 5b respectively, being different only in that the inner metal feature layers 8, 18, by being applied one at a time, are not identical.

Referring to FIG. 21a and FIG. 21b(I) to 21b(xxviii), the processing route for building up the structure of FIG. 21 is to first build up the membrane Ia of FIG. 6 (stages I and II of FIG. 4) steps 21(I) to 21(viii), and then to build this up into the semi-symmetrical inner substructure of FIG. 21 by the macro stage III (FIG. 4) of: adding a metal feature layer 8 thereupon and building up a second via layer 14 thereover and laminating by application of a dielectric material 5 layer thereover—steps (ix) to (xvi). The structure is now thinned and planarized—Step (xvii) to expose the ends of vias 14. Then a second metal feature layer 18 is applied and a third via layer 24 is applied thereonto—Stage IV, steps 21(xviii) to 21(xxvii), and the whole structure is then thinned and planarized—21 (xxviii) (Stage V of FIG. 4).

The build up proceeds as follows: after obtaining the membrane Ia of FIG. 6 (Stages I and II, i.e. Steps (I) to (viii)), a 2nd layer of photoresist 7 is applied exposed and developed to form a feature pattern—Step (ix), and a copper feature layer 8 is applied into the feature pattern—Step (x). The 2nd layer of photoresist 7 is stripped away—Step (xi) and a 3rd layer of photoresist 13 is applied, covering the spaces between the features 8, and, after exposure & developing, forming a 2nd via pattern over the feature layer—Step (xii). Copper is pattern plated into the via pattern to form a 2nd layer of copper vias 14—Step (xiii), and the 3rd layer of photoresist 13 is stripped away—Step (xiv), exposing the copper of the features 8 and vias 14. The copper seed layer 2 is etched away—step (xv), and the exposed features 8 and vias 18 are now laminated with a dielectric material layer 5—Step (xvi) and thinned and planarized—Step (xvii), thereby exposing the ends of the copper vias 14—Stage III.

After depositing a further layer of adhesion metal 6 (Step (xviii)) and a further copper seed layer 2—Step (xix), a fourth layer of photoresist 17 is applied, exposed and developed to form a second feature pattern—Step (xx), and a second copper feature layer 18 is applied into the second feature pattern—Step (xxi). The 4th layer of photoresist 17 is stripped away—Step (xxii) and a 5th layer of photoresist 23 is applied, covering the spaces between the features 18, and, after exposure & developing, forming a 3rd via pattern over the feature layer 18—Step (xxiii). Copper is applied into the via pattern to form a 3rd layer of copper vias 24—Step (xxiv), and the 5th layer of photoresist 23 is stripped away—Step (xxv) exposing the copper of the features 18 and vias 24. After etching away the adhesion layer 6 and copper seed layer 2 between the vias 24—step (xxvi), the structure is laminated with a dielectric material layer 5—Step (xxvii)—Stage IV.

The thicker substructure, with two feature layers thus formed is thinned and planarized—Stage V, typically by a grinding an/or chemical polishing technique, and can then be built up by depositing outer layers—Stage VI and terminating—Stage VII.

Referring to FIG. 22, a semi-symmetrical inner substructure corresponding to that of FIG. 21 may also be built up from the pattern plated membrane of FIG. 8. The processing route is identical to that of FIG. 21a, but the starting point is the substructure of FIG. 8 and not that of FIG. 6.

FIG. 22b(I) to 22b(xxviii) show the intermediate structures produced by corresponding steps of FIG. 22a. Specifically, FIGS. 22b(I) to 22b(v), correspond to Stage I of fabricating the membrane Ib FIG. 22b(vi) represents Stage II of etching away the sacrificial carrier, resulting in free standing membrane Ib as shown in FIG. 9. In FIGS. 22b(vii) to 22b(xvi), the free standing membrane Ib is built up by adding a feature layer 8 and a second via layer 14, giving the single layer substructure of FIG. 18. This corresponds to Stage III of the macro process, shown in FIG. 4. The single layer substructure of FIG. 18 is built up into the double feature layer substructure of FIG. 22, by Stage IV, i.e. building up a second feature layer 18 and a third via layer 24—steps (xvii) to (xxvii). This is now thinned and planarized—Stage V, step (xxviii), and may be further built up on both sides thereof, to give the 1-2-1 and 2-2-2 semi symmetrical support structures shown in FIGS. 23 and 24, by adding further layers on both sides—Stage VI of FIG. 4, see processing route described in detail in FIGS. 10 and 10(I) to 10(xi).

The inner substructures of FIG. 21 may be built up to give the semi symmetrical structures shown in FIGS. 23 and 24. The structures shown in schematic cross-section in FIGS. 23 and 24, are similar to the 2-0-2 and 3-0-3 structures of FIGS. 5a and 5b mutatis mutandis, but are not truly symmetrical on account of the asymmetrical build up of the substructure, described above. Nevertheless, since the outer feature layers are co-deposited and thus have similar thicknesses and processing conditions, the substrates thus formed do not show a tendency to warp.

Similarly, the inner substructure of FIG. 22 can be built up into the corresponding variant semi symmetrical structures shown in FIGS. 25 and 26, which are schematic cross-sections through 1-2-1 and 2-2-2 variant semi-symmetrical support structures similar to those of FIGS. 23 and 24, mutatis mutandis, but showing where the pattern plated barrier metal included layers 1' from the first stages of the fabrication remain trapped within the structures. By contrasting with the structures of FIGS. 12 and 14, the differences between the two fabrication routes will be apparent.

As described hereinabove, the various multilayer substrates described herein consist of alternating conductive layers 8, 18, 28, 38 . . . T8 having high conductivity and serving as conductive paths, separated by dielectric material 5. It will be appreciated however, that the conductive layers may include resistors, in-layer capacitors, inductors and the like. Generally the dielectric material 5 is selected to provide high electrical resistance, and has an appropriate thickness and dielectric constant that match the capacitance and impedance values required by the substrate designer.

Thus persons skilled in the art will appreciate that the present invention is not limited to what has been particularly shown and described hereinabove. Rather the scope of the present invention is defined by the appended claims and includes both combinations and sub combinations of the various features described hereinabove as well as variations and modifications thereof, which would occur to persons skilled in the art upon reading the foregoing description.

In the claims, the word "comprise", and variations thereof such as "comprises", "comprising" and the like indicate that the components or methods listed are included, but not generally to the exclusion of other components.

What is claimed is:

1. A method of fabricating a free standing membrane comprising a via array in a dielectric surround comprising polymer, for use as a precursor in the construction of superior electronic support structures, comprising the stages:
   I—fabricating a membrane comprising conductive vias in a dielectric surround comprising polymer on a sacrificial carrier, comprising the sub-steps of:
   (i) panel plating a barrier metal layer onto a sacrificial carrier;
   (ii) applying a seed layer of copper onto the barrier metal layer;
   (iii) applying, exposing and developing a photoresist layer onto the copper seed layer to form patterns;
   (iv) pattern plating copper vias into the photo resist patterns;
   (v) stripping away the photoresist layer leaving the upstanding copper vias, and
   (vi) laminating a dielectric material layer over the copper vias, such that the free standing membrane formed thereby comprises a copper via array in a dielectric matrix; and
   II—detaching the membrane from the sacrificial carrier to form a free standing laminated array.

2. A method of fabricating an electronic substrate comprising at least the stages of:
   I—fabricating a membrane comprising conductive vias in a dielectric surround comprising polymer on a sacrificial carrier, comprising the sub-steps of:
   (i) panel plating a barrier metal layer onto a sacrificial carrier;
   (ii) applying a seed layer of copper onto the barrier metal layer;
   (iii) applying, exposing and developing a photoresist layer onto the copper seed layer to form patterns;
   (iv) pattern plating copper vias into the photoresist patterns;
   (v) stripping away the photoresist layer leaving the upstanding copper vias, and
   (vi) laminating a dielectric material layer over the copper vias;
   II—detaching the membrane from the sacrificial carrier to form a free standing laminated array, comprising the sub steps of:
   (vii) removing the sacrificial carrier, and
   (viii) removing the barrier metal layer;
   V—thinning and planarizing;
   VI—building-up; and
   VII—terminating,
   such that the resulting electronic substrate comprises a copper structure in a dielectric matrix.

3. The method of claim 2, wherein the conductive vias are fabricated from copper applied by a plating technique selected from the group consisting of electroplating and electroless plating.

4. The method of claim 2, wherein the barrier metal layer has at least one of the following characteristics:
   (a) the barrier metal layer is selected from the group consisting of tantalum, tungsten, chromium, titanium, a titanium-tungsten combination, a titanium-tantalum combination, nickel, gold, nickel layer followed by gold layer, a gold layer followed by a nickel layer, tin, lead, tin layer followed by a lead layer, tin-lead alloy, and tin-silver alloy and is applied by a physical vapor deposition process;
   (b) the barrier metal layer is selected from the group consisting of nickel, gold, a nickel layer followed by gold layer, a gold layer followed by a nickel layer, tin, lead, a tin layer followed by a lead layer, tin-lead alloy, and tin-silver alloy and is applied by a plating method selected from the group consisting of electroplating and electroless plating, and
   (c) the barrier metal layer has a thickness in the range of 0.1 μm to 5 μm.

5. The method of claim 2, further comprising stage III of adding a metal feature layer and a further via layer to form an inner substructure comprising a center metal feature layer membrane surrounded by via layers, such that the electronic substrate built up therearound has an odd number of metal feature layers.

6. The method of claim 5 wherein stage III comprises the substeps of:
   (a) applying, exposing and developing a photoresist layer onto the copper seed layer to form feature patterns;
   (b) pattern plating copper feature layer into the feature patterns;
   (c) stripping away the photoresist layer,
   (d) applying exposing and developing a second layer of photoresist to form via patterns;
   (e) pattern plating copper into the via patterns to form copper vias;
   (f) stripping away the second layer of photoresist;
   (g) etching the copper seed layer, and
   (h) laminating a dielectric material layer over the bare copper vias and copper feature layers.

7. The method of claim 5, further comprising stage IV of adding a further inner feature layer followed by a further inner via layer to form an inner substructure comprising a central via layer surrounded by feature layers, such that the electronic substrate built up therearound has an even number of metal feature layers.

8. The method of claim 7 wherein stage IV comprises the steps of:
   (i) thinning and planarizing the laminated dielectric material layer applied in step (j) to expose the outer surface of the vias applied in step (e);

(k) applying adhesion metal layers onto the exposed outer surfaces of vias and laminated dielectric material layer therearound;

(l) applying copper seed layers onto the adhesion metal layers;

(m) applying, exposing and developing second feature layers of photoresist onto the copper seed layers to form second feature patterns;

(n) pattern plating copper feature layer into the second feature patterns;

(o) stripping away the second feature layer of photoresist;

(p) applying exposing and developing a third via layers of photoresist to form third via patterns;

(q) applying copper into the third via patterns to form third layers of copper vias;

(r) stripping away the third layers of photoresist;

(s) etching away the copper seed layers and adhesion metal layers, and (t) laminating a dielectric material layers thereover.

9. The method of claim 7 wherein the adhesion metal is selected from the group consisting of titanium, chrome, and nickel chrome.

10. The method of claim 2 wherein the dielectric surround is a fiber reinforced resin composite.

11. The method of claim 2, wherein the dielectric surround comprises a resin selected from the group consisting of thermoplastic resins, thermosetting polymeric resins and resins having mixed thermoplastic and thermosetting properties.

12. The method of claim 11, wherein the dielectric surround further comprises inorganic particulate fillers and the dielectric material is further characterized by having at least one of the following characteristics:

(a) the inorganic particulate fillers comprise particles of a ceramic or glass;

(b) particle sizes of the order of single microns, and (c) 15% to 30% of particulate filler by weight.

13. The method of claim 11, wherein the dielectric surround is a fiber matrix composite material and further comprises fibers selected from the group consisting of organic fibers and glass fibers as chopped fibers or continuous fibers arranged in cross-plied arrangements or as woven mats.

14. The method of claim 12 wherein the dielectric surround is a prepreg comprising a fiber mat that is pre-impregnated with a partially cured polymeric resin.

15. The method of claim 2 wherein stage II of detaching the laminated columnar via structure from the sacrificial carrier to form a free standing laminated array comprises removing the sacrificial carrier away by an etching process.

16. The method of claim 2 wherein the stage of thinning and planarizing dielectric material layers, to expose outer via surfaces therebeneath, comprises a technique selected from the group consisting of mechanically grinding, chemical mechanical polishing (CMP), dry etching and multiple stage processing using two or more of these techniques.

17. The method of claim 2, further comprising an additional stage VI, of building up feature layers and via layers on both sides of the membrane.

18. The method of claim 17, wherein additional stage VI comprises the steps of:

(a) applying adhesion metal layers;

(b) applying seed layers of copper onto the adhesion metal layers;

(c) applying, exposing and developing first outer layers of photoresist onto copper seed layers to form patterns for first outer feature layers;

(d) pattern plating first outer copper features into the first outer layers of photoresist patterns;

(e) stripping away the first outer layers of photoresist;

(f) applying, exposing and developing second outer layers of photoresist to form patterns for first outer via layers;

(g) pattern plating first outer copper vias into second outer layers of photoresist patterns;

(h) stripping away second outer layers of photoresist;

(i) etching away the copper seed layers and adhesion metal layers;

(j) laminating dielectric material layers over the exposed copper features and vias, and (k) thinning and planarizing the dielectric material layers until the outer faces of the vias are exposed.

19. The method of claim 18 wherein the adhesion metal is selected from the group consisting of titanium, chrome, and nickel chrome.

20. The method of claim 18 wherein steps (a) to (k) are repeated, thereby building up additional outer layers.

21. The method of claim 2, wherein stage VII of terminating, comprises the steps of:

(I) applying outer adhesion metal layers to outer layers of stacked structure;

(ii) applying outer copper seed layers onto the outer adhesion metal layers;

(iii) applying, exposing and developing outer photoresist layers to form patterns;

(iv) pattern plating copper lines and pads features into outer layers of photoresist patterns;

(v) stripping away the outer photoresist layers;

(vi) applying exposing and developing terminal photoresist layers to selectively expose copper the pads;

(vii) electroplating termination metal layers onto the exposed copper pads, said termination metal layers being fabricated from a metal selected from the group consisting of nickel, gold, tin, lead, silver, palladium, and combinations and alloys thereof;

(viii) stripping away the terminal photoresist layers;

(ix) etching exposed copper seed layers and exposed adhesion metal layers, and (x) applying exposing and developing solder mask layers so to mask copper lines and expose termination metal layers.

22. The method of claim 2 wherein stage VII of terminating the electronic substrate comprises the steps of:

(i) applying outer adhesion metal layers to outer layers of stacked structure;

(ii) applying outer copper seed layers onto the outer adhesion metal layers;

(iii) applying, exposing and developing outer photoresist layers to form patterns;

(iv) pattern plating copper lines and pads features into outer layers of photoresist patterns;

(v) stripping away the outer photoresist layers;

(vi) etching exposed copper seed layers and exposed adhesion metal layers;

(vii) applying exposing and developing solder mask layers so to mask copper lines and expose copper pads;

(viii) electroless plating termination layers onto exposed copper pads, said termination layers being fabricated from a metal selected from the group consisting of nickel, gold, tin, lead, silver, palladium, nickel-gold, tin-silver, alloys and tarnish resistant polymer materials.

* * * * *